(12) United States Patent
Sakurai et al.

(10) Patent No.: US 11,495,616 B2
(45) Date of Patent: Nov. 8, 2022

(54) MULTI-TIER THREE-DIMENSIONAL MEMORY DEVICE WITH DIELECTRIC SUPPORT PILLARS AND METHODS FOR MAKING THE SAME

(71) Applicant: SANDISK TECHNOLOGIES LLC, Addison, TX (US)

(72) Inventors: Takuya Sakurai, Yokkaichi (JP); Yoshitaka Otsu, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 46 days.

(21) Appl. No.: 17/012,862

(22) Filed: Sep. 4, 2020

(65) Prior Publication Data
US 2020/0403005 A1    Dec. 24, 2020

Related U.S. Application Data

(63) Continuation-in-part of application No. 16/276,952, filed on Feb. 15, 2019, now Pat. No. 10,957,706.
(Continued)

(51) Int. Cl.
*H01L 27/11582* (2017.01)
*H01L 27/11565* (2017.01)
(Continued)

(52) U.S. Cl.
CPC .. *H01L 27/11582* (2013.01); *H01L 21/31116* (2013.01); *H01L 21/31144* (2013.01); *H01L 21/76802* (2013.01); *H01L 23/5226* (2013.01); *H01L 27/1157* (2013.01); *H01L 27/11565* (2013.01); *H01L 27/11573* (2013.01);
(Continued)

(58) Field of Classification Search
CPC ......... H01L 21/31144; H01L 21/76802; H01L 21/31116; H01L 23/5226; H01L 27/11582; H01L 27/11565; H01L 27/1157; H01L 27/11573; H01L 27/11556; H01L 27/11519; H01L 27/11524; H01L 27/11526; H01L 27/11575; H01L 29/4011
See application file for complete search history.

(56) References Cited

U.S. PATENT DOCUMENTS

| 5,915,167 A | 6/1999 | Leedy |
| 8,878,278 B2 | 11/2014 | Alsmeier et al. |

(Continued)

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).
(Continued)

*Primary Examiner* — Andres Munoz
(74) *Attorney, Agent, or Firm* — The Marbury Law Group PLLC

(57) ABSTRACT

A semiconductor device includes an alternating stack of insulating layers and electrically conductive layers located over a substrate including a semiconductor material layer, a memory opening and a support opening extending through the alternating stack, a memory opening fill structure located in the memory opening and including a memory film and a semiconductor material portion in contact with the semiconductor material layer, and a support pillar structure located in the support opening. The support pillar structure lacks a semiconductor material portion which is in contact with the semiconductor material layer.

5 Claims, 115 Drawing Sheets

Related U.S. Application Data

(60) Provisional application No. 62/747,047, filed on Oct. 17, 2018.

(51) Int. Cl.

| | | |
|---|---|---|
| *H01L 27/1157* | (2017.01) | |
| *H01L 27/11573* | (2017.01) | |
| *H01L 23/522* | (2006.01) | |
| *H01L 21/311* | (2006.01) | |
| *H01L 21/28* | (2006.01) | |
| *H01L 21/768* | (2006.01) | |
| H01L 27/11556 | (2017.01) | |
| H01L 27/11519 | (2017.01) | |
| H01L 27/11524 | (2017.01) | |
| H01L 27/11526 | (2017.01) | |

(52) U.S. Cl.
CPC ... *H01L 29/40117* (2019.08); *H01L 27/11519* (2013.01); *H01L 27/11524* (2013.01); *H01L 27/11526* (2013.01); *H01L 27/11556* (2013.01)

(56) References Cited

U.S. PATENT DOCUMENTS

| | | |
|---|---|---|
| 9,230,987 B2 | 1/2016 | Pachamuthu et al. |
| 9,412,749 B1 | 8/2016 | Shimabukuro et al. |
| 9,449,982 B2 | 9/2016 | Lu et al. |
| 9,536,897 B2 | 1/2017 | Yoo et al. |
| 9,576,967 B1 | 2/2017 | Kimura et al. |
| 9,627,403 B2 | 4/2017 | Liu et al. |
| 9,659,956 B1 | 5/2017 | Pachamuthu et al. |
| 9,754,963 B1 | 9/2017 | Kawamura et al. |
| 9,786,681 B1 | 10/2017 | Ariyoshi |
| 9,853,038 B1 | 12/2017 | Cui |
| 9,881,929 B1 | 1/2018 | Ravikirthi et al. |
| 9,978,766 B1 | 5/2018 | Hosoda et al. |
| 10,014,316 B2 | 7/2018 | Yu et al. |
| 10,115,632 B1 | 10/2018 | Masamori et al. |
| 10,141,331 B1 | 11/2018 | Susuki et al. |
| 10,224,240 B1 | 3/2019 | Funayama et al. |
| 10,304,852 B1 | 5/2019 | Cui et al. |
| 10,381,434 B1 | 8/2019 | Pachamuthu et al. |
| 10,475,879 B1 | 11/2019 | Pachamuthu et al. |
| 10,490,569 B2 | 11/2019 | Mushiga et al. |
| 10,700,089 B1 | 6/2020 | Hojo et al. |
| 2010/0013049 A1 | 1/2010 | Tanaka et al. |
| 2010/0133598 A1 | 6/2010 | Chae et al. |
| 2010/0133599 A1 | 6/2010 | Chae et al. |
| 2012/0061744 A1 | 3/2012 | Hwang et al. |
| 2013/0248974 A1 | 9/2013 | Alsmeier et al. |
| 2015/0236038 A1 | 8/2015 | Pachamuthu et al. |
| 2015/0294978 A1 | 10/2015 | Lu et al. |
| 2016/0049423 A1 | 2/2016 | Yoo et al. |
| 2016/0322381 A1 | 11/2016 | Liu et al. |
| 2017/0263558 A1 | 9/2017 | Shingu et al. |
| 2017/0287926 A1 | 10/2017 | Ariyoshi |
| 2018/0108671 A1 | 4/2018 | Yu et al. |
| 2018/0130812 A1 | 5/2018 | Hosoda et al. |
| 2018/0261613 A1 | 9/2018 | Ariyoshi |
| 2018/0301374 A1 | 10/2018 | Masamori et al. |
| 2018/0342531 A1 | 11/2018 | Susuki et al. |
| 2019/0252396 A1 | 8/2019 | Mushiga et al. |
| 2019/0280003 A1 | 9/2019 | Mushiga et al. |

OTHER PUBLICATIONS

ISR—Notification of Transmittal of the International Search Report and Written Opinion of the International Search Authority for International Patent Application No. PCT/US2019/046416, dated Dec. 3, 2019, 12 pages.

USPTO Office Communication, Non-Final Office Action for U.S. Appl. No. 16/276,996, dated Aug. 18, 2020, 17 pages.

U.S. Appl. No. 16/276,952, filed Feb. 15, 2019, SanDisk Technologies LLC.

U.S. Appl. No. 16/276,996, filed Feb. 15, 2019, SanDisk Technologies LLC.

U.S. Appl. No. 16/361,773, filed Mar. 22, 2019, SanDisk Technologies LLC.

U.S. Appl. No. 16/368,007, filed Mar. 28, 2019, SanDisk Technologies LLC.

U.S. Appl. No. 16/692,027, filed Nov. 22, 2019, SanDisk Technologies LLC.

U.S. Appl. No. 16/735,854, filed Jan. 7, 2020, SanDisk Technologies LLC.

U.S. Appl. No. 16/876,370, filed May 18, 2020, SanDisk Technologies LLC.

U.S. Appl. No. 16/893,933, filed Jun. 5, 2020, SanDisk Technologies LLC.

U.S. Appl. No. 16/893,995, filed Jun. 5, 2020, SanDisk Technologies LLC.

U.S. Appl. No. 16/918,463, filed Jul. 1, 2020, SanDisk Technologies LLC.

U.S. Appl. No. 16/918,493, filed Jul. 1, 2020, SanDisk Technologies LLC.

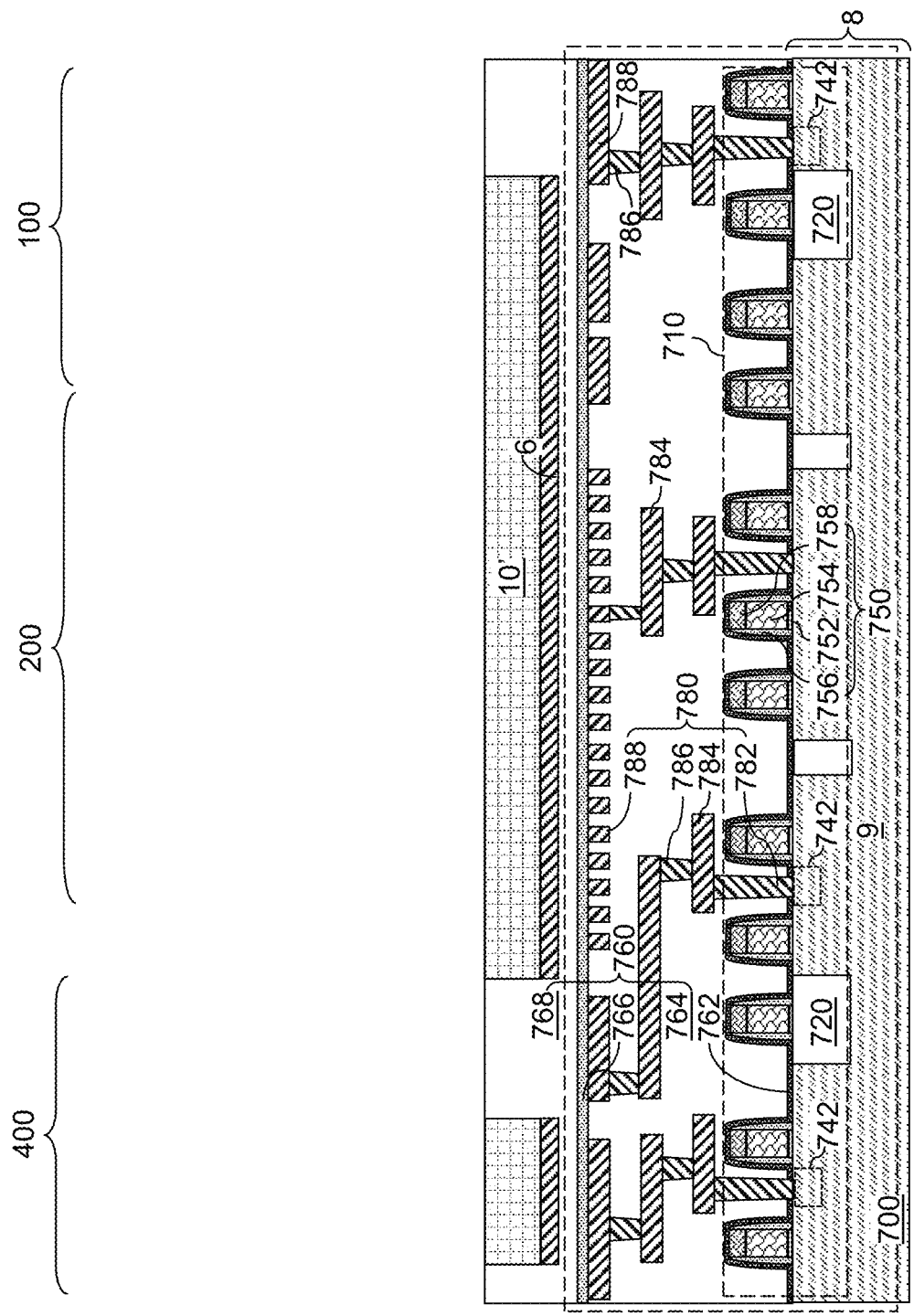

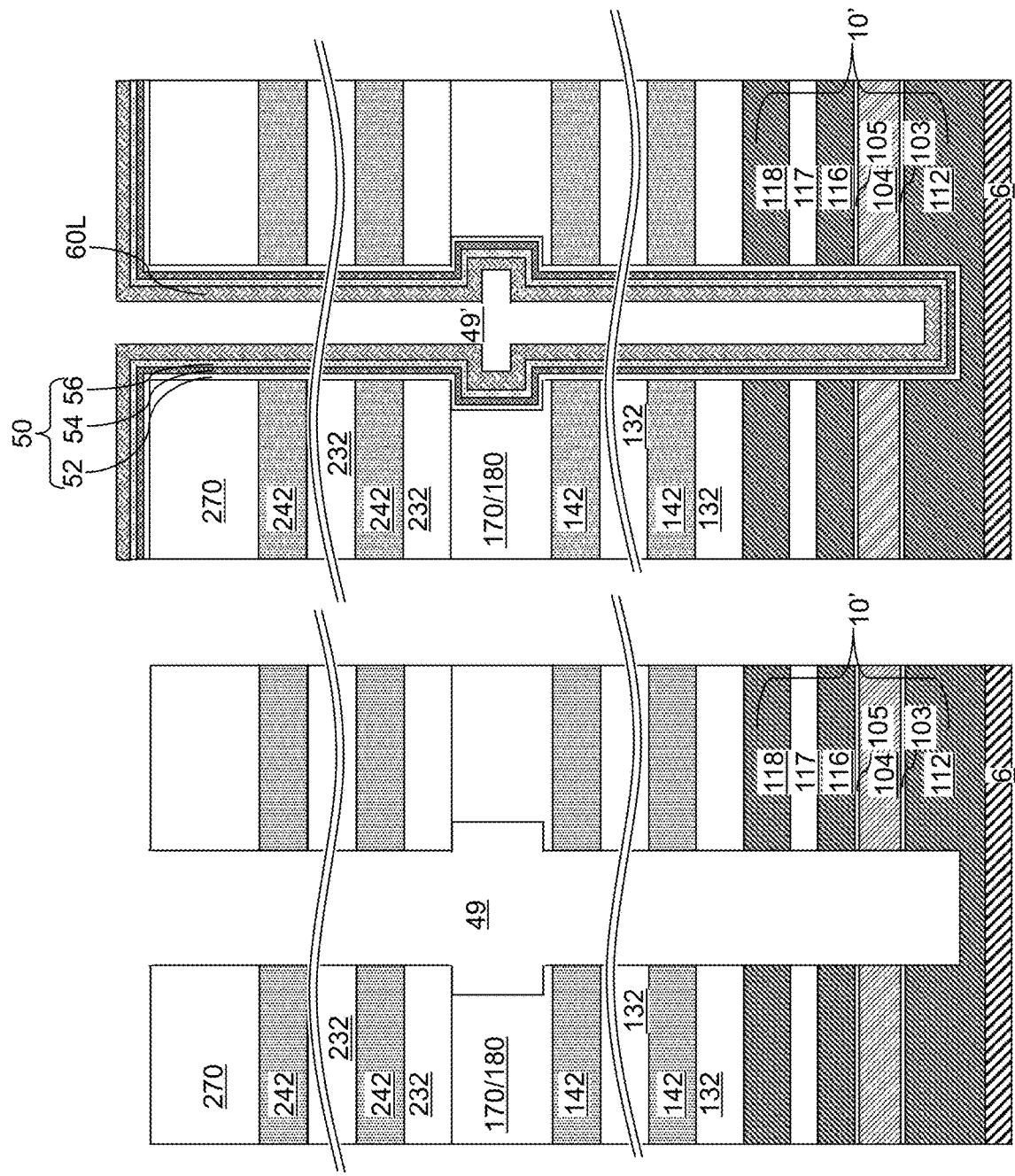

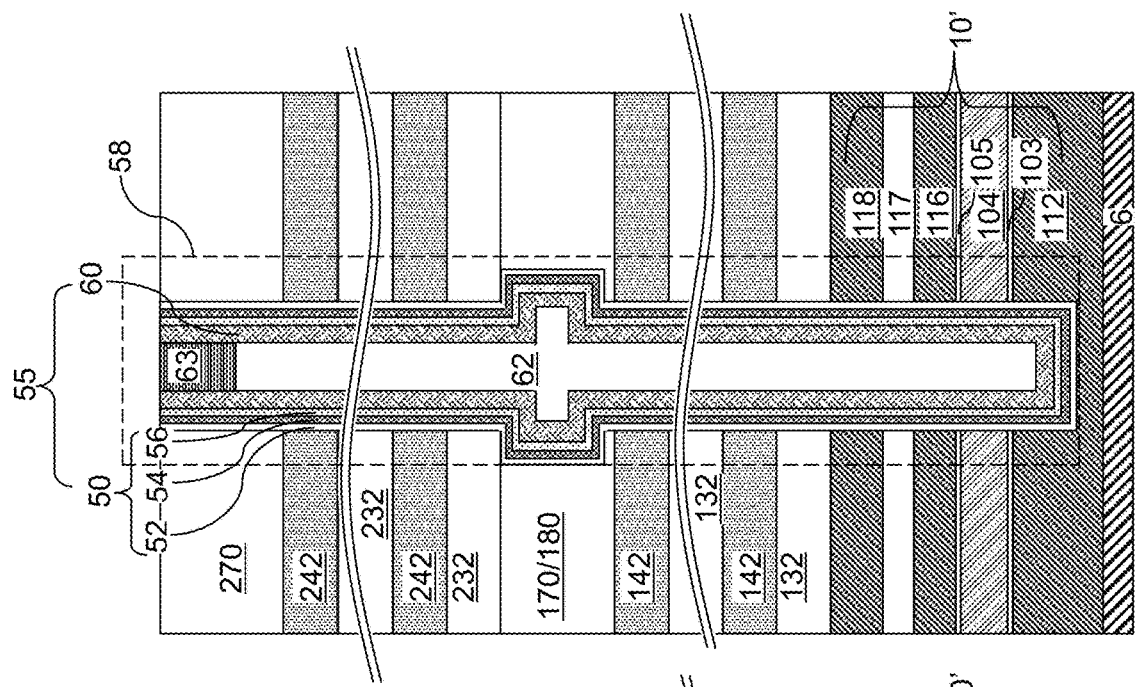
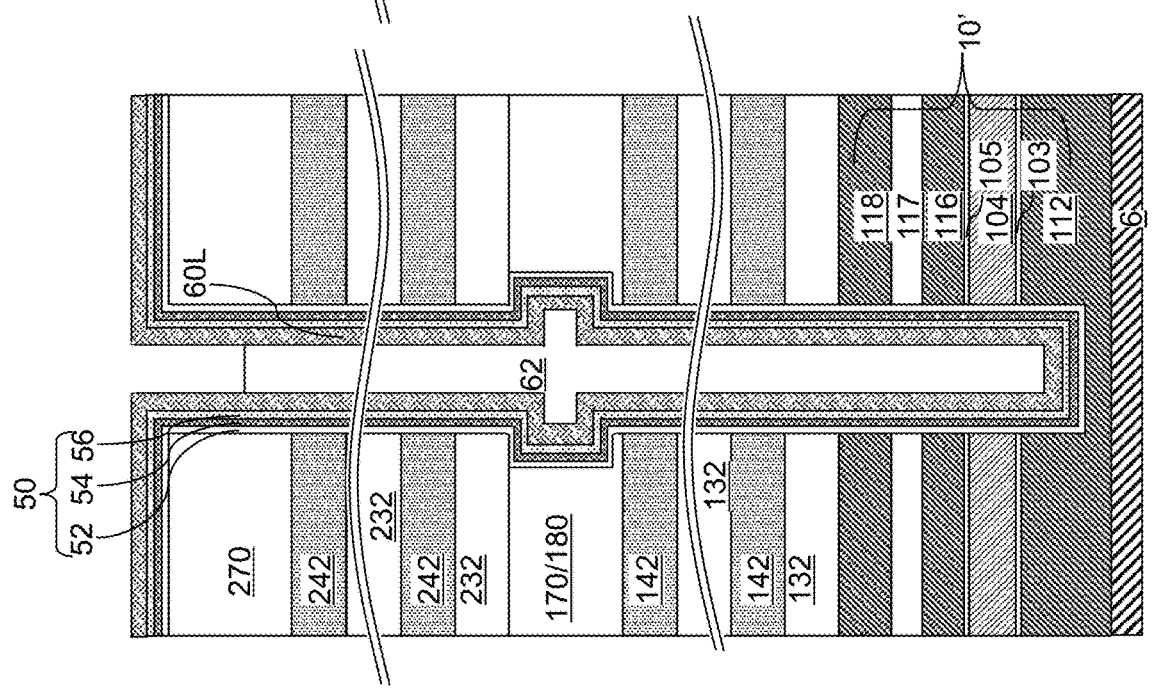

MULTI-TIER THREE-DIMENSIONAL MEMORY DEVICE WITH DIELECTRIC SUPPORT PILLARS AND METHODS FOR MAKING THE SAME

RELATED APPLICATIONS

This application is a continuation-in-part application of U.S. application Ser. No. 16/276,952 filed on Feb. 15, 2019, which claims benefit of U.S. Provisional Application Ser. No. 62/747,047 filed in Oct. 17, 2018, the entire contents of both of which are incorporated herein by reference.

FIELD

The present disclosure relates generally to the field of semiconductor devices and specifically to a three-dimensional memory device having dielectric support pillars and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor device includes an alternating stack of insulating layers and electrically conductive layers located over a substrate including a semiconductor material layer, a memory opening and a support opening extending through the alternating stack, a memory opening fill structure located in the memory opening and including a memory film and a semiconductor material portion in contact with the semiconductor material layer, and a support pillar structure located in the support opening. The support pillar structure lacks a semiconductor material portion which is in contact with the semiconductor material layer.

According to another aspect of the present disclosure, a method of forming a semiconductor device is provided, which comprises: forming at least one alternating stack of insulating layers and spacer material layers over a substrate including a semiconductor material layer, wherein the spacer material layers are formed as, or are subsequently replaced with, electrically conductive layers; forming a memory opening and a support opening through the at least one alternating stack; forming a first semiconductor oxide liner at a bottom portion of the support opening and a second semiconductor oxide liner at a bottom portion of the memory opening by oxidation of surface portions of the semiconductor material layer around bottom regions of the support opening and the memory opening; removing the second semiconductor oxide liner without removing the first semiconductor oxide liner; forming a semiconductor material portion in contact with the semiconductor material layer in the memory opening by performing a selective semiconductor deposition process without growing any semiconductor material from the first semiconductor oxide liner; and forming a memory opening fill structure in the memory opening and a support pillar structure in the support opening, wherein the memory opening fill structure comprises the semiconductor material portion, a memory film, and a vertical semiconductor channel, and the support pillar structure comprises the first semiconductor oxide liner, a dummy memory film, and a dummy vertical semiconductor channel.

According to an aspect of the present disclosure, a three-dimensional semiconductor device is provided, which comprises: a first-tier alternating stack of first insulating layers and first electrically conductive layers located over a substrate; a second-tier alternating stack of second insulating layers and second electrically conductive layers located over the first-tier alternating stack; memory stack structures vertically extending through each layer of the alternating stack in a memory array region; stepped surfaces of the first-tier alternating stack and the second-tier alternating stack located in a staircase region adjacent to the memory array region; and first-tier dielectric support pillar structures extending through portions of the first-tier alternating stack underlying the stepped surfaces, wherein a height of each of the dielectric support pillar structures decreases with a lateral distance from the memory array region.

According to another embodiment, a three-dimensional semiconductor device comprises a first-tier alternating stack of first insulating layers and first electrically conductive layers located over a substrate; a second-tier alternating stack of second insulating layers and second electrically conductive layers located over the first-tier alternating stack; a memory array region including memory stack structures that vertically extend through each layer of the first-tier alternating stack and the second-tier alternating stack; a staircase region including first stepped surfaces of the first-tier alternating stack and second stepped surfaces of the second-tier alternating stack; dielectric support pillar structures consisting essentially of at least one dielectric material and extending through the first-tier alternating stack and not extending through any layer of the second-tier alternating stack; and composite support pillar structures comprising a semiconductor material portion and extending through all layers of the first-tier alternating stack and through the second stepped surfaces.

According to another embodiment, a method of forming a semiconductor structure comprises forming a first-tier alternating stack of first insulating layers and first spacer material layers over a substrate; forming in-process dielectric support pillar structures through the first-tier alternating stack in a first staircase region; forming a second-tier alternating stack of second insulating layers and second sacrificial material layers over the first-tier alternating stack and the in-process support pillar structures; patterning the second-tier alternating stack and the first-tier alternating stack to form first stepped surfaces on the first-tier alternating stack and second stepped surfaces on the second-tier alternating stack, wherein the in-process dielectric support pillar structures are collaterally recessed vertically to provide dielectric support pillar structures comprising at least one dielectric material and extending through the first-tier alternating stack and having different heights; forming memory stack structures vertically extending through each layer of the first-tier alternating stack and the second-tier alternating stack in a memory array region; and replacing remaining portions of the first spacer material layers and the second spacer material layers with first electrically conductive layers and second electrically conductive layers.

According to another embodiment, a three-dimensional semiconductor device comprises a first-tier alternating stack of first insulating layers and first electrically conductive layers located over a substrate; a second-tier alternating stack of second insulating layers and second electrically conductive layers located over the first-tier alternating stack; a memory array region including memory stack structures that vertically extend through each layer of the first-tier alternating stack and the second-tier alternating stack; a staircase region including first stepped surfaces of the first-tier alternating stack and second stepped surfaces of the second-tier alternating stack; and dielectric support pillar structures consisting essentially of at least one dielectric material and located within the staircase region, wherein one of the dielectric support pillar structures extends through all layers of the first-tier alternating stack and at least a bottommost layer of the second-tier alternating stack, and has a greater lateral extent at a level of a topmost layer of the first-tier alternating stack than at a level of the bottommost layer of the second-tier alternating stack.

According to another embodiment, a method of forming a semiconductor structure comprises forming a first-tier alternating stack of first insulating layers and first spacer material layers over a substrate; forming a second-tier alternating stack of second insulating layers and second sacrificial material layers over the first-tier alternating stack; forming inter-tier support openings vertically extending at least from a horizontal plane including a topmost surface of the second-tier alternating stack at least to another horizontal plane including a bottommost surface of the first-tier alternating stack, wherein each of the inter-tier support openings has a greater lateral extent at a level of a topmost layer of the first-tier alternating stack than at a level of a bottommost layer of the second-tier alternating stack; forming dielectric support pillar structures in the inter-tier support openings; forming first stepped surfaces on the first-tier alternating stack and second stepped surfaces on the second-tier alternating stack by patterning the first-tier alternating stack and the second-tier alternating stack prior to, or after, formation of the dielectric support pillar structures; forming memory stack structures vertically extending through each layer of the first-tier alternating stack and the second-tier alternating stack in a memory array region; and replacing remaining portions of the first spacer material layers and the second spacer material layers with first electrically conductive layers and second electrically conductive layers.

BRIEF DESCRIPTION OF THE DRAWINGS

FIG. 1A is a vertical cross-sectional view of a first exemplary structure after formation of semiconductor devices, lower level dielectric layers, lower metal interconnect structures, and in-process source level material layers on a semiconductor substrate according to a first embodiment of the present disclosure.

FIGS. 9A-9D illustrate sequential vertical cross-sectional views of a memory opening during formation of a memory opening fill structure according to an embodiment of the present disclosure.

DETAILED DESCRIPTION

Figure 1B:
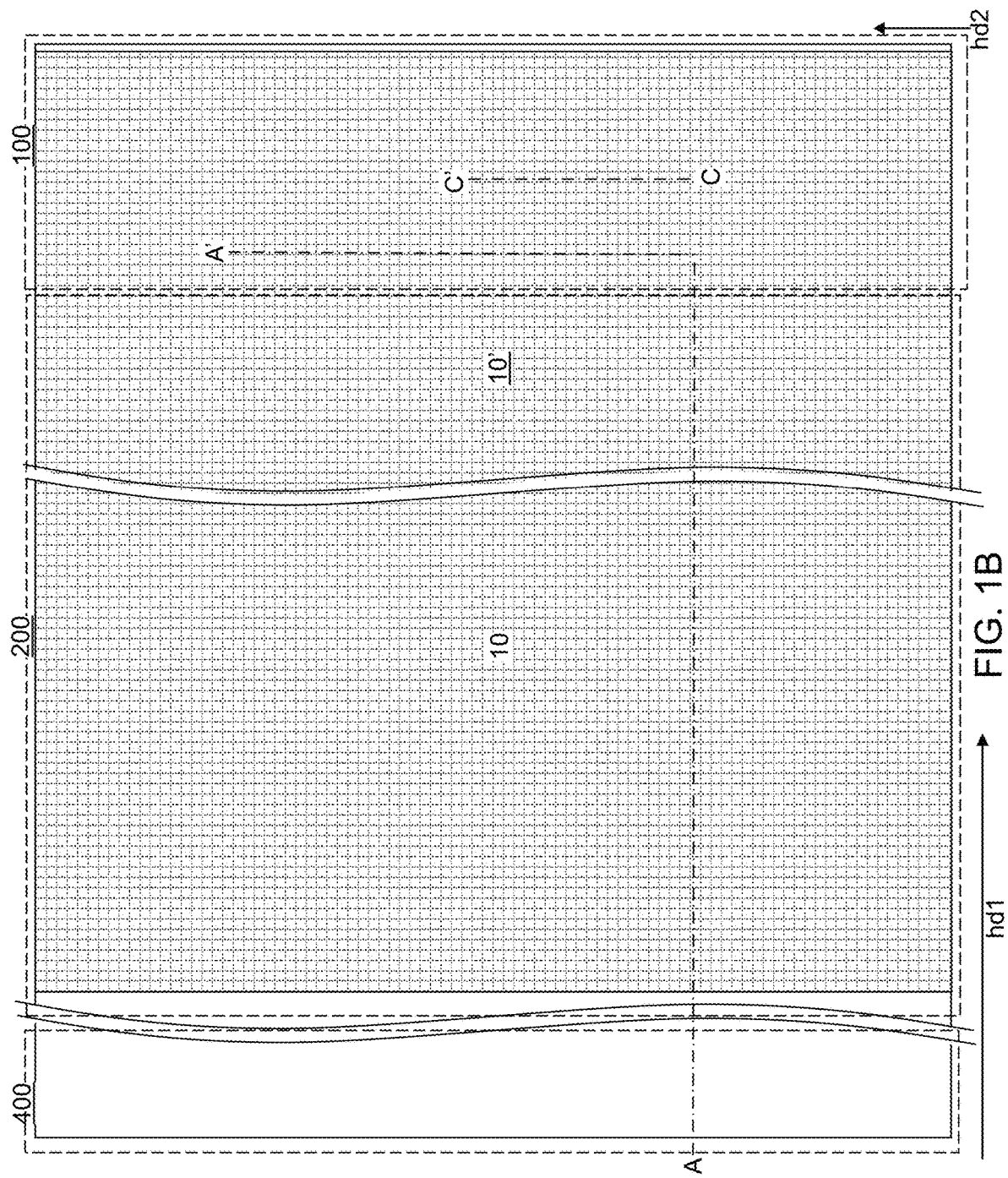
FIG. 1B is a top-down view of the first exemplary structure of FIG. 1A. The hinged vertical plane A-A' is the plane of the vertical cross-sectional view of FIG. 1A.

Slit trenches, support pillar structures and word line contact via structures are formed with tight pitches in order to scale a three-dimensional memory device. Support pillar structures that include a dummy semiconductor channel and dummy memory film and that are formed at the same time as the semiconductor channels and memory films reduce processing cost, but make it difficult to scale the support pillar structures due to the risk of electrical shorts with word line contact via structures and source lines in slit trenches. Further, a sacrificial semiconductor material, such as amorphous silicon can cause particle generation if physically exposed during formation of stepped surfaces for a terrace region. Thus, etching of a sacrificial semiconductor material during formation of stepped surfaces is preferably avoided, which places a constraint on the processing. In view of the above, embodiments of the present disclosure are directed to a three-dimensional memory device having dielectric support pillars and methods of making the same, the various aspects of which are discussed in detail below. The dielectric support pillar structures do not pose a risk of short circuits and particle generation during stepped surface etching. The embodiments of the present disclosure can be used to form various semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are used merely to identify similar elements, and different ordinals may be used across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

According to an aspect of the present disclosure, a p-n junction can be formed at the level of a source-select gate electrode layer by providing a source-level p-doped layer that is heavily doped with boron atoms and an underlying sacrificial source-level sacrificial layer that is subsequently replaced with an n-doped source contact layer. Due to a fast diffusion rate of the boron atoms compared to n-type dopant atoms from the n-doped source contact layer, the boron atoms diffuse farther upward than the n-type dopant atoms from the n-doped source contact layer at a bottom portion of each vertical semiconductor channel. A sharp p-n junction is formed at the level of the source-select gate electrode layer to provide sufficient GIDL current for a cell erase operation.

Three-dimensional memory devices of various embodiments of the present disclosure include a monolithic three-dimensional NAND string memory device, and can be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of planes therein. Each die includes one or more planes. Identical concurrent operations can be executed in each plane within a same die, although there may be some restrictions. In embodiments in which a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Figure 1C:
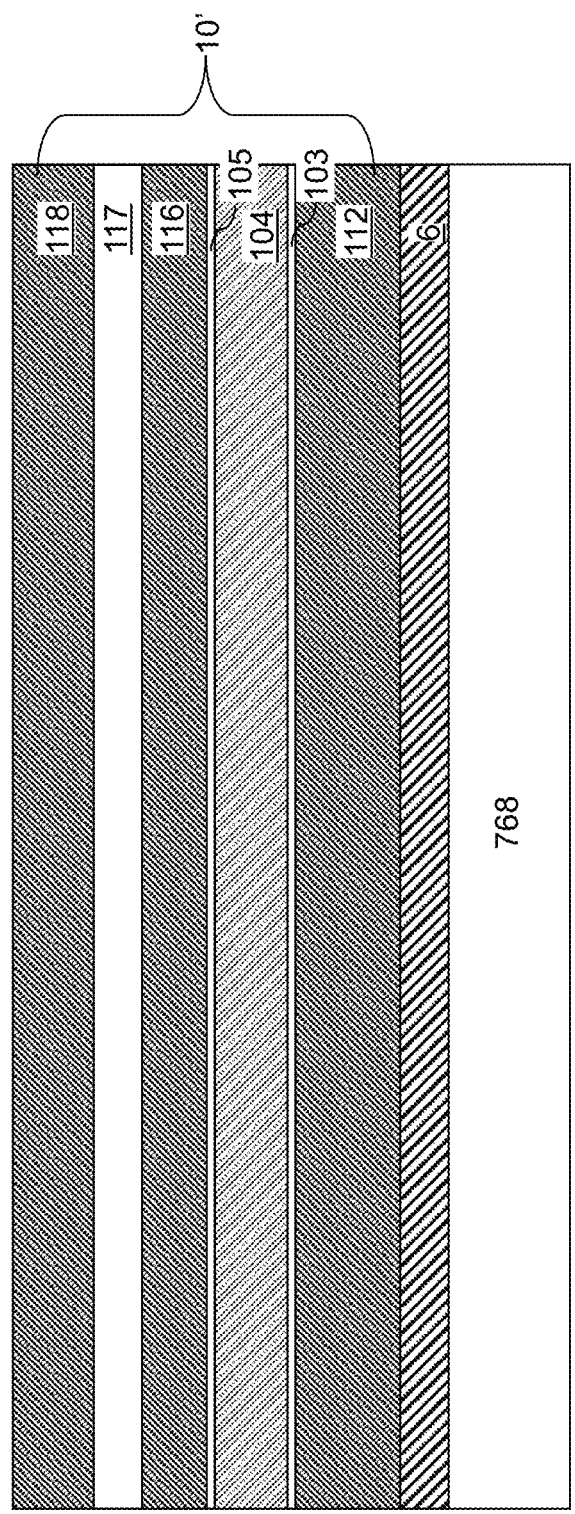
FIG. 1C is a magnified view of the in-process source level material layers along the vertical plane C-C' of FIG. 1B.

Referring to FIGS. 1A-1C, a first exemplary structure according to a first embodiment of the present disclosure is illustrated. FIG. 1C is a magnified view of an in-process source-level material layers 10' illustrated in FIGS. 1A and 1B. The first exemplary structure includes a substrate 8 and semiconductor devices 710 formed thereupon. The substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring among the various nodes of the semiconductor devices and landing pads for through-memory-level contact via structures to be subsequently formed. The lower-level metal interconnect structures 780 are embedded within the dielectric layer stack of the lower-level dielectric material layers 760, and comprise a lower-level metal line structure located under and optionally contacting a bottom surface of the silicon nitride layer 766.

For example, the lower-level metal interconnect structures 780 can be embedded within the first dielectric material layers 764. The first dielectric material layers 764 may be a plurality of dielectric material layers in which various elements of the lower-level metal interconnect structures 780 are sequentially embedded. Each dielectric material layer among the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 can be formed within a topmost dielectric material layer of the first dielectric material layers 764 (which can be a plurality of dielectric material layers). Each of the lower-level metal interconnect structures 780 can include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 can be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses can also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 can include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses can also be used.

The in-process source-level material layers 10' can include various layers that are subsequently modified to form source-level material layers. The source-level material layers, upon formation in subsequent processing steps by modification of the in-process source-level material layers 10', include a source contact layer that functions as a common source region for vertical field effect transistors of a three-dimensional memory device. The in-process source-level material layers 10' include a source-level sacrificial layer 10' and at least one source-level semiconductor layer (such as a lower source-level semiconductor layer 112 and/or an upper source-level semiconductor layer 116) including boron atoms as p-type dopant atoms. In one embodiment, the in-process source-level material layer 10' can include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and a source-select-level conductive layer 118.

In one embodiment, the lower source-level semiconductor layer 112 can include a p-doped semiconductor material such as p-doped polysilicon or p-doped amorphous silicon.

The lower source-level semiconductor layer 112 can include boron atoms at an atomic concentration in a range from $1.0 \times 10^{19}/cm^3$ to $1.0 \times 10^{21}/cm^3$, such as from $1.0 \times 10^{20}/cm^3$ to $8.0 \times 10^{20}/cm^3$. The lower source-level semiconductor layer 112 can be formed by chemical vapor deposition with in-situ n-type doping or with ex-situ n-type doping. For example, boron atoms can be implanted into an intrinsic amorphous silicon layer or an intrinsic polysilicon layer to provide the lower source-level semiconductor layer 112.

Alternatively, the lower source-level semiconductor layer 112 includes an n-doped semiconductor material such as n-doped polysilicon or n-doped amorphous silicon. The lower source-level semiconductor layer 112 can include n-type dopant atoms at an atomic concentration in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The n-type dopants atoms can include phosphorus atoms, arsenic atoms, antimony atoms, or a combination thereof. In one embodiment, the n-type dopant atoms in the lower source-level semiconductor layer 112 can consist essentially of phosphorus atoms. In another embodiment, the n-type dopant atoms in the lower source-level semiconductor layer 112 can consist essentially of arsenic atoms. In one embodiment, the n-type dopant atoms in the lower source-level semiconductor layer 112 can consist essentially of phosphorus atoms and arsenic atoms. The lower source-level semiconductor layer 112 can be formed by chemical vapor deposition with in-situ n-type doping or with ex-situ n-type doping. The thickness of the lower source-level semiconductor layer 112 can be in a range from 10 nm to 300 nm, such as from 20 nm to 150 nm, although lesser and greater thicknesses can also be used.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be used.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. In one embodiment, the source-level sacrificial layer 104 can consist essentially of undoped amorphous silicon or a silicon-germanium alloy with an atomic concentration of germanium greater than 20%. The source-level sacrificial layer 104 can be deposited by chemical vapor deposition. The thickness of the source-level sacrificial layer 104 can be in a range from 30 nm to 400 nm, such as from 60 nm to 200 nm, although lesser and greater thicknesses can also be used.

In one embodiment, the upper source-level semiconductor layer 116 includes an n-doped semiconductor material such as n-doped polysilicon or n-doped amorphous silicon. The upper source-level semiconductor layer 116 can include n-type dopant atoms at an atomic concentration in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The n-type dopants atoms can include phosphorus atoms, arsenic atoms, antimony atoms, or a combination thereof. In one embodiment, the n-type dopant atoms in the upper source-level semiconductor layer 116 can consist essentially of phosphorus atoms. In another embodiment, the n-type dopant atoms in the upper source-level semiconductor layer 116 can consist essentially of arsenic atoms. In one embodiment, the n-type dopant atoms in the upper source-level semiconductor layer 116 can consist essentially of phosphorus atoms and arsenic atoms. The upper source-level semiconductor layer 116 can be formed by chemical vapor deposition with in-situ n-type doping or with ex-situ n-type doping.

Alternatively, the upper source-level semiconductor layer 116 can include a p-doped semiconductor material such as p-doped polysilicon or p-doped amorphous silicon. The upper source-level semiconductor layer 116 can include boron atoms at an atomic concentration in a range from $1.0 \times 10^{19}/cm^3$ to $1.0 \times 10^{21}/cm^3$, such as from $1.0 \times 10^{20}/cm^3$ to $8.0 \times 10^{20}/cm^3$. The upper source-level semiconductor layer 116 can be formed by chemical vapor deposition with in-situ n-type doping or with ex-situ n-type doping. For example, boron atoms can be implanted into an intrinsic amorphous silicon layer or an intrinsic polysilicon layer to provide the upper source-level semiconductor layer 116. The thickness of the upper source-level semiconductor layer 116 can be in a range from 10 nm to 300 nm, such as from 20 nm to 150 nm, although lesser and greater thicknesses can also be used.

At least one of the lower source-level semiconductor layer 112 and the upper source-level semiconductor layer 116 has a p-type doping and includes boron as electrical dopants. In one embodiment, the lower source-level semiconductor layer 112 is p-doped and the upper source-level semiconductor layer 116 is n-doped. In another embodiment, the lower source-level semiconductor layer 112 is n-doped and the upper source-level semiconductor layer 116 is p-doped. In yet another embodiment, the lower source-level semiconductor layer 112 and the upper source-level semiconductor layer 116 are p-doped.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be used. The source-select-level conductive layer 118 can include a conductive material that can be used as a source-select-level gate electrode. For example, the source-select-level conductive layer 118 can include a doped semiconductor material such as doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be used.

The in-process source-level material layers 10' can be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an a real overlap in a plan view (i.e., along a vertical plane or direction perpendicular to the top surface of the substrate 8.

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed. The at least one second dielectric material layer 768 can include a blanket layer portion underlying the conductive plate layer 6 and the in-process source-level material layers 10' and a patterned portion that fills gaps among the patterned portions of the conductive plate layer 6 and the in-process source-level material layers 10'.

The optional conductive plate layer 6 and the in-process source-level material layers 10' can be patterned such that an opening extends over a staircase region 200 in which contact via structures contacting word line electrically conductive layers are to be subsequently formed. In one embodiment, the staircase region 200 can be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 10' can be formed within the area of a memory array region 100, in which a three-dimensional memory array including memory stack structures is to be subsequently formed. A peripheral device region 400 that is subsequently filled with a field dielectric material portion can be provided adjacent to the staircase region 200.

The region of the semiconductor devices 710 and the combination of the lower-level dielectric layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are embedded in the lower-level dielectric layers 760.

The lower-level metal interconnect structures 780 can be electrically connected to active nodes (e.g., transistor active regions 742 or gate electrodes 754) of the semiconductor devices 710 (e.g., CMOS devices), and are located at the level of the lower-level dielectric layers 760. Through-memory-level contact via structures can be subsequently formed directly on the lower-level metal interconnect structures 780 to provide electrical connection to memory devices to be subsequently formed. In one embodiment, the pattern of the lower-level metal interconnect structures 780 can be selected such that the landing-pad-level metal line structures 788 (which are a subset of the lower-level metal interconnect structures 780 located at the topmost portion of the lower-level metal interconnect structures 780) can provide landing pad structures for the through-memory-level contact via structures to be subsequently formed.

Figure 2:
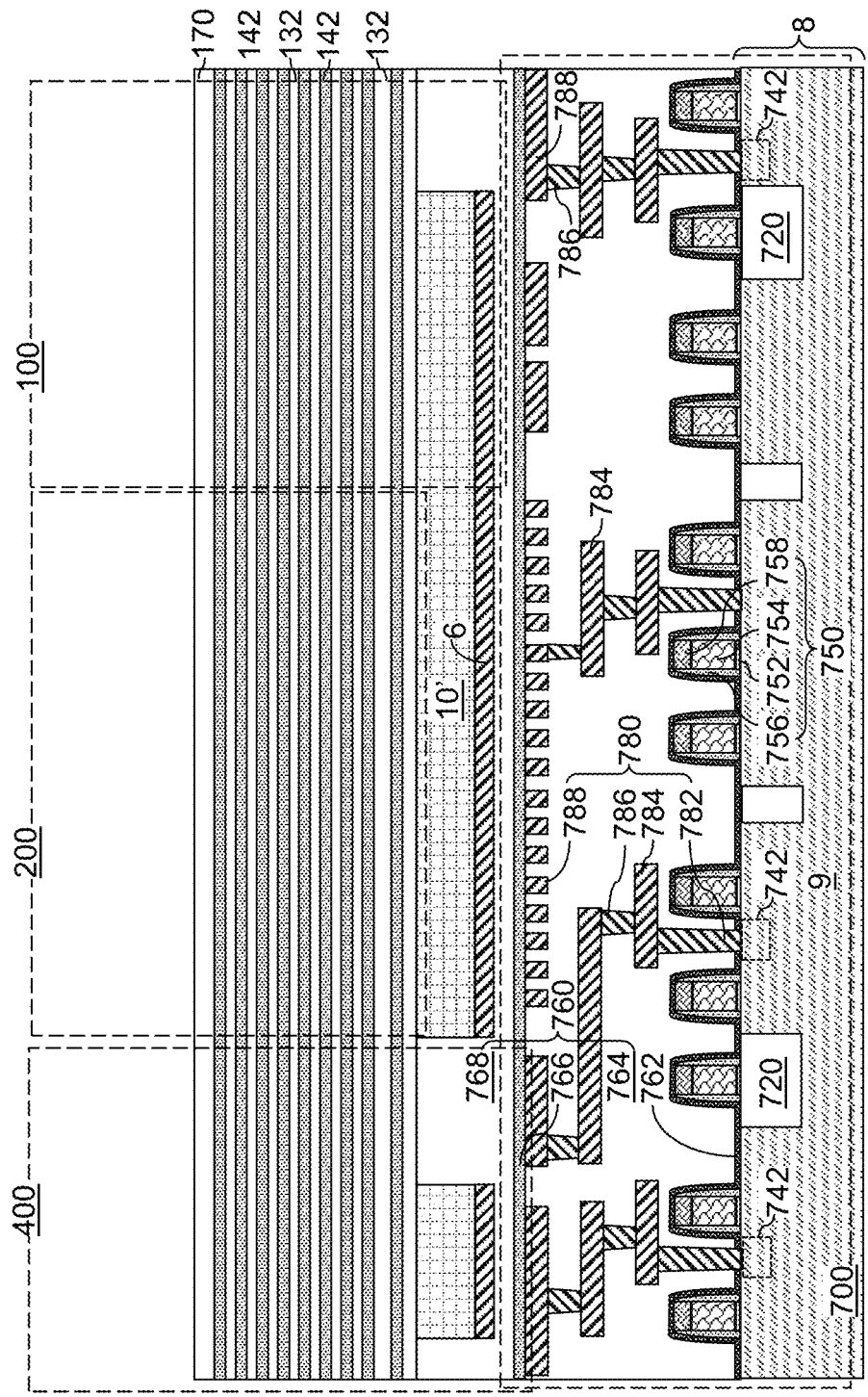
FIG. 2 is a vertical cross-sectional view of the first exemplary structure after formation of a first-tier alternating stack of first insulating layers and first spacer material layers according to an embodiment of the present disclosure.

Referring to FIG. 2, an alternating stack of first material layers and second material layers is subsequently formed. Each first material layer can include a first material, and each second material layer can include a second material that is different from the first material. In embodiments in which at least another alternating stack of material layer is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described using embodiments in which sacrificial material layers are replaced with electrically conductive layers, in other embodiments the spacer material layers are formed as electrically conductive layers (thereby obviating the need to perform replacement processes).

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the in-process source-level material layers 10'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is used for the first insulating layers 132, tetraethylorthosilicate (TEOS) can be used as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be used for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be used. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the first-tier alternating stack (132, 142). The first insulating cap layer 170 includes a dielectric material, which can be any dielectric material that can be used for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be used.

Figure 3:
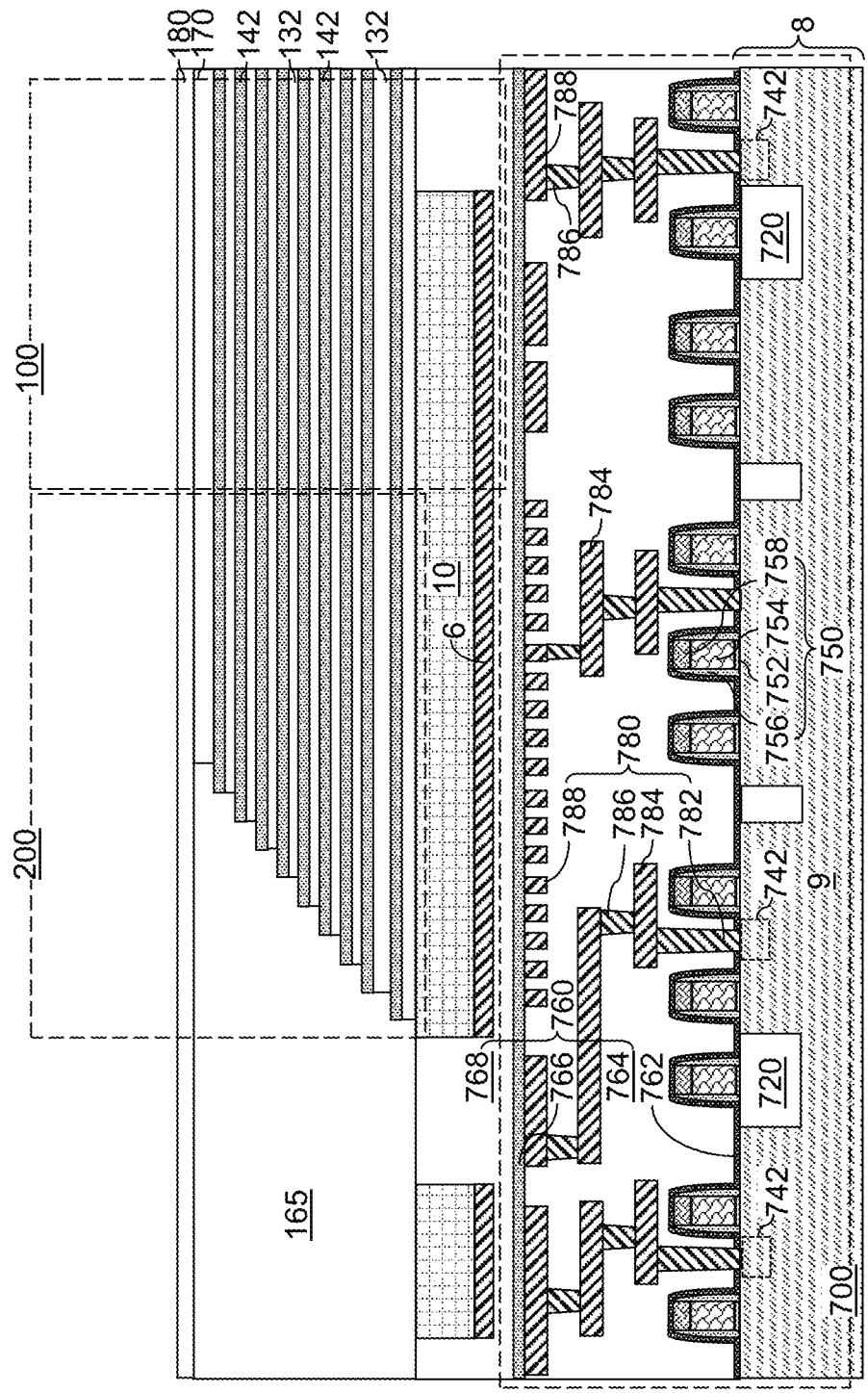
FIG. 3 is a vertical cross-sectional view of the first exemplary structure after patterning a first staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be used.

Figure 4A:
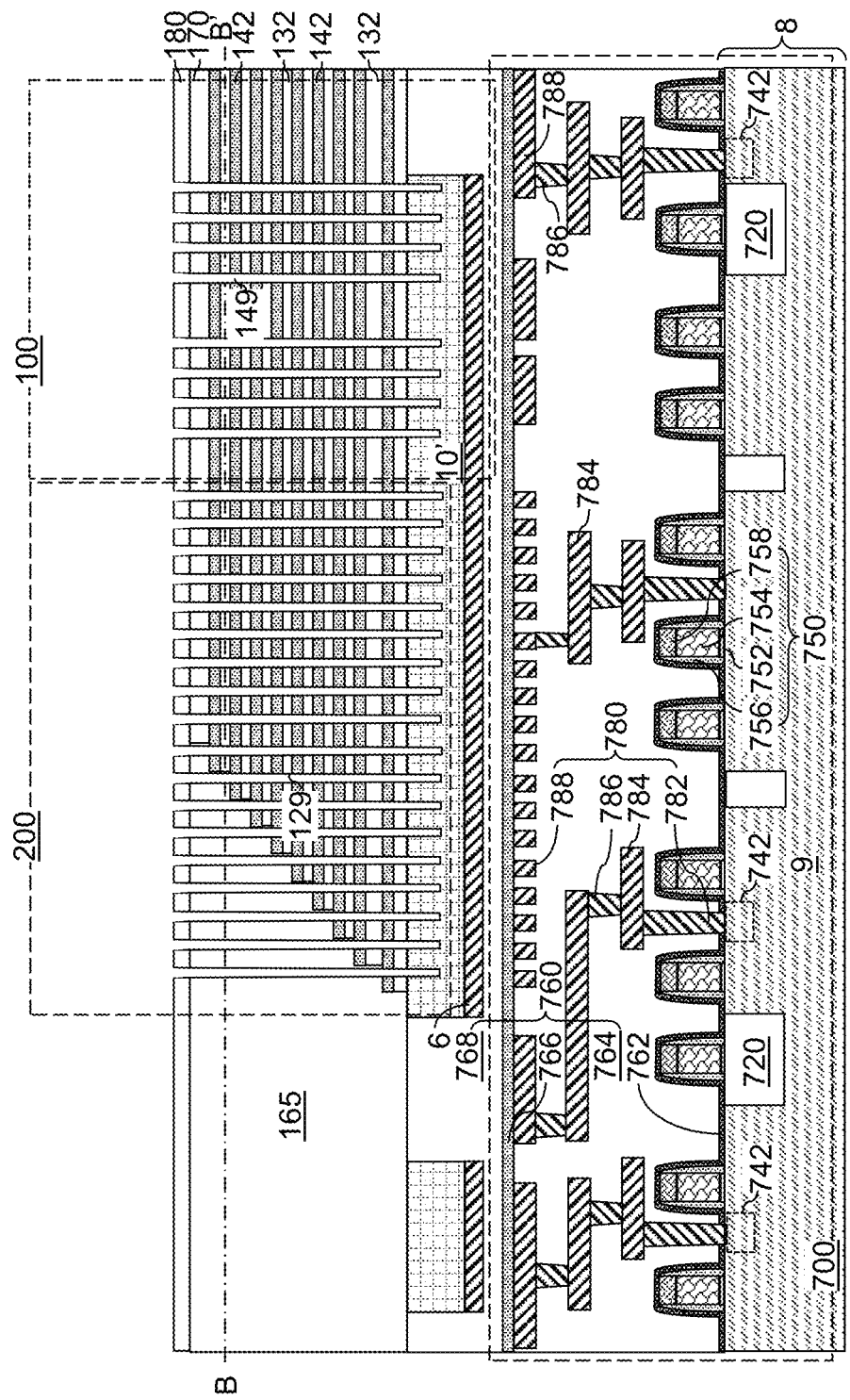
FIG. 4A is a vertical cross-sectional view of the first exemplary structure after formation of first-tier memory openings and first-tier support openings according to an embodiment of the present disclosure.
Figure 4B:
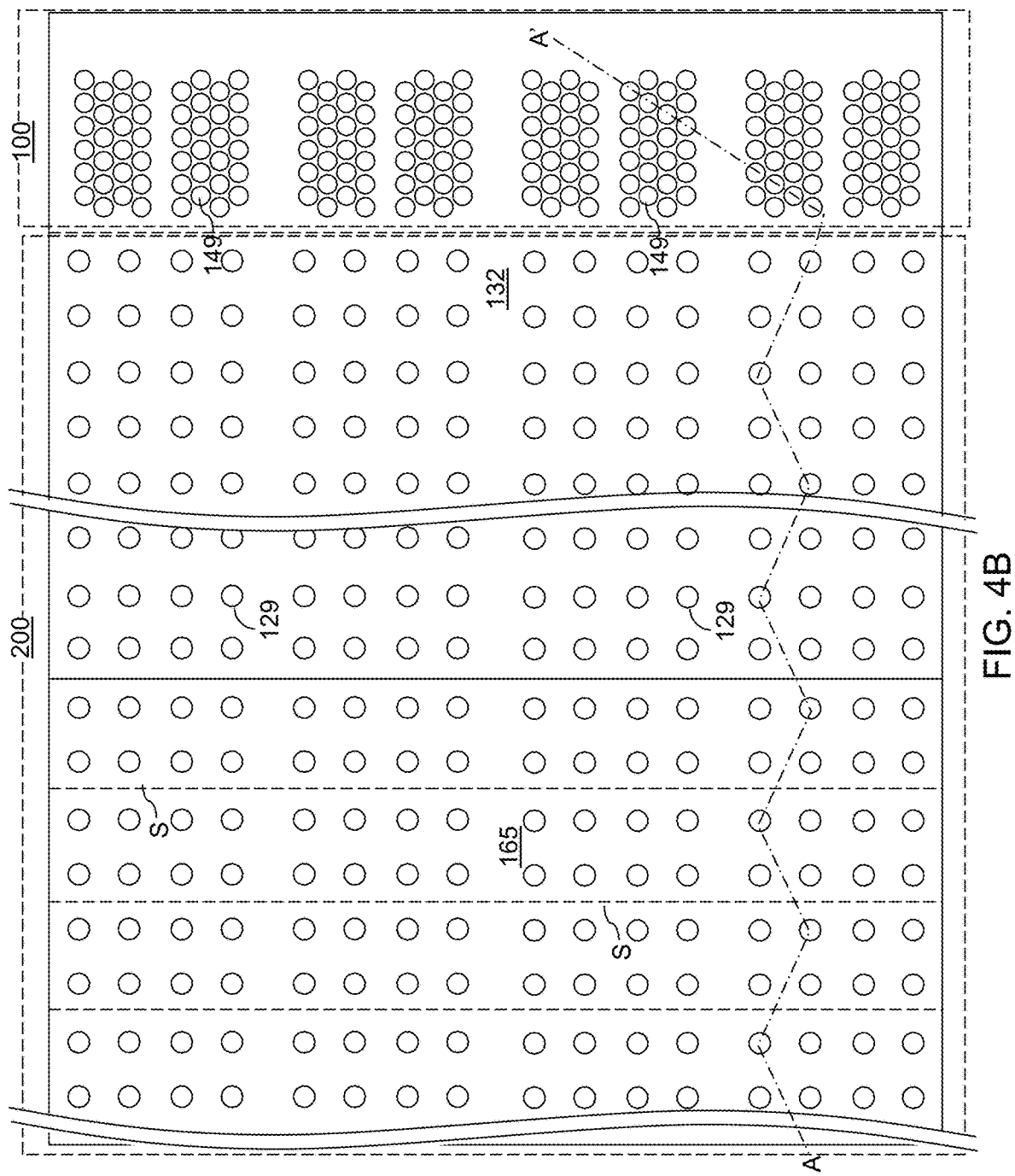
FIG. 4B is a horizontal cross-sectional view of the first exemplary structure of FIG. 4A. The hinged vertical plane A-A' corresponds to the plane of the vertical cross-sectional view of FIG. 4A.

Referring to FIGS. 4A and 4B, various first-tier openings (149, 129) can be formed through the inter-tier dielectric layer 180 and the first-tier structure (132, 142, 170, 165) and into the in-process source-level material layers 10'. A photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165) and into the in-process source-level material layers 10' by a first anisotropic etch process to form the various first-tier openings (149, 129) concurrently, i.e., during the first isotropic etch process. The various first-tier openings (149, 129) can include first-tier memory openings 149 and first-tier support openings 129. Locations of steps S in the first-tier alternating stack (132, 142) are illustrated as dotted lines in FIG. 4B.

The first-tier memory openings 149 are openings that are formed in the memory array region 100 through each layer within the first-tier alternating stack (132, 142) and are subsequently used to form memory stack structures therein. The first-tier memory openings 149 can be formed in clusters of first-tier memory openings 149 that are laterally spaced apart along the second horizontal direction hd2. Each cluster of first-tier memory openings 149 can be formed as a two-dimensional array of first-tier memory openings 149.

The first-tier support openings 129 are openings that are formed in the staircase region 200 and are subsequently used to form staircase-region contact via structures that interconnect a respective pair of an underlying lower-level metal interconnect structure 780 (such as a landing-pad-level metal line structure 788) and an electrically conductive layer (which can be formed as one of the spacer material layers or can be formed by replacement of a sacrificial material layer within the electrically conductive layer). A subset of the first-tier support openings 129 that is formed through the first retro-stepped dielectric material portion 165 can be formed through a respective horizontal surface of the first stepped surfaces. Further, each of the first-tier support openings 129 can be formed directly above (i.e., above, and with an a real overlap with) a respective one of the lower-level metal interconnect structure 780.

In one embodiment, the first anisotropic etch process can include an initial step in which the materials of the first-tier alternating stack (132, 142) are etched concurrently with the material of the first retro-stepped dielectric material portion

165. The chemistry of the initial etch step can alternate to optimize etching of the first and second materials in the first-tier alternating stack (132, 142) while providing a comparable average etch rate to the material of the first retro-stepped dielectric material portion 165. The first anisotropic etch process can use, for example, a series of reactive ion etch processes or a single reaction etch process (e.g., $CF_4/O_2/Ar$ etch). The sidewalls of the various first-tier openings (149, 129) can be substantially vertical, or can be tapered.

After etching through the alternating stack (132, 142) and the first retro-stepped dielectric material portion 165, the chemistry of a terminal portion of the first anisotropic etch process can be selected to etch through the dielectric material(s) of the at least one second dielectric layer 768 with a higher etch rate than an average etch rate for the in-process source-level material layers 10'. For example, the terminal portion of the anisotropic etch process may include a step that etches the dielectric material(s) of the at least one second dielectric layer 768 selective to a semiconductor material within a component layer in the in-process source-level material layers 10'. In one embodiment, the terminal portion of the first anisotropic etch process can etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process can include at least one etch chemistry for etching the various semiconductor materials of the in-process source-level material layers 10'. The photoresist layer can be subsequently removed, for example, by ashing.

Optionally, the portions of the first-tier memory openings 149 and the first-tier support openings 129 at the level of the inter-tier dielectric layer 180 can be laterally expanded by an isotropic etch. In this case, the inter-tier dielectric layer 180 can comprise a dielectric material (such as borosilicate glass) having a greater etch rate than the first insulating layers 132 (that can include undoped silicate glass) in dilute hydrofluoric acid. An isotropic etch (such as a wet etch using HF) can be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
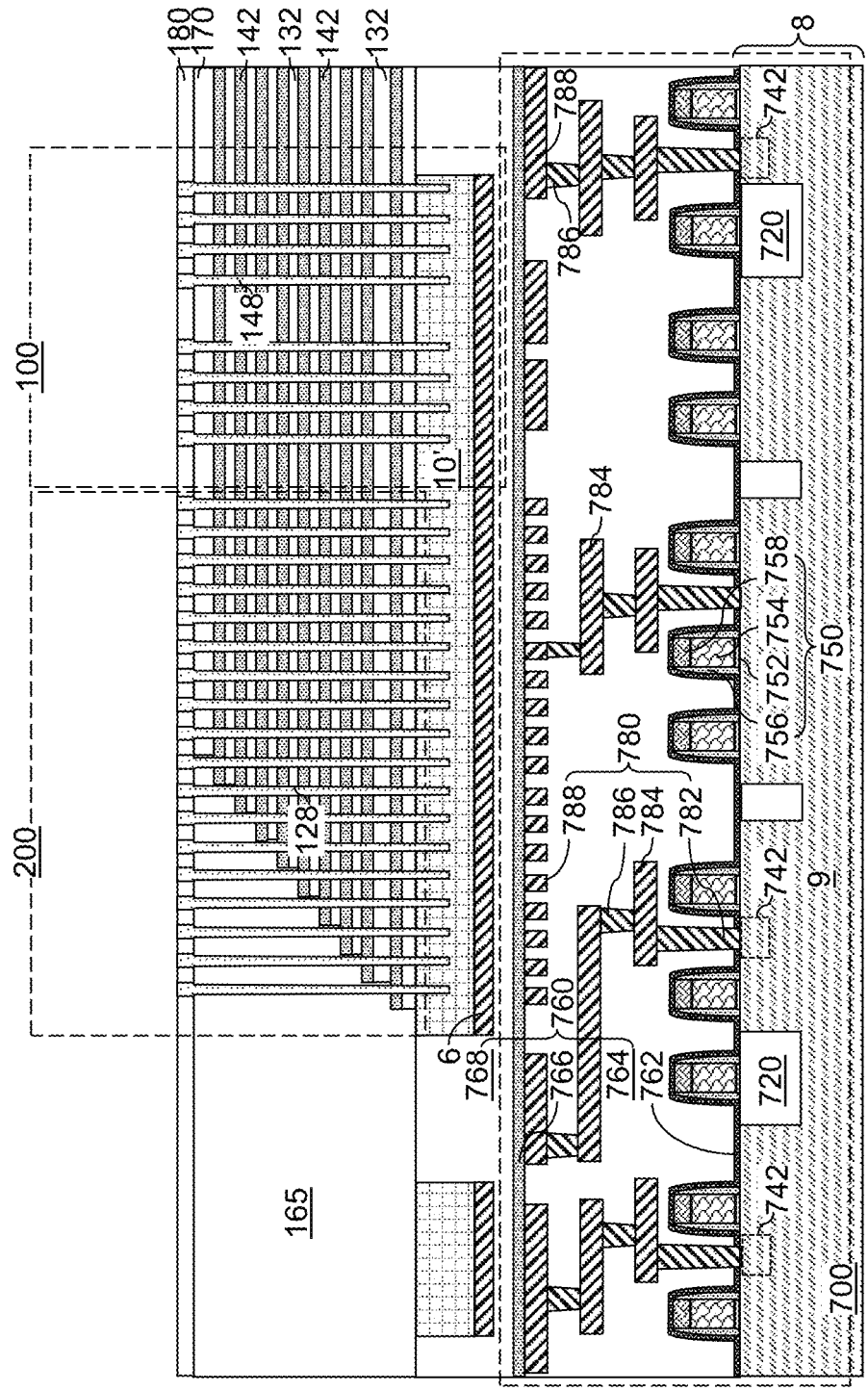
FIG. 5 is a vertical cross-sectional view of the first exemplary structure after formation of various sacrificial fill structures according to an embodiment of the present disclosure.

Referring to FIG. 5, sacrificial first-tier opening fill structures (148, 128) can be formed in the various first-tier openings (149, 129). For example, a sacrificial first-tier fill material is deposited concurrently deposited in each of the first-tier openings (149, 129). The sacrificial first-tier fill material includes a material that can be subsequently removed selective to the materials of the first insulating layers 132 and the first sacrificial material layers 142.

In one embodiment, the sacrificial first-tier fill material can include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material can include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material can include amorphous silicon or a carbon-containing material (such as amorphous carbon or diamond-like carbon) that can be subsequently removed by ashing, or a silicon-based polymer that can be subsequently removed selective to the materials of the first-tier alternating stack (132, 142).

Portions of the deposited sacrificial material can be removed from above the topmost layer of the first-tier alternating stack (132, 142), such as from above the inter-tier dielectric layer 180. For example, the sacrificial first-tier fill material can be recessed to a top surface of the inter-tier dielectric layer 180 using a planarization process. The planarization process can include a recess etch, chemical mechanical planarization (CMP), or a combination thereof. The top surface of the inter-tier dielectric layer 180 can be used as an etch stop layer or a planarization stop layer.

Remaining portions of the sacrificial first-tier fill material comprise sacrificial first-tier opening fill structures (148, 128). Specifically, each remaining portion of the sacrificial material in a first-tier memory opening 149 constitutes a sacrificial first-tier memory opening fill structure 148. Each remaining portion of the sacrificial material in a first-tier support opening 129 constitutes a sacrificial first-tier support opening fill structure 128. The various sacrificial first-tier opening fill structures (148, 128) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill structures (148, 128) can be coplanar with the top surface of the inter-tier dielectric layer 180. Each of the sacrificial first-tier opening fill structures (148, 128) may, or may not, include cavities therein.

Figure 6:
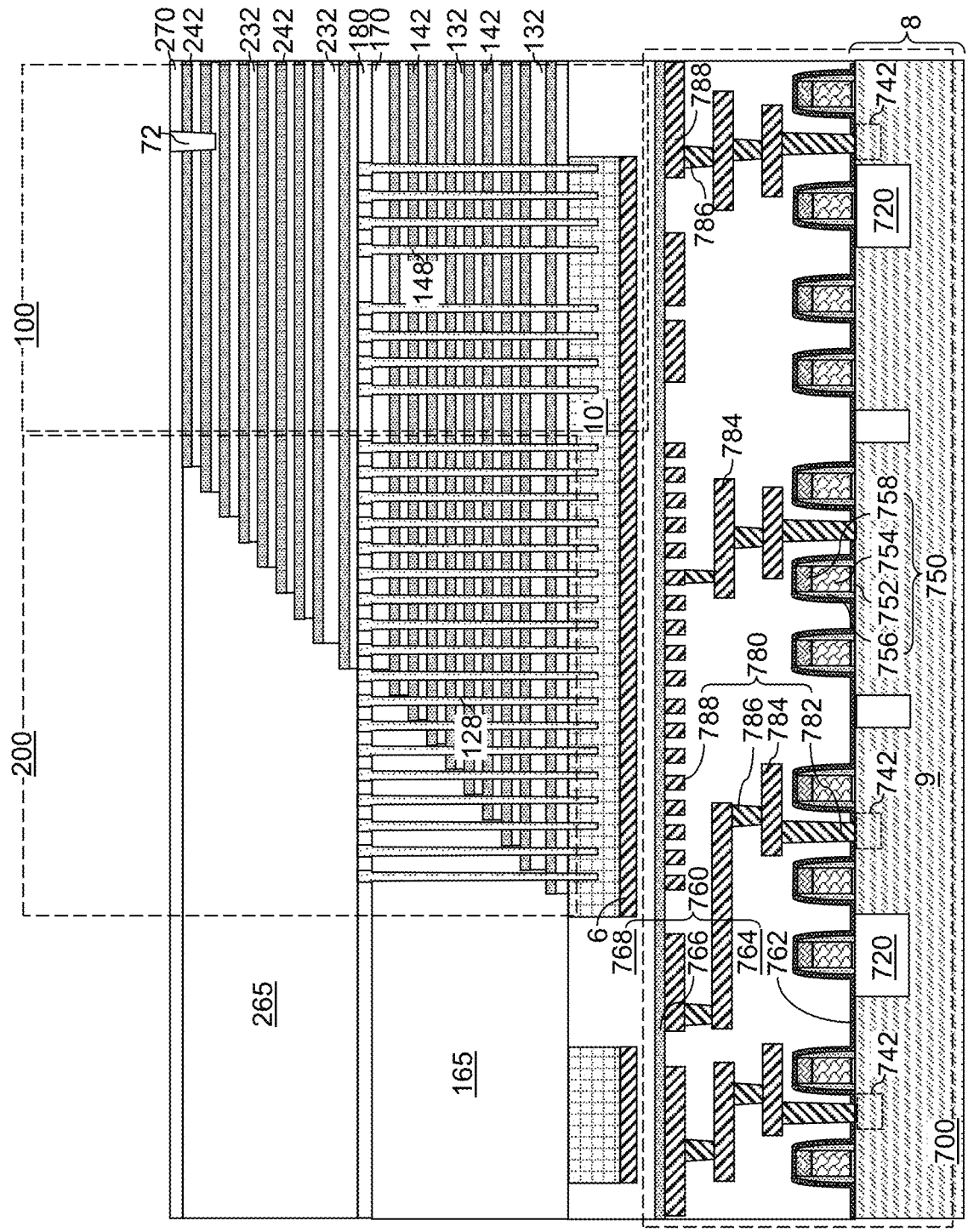
FIG. 6 is a vertical cross-sectional view of the first exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure can be formed over the first-tier structure (132, 142, 170, 148). The second-tier structure can include an additional alternating stack of insulating layers and spacer material layers, which can be sacrificial material layers. For example, a second-tier alternating stack (232, 242) of material layers can be subsequently formed on the top surface of the first-tier alternating stack (132, 142). The second-tier alternating stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second-tier alternating stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be used for the second insulating layers 232 can be any material that can be used for the first insulating layers 132. The fourth material of the second sacrificial material layers 242 is a sacrificial material that can be removed selective to the third material of the second insulating layers 232. Sacrificial materials that can be used for the second sacrificial material layers 242 can be any material that can be used for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be used for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be used. In one embodiment, each second sacrificial material layer 242 in the second-tier alternating stack (232, 242) can have a uniform thickness that is substantially invariant within each respective second sacrificial material layer 242.

Second stepped surfaces in the second stepped area can be formed in the staircase region 200 using a same set of processing steps as the processing steps used to form the first stepped surfaces in the first stepped area with suitable adjustment to the pattern of at least one masking layer. A second retro-stepped dielectric material portion 265 can be formed over the second stepped surfaces in the staircase region 200.

A second insulating cap layer 270 can be subsequently formed over the second-tier alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the in-process source-level material layers 10', and at least one retro-stepped dielectric material portion (165, 265) can be formed over the staircase regions on the at least one alternating stack (132, 142, 232, 242).

Optionally, drain-select-level isolation structures 72 can be formed through a subset of layers in an upper portion of the second-tier alternating stack (232, 242). The second sacrificial material layers 242 that are cut by the select-drain-level isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1. The combination of the second-tier alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
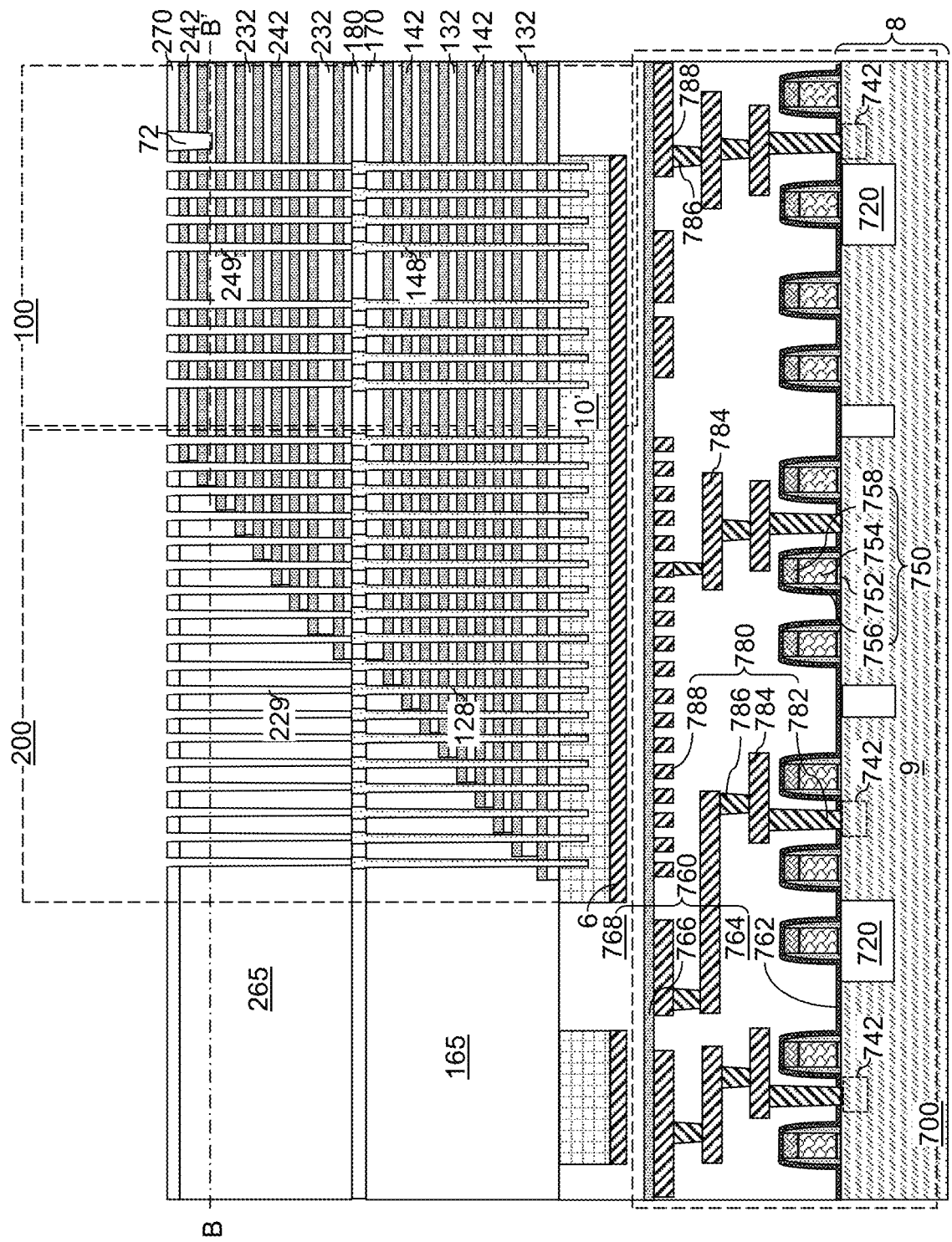
FIG. 7A is a vertical cross-sectional view of the first exemplary structure after formation of second-tier memory openings and second-tier support openings according to an embodiment of the present disclosure.
Figure 7B:
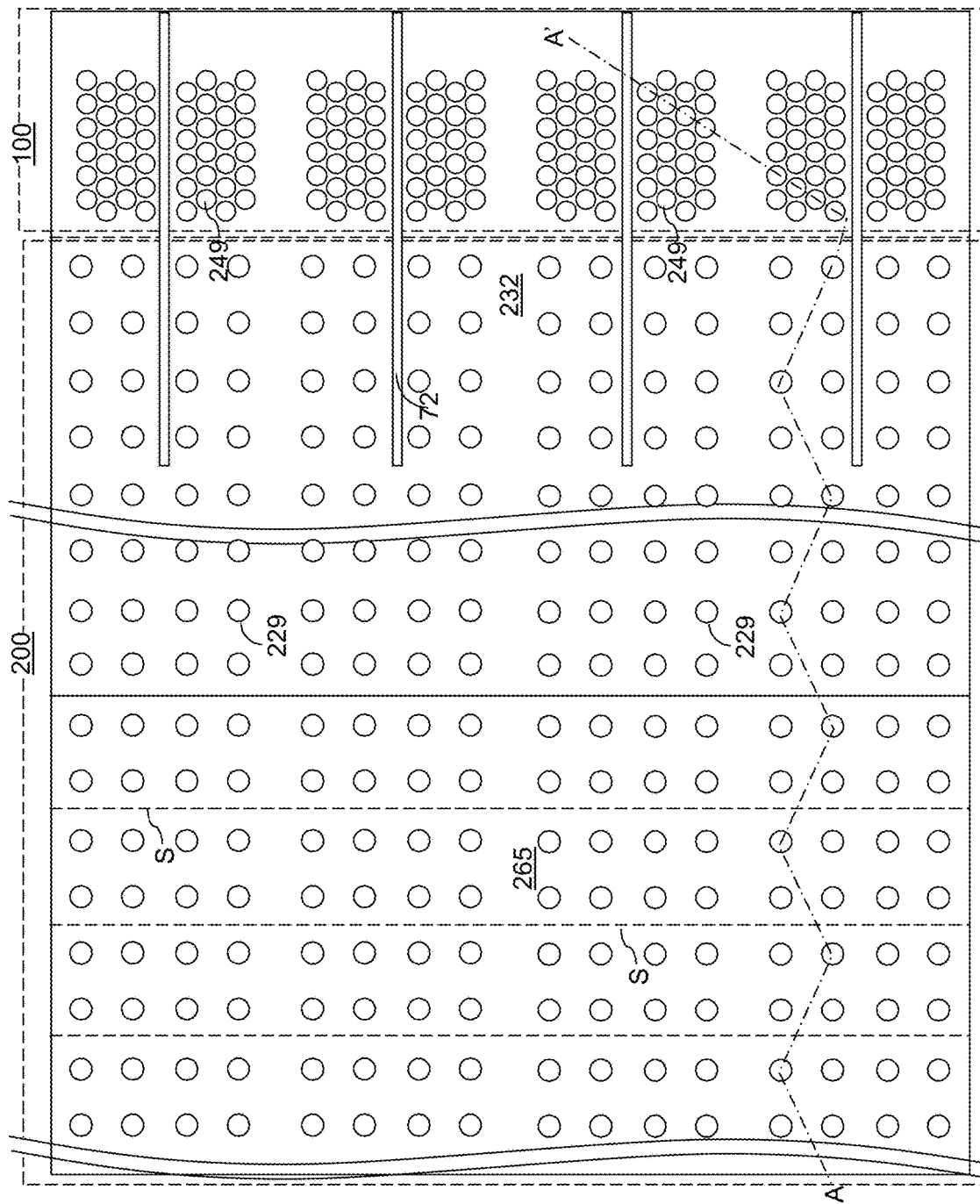
FIG. 7B is a horizontal cross-sectional view of the first exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) can be formed through the second-tier structure (232, 242, 265, 270, 72). A photoresist layer (not shown) can be applied over the second insulating cap layer 270, and can be lithographically patterned to form various openings therethrough. The pattern of the openings can be the same as the pattern of the various first-tier openings (149, 129), which is the same as the sacrificial first-tier opening fill structures (148, 128). Thus, the lithographic mask used to pattern the first-tier openings (149, 129) can be used to pattern the photoresist layer.

The pattern of openings in the photoresist layer can be transferred through the second-tier structure (232, 242, 265, 270, 72) by a second anisotropic etch process to form various second-tier openings (249, 229) concurrently, i.e., during the second anisotropic etch process. The various second-tier openings (249, 229) can include second-tier memory openings 249 and second-tier support openings 229.

The second-tier memory openings 249 are formed directly on a top surface of a respective one of the sacrificial first-tier memory opening fill structures 148. The second-tier support openings 229 are formed directly on a top surface of a respective one of the sacrificial first-tier support opening fill structures 128. Further, each second-tier support openings 229 can be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process can include an etch step in which the materials of the second-tier alternating stack (232, 242) are etched concurrently with the material of the second retro-stepped dielectric material portion 265. The chemistry of the etch step can alternate to optimize etching of the materials in the second-tier alternating stack (232, 242) while providing a comparable average etch rate to the material of the second retro-stepped dielectric material portion 265. The second anisotropic etch process can use, for example, a series of reactive ion etch processes or a single reaction etch process (e.g., $CF_4/O_2/Ar$ etch). The sidewalls of the various second-tier openings (249, 229) can be substantially vertical, or can be tapered. A bottom periphery of each second-tier opening (249, 229) may be laterally offset, and/or may be located entirely within, a periphery of a top surface of an underlying sacrificial first-tier opening fill structure (148, 128). The photoresist layer can be subsequently removed, for example, by ashing.

Figure 8:
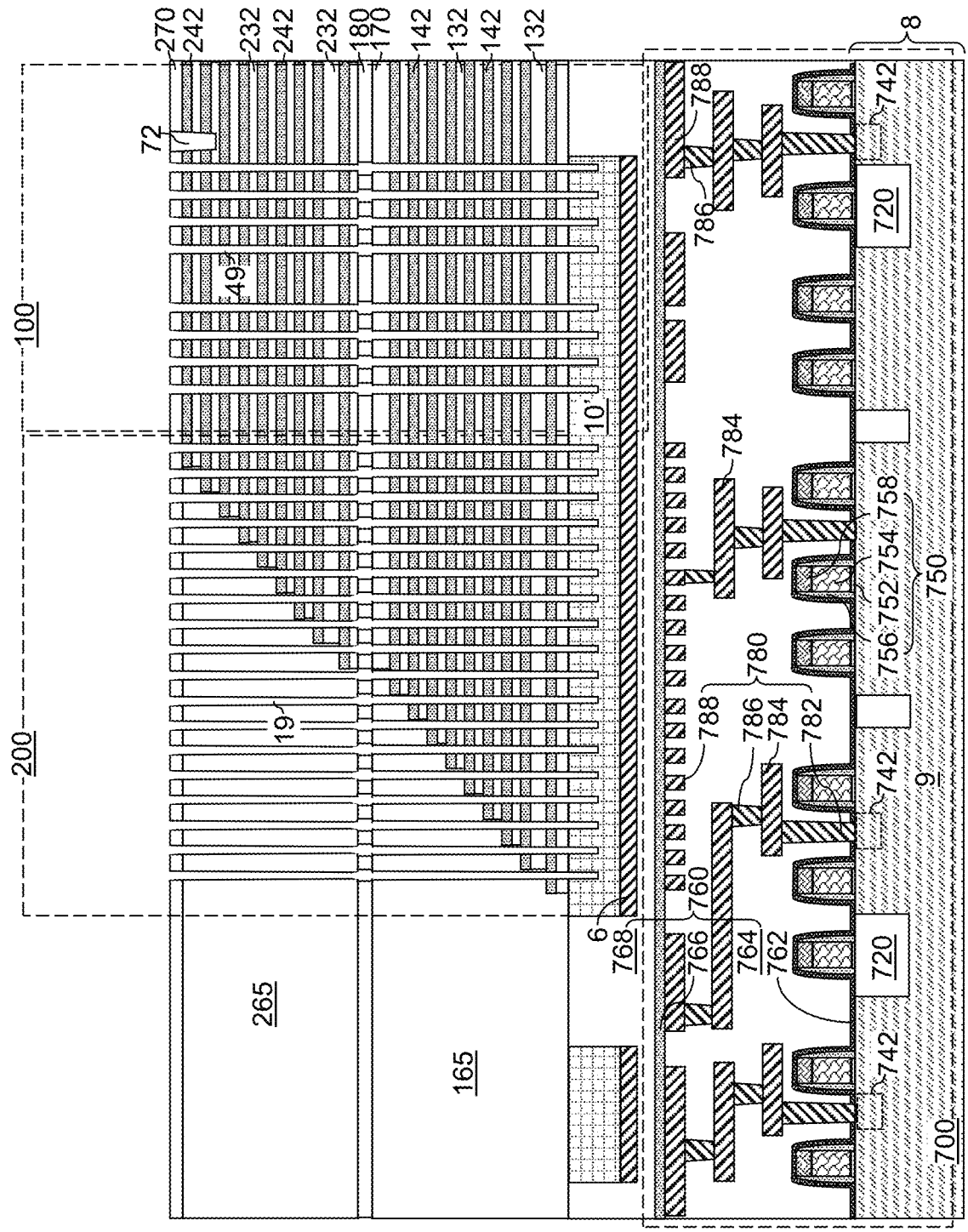
FIG. 8 is a vertical cross-sectional view of the first exemplary structure after formation of inter-tier memory openings and inter-tier support openings according to an embodiment of the present disclosure.

Referring to FIG. 8, the sacrificial first-tier fill material of the sacrificial first-tier opening fill structures (148, 128) can be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill structure 148 is removed. A support opening 19, which is also referred to as an inter-tier support opening 19, is formed in each combination of a second-tier support openings 229 and a volume from which a sacrificial first-tier support opening fill structure 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a memory opening 49 in the first exemplary device structure of FIG. 8 is illustrated. The memory opening 49 extends through the first-tier structure and the second-tier structure.

Referring to FIG. 9B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. Alternatively, the sacrificial material layers (142, 242) can be laterally recessed with respect to the sidewalls of the insulating layers (132, 232), and a combination of a deposition process and an anisotropic etch process can be used to form the charge storage layer 54 as a plurality of memory material portions that are vertically spaced apart. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L can having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon.

In another embodiment, the semiconductor channel material layer 60L has an n-type doping in which n-type dopants (such as phosphor atoms or arsenic atoms) are present at an atomic concentration in a range from $1.0 \times 10^{15}/cm^3$ to $1.0 \times 10^{19}/cm^3$, such as from $1.0 \times 10^{16}/cm^3$ to $1.0 \times 10^{18}/cm^3$. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be used. A cavity 49' is formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the n-doped semiconductor material constitutes a drain region 63. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
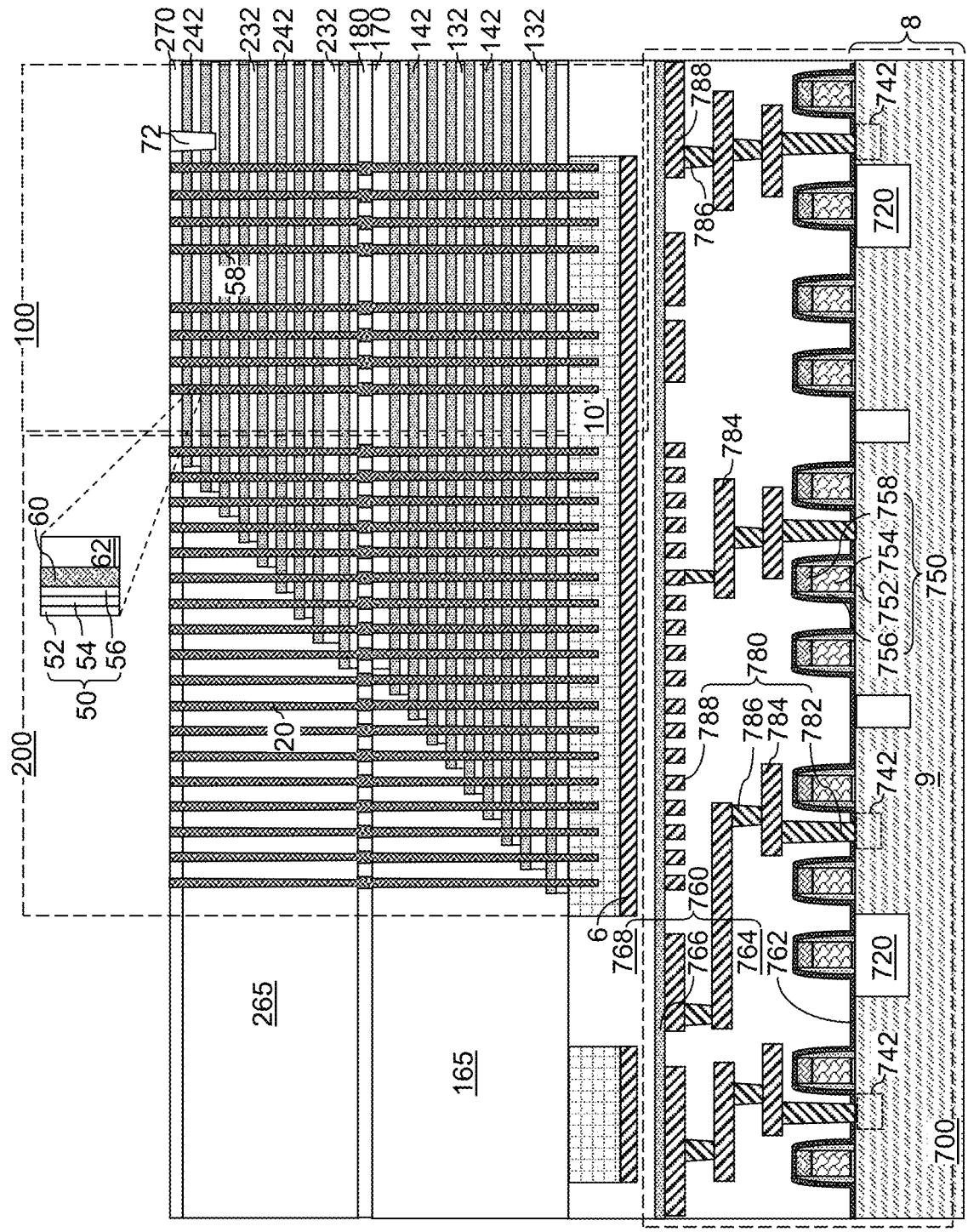
FIG. 10 is a vertical cross-sectional view of the first exemplary structure after formation of memory opening fill structures and support pillar structures according to an embodiment of the present disclosure.

Referring to FIG. 10, the first exemplary structure is illustrated after formation of the memory opening fill structures 58. Support pillar structures 20 are formed in the support openings 19 concurrently with formation of the memory opening fill structures 58. Each support pillar structure 20 can have a same set of components as a memory opening fill structure 58.

Figure 11A:
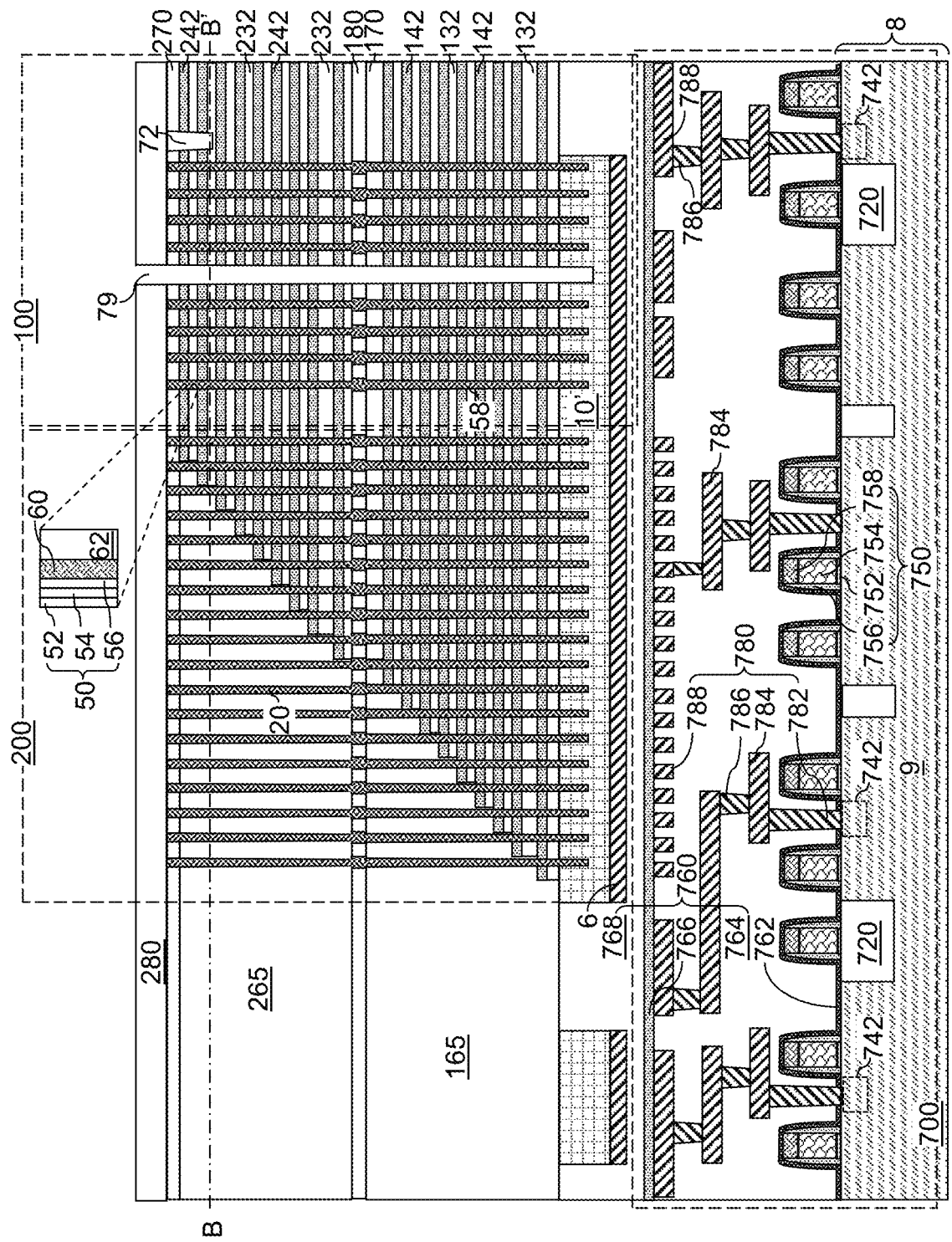
FIG. 11A is a vertical cross-sectional view of the first exemplary structure after formation of a first contact level dielectric layer and backside trenches according to an embodiment of the present disclosure.
Figure 11B:
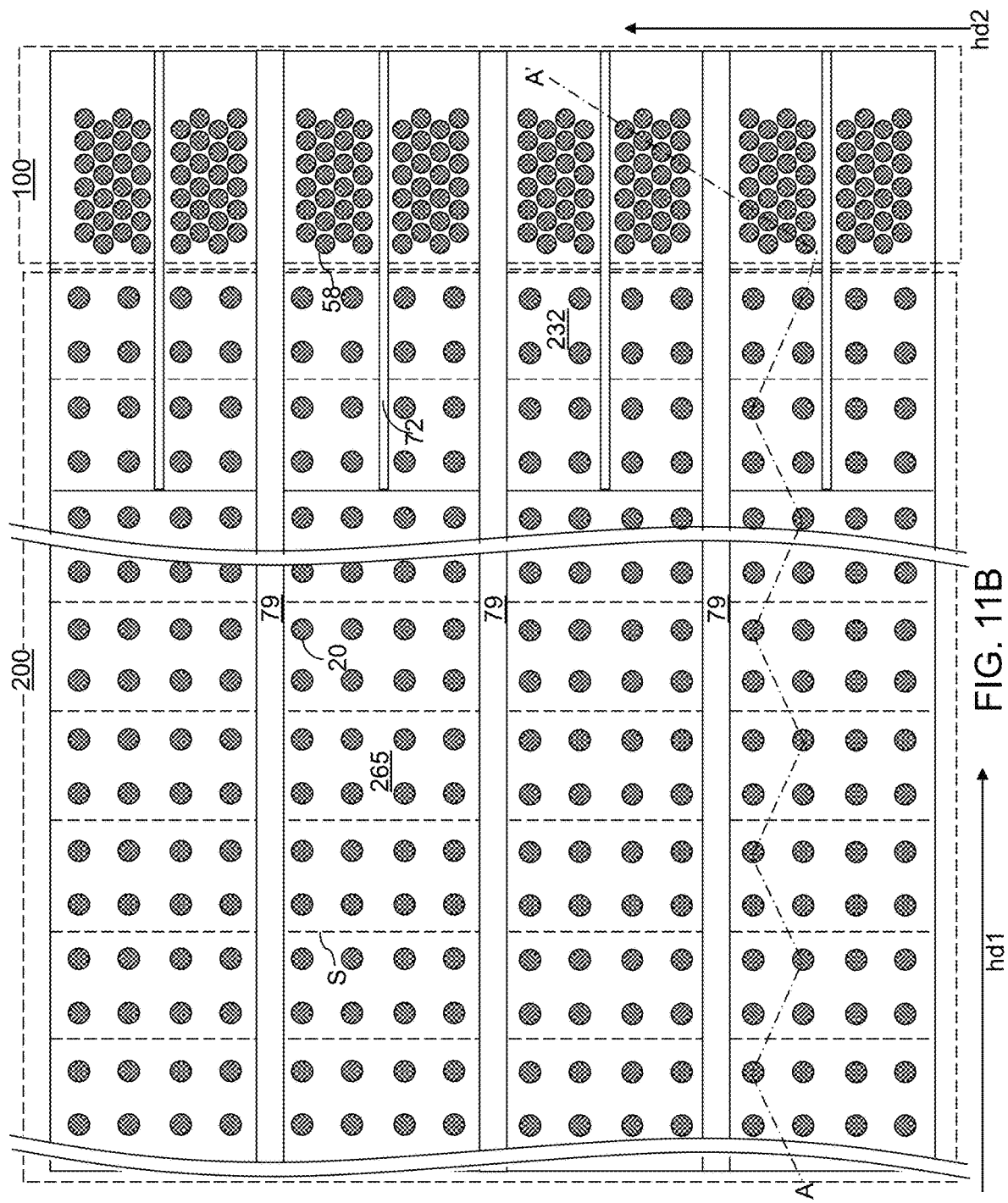
FIG. 11B is a horizontal cross-sectional view of the first exemplary structure along the horizontal plane B-B' of FIG. 11A. The hinged vertical plane A-A' corresponds to the plane of the vertical cross-sectional view of FIG. 11A.

Referring to FIGS. 11A and 11B, a first contact level dielectric layer 280 can be formed over the second-tier structure (232, 242, 270, 265, 72). The first contact level dielectric layer 280 includes a dielectric material such as silicon oxide, and can be formed by a conformal or non-conformal deposition process. For example, the first contact level dielectric layer 280 can include undoped silicate glass and can have a thickness in a range from 100 nm to 600 nm, although lesser and greater thicknesses can also be used.

A photoresist layer can be applied over the first contact level dielectric layer 280 and can be lithographically patterned to form elongated openings that extend along the first horizontal direction hd1 between clusters of memory opening fill structures 58. Backside trenches 79 can be formed by transferring the pattern in the photoresist layer through the first contact level dielectric layer 280, the second-tier structure (232, 242, 270, 265, 72), and the first-tier structure (132, 142, 170, 165), and into the in-process source-level material layers 10'. Portions of the first contact level dielectric layer 280, the second-tier structure (232, 242, 270, 265, 72), the first-tier structure (132, 142, 170, 165), and the in-process source-level material layers 10' that underlie the openings in the photoresist layer can be removed to form the backside trenches 79. In one embodiment, the backside trenches 79 can be formed between clusters of memory stack structures 55. The clusters of the memory stack structures 55 can be laterally spaced apart along the second horizontal direction hd2 by the backside trenches 79.

Figure 12:
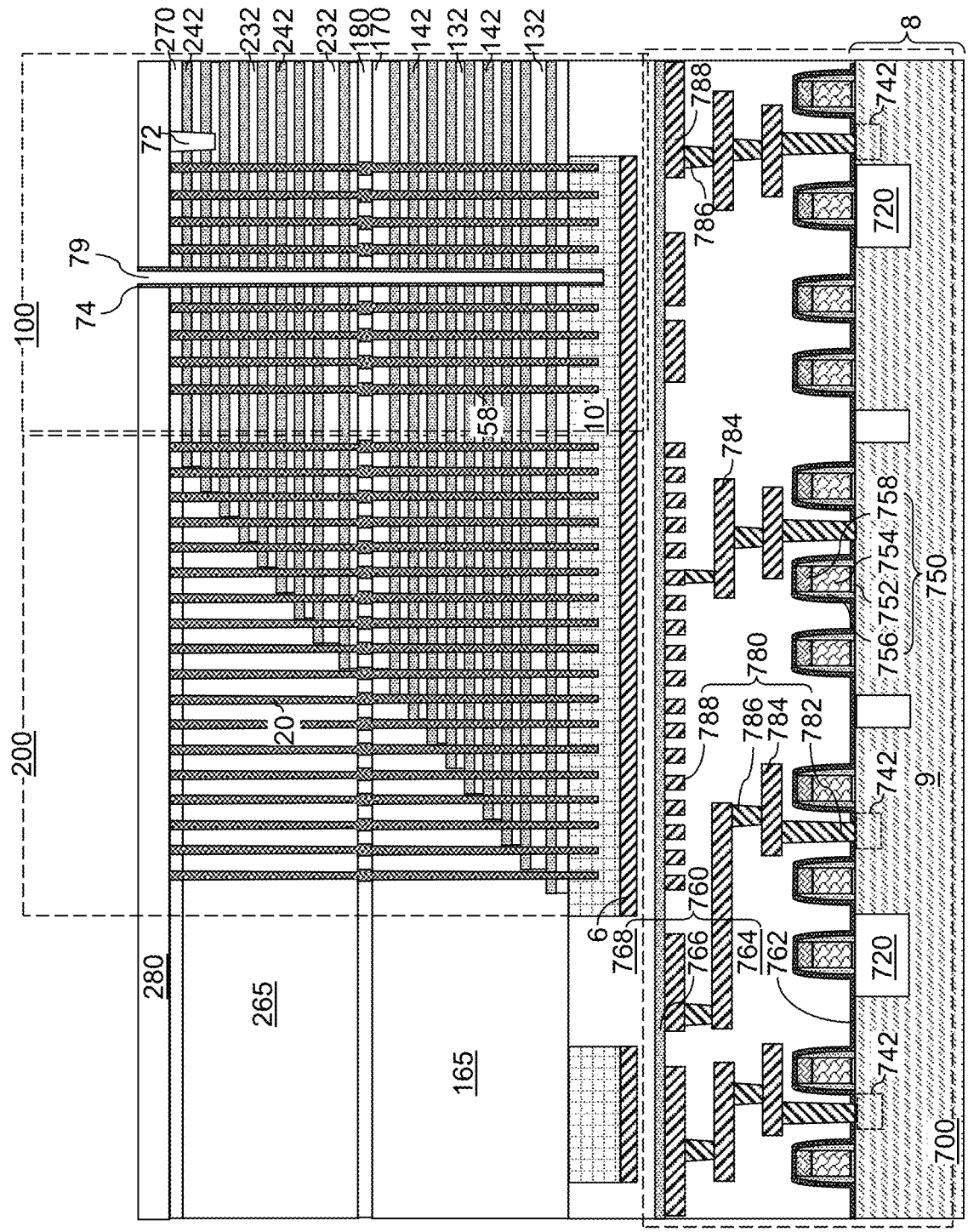
FIG. 12 is a vertical cross-sectional view of the first exemplary structure after formation of backside trench spacers according to an embodiment of the present disclosure.
Figure 13A:
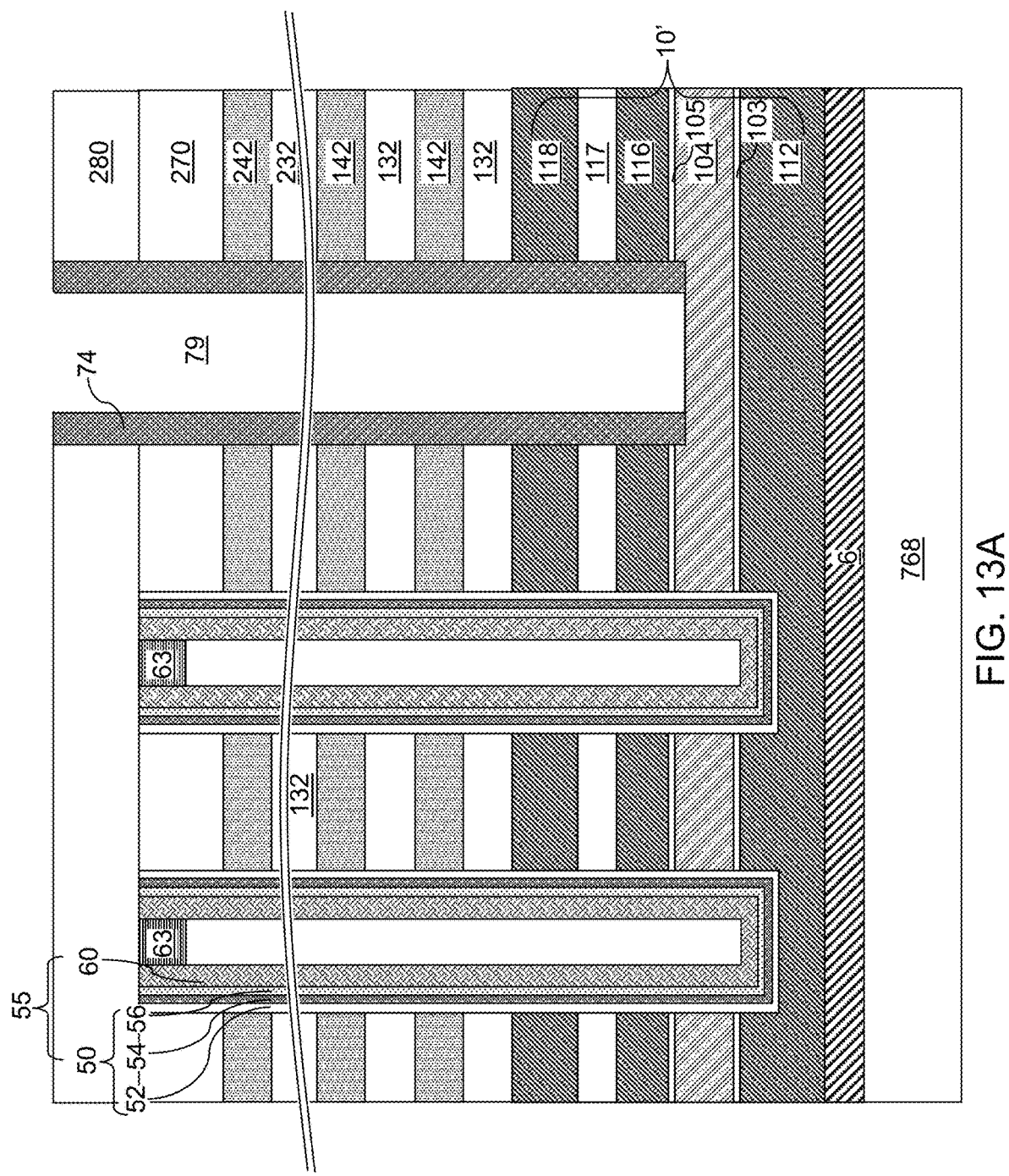
FIGS. 13A-13E illustrate sequential vertical cross-sectional views of memory opening fill structures and a backside trench during formation of source-level material layers according to an embodiment of the present disclosure.

Referring to FIGS. 12 and 13A, a backside trench spacer 74 can be formed on sidewalls of each backside trench 79. For example, a conformal spacer material layer can be deposited in the backside trenches 79 and over the first contact level dielectric layer 280, and can be anisotropically etched to form the backside trench spacers 74. The backside trench spacers 74 include a material that is different from the material of the source-level sacrificial layer 104. For example, the backside trench spacers 74 can include silicon nitride.

Figure 13B:
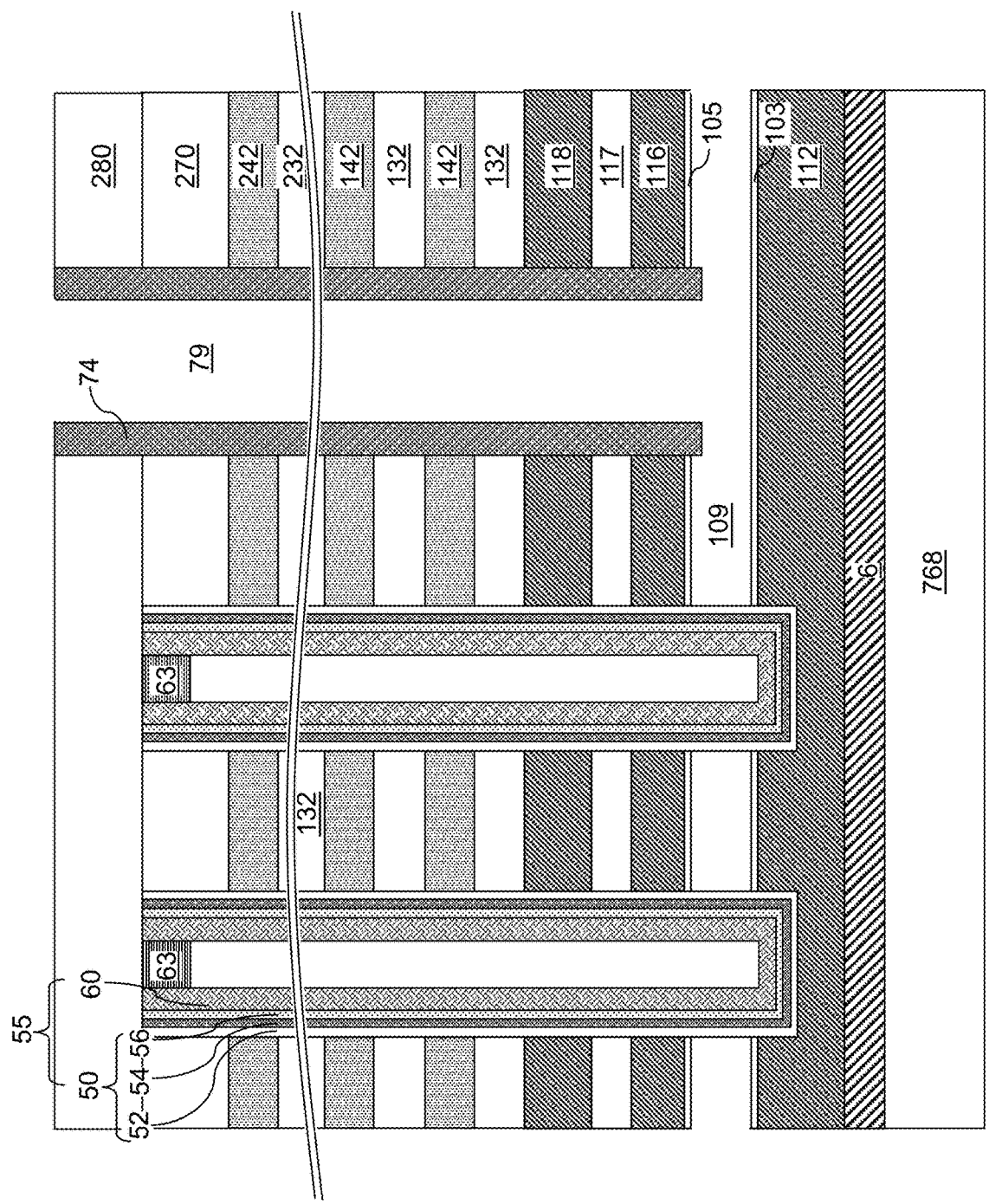

Referring to FIG. 13B, an etchant that etches the material of the source-level sacrificial layer 104 selective to the materials of the first-tier alternating stack (132, 142), the second-tier alternating stack (232, 242), the first and second insulating cap layers (170, 270), the first contact level dielectric layer 280, the upper sacrificial liner 105, and the lower sacrificial liner 103 can be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) can be used to remove the source-level sacrificial layer 104 selective to the backside trench spacers 74 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 74, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and a bottom surface that are physically exposed to the source cavity 109.

Figure 13C:
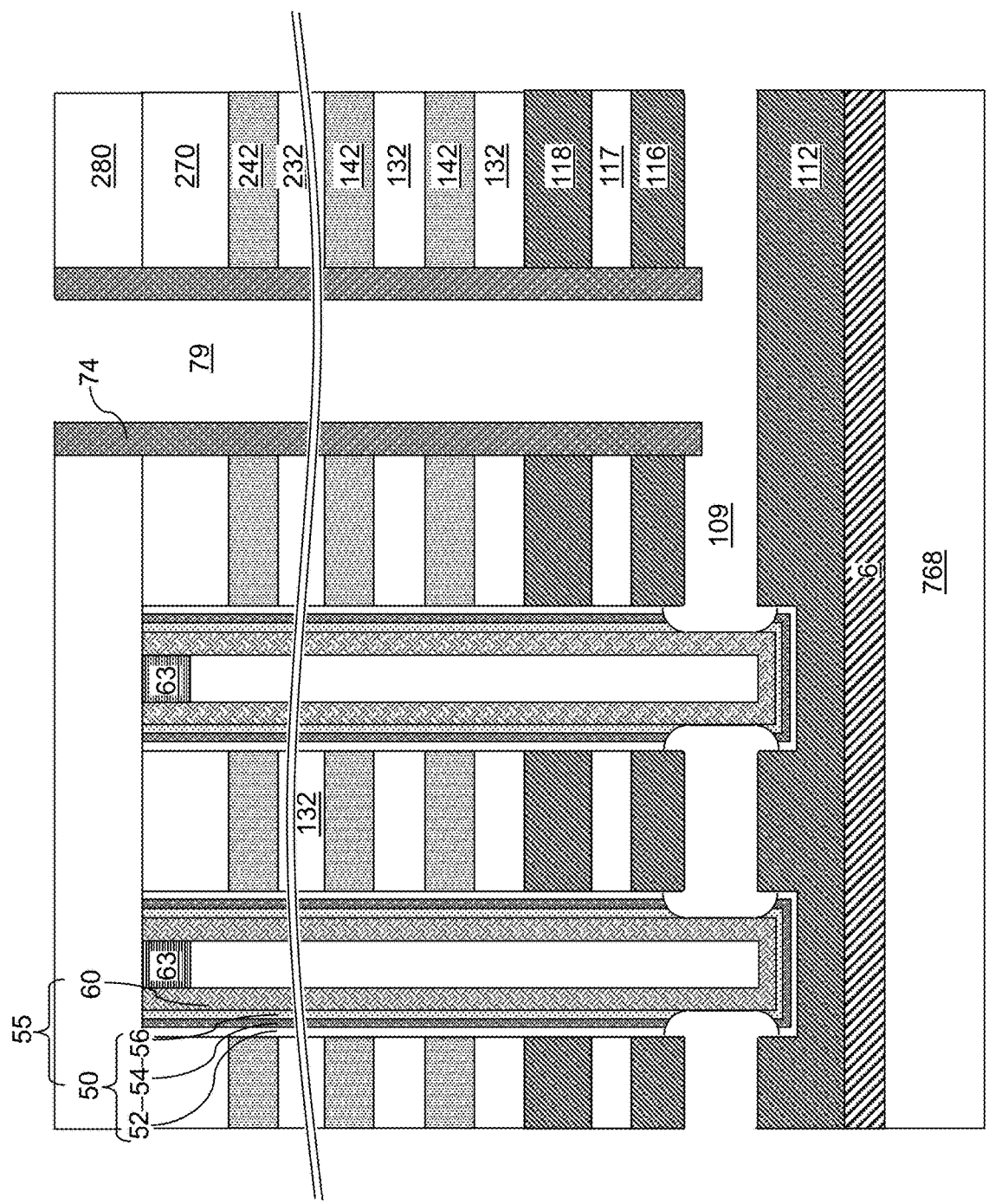

Referring to FIG. 13C, a sequence of isotropic etchants, such as wet etchants, can be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 can be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 13D:
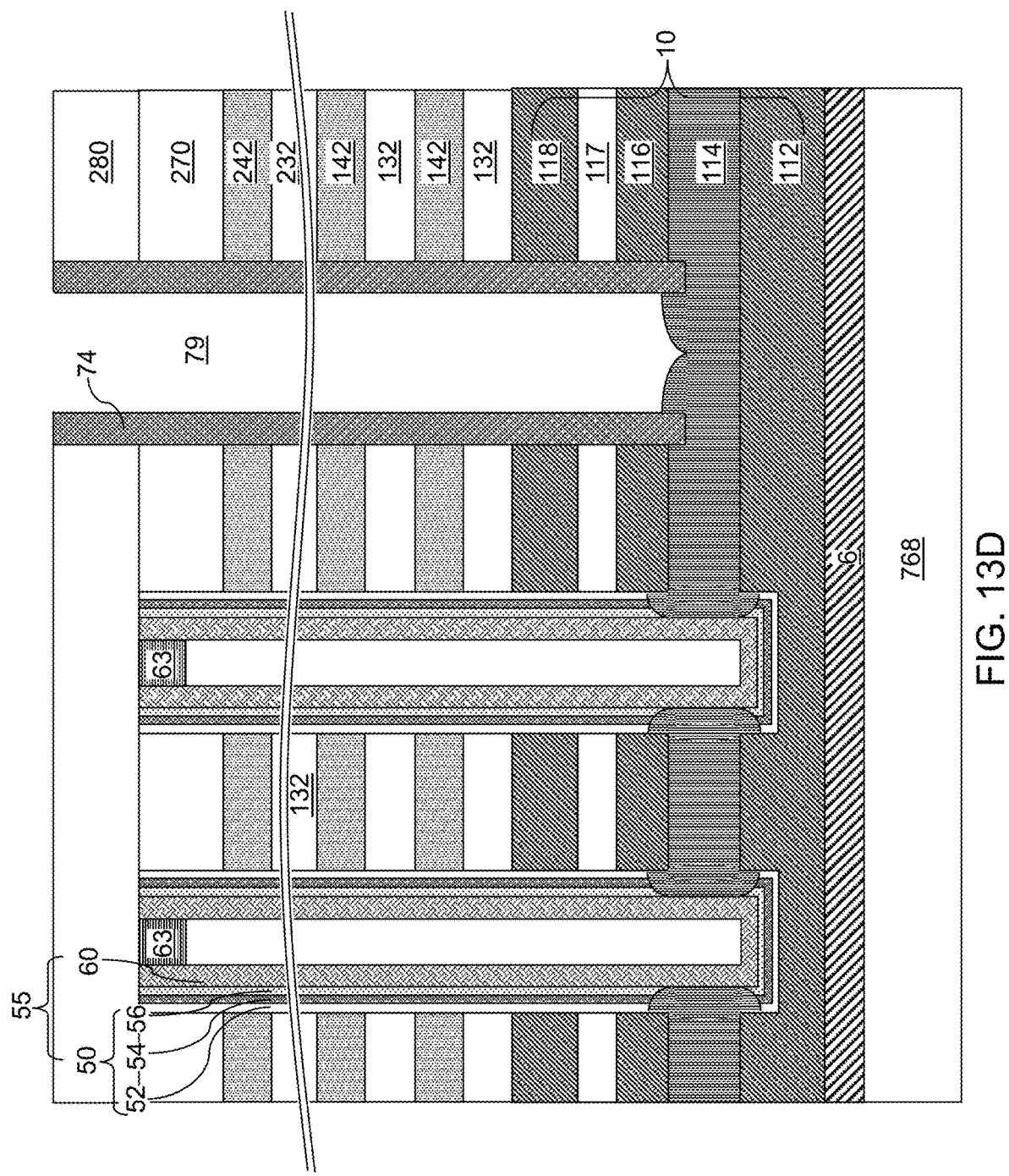

Referring to FIG. 13D, an n-doped semiconductor material can be deposited on the physically exposed semiconductor surfaces around the source cavity 109. The physically exposed semiconductor surfaces include bottom portions of outer sidewalls of the vertical semiconductor channels 60 and a boron-doped horizontal surface of the at least one source-level semiconductor layer (such as a bottom surface of the upper source-level semiconductor layer 116 and/or a top surface of the lower source-level semiconductor layer 112). For example, the physically exposed semiconductor surfaces can include the bottom portions of outer sidewalls of the vertical semiconductor channels 60, the top horizontal surface of the lower source-level semiconductor layer 112, and the bottom surface of the upper source-level semiconductor layer 116.

In one embodiment, the n-doped semiconductor material can be deposited on the physically exposed semiconductor surfaces around the source cavity 109 by a selective semiconductor deposition process. A semiconductor precursor gas, an etchant, and an n-type dopant precursor gas can be flowed concurrently into a process chamber including the first exemplary structure during the selective semiconductor deposition process. For example, the semiconductor precursor gas can include silane, disilane, or dichlorosilane, the etchant gas can include gaseous hydrogen chloride, and the n-type dopant precursor gas such as phosphine, arsine, or stibine. In this case, the selective semiconductor deposition process grows an n-doped semiconductor material from physically exposed semiconductor surfaces around the source cavity 109. The deposited n-doped semiconductor material forms a source contact layer 114, which can contact sidewalls of the vertical semiconductor channels 60. The atomic concentration of the n-type dopants in the deposited semiconductor material can be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed can consist essentially of semiconductor atoms and n-type dopant atoms. Alternatively, at least one non-selective n-doped semiconductor material deposition process can be used to form the source contact layer 114. Optionally, one or more etch back processes may be used in combination with a plurality of selective or non-selective deposition processes to provide a seamless and/or voidless source contact layer 114.

The duration of the selective semiconductor deposition process can be selected such that the source cavity 109 is filled with the source contact layer 114, and the source contact layer 114 contacts bottom end portions of inner sidewalls of the backside trench spacers 74. In one embodiment, the source contact layer 114 can be formed by selectively depositing an n-doped semiconductor material from semiconductor surfaces around the source cavity 109. In one embodiment, the doped semiconductor material can include doped polysilicon. Thus, the source-level sacrificial layer 104 can be replaced with the source contact layer 114.

The layer stack including the lower source-level semiconductor layer 112, the source contact layer 114, and the upper source-level semiconductor layer 116 constitutes a buried source layer (112, 114, 116). A p-n junction is present between the source contact layer 114 and the upper source-level semiconductor layer 116. The set of layers including the buried source layer (112, 114, 116), the source-level insulating layer 117, and the source-select-level conductive layer 118 constitutes source-level material layers 10, which replaces the in-process source-level material layers 10'.

Figure 13E:
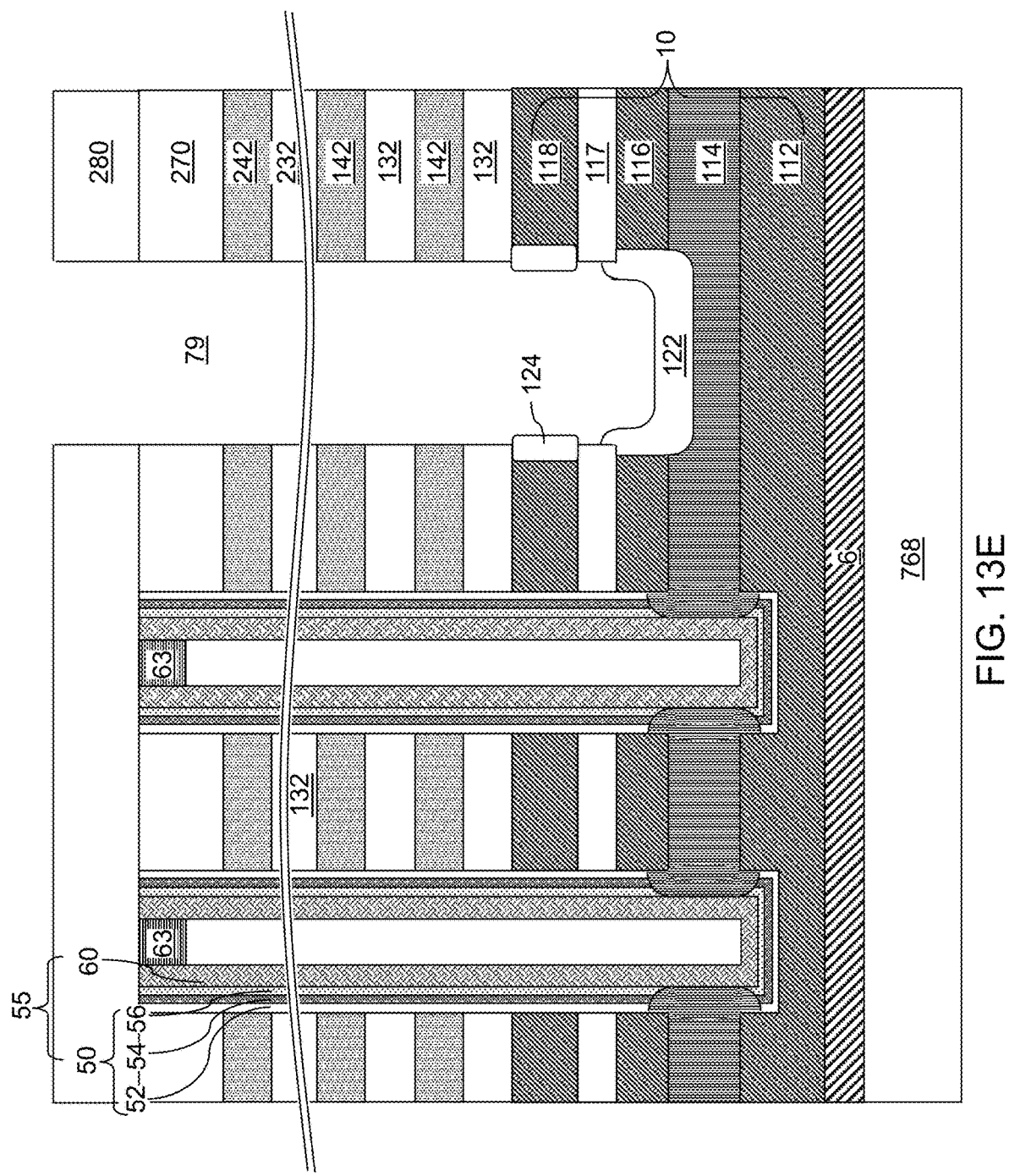
Figure 14:
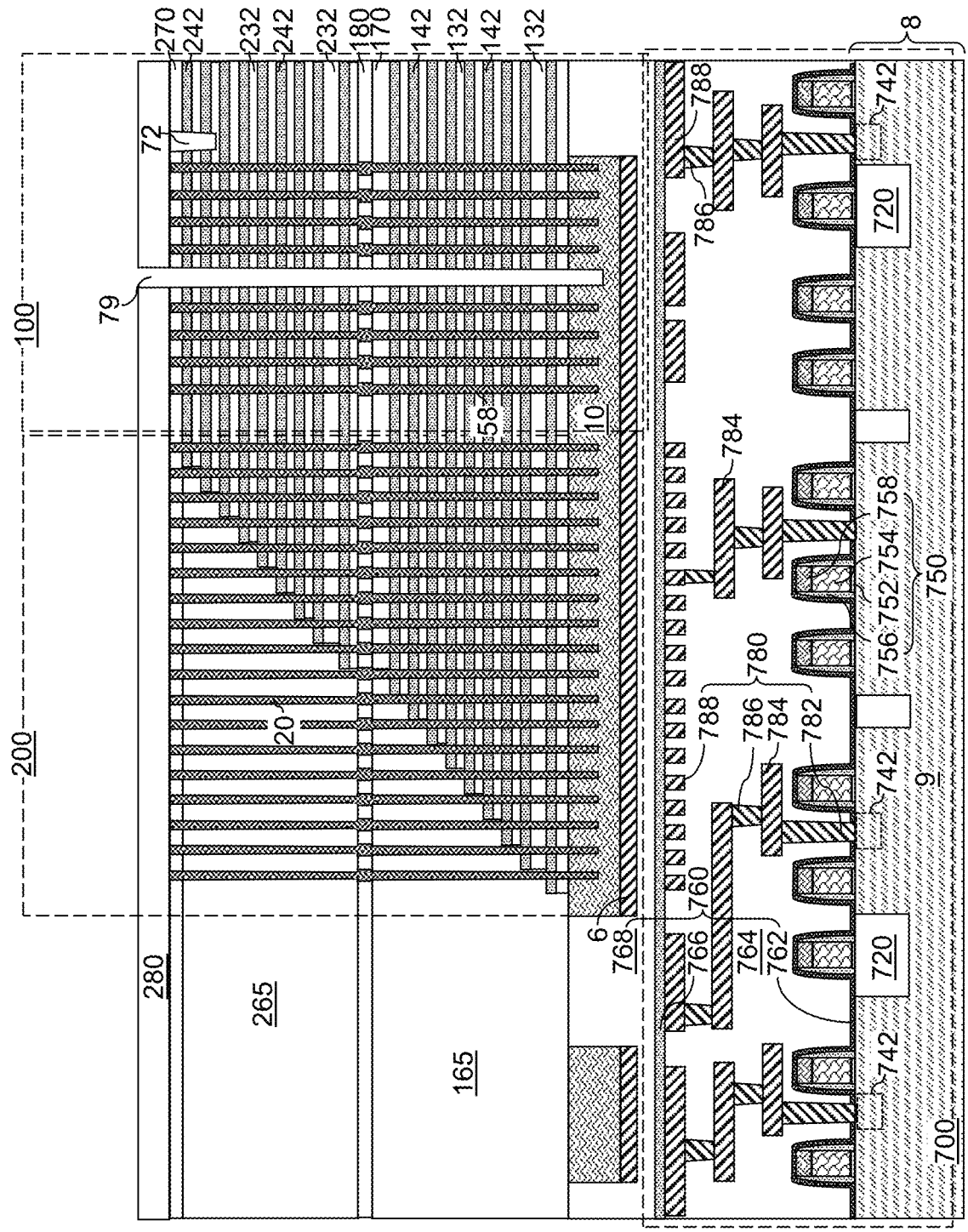
FIG. 14 is a vertical cross-sectional view of the first exemplary structure after formation of source-level material layers according to an embodiment of the present disclosure.

Referring to FIGS. 13E and 14, the backside trench spacers 74 can be removed selective to the insulating layers (132, 232), the first and second insulating cap layers (170, 270), the first contact level dielectric layer 280, and the source contact layer 114 using an isotropic etch process. For example, if the backside trench spacers 74 include silicon nitride, a wet etch process using hot phosphoric acid can be performed to remove the backside trench spacers 74. In one embodiment, the isotropic etch process that removes the backside trench spacers 74 can be combined with a subsequent isotropic etch process that etches the sacrificial material layers (142, 242) selective to the insulating layers (132, 232), the first and second insulating cap layers (170, 270), the first contact level dielectric layer 280, and the source contact layer 114.

An oxidation process can be performed to convert physically exposed surface portions of semiconductor materials into dielectric semiconductor oxide portions. For example, surfaces portions of the source contact layer 114 and the upper source-level material layer 116 can be converted into dielectric semiconductor oxide plates 122, and surface portions of the source-select-level conductive layer 118 can be converted into annular dielectric semiconductor oxide spacers 124.

Figure 15:
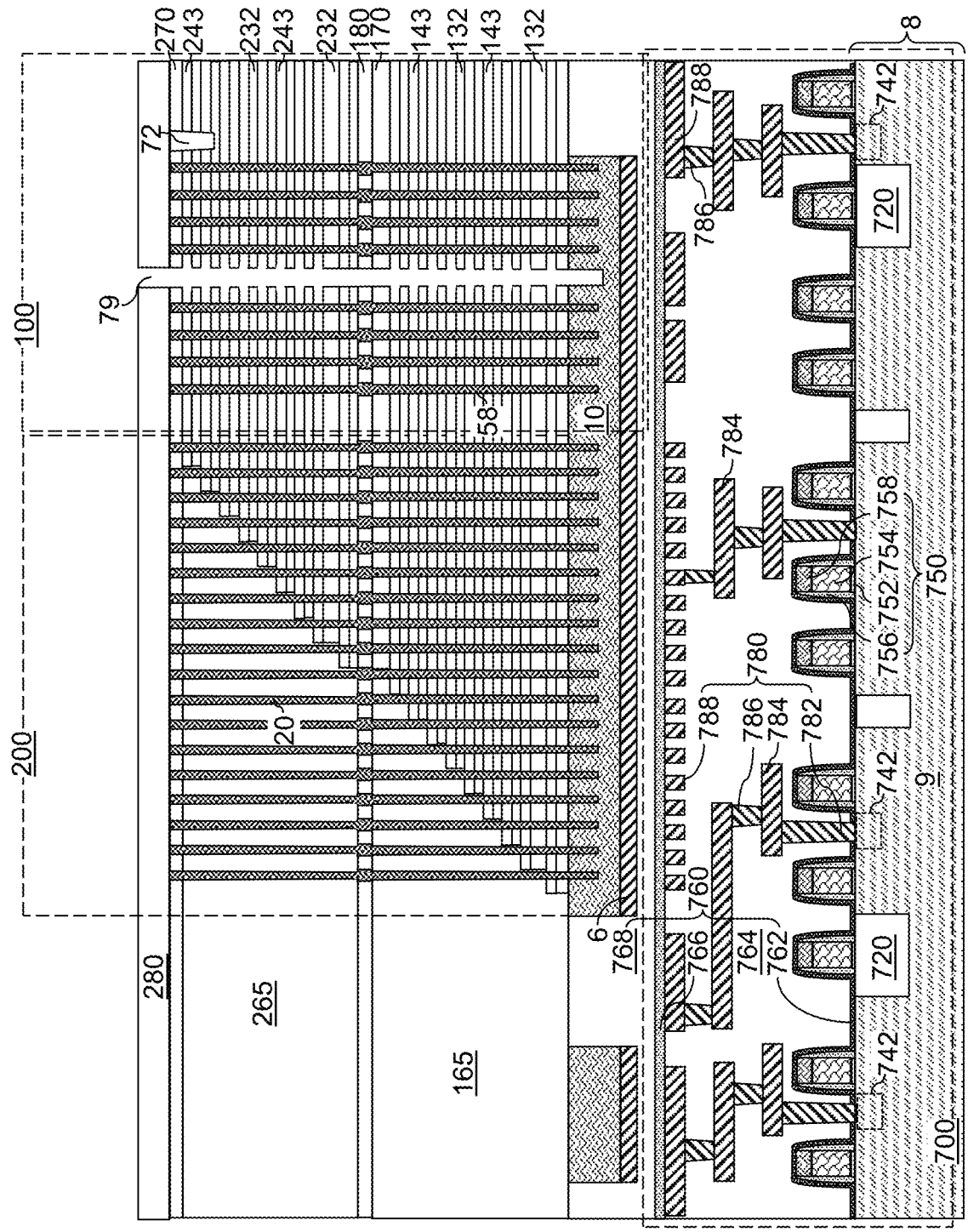
FIG. 15 is a vertical cross-sectional view of the first exemplary structure after formation of backside recesses according to an embodiment of the present disclosure.

Referring to FIG. 15, the sacrificial material layers (142, 242) are can be removed selective to the insulating layers (132, 232), the first and second insulating cap layers (170, 270), the first contact level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) selective to the materials of the insulating layers (132, 232), the first and second insulating cap layers (170, 270), the retro-stepped dielectric material portions (165, 265), and the material of the outermost layer of the memory films 50 can be introduced into the backside openings 79, for example, using an isotropic etch process. For example, the sacrificial material layers (142, 242) can include silicon nitride, the materials of the insulating layers (132, 232), the first and second insulating cap layers (170, 270), the retro-stepped dielectric material portions (165, 265), and the outermost layer of the memory films 50 can include silicon oxide materials.

The isotropic etch process can be a wet etch process using a wet etch solution, or can be a gas phase (dry) etch process in which the etchant is introduced in a vapor phase into the backside trenches 79. For example, if the sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) can be a laterally extending cavity having a lateral dimension that is greater than the vertical extent of the cavity. In other words, the lateral dimension of each of the backside recesses (143, 243) can be greater than the height of the respective backside recess (143, 243). A plurality of backside recesses (143, 243) can be formed in the volumes from which the material of the sacrificial material layers (142, 242) is removed. Each of the backside recesses (143, 243) can extend substantially parallel to the top surface of the substrate semiconductor layer 9. A backside recess (143, 243) can be vertically bounded by a top surface of an underlying insulating layer (132, 232) and a bottom surface of an overlying insulating layer (132, 232). In one embodiment, each of the backside recesses (143, 243) can have a uniform height throughout.

Figure 16:
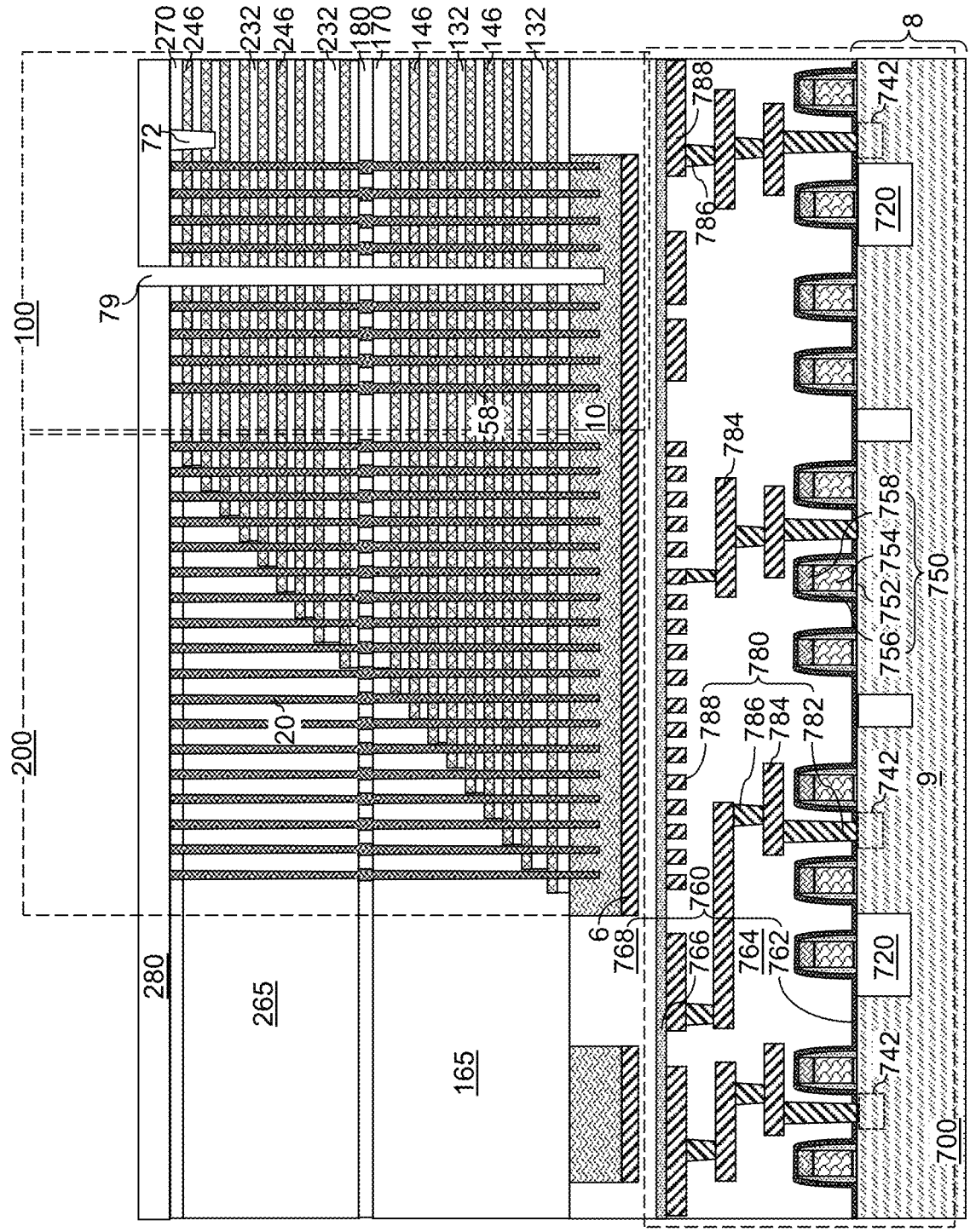
FIG. 16 is a vertical cross-sectional view of the first exemplary structure after formation of electrically conductive layers according to an embodiment of the present disclosure.

Referring to FIG. 16, a backside blocking dielectric layer (not shown) can be optionally deposited in the backside recesses (143, 243) and the backside trenches 79 and over the first contact level dielectric layer 280. The backside blocking dielectric layer includes a dielectric material such as a dielectric metal oxide, silicon oxide, or a combination thereof. For example, the backside blocking dielectric layer can include aluminum oxide. The backside blocking dielectric layer can be formed by a conformal deposition process such as atomic layer deposition or chemical vapor deposition. The thickness of the backside blocking dielectric layer can be in a range from 1 nm to 20 nm, such as from 2 nm to 10 nm, although lesser and greater thicknesses can also be used.

At least one conductive material can be deposited in the plurality of backside recesses (243, 243), on the sidewalls of the backside trenches 79, and over the first contact level dielectric layer 280. The at least one conductive material can be deposited by a conformal deposition method, which can be, for example, chemical vapor deposition (CVD), atomic layer deposition (ALD), electroless plating, electroplating, or a combination thereof. The at least one conductive material can include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material can include at least one metallic material, i.e., an electrically conductive material that includes at least one metallic element. Non-limiting exemplary metallic materials that can be deposited in the backside recesses (143, 243) include tungsten, tungsten nitride, titanium, titanium nitride, tantalum, tantalum nitride, cobalt, and ruthenium. For example, the at least one conductive material can include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) can be a combination of titanium nitride layer and a tungsten fill material.

Electrically conductive layers (146, 246) can be formed in the backside recesses (143, 243) by deposition of the at least one conductive material. A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the first contact level dielectric layer 280. Each of the first electrically conductive layers 146 and the second electrically conductive layers 246 can include a respective conductive metallic nitride liner and a respective conductive fill material. Thus, the first and second sacrificial material layers (142, 242) can be replaced with the first and second electrically conductive layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

Residual conductive material can be removed from inside the backside trenches 79. Specifically, the deposited metallic material of the continuous metallic material layer can be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246.

Each electrically conductive layer (146, 246) can be a conductive sheet including openings therein. A first subset of the openings through each electrically conductive layer (146, 246) can be filled with memory opening fill structures 58. A second subset of the openings through each electrically conductive layer (146, 246) can be filled with the support pillar structures 20. Each electrically conductive layer (146, 246) can have a lesser area than any underlying electrically conductive layer (146, 246) because of the first and second stepped surfaces. Each electrically conductive layer (146, 246) can have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Figure 17A:
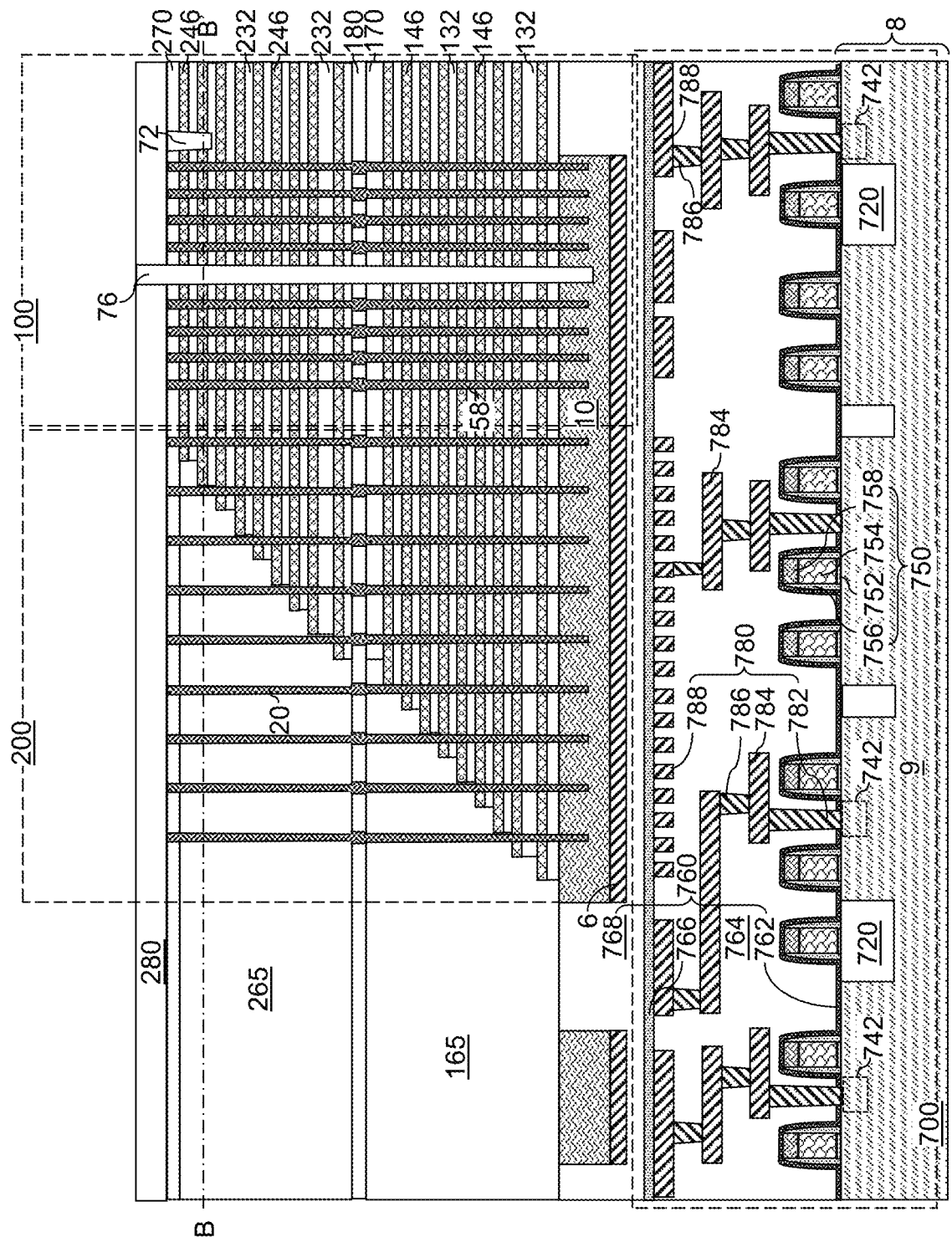
FIG. 17A is a vertical cross-sectional view of the first exemplary structure after formation of dielectric wall structures in the backside trenches according to an embodiment of the present disclosure.
Figure 17B:
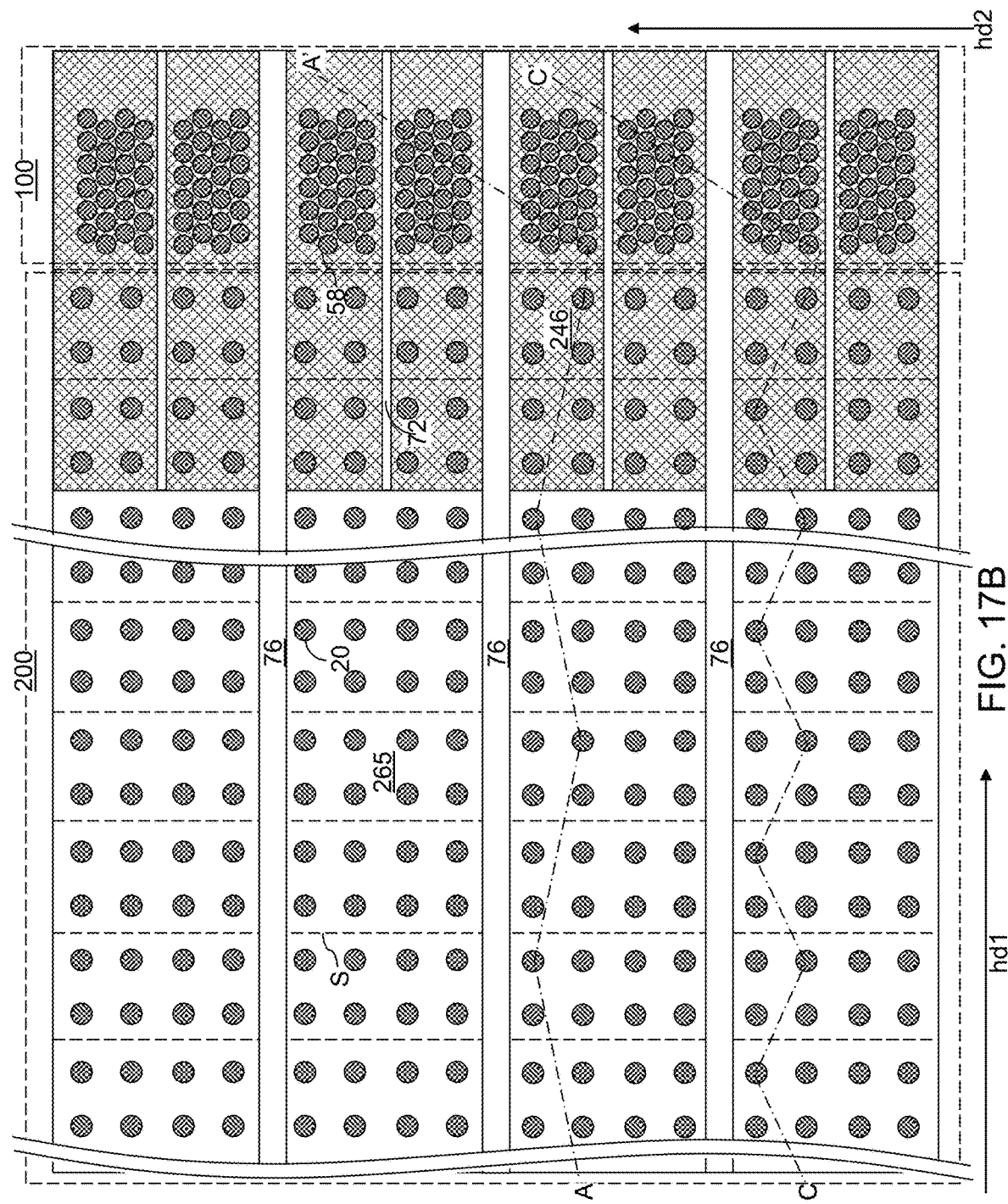
FIG. 17B is a horizontal cross-sectional view of the first exemplary structure along the horizontal plane B-B' of FIG. 17A. The hinged vertical plane A-A' corresponds to the plane of the vertical cross-sectional view of FIG. 17A.
Figure 17C:
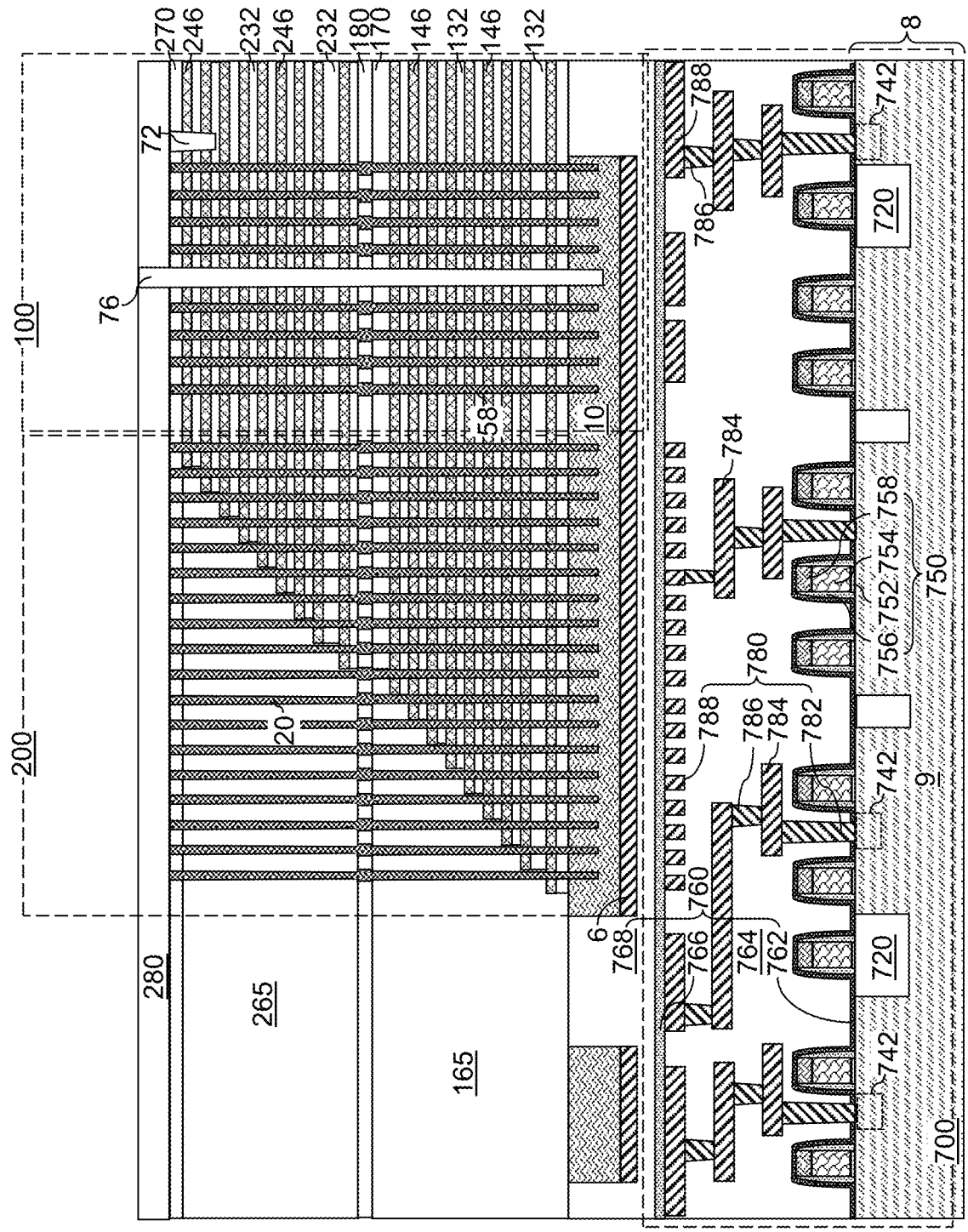
FIG. 17C is a vertical cross-sectional view of the first exemplary structure along the vertical plane C-C' of FIG. 17B.

Referring to FIGS. 17A-17C, a dielectric material is deposited in the backside trenches 79 to form dielectric wall structures 76. Each of the dielectric wall structures 76 can laterally extend along the first horizontal direction hd1 and can vertically extend through each layer of an alternating stack of the insulating layers (132, 232) and the word-line-level electrically conductive layers (146, 246). Each dielectric wall structure 76 can contact sidewalls of the first and second insulating cap layers (170, 270).

Figure 18A:
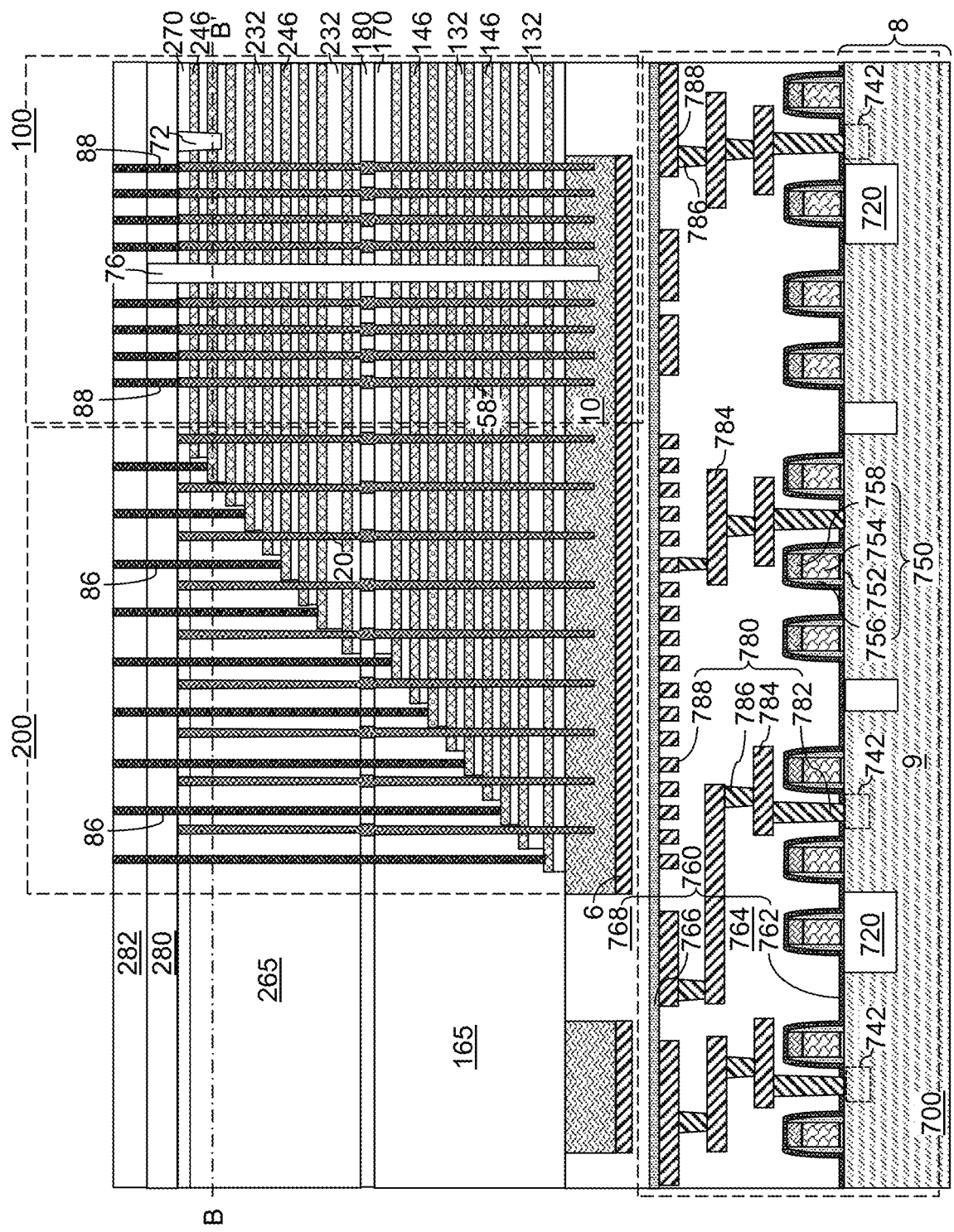
FIG. 18A is a vertical cross-sectional view of the first exemplary structure after formation of a second contact level dielectric layer and various contact via structures according to an embodiment of the present disclosure.
Figure 18B:
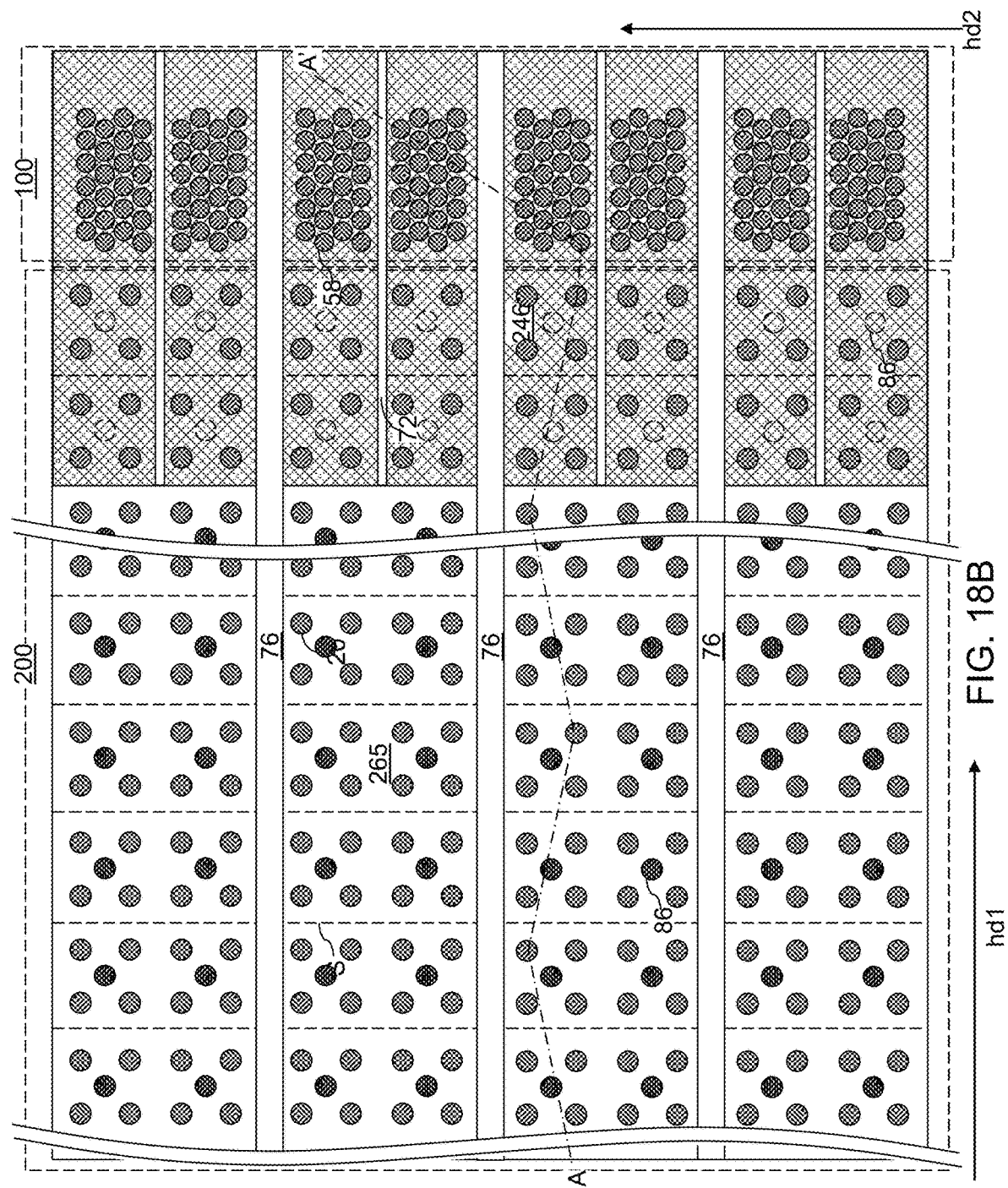
FIG. 18B is a horizontal cross-sectional view of the first exemplary structure along the vertical plane B-B' of FIG. 18A. The hinged vertical plane A-A' corresponds to the plane of the vertical cross-sectional view of FIG. 18A.

Referring to FIGS. 18A and 18B, a second contact level dielectric layer 282 may be formed over the first contact level dielectric layer 280. The second contact level dielectric layer 282 includes a dielectric material such as silicon oxide, and can have a thickness in a range from 100 nm to 600 nm, although lesser and greater thicknesses can also be used.

A photoresist layer (not shown) can be applied over the second contact level dielectric layer 282, and can be lithographically patterned to form various contact via openings. For example, openings for forming drain contact via structures can be formed in the memory array region 100, and openings for forming staircase region contact via structures can be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) can be used as etch stop structures. Drain contact via cavities can be formed over each drain region 63, and staircase-region contact via cavities can be formed over each electrically conductive layer (146. 246) at the stepped surfaces underlying the first and second retro-stepped dielectric material portions (165, 265). The photoresist layer can be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 can include drain select level contact via structures that contact a subset of the second electrically conductive layers 246 that function as drain select level gate electrodes. Further, the staircase-region contact via structures 86 can include word line contact via structures that contact electrically conductive layers (146, 246) that underlie the drain select level gate electrodes and function as word lines for the memory stack structures 55.

Figure 19:
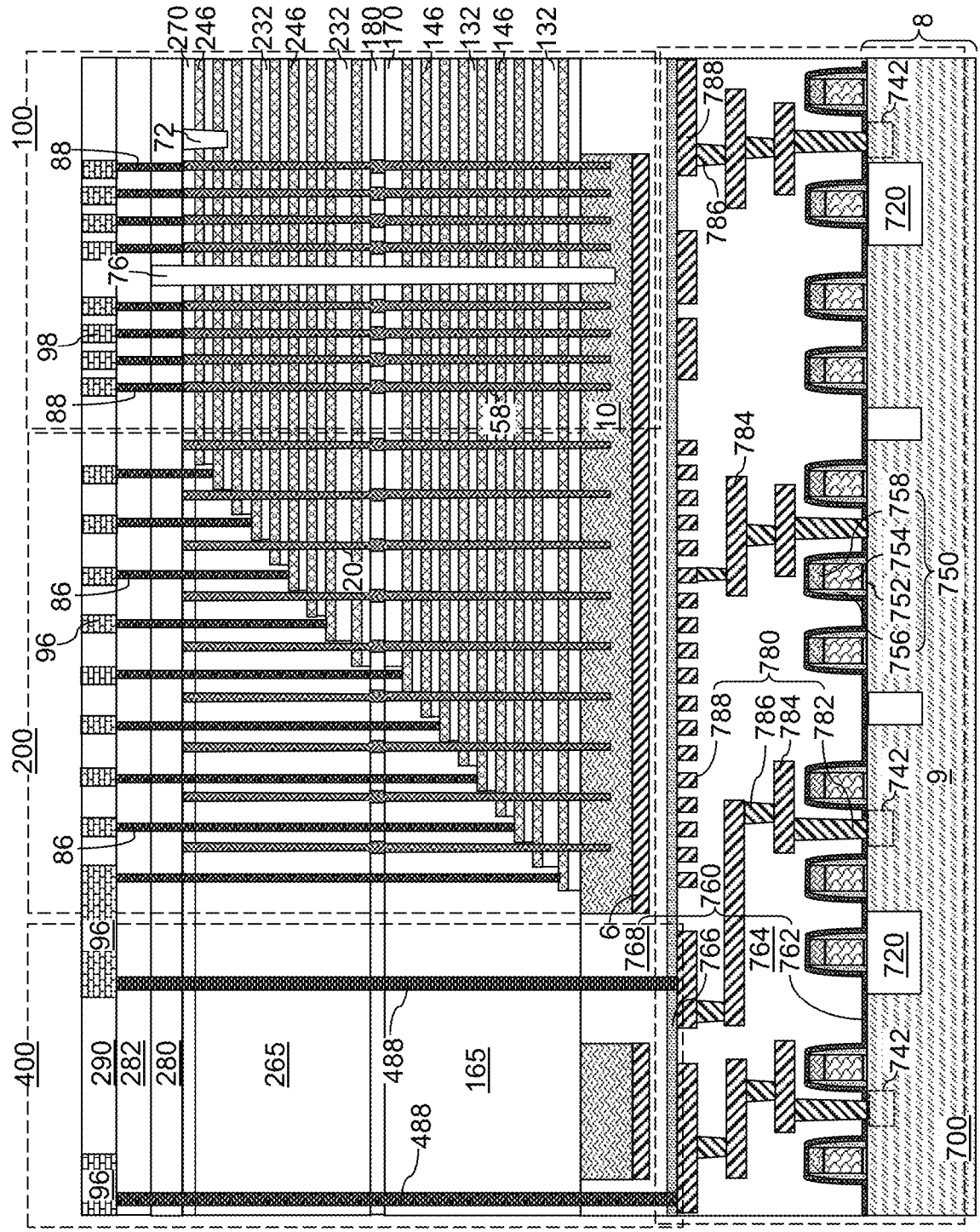
FIG. 19 is a vertical cross-sectional view of the first exemplary structure after formation of through-memory-level via structures and upper metal line structures according to an embodiment of the present disclosure.

Referring to FIG. 19, peripheral-region via cavities can be formed through the second and first contact level dielectric layers (282, 280), the second and first retro-stepped dielectric material portions (265, 165), and the at least one second dielectric layer 768 to top surfaces of the lower metal interconnect structure 780 in the peripheral device region 400. At least one conductive material can be deposited in the peripheral-region via cavities to form peripheral-region contact via structures 488.

At least one additional dielectric layer can be formed over the contact level dielectric layers (280, 282), and additional metal interconnect structures (herein referred to as upper-level metal interconnect structures) can be formed in the at least one additional dielectric layer. For example, the at least one additional dielectric layer can include a line-level dielectric layer 290 that is formed over the contact level dielectric layers (280, 282). The upper-level metal interconnect structures can include bit lines 98 contacting, or electrically connected to, a respective one of the drain contact via structures 88, and interconnection line structures 96 contacting, and/or electrically connected to, at least one of the staircase-region contact via structures 86, and the peripheral-region contact via structures 488.

At least one thermal anneal process is performed after formation of the source contact layer 114. The at least one thermal anneal process can be performed as a stand-alone anneal process, or can be a collateral anneal process that occurs during a thermal oxidation process or a thermal deposition process. For example, the at least one thermal anneal process can include the oxidation process that forms the dielectric semiconductor oxide plates 122 and the annular dielectric semiconductor oxide spacers 124. Additionally, the thermal anneal process can include a dopant activation anneal that is performed to activate the electrical dopants in the source contact layer 114 and any other electrical dopants such as the dopants in the lower source-level semiconductor layer 112, the dopants in the upper source-level semiconductor layer 116, and the dopants in the drain regions 63.

Figure 20A:
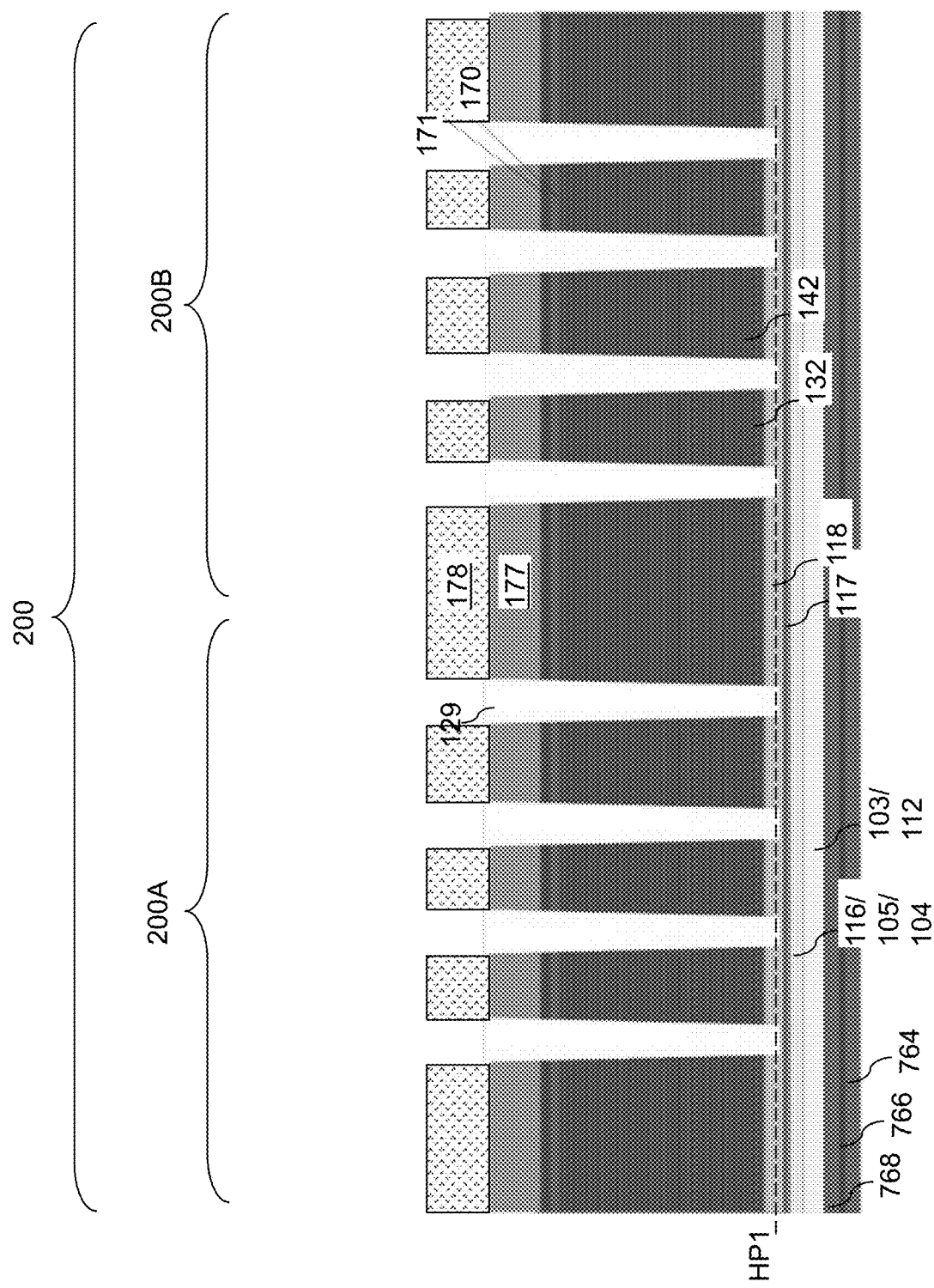
FIG. 20A is a vertical cross-sectional view of a staircase region of a second exemplary structure after formation of first-tier memory openings and first-tier support openings according to an embodiment of the present disclosure.
Figure 20B:
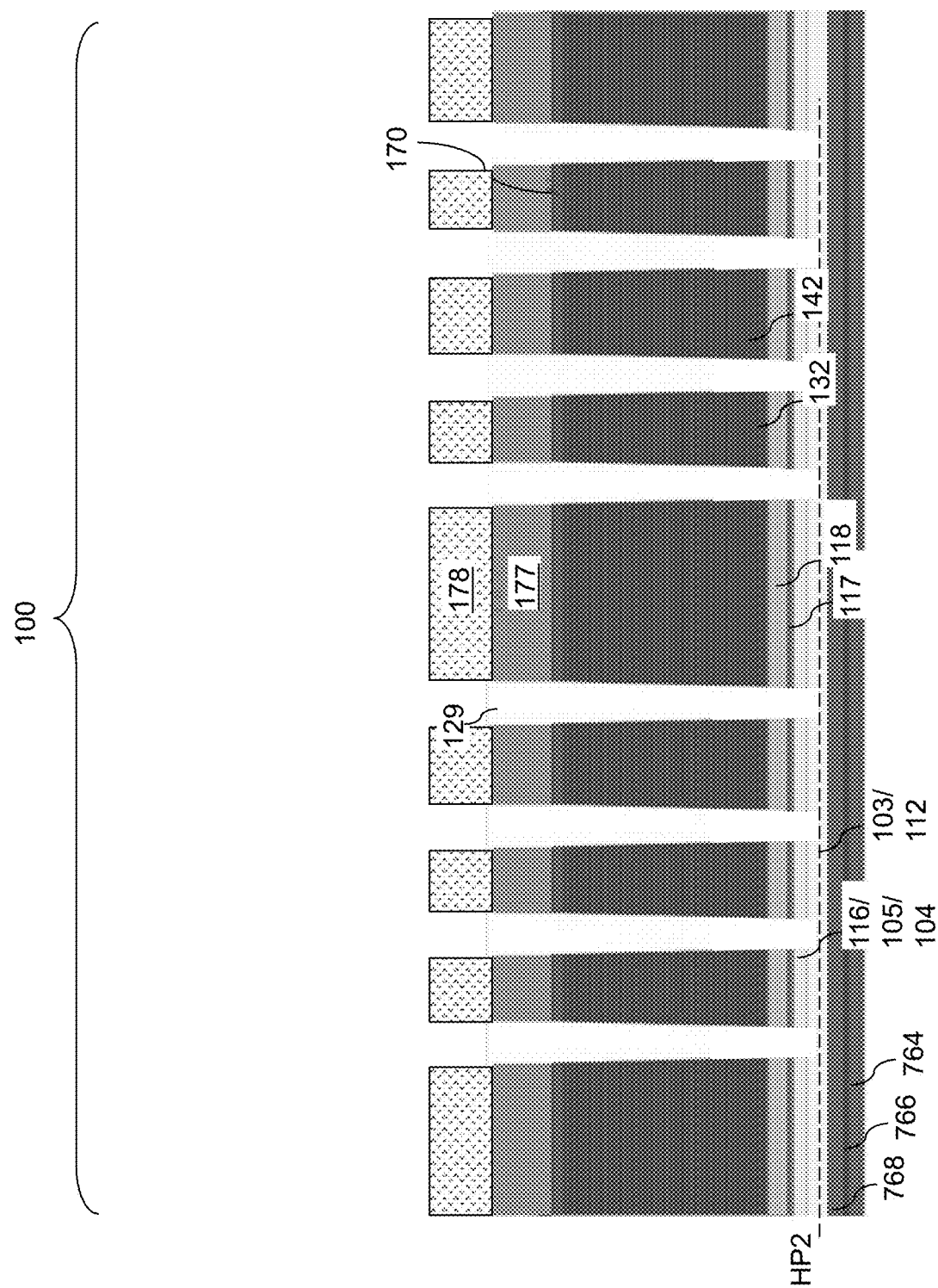
FIG. 20B is a vertical cross-sectional view of a memory array region of the second exemplary structure of FIG. 20A.

Referring to FIGS. 20A and 20B, a second exemplary structure according to a second embodiment of the present disclosure can be derived from the first exemplary structure of FIG. 2 by omitting formation of the first retro-stepped dielectric material portion 165 and the inter-tier dielectric layer 180, and by performing the processing steps of FIGS. 4A and 4B.

A patterned dielectric mask layer 171 can be formed over the first insulating cap layer 170 such that the patterned dielectric mask layer 171 covers the memory array region 100, and does not cover the staircase region 200. The staircase region 200 includes a first staircase region 200A in which stepped surfaces of a first-tier alternating stack (132, 142) are to be subsequently formed and a second staircase region 200B in which stepped surfaces of a second-tier alternating stack (232, 242) are to be subsequently formed. The patterned dielectric mask layer 171 includes a different material from the insulating cap layer 170. For example, the patterned dielectric mask layer 171 can include silicon nitride. The thickness of the patterned dielectric mask layer 171 can be in a range from 10 nm to 200 nm, although lesser and greater thicknesses can also be used.

A patterning film 177 can be applied over the patterned dielectric mask layer 171 in the staircase region 200 and over the first insulating cap layer 170 in the memory array region 100. The patterning film 177 can include a material that can assist patterning of underlying material layers by functioning as an etch mask. For example, the patterning film 177 can include a material based on amorphous carbon. In one embodiment, the patterning film 177 can include Advanced Patterning Film (APF) available from Applied Materials, Inc™. A first photoresist layer 178 can be applied over the patterning film 177, and can be lithographically patterned with the pattern of the first-tier memory openings 149 and the first-tier support openings 129 to be subsequently formed. For example, the pattern of the openings in the first photoresist layer 178 can be the same as the pattern of the first-tier memory openings 149 and the first-tier support openings 129 in the first embodiment (for example, as illustrated in FIG. 4B).

An anisotropic etch process is performed to transfer the pattern in the first photoresist layer 178 through the patterning film 177, and through the first insulating cap layer 170 and through an upper portion of the first-tier alternating stack (132, 142). The patterned dielectric mask layer 171 that is present in the staircase region 200 can reduce the depth of the openings formed in the staircase region 200 relative to the depth of the openings formed in the memory array region 100. The patterned dielectric mask layer 171 is etched through underneath each opening in the first photoresist layer 178 in the staircase region 200 during the anisotropic etch process, and the depths of the openings in the staircase region 200 and in the memory array region 100 increase throughout the anisotropic etch process.

First-tier memory openings 149 are formed through the first-tier alternating stack (132, 142) in the memory array region 100, and first-tier support openings 129 are formed through the first-tier alternating stack (132, 142) in the staircase region 200. In one embodiment, the anisotropic etch process is continued until the bottom surfaces of the support openings 129 reach a first horizontal plane HP1 located at a level of the source-select-level conductive layer 118 and the bottom surfaces of the first-tier memory openings 149 reach a second horizontal plane HP2 located at a level of the lower source-level semiconductor layer 112.

The patterned dielectric mask layer 171 can be used to differentiate the depth of the first-tier memory openings 149 and the depth of the first-tier support openings 129 during the anisotropic etch process. Specifically, the patterned dielectric mask layer 171 can add an additional material to etch through in the staircase region 200 relative to the memory array region 100 so that the anisotropic etch process forms the first-tier memory openings 149 with a greater depth than the first-tier support openings 129.

Figure 21:
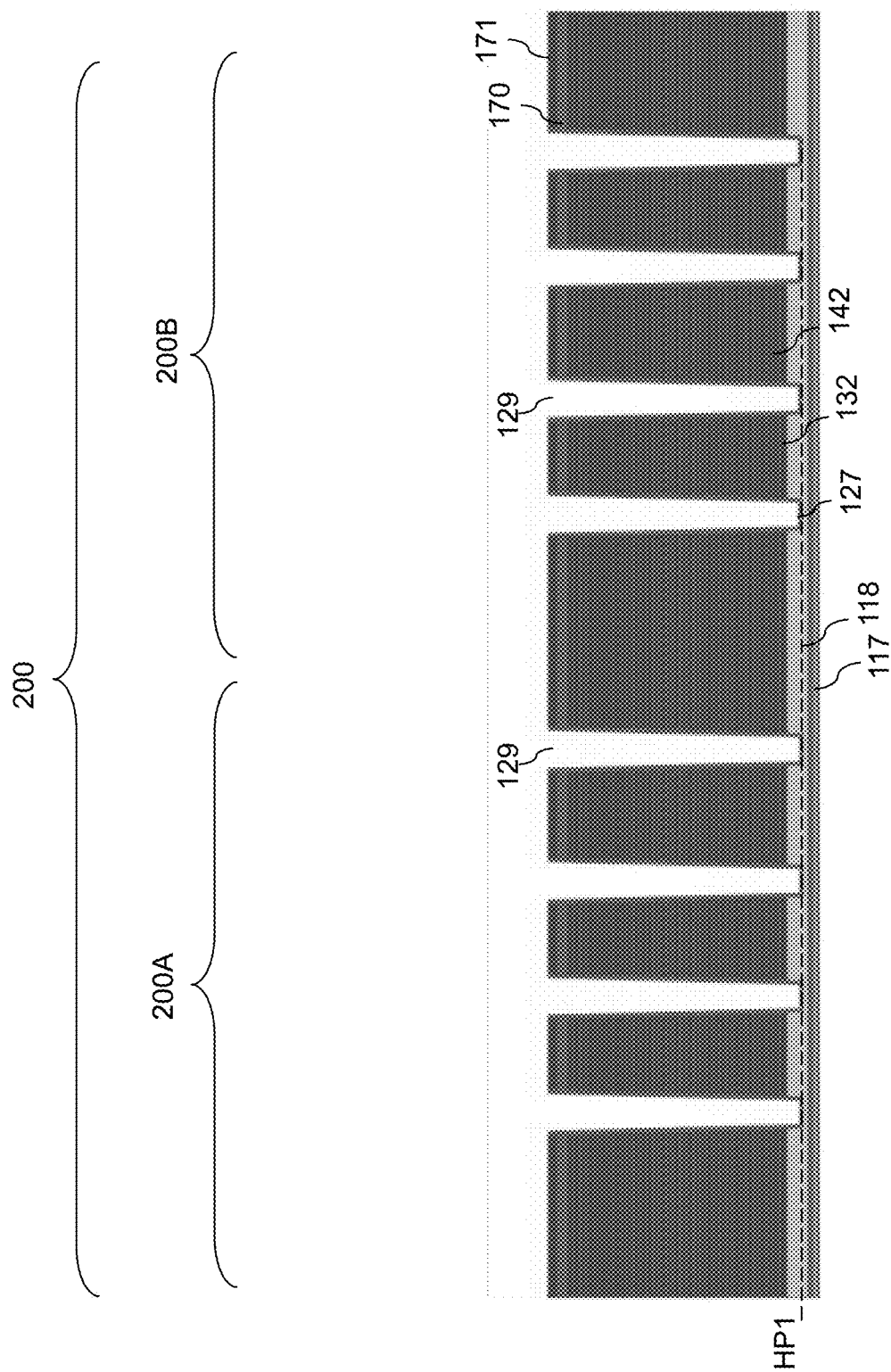
FIG. 21 is a vertical cross-sectional view of the staircase region of the second exemplary structure after removal of a patterned etch mask according to an embodiment of the present disclosure.

Referring to FIG. 21, the first photoresist layer 178 and the patterning film 177 can be subsequently removed, for example, by ashing. A sacrificial dielectric liner 127 can be formed by conformal deposition of a dielectric material layer. The sacrificial dielectric liner 127 can include a thin dielectric material such as silicon oxide. The thickness of the sacrificial dielectric liner 127 can be in a range from 3 nm to 10 nm, although lesser and greater thicknesses can also be used.

Figure 22:
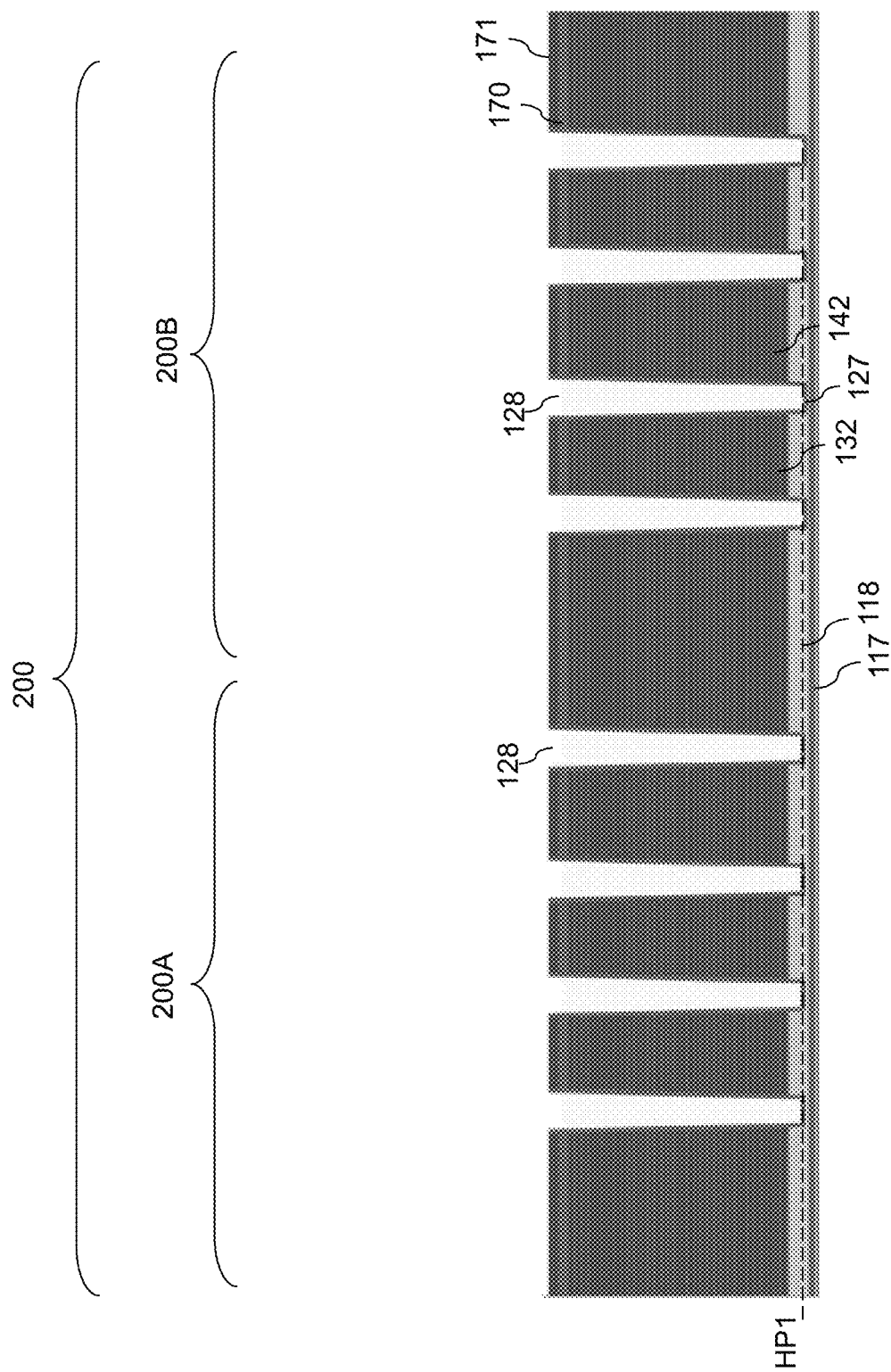
FIG. 22 is a vertical cross-sectional view of the staircase region of the second exemplary structure after formation of sacrificial first-tier memory opening fill structures and sacrificial first-tier support opening fill structures according to an embodiment of the present disclosure.

Referring to FIG. 22, sacrificial first-tier support opening fill structures 128 are formed in the first-tier support openings 129, and sacrificial first-tier memory opening fill structures 148 are formed in the first-tier memory openings 149 by performing the processing steps of FIG. 5. The sacrificial first-tier support opening fill structures 128 and the sacrificial first-tier memory opening fill structures 148 can include a sacrificial fill material, which may be a semiconductor material such as amorphous silicon. The sacrificial first-tier support opening fill structures 128 and the sacrificial first-tier memory opening fill structures 148 include the same material. In one embodiment, top surfaces of the sacrificial first-tier support opening fill structures 128 may be recessed relative to the top surface of the patterned dielectric mask layer 171. In this case, top surfaces of the sacrificial first-tier memory opening fill structures 148 can be recessed relative to the top surface of the first-tier insulating cap layer 170. Portions of the sacrificial dielectric liner 127 that overlie the first insulating cap layer 170 can be removed during recessing of the sacrificial fill material.

Figure 23:
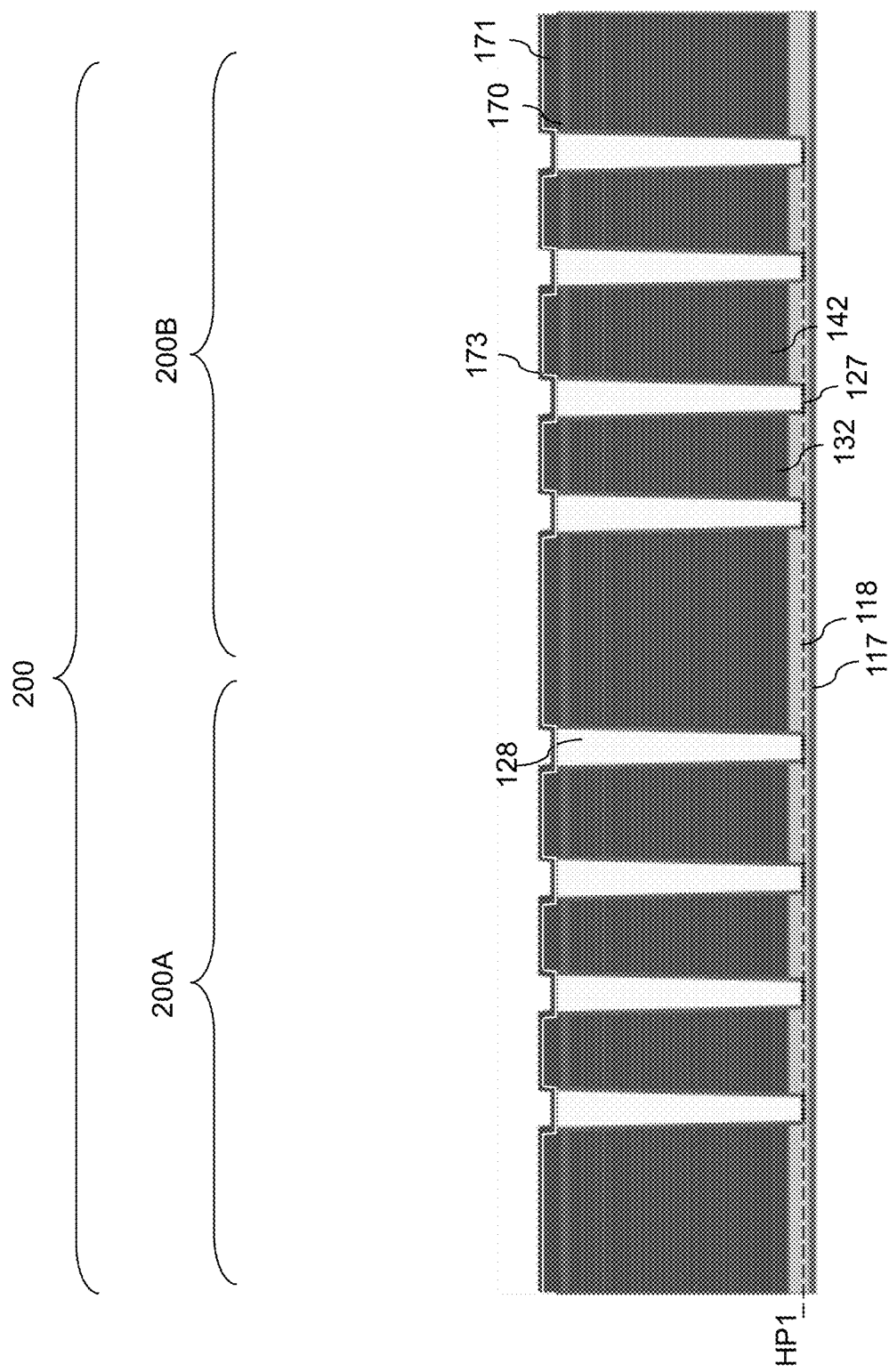
FIG. 23 is a vertical cross-sectional view of the staircase region of the second exemplary structure after formation of a dielectric mask layer according to an embodiment of the present disclosure.

Referring to FIG. 23, a cover silicon nitride layer 173 can be deposited over the top surface of the patterned dielectric mask layer 171 and the top surfaces of the sacrificial first-tier support opening fill structures 128 and the sacrificial first-tier memory opening fill structures 148. The thickness of the cover silicon nitride layer 173 can be in a range from 5 nm to 30 nm, although lesser and greater thicknesses can also be used.

Figure 24:
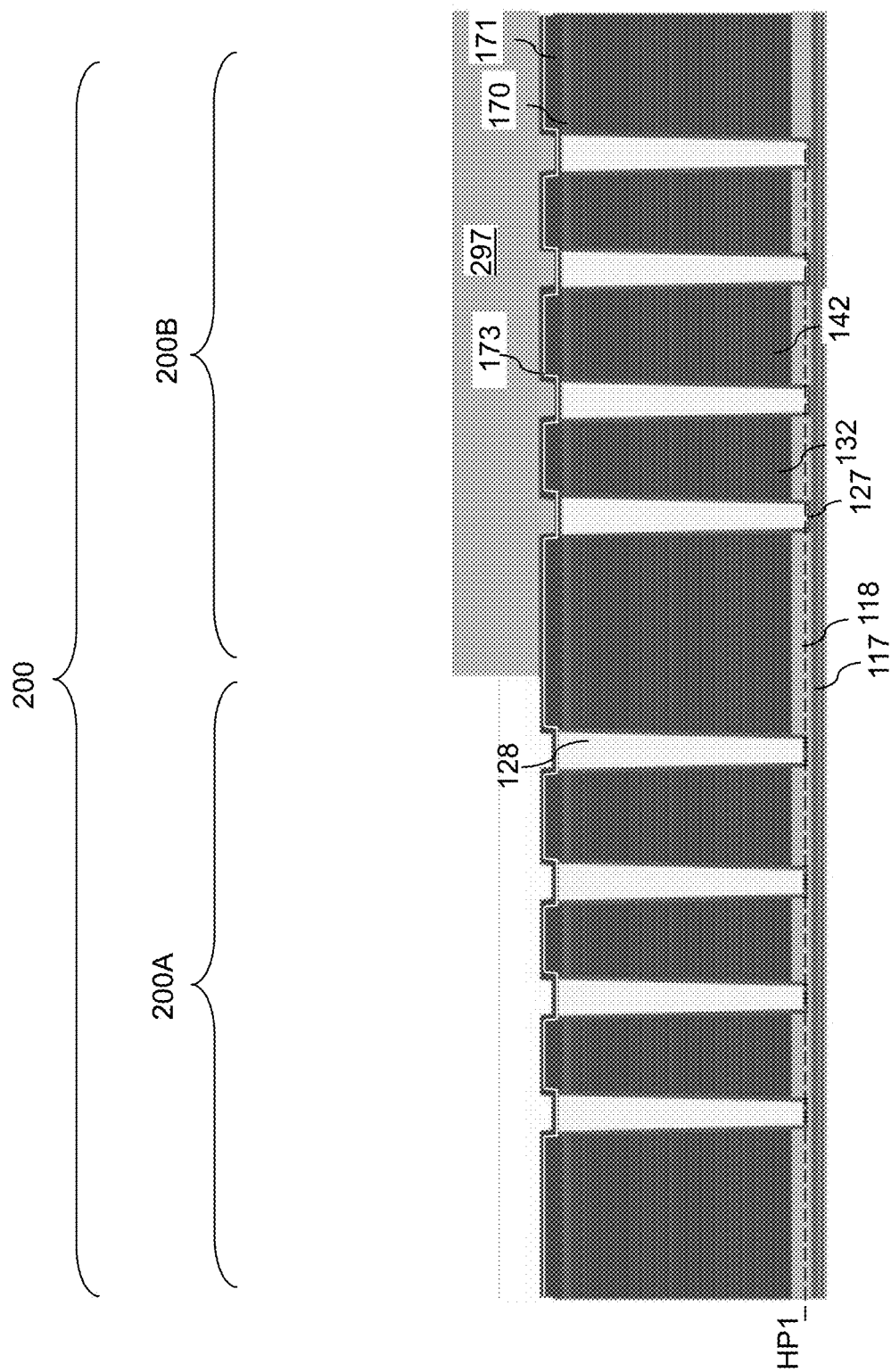
FIG. 24 is a vertical cross-sectional view of the staircase region of the second exemplary structure after formation of a patterned photoresist layer according to an embodiment of the present disclosure.

Referring to FIG. 24, a second photoresist layer 297 is applied over the cover silicon nitride layer 173, and is lithographically patterned to cover the memory array region 100, the peripheral device region 400, and the second staircase region 200B in which stepped surfaces of a second-tier alternating stack are to be subsequently formed, while not covering the first staircase region 200A in which stepped surfaces of the first-tier alternating stack (132, 142) are to be subsequently formed. In other words, each opening in the second photoresist layer 297 can be present only in a respective first staircase region 200A.

Figure 25:
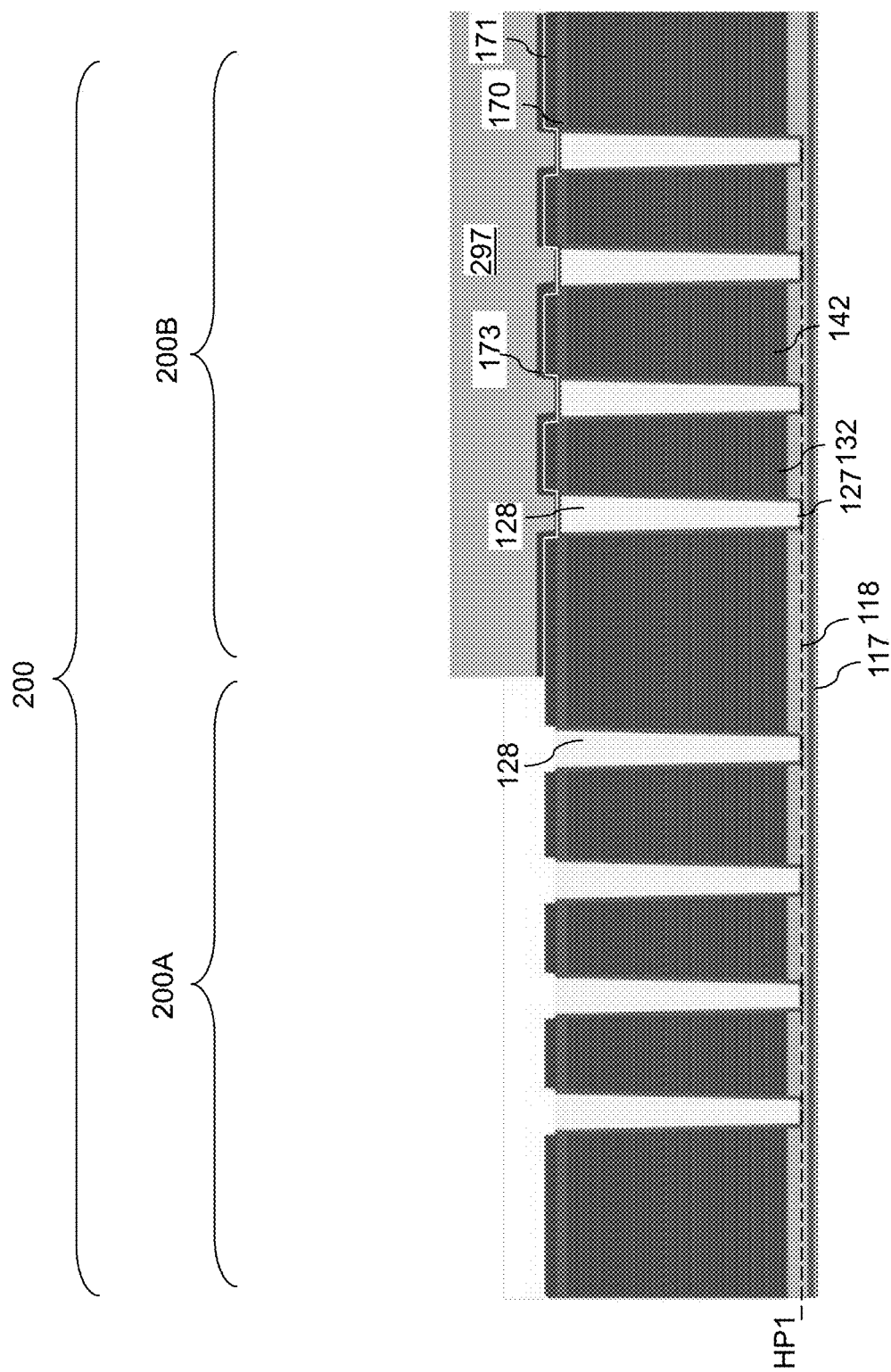
FIG. 25 is a vertical cross-sectional view of the staircase region of the second exemplary structure after patterning the dielectric mask layer according to an embodiment of the present disclosure.

Referring to FIG. 25, each unmasked portion of the cover silicon nitride layer 173 can be etched outside the areas covered by the second photoresist layer 297. An isotropic etch process or an anisotropic etch process may be used. The duration of the isotropic or anisotropic etch process can be selected such that the patterned dielectric mask layer 171 remains outside the areas of the sacrificial first-tier support opening fill structures 128. Top surfaces of the sacrificial first-tier support opening fill structures 128 in the first staircase region 200A are physically exposed, while the sacrificial first-tier support opening fill structures 128 in the second staircase region 200B are covered by the cover silicon nitride layer 173.

Figure 26:
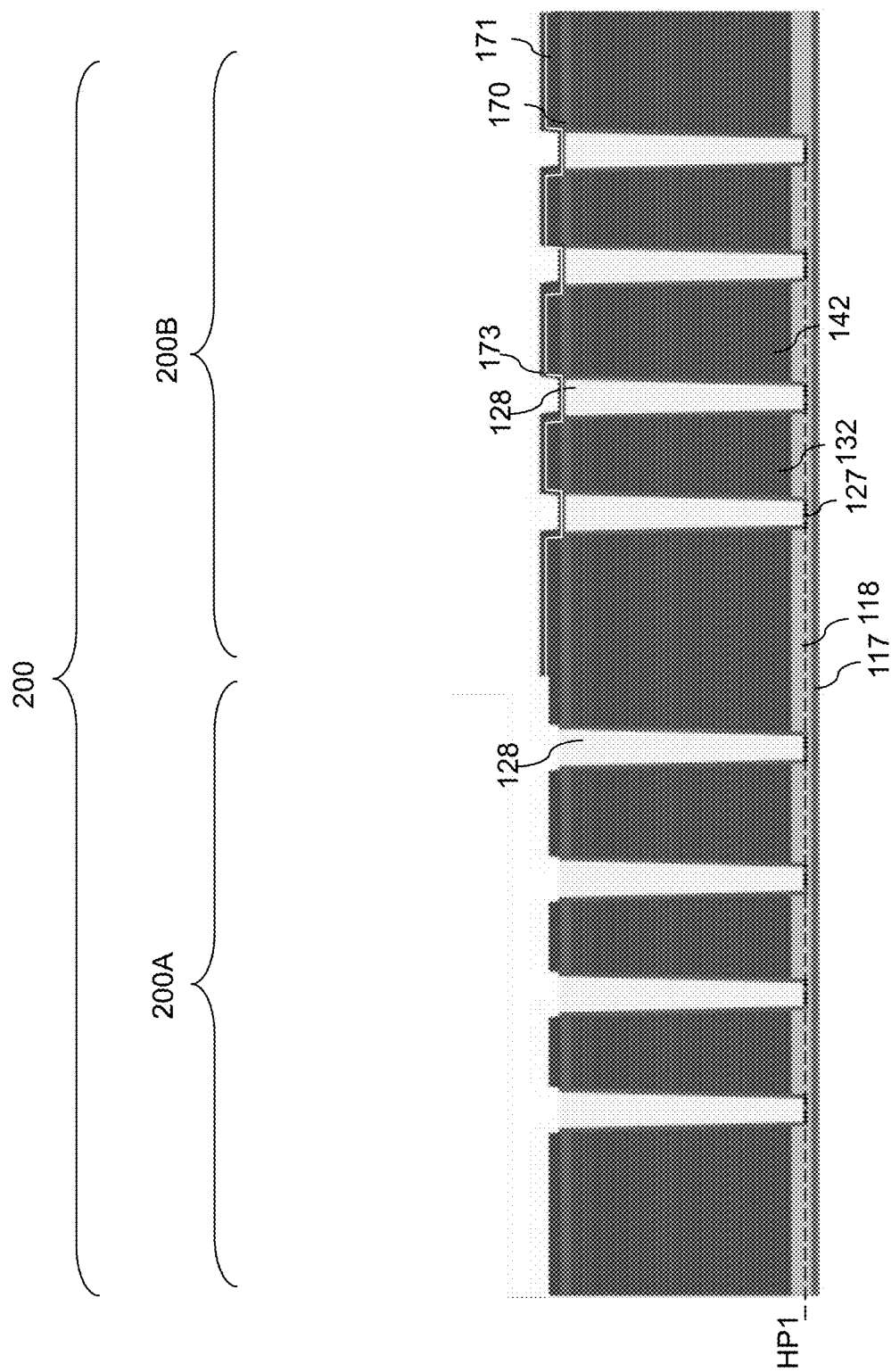
FIG. 26 is a vertical cross-sectional view of the staircase region of the second exemplary structure after removal of the patterned photoresist layer according to an embodiment of the present disclosure.

Referring to FIG. 26, the second photoresist layer 297 can be removed, for example, by ashing.

Figure 27:
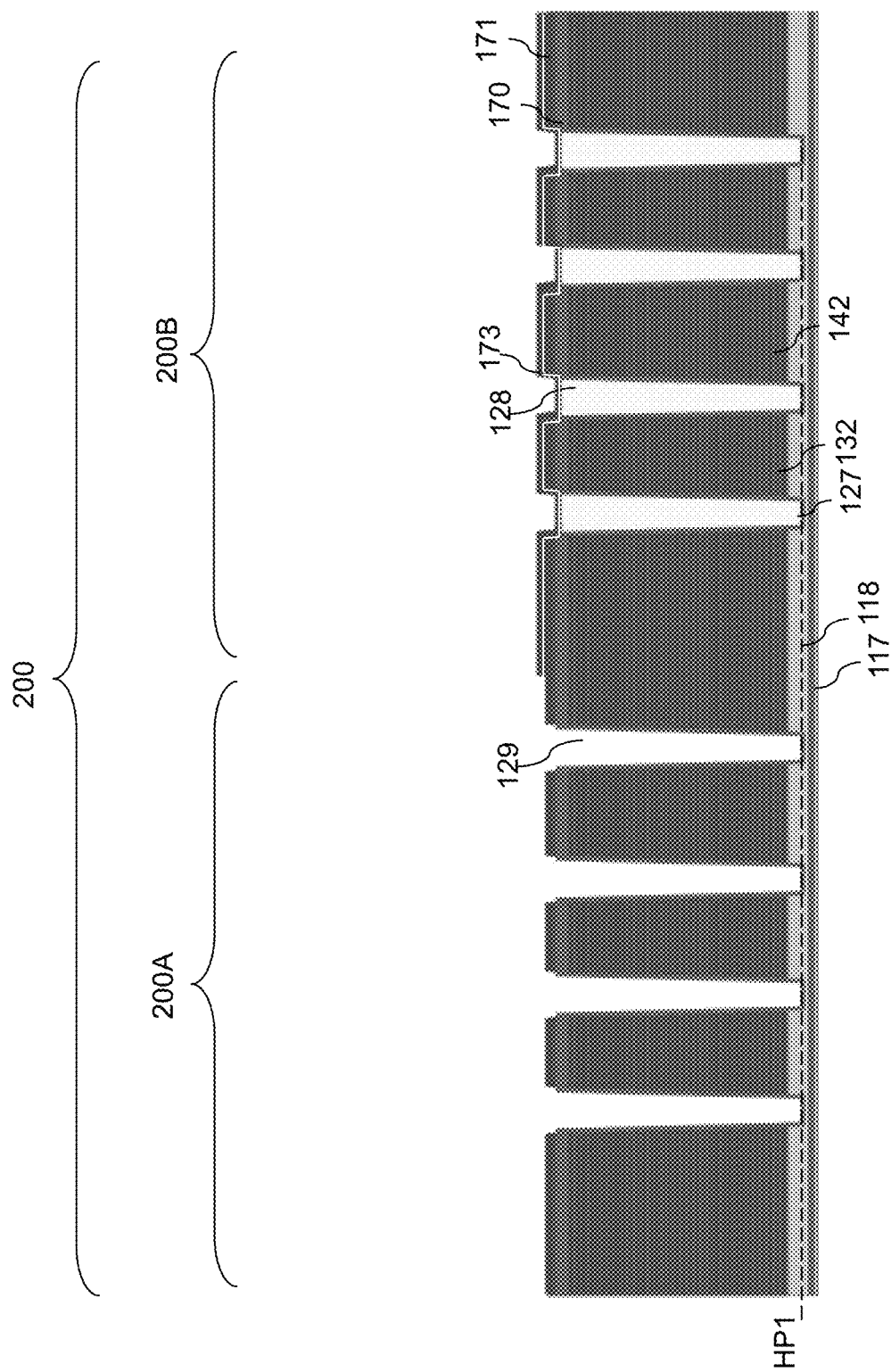
FIG. 27 is a vertical cross-sectional view of the staircase region of the second exemplary structure after removal of a first subset of the sacrificial first-tier support opening fill structures according to an embodiment of the present disclosure.

Referring to FIG. 27, the sacrificial first-tier support opening fill structures 128 within the first staircase region 200A can be removed by an etch process that etches the sacrificial fill material of the sacrificial first-tier support opening fill structures 128 selective to the materials of the first-tier alternating stack (132, 142) and the source-select-level conductive layer 118. For example, if the source-select-level conductive layer 118 include heavily doped silicon and if the sacrificial first-tier support opening fill structures 128 include amorphous undoped silicon, undoped polysilicon, or a silicon-germanium alloy, a wet etch process using hot trimethyl-2 hydroxyethyl ammonium hydroxide ("hot TMY") or tetramethyl ammonium hydroxide (TMAH) may be used to remove the sacrificial first-tier support opening fill structures 128. Volumes of a first subset of the first-tier support openings 129 become empty within the first staircase region 200A, while volumes of a second subset of the first-tier support openings 129 within the second staircase region 200B are filled with a remaining subset of the sacrificial first-tier support opening fill structures 128. Portions of the sacrificial dielectric liners 127 can be removed from the first subset of the first-tier support openings 129.

Figure 28:
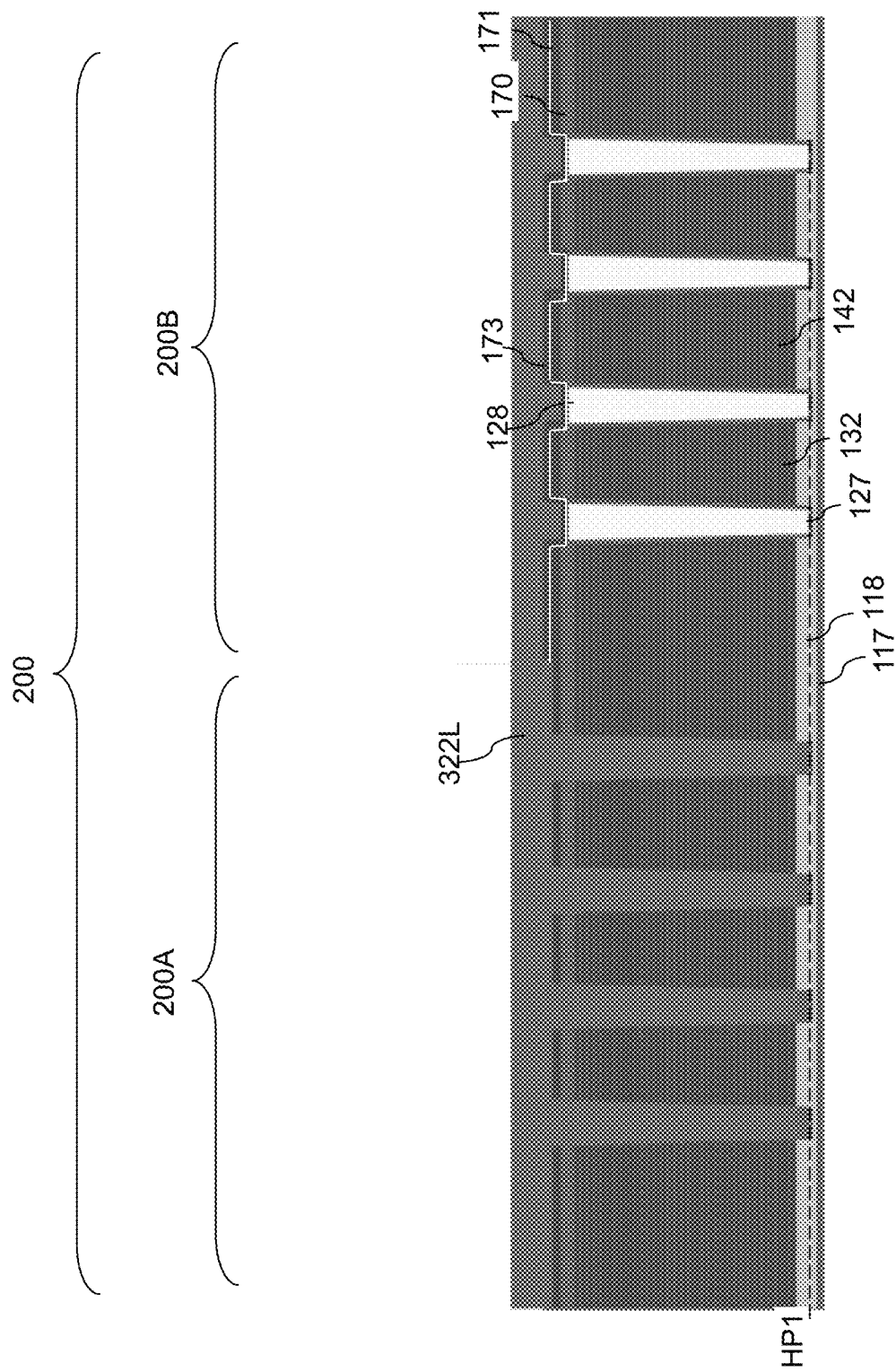
FIG. 28 is a vertical cross-sectional view of the staircase region of the second exemplary structure after deposition of a dielectric fill material layer in a first subset of the first-tier support openings according to an embodiment of the present disclosure.

Referring to FIG. 28, a dielectric fill material, such as undoped silicate glass or a doped silicate glass, can be deposited in the empty volumes of the first-tier support openings 129 within the first staircase region 200A and over the cover silicon nitride layer 173 to form a continuous dielectric fill material layer 322L.

Figure 29:
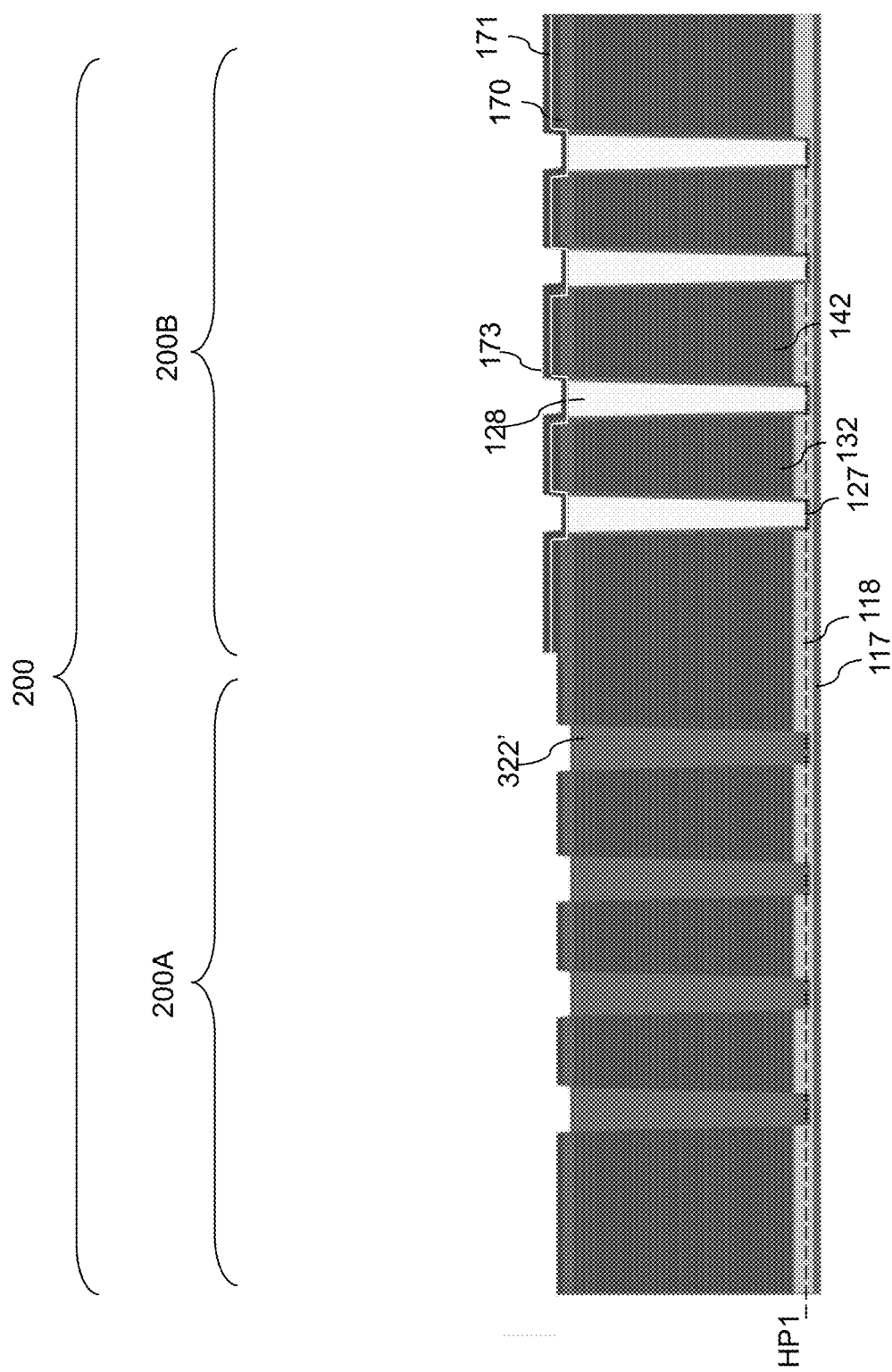
FIG. 29 is a vertical cross-sectional view of the staircase region of the second exemplary structure after formation of in-process dielectric support pillar structures according to an embodiment of the present disclosure.

Referring to FIG. 29, the dielectric fill material is etched back, for example, by a recess etch. Each remaining portion of the dielectric fill material in the first-tier support openings 129 constitutes an in-process dielectric support pillar structure 322'. A first subset of the sacrificial first-tier support opening fill structures 128 is replaced with the in-process dielectric support pillar structures 322'. The in-process dielectric support pillar structures 322' are dielectric support pillar structure that are subsequently used as support pillar structures during replacement of the first sacrificial material layers 142 with first electrically conductive layers. The in-process dielectric support pillar structures 322' are in-process structures, i.e., a structure that is modified during a subsequent processing step. The in-process dielectric support pillar structures 322' are formed through the first-tier alternating stack (132, 142) in the first staircase region 200A. Each first-tier dielectric support pillar structure 322' can have a top surface above the horizontal plane including the bottom surface of the first insulating cap layer 170.

Figure 30:
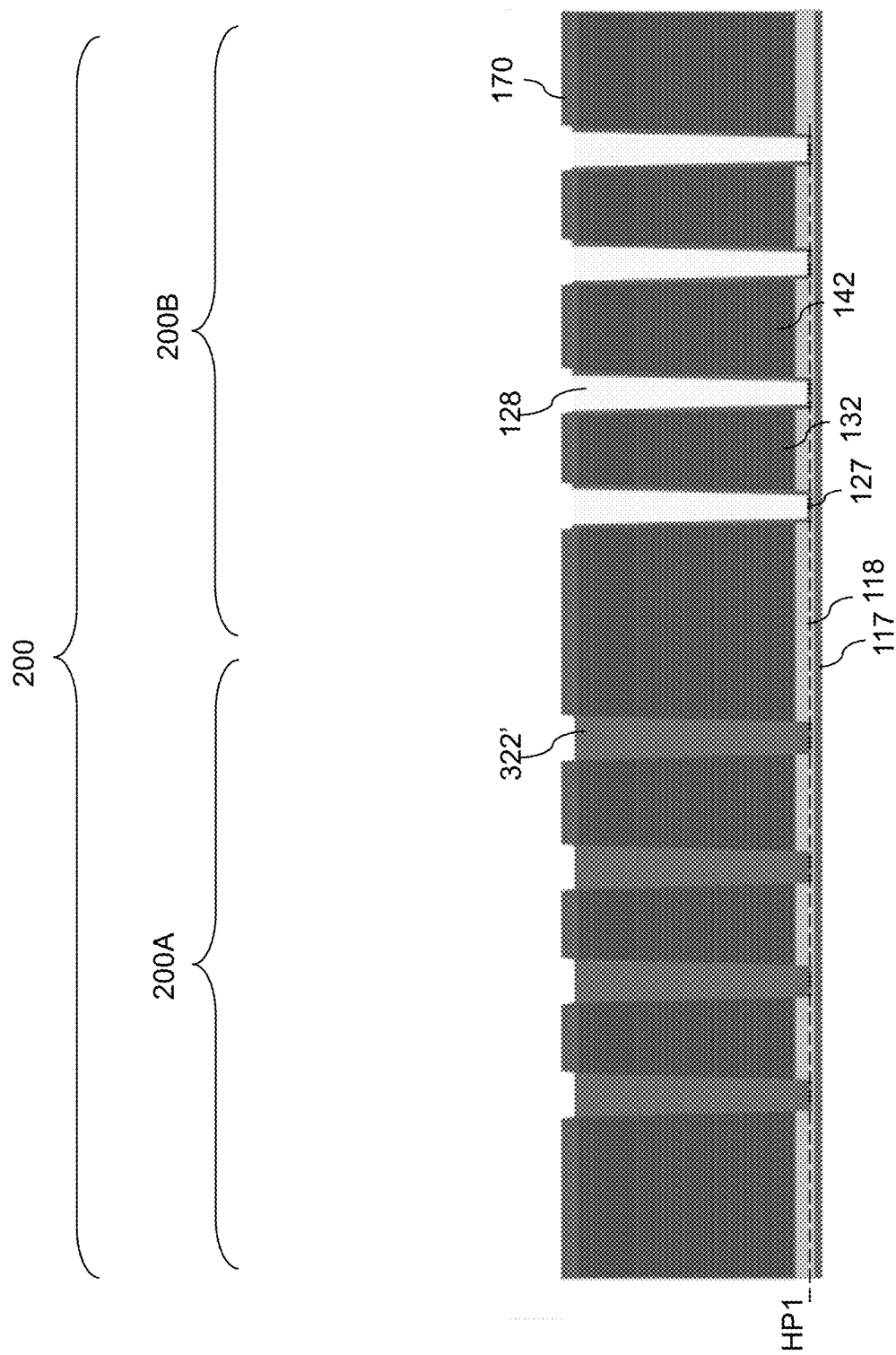
FIG. 30 is a vertical cross-sectional view of the staircase region of the second exemplary structure after removal of the dielectric mask layer according to an embodiment of the present disclosure.

Referring to FIG. 30, the cover silicon nitride layer 173 and the patterned dielectric mask layer 171 can be removed from above the first insulating cap layer 170, for example, by a wet etch process using hot phosphoric acid.

Figure 31:
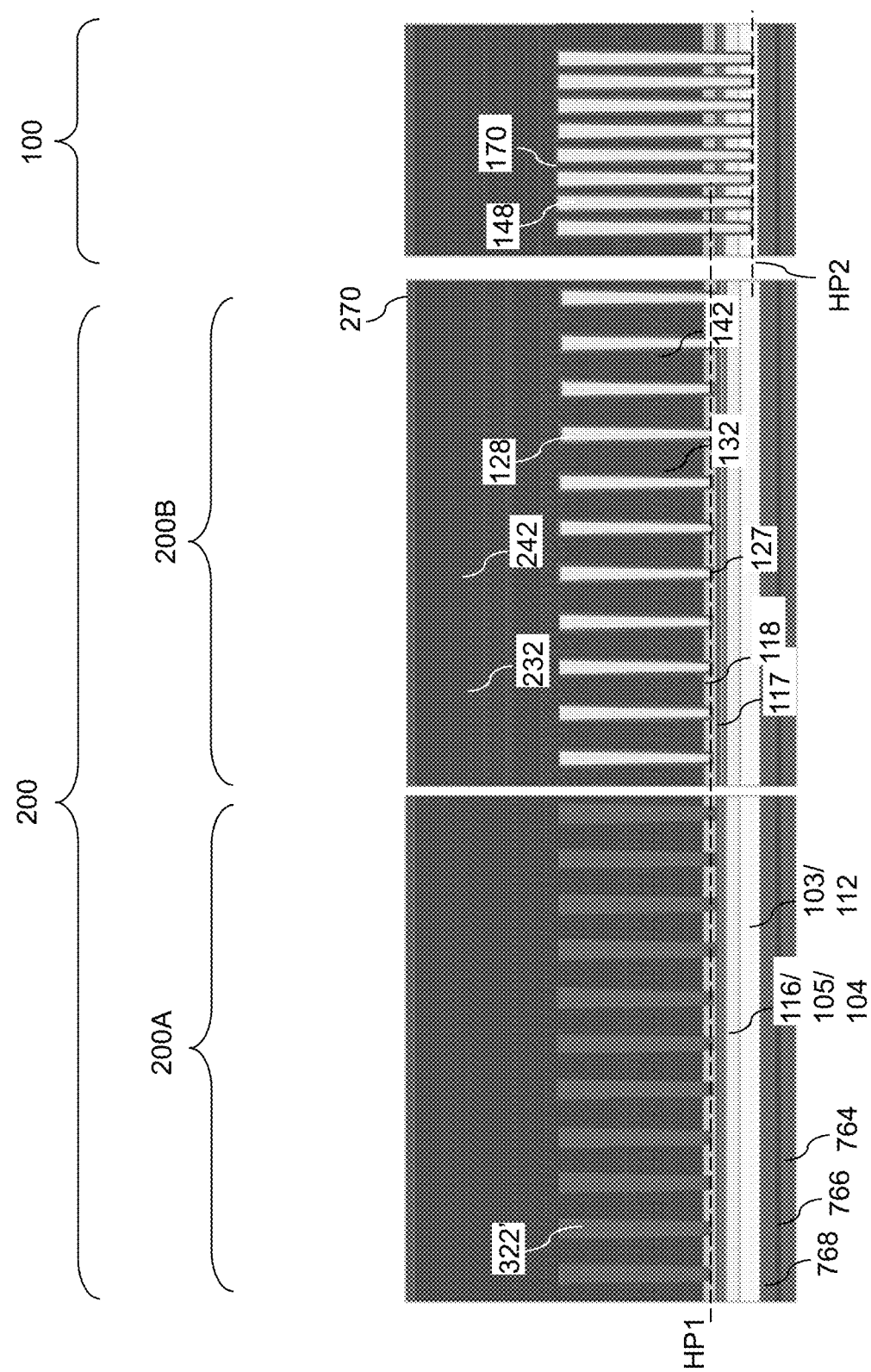
FIG. 31 is a vertical cross-sectional view of the second exemplary structure after formation of a second-tier alternating stack of second insulating layers and second sacrificial material layers according to an embodiment of the present disclosure.

Referring to FIG. 31, the processing steps of FIG. 6 can be performed without patterning the second-tier alternating stack (232, 242). In other words, processing steps for forming stepped surfaces on the second-tier alternating stack (232, 242) are omitted, and processing steps for forming a second retro-stepped dielectric material portion 265 are omitted. Instead, each layer within the second-tier alternating stack (232, 242) and the second insulating cap layer 270 are formed as unpatterned blanket layers.

Figure 32:
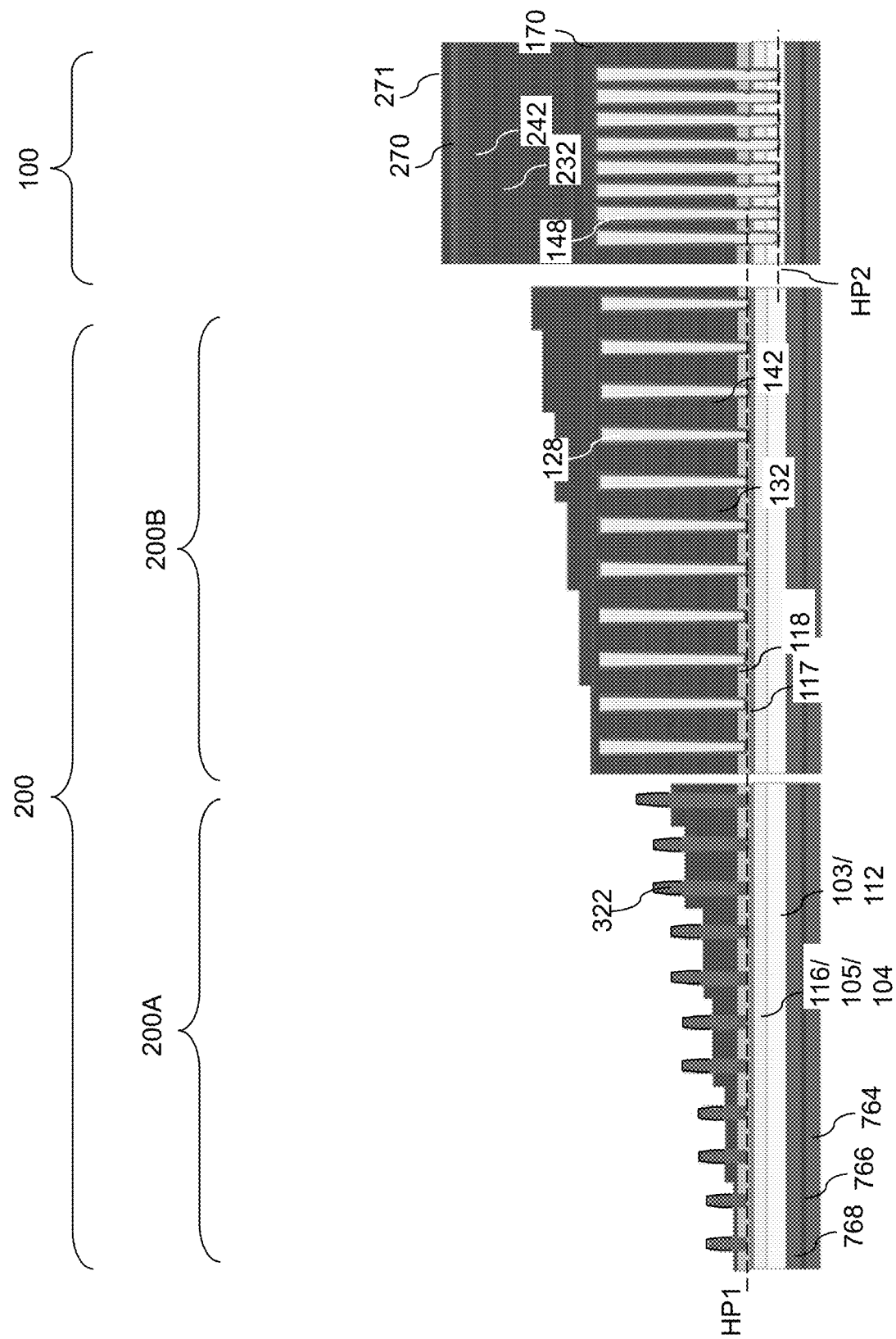
FIG. 32 is a vertical cross-sectional view of the second exemplary structure after formation of first stepped surfaces and second stepped surfaces according to an embodiment of the present disclosure.

Referring to FIG. 32, stepped surfaces are formed in the staircase region 200 by applying a trimmable etch mask layer over the over the second-tier alternating stack (232, 242), forming an opening within a portion of the staircase region 200 that is distal from the memory array region 100, and iteratively repeating an anisotropic etch process that etches at least one pair of an insulating layer (132, 232) and a spacer material layer (such as one of the sacrificial material layers (142, 242)) within the first-tier alternating stack (132, 142) and the second-tier alternating stack (232, 242) and a trimming process that trims a lateral extent of the trimmable etch mask layer. The trimmable etch mask layer includes a material that can be isotropically etched at a controlled etch rate. The trimmable etch mask layer can include a carbon-based material with an additive that reduces the trimming rate to provide an isotropic controlled trimming process. The iterative repetition of the anisotropic etch process and the trimming process iteratively etches pairs of a sacrificial material layer (242, 142) and an insulating layer (232, 132) and expands the lateral extent of the opening in the trimmable mask layer. The second-tier alternating stack (232, 242) and the first-tier alternating stack (132, 142) are patterned to form first stepped surfaces on the first-tier alternating stack (132, 142) and second stepped surfaces on the second-tier alternating stack (232, 242).

The in-process dielectric support pillar structures 322' are collaterally recessed vertically during etching of the first insulating layers 132 and the first sacrificial material layers 142. Specifically, the in-process dielectric support pillar structures 322' are partially etched during a subset of the anisotropic etch processes that is performed after the in-process dielectric support pillar structures 322' are physically exposed. The in-process dielectric support pillar structures 322' are vertically recessed by different etch distances. Remaining portions of the in-process dielectric support pillar structures 322' form dielectric support pillar structures 322 comprising at least one dielectric material. The dielectric support pillar structures 322 extend through the first-tier alternating stack (132, 142) and have different heights.

In one embodiment, the dielectric support pillar structures 322 can have a variable height that decreases with a lateral distance from the memory array region 100. In one embodiment, each dielectric support pillar structure 322 can have a lesser height than top surfaces of the sacrificial first-tier memory opening fill structures 128. In one embodiment, each dielectric support pillar structure 322 can be located below a horizontal plane including a bottom surface of the first insulating cap layer 170 and a top surface of a topmost layer of the first-tier alternating stack (132, 142).

Figure 33:
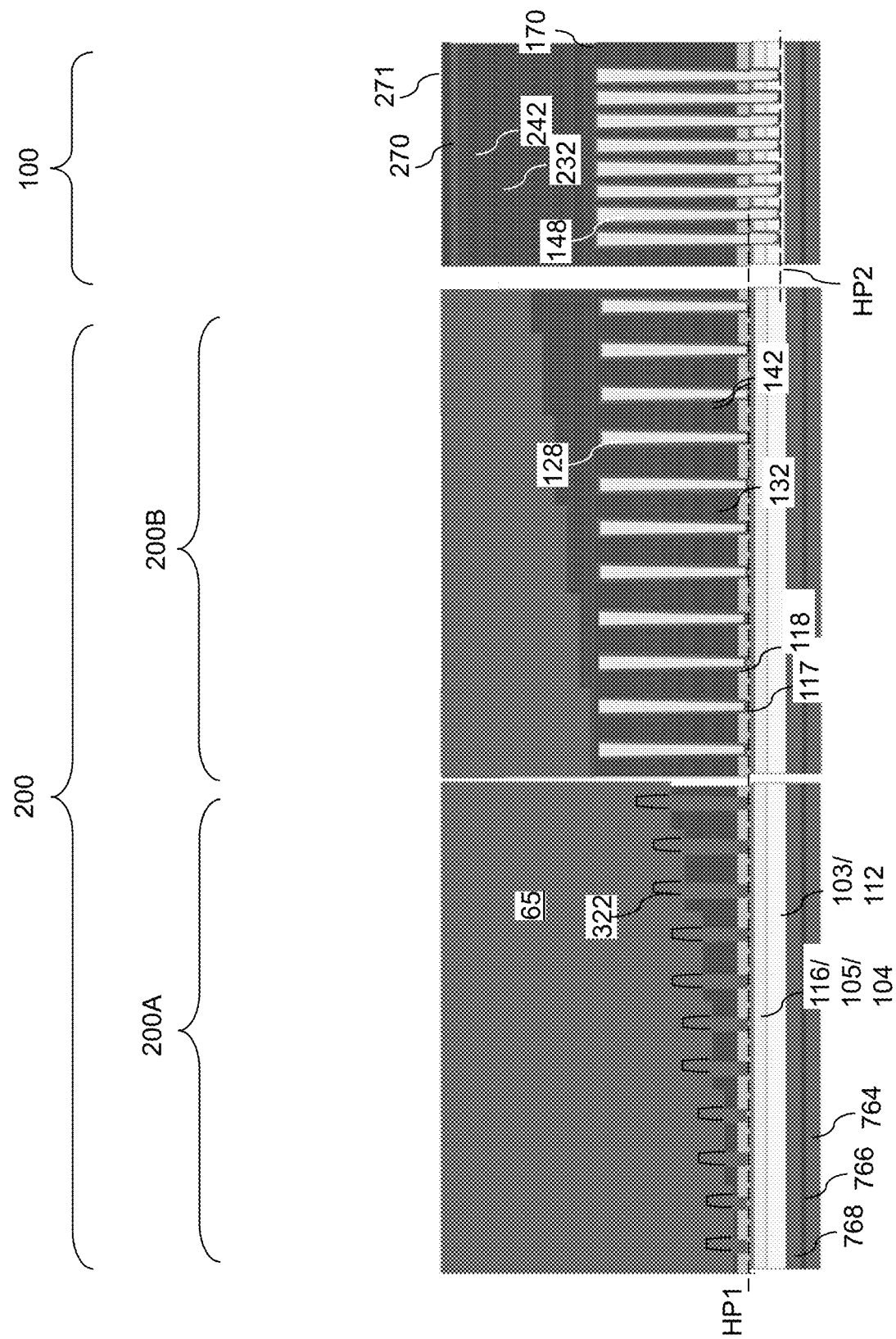
FIG. 33 is a vertical cross-sectional view of the second exemplary structure after formation of a retro-stepped dielectric material portion according to an embodiment of the present disclosure.

Referring to FIG. 33, a retro-stepped dielectric material portion 65 can be formed by depositing a dielectric material over the stepped surfaces. The stepped surfaces of the retro-stepped dielectric material portion 65 can continuously extend from a bottommost layer of the first-tier alternating stack (132, 142) to a topmost layer of the second-tier alternating stack (232, 242). The retro-stepped dielectric material portion 65 includes a planarizable dielectric material such as a silicate glass. The material of the retro-stepped dielectric material portion 65 may be the same as, or may be different from, the material of the dielectric support pillar structures 322. In one embodiment, the dielectric support pillar structures 322 can include undoped silicate glass, and the retro-stepped dielectric material portion 65 can include a doped silicate glass or undoped silicate glass. The retro-stepped dielectric material portion 65 can have a homogeneous composition throughout. The retro-stepped dielectric material portion 65 is formed over the first stepped surfaces on the first-tier alternating stack (132, 142) and the second stepped surfaces on the second-tier alternating stack (232, 242). The retro-stepped dielectric material portion 65 contacts the dielectric support pillar structures 322.

Figure 34:
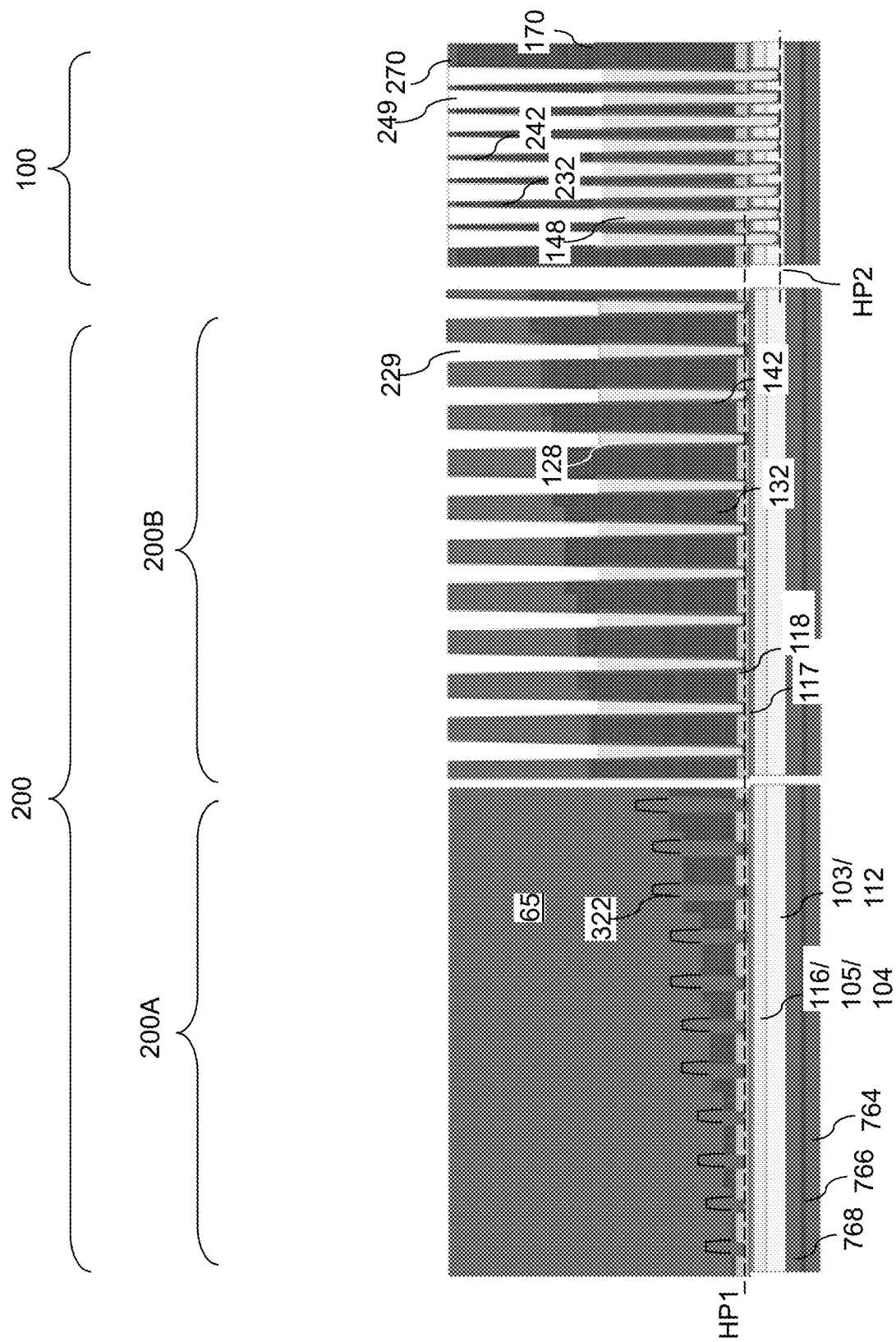
FIG. 34 is a vertical cross-sectional view of the second exemplary structure after formation of second-tier memory openings and second-tier support openings according to an embodiment of the present disclosure.

Referring to FIG. 34, the processing steps of FIGS. 7A and 7B can be performed to form second-tier memory openings 249 over the sacrificial first-tier memory opening fill structures 148 and to form second-tier support openings 229 over the sacrificial first-tier support opening fill structures 128. The pattern of the second-tier support openings 229 can be modified from the pattern of the second-tier support openings 229 at the processing steps of FIGS. 7A and 7B such that the second-tier support openings 229 are formed only in the second staircase region 200B and are not formed in the first staircase region 200A.

Figure 35:
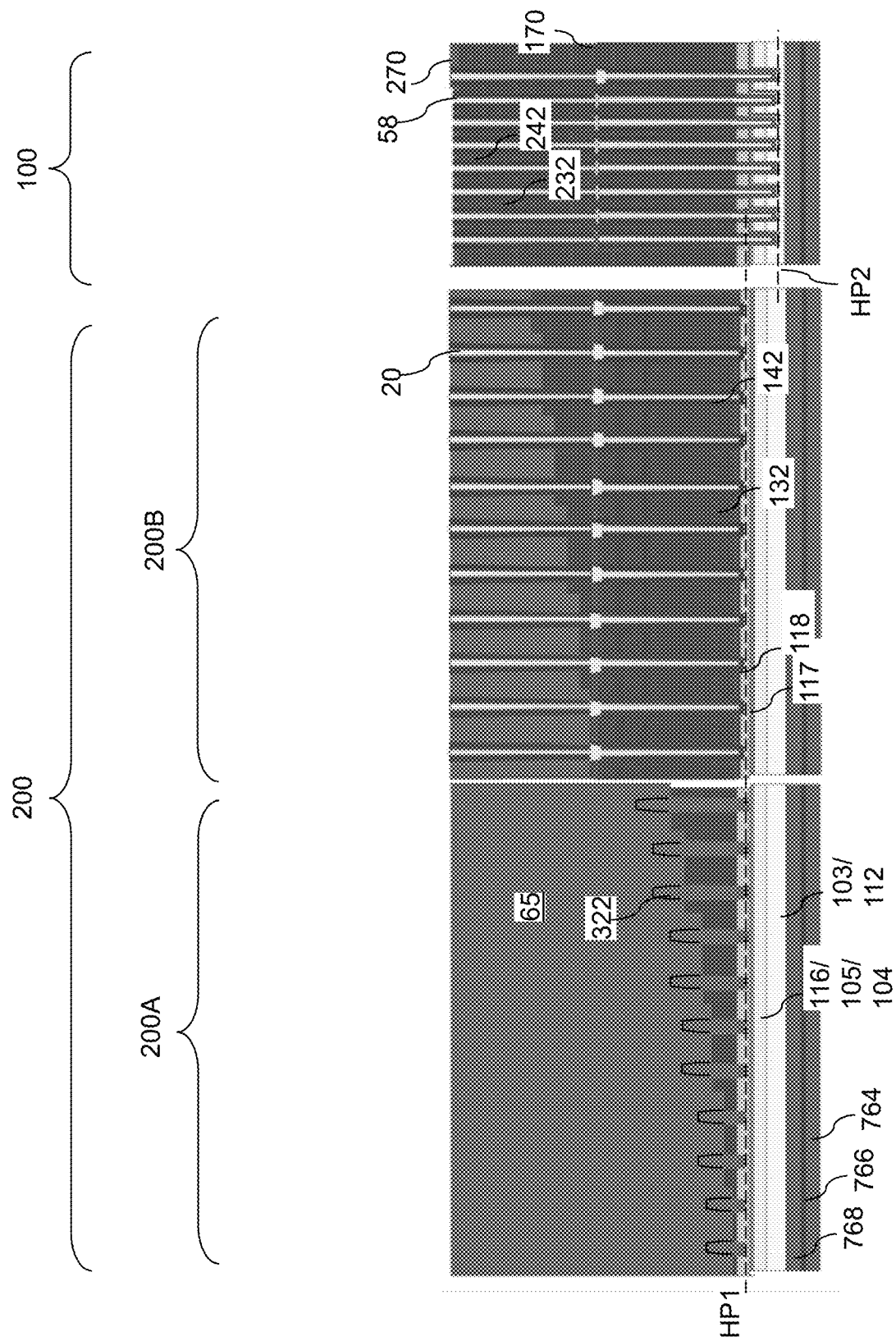
FIG. 35 is a vertical cross-sectional view of the second exemplary structure after formation of memory opening fill structures and composite support pillar structures according to an embodiment of the present disclosure.

Referring to FIG. 35, the processing steps of FIGS. 8 and 9A-9D can be performed. The sacrificial first-tier support opening fill structures 128 can be removed underneath the second-tier support openings 229 in the second staircase region 200B to form support openings, which are also referred to as inter-tier support openings. The inter-tier support openings can extend through the retro-stepped dielectric material portion 65, a region of the second-tier alternating stack (232, 242) that underlie the second stepped surfaces, and the first-tier alternating stack (132, 142). The sacrificial first-tier memory opening fill structures 148 can be removed underneath the second-tier memory openings 249 in the memory array region 100 to form memory openings, which are also referred to as inter-tier memory openings. Portions of the sacrificial dielectric liners 127 can be removed from the second subset of the first-tier support openings 129 and from the first-tier memory openings 149.

Memory opening fill structures 58 and support pillar structures 20 can be formed as in the first embodiment. Each support pillar structure 20 can include a memory film 50, a vertical semiconductor channel 60 (which is a dummy vertical semiconductor channel that is not electrically active) an optional dielectric core 62, and a drain region 63 (which is a dummy drain region that is not electrically active). The support pillar structures 20 include multiple material portions having different compositions, and are herein referred to as composite support pillar structures.

Memory opening fill structures 58 are formed in the inter-tier memory openings 49 and the support pillar structures 20 (i.e., the composite support pillar structures) are formed in the inter-tier support openings 19 simultaneously. Each of the memory opening fill structures 58 comprises a respective one of the memory stack structures 55. The memory stack structures 55 vertically extend through each layer of the first-tier alternating stack (132, 142) and the second-tier alternating stack (232, 242) in a memory array region 100. The support pillar structures 20 are formed through the first-tier alternating stack (132, 142) and the second stepped surfaces. Each of the support pillar structures 20 comprises a respective semiconductor material portion, i.e., a vertical semiconductor channel 60 that is not electrically active.

Figure 36:
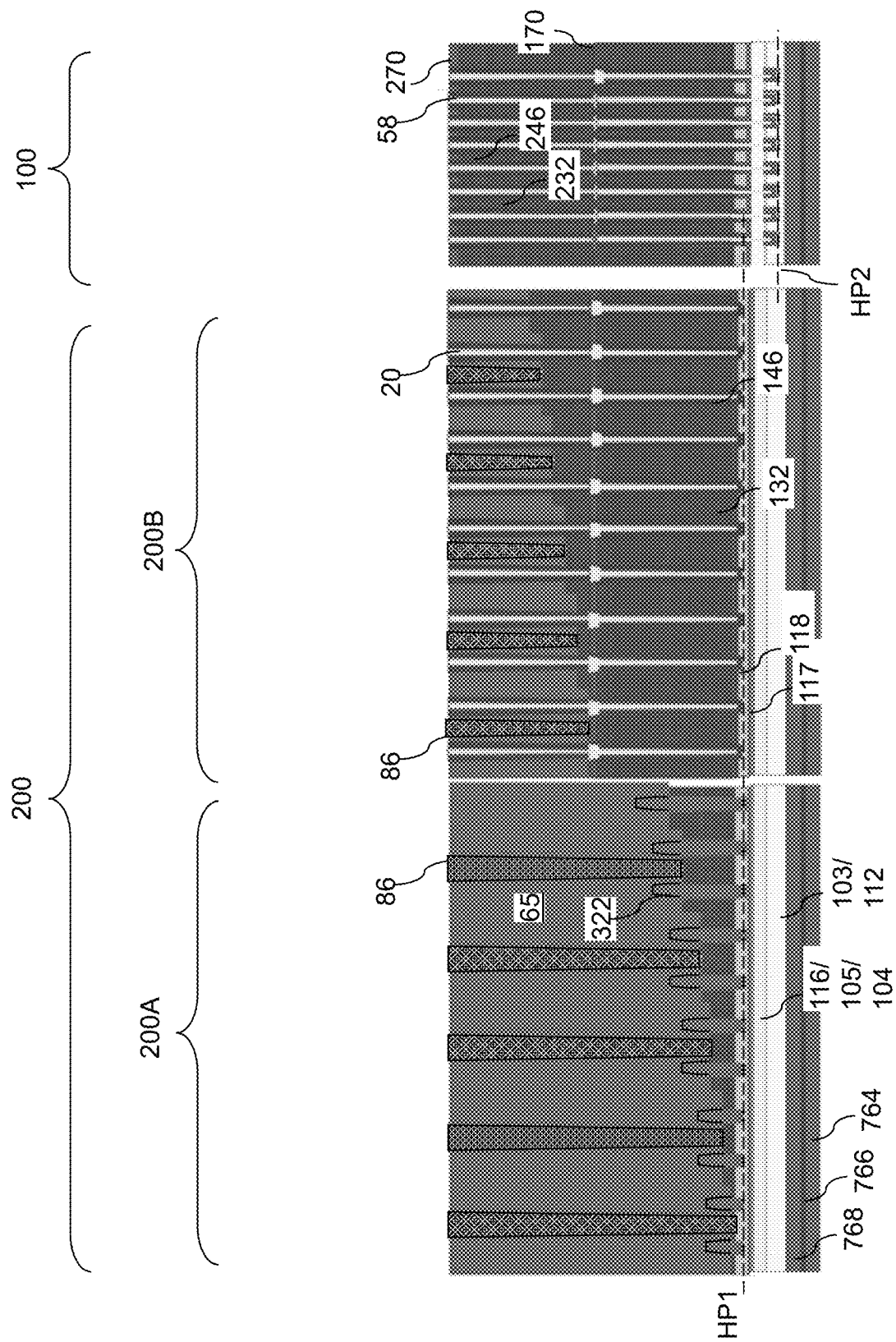
FIG. 36 is a vertical cross-sectional view of the second exemplary structure after formation of word line contact via structures according to an embodiment of the present disclosure.

Referring to FIG. 36, subsequent processing steps of the first embodiment can be performed. Remaining portions of the first spacer material layers (such as the first sacrificial material layers 142) and the second spacer material layers (such as the second sacrificial material layer 242) are replaced with first electrically conductive layers 146 and second electrically conductive layers 246. The combination of the support pillar structures 20 and the dielectric support pillar structures 322 provide structural support during replacement of the sacrificial material layers (142, 242) with electrically conductive layers (146, 246). Staircase-region contact via structures 86 can be subsequently formed on a respective one of the electrically conductive layers (146, 246). Word line contact via structures 86 can be formed on a top surface of a respective one of the first electrically conductive layers 146 and the second electrically conductive layers 246.

Referring to FIGS. 1A-36 and according to various embodiments of the present disclosure, a three-dimensional semiconductor device is provided, which comprises: a first-tier alternating stack (132, 146) of first insulating layers 142 and first electrically conductive layers 146 located over a substrate 8; a second-tier alternating stack (232, 246) of second insulating layers 232 and second electrically conductive layers 246 located over the first-tier alternating stack (132, 146); a memory array region 100 including memory stack structures 55 that vertically extend through each layer of the first-tier alternating stack (132, 146) and the second-tier alternating stack (232, 246); a staircase region 200 including first stepped surfaces of the first-tier alternating stack (132, 146) and second stepped surfaces of the second-tier alternating stack (232, 246); dielectric support pillar structures 322 consisting essentially of at least one dielectric material and extending through the first-tier alternating stack (132, 146) and not extending through any layer of the second-tier alternating stack (232, 246); and composite support pillar structures 20 comprising a semiconductor material portion (such as a vertical semiconductor channel 60) and extending through all layers of the first-tier alternating stack (132, 146) and through the second stepped surfaces.

As used herein, dielectric support pillar structures 322 consisting essentially of at least one dielectric material means that the dielectric support pillar structures 322 have less than 5 volume percent of a semiconductor phase, such as 0 to 0.5 volume percent of a semiconductor phase, an contain 95 to 100 volume percent of a dielectric material. It should be noted that silicon atoms in silicon oxide or silicon nitride dielectric material do not constitute a separate semiconductor phase.

A retro-stepped dielectric material portion 65 can overlie, and contact, the first stepped surfaces and the second stepped surfaces. The composite support pillar structures 20 extend through the retro-stepped dielectric material portion 65.

In one embodiment, each of the composite support pillar structures 20 has a top surface within a same horizontal plane that overlies a topmost layer of the second-tier alternating stack (232, 246). For example, the top surfaces of the composite support pillar structures 20 can be within a same horizontal plane as the top surface of the retro-stepped dielectric material portion 65 and the top surface of the second insulating cap layer 270 that overlies the second-tier alternating stack (232, 246).

In one embodiment, the dielectric support pillar structures 322 have different heights that decrease with a lateral distance from the memory array region 100. In one embodiment, each of the dielectric support pillar structures 322 protrudes above the first stepped surfaces and includes a respective upper portion that is laterally surrounded by the retro-stepped dielectric material portion 65.

In one embodiment, the three-dimensional semiconductor device comprises first word line contact via structures 86 extending through the retro-stepped dielectric material portion 65 and contacting a respective one of the first electrically conductive layers 146, and second word line contact via structures 86 extending through the retro-stepped dielectric material portion 65 and contacting a respective one of the second electrically conductive layers 246.

In one embodiment, the retro-stepped dielectric material portion 65 continuously extends from a surface of a bottommost insulating layer (i.e., the bottommost one of the first insulating layers 132) within the first-tier alternating stack (132, 146) to a surface of a topmost insulating layer (i.e., a topmost one of the second insulating layers 232) within the second-tier alternating stack (232, 246), has a homogeneous composition throughout, has a top surface located at, or overlies, a topmost surface of the second-tier alternating stack (232, 246), overlies the dielectric support pillar structures 322, and laterally surrounds the composite support pillar structures 20.

In one embodiment, bottom surfaces of the dielectric support pillar structures 322 and bottom surfaces of the composite support pillar structures 20 are located within a first horizontal plane HP1. In one embodiment, bottom portions of the memory stack structures 55 contact a source contact layer 114 that underlie the first horizontal plane HP1.

In one embodiment, each of the memory stack structures 55 comprises a respective memory film 50 and a respective vertical semiconductor channel 60. In one embodiment, each of the memory films 50 comprises a layer stack including a charge storage layer 54 and a tunneling dielectric 56, and each of the composite support pillar structures 20 comprises a layer stack including a first dielectric material layer having a same composition and a same thickness as the charge storage layer 54 and a second dielectric material layer having a same composition and a same thickness as the tunneling dielectric 56. In one embodiment, the semiconductor material portion of each of the composite support pillar structure 20 comprises a semiconductor material having a same material composition as the vertical semiconductor channels 60.

In one embodiment, the three-dimensional semiconductor device comprises an insulating cap layer (such as the first insulating cap layer 170) located between the first-tier alternating stack (132, 146) and the second-tier alternating stack (232, 246). The first-tier memory openings 149 and the first-tier support openings 129 can have straight tapered sidewalls. Alternatively, the sidewalls of the first insulating cap layer 170 can be laterally recessed selective to the materials of the first insulating layers 132 and the first sacrificial material layers 142 around each first-tier memory opening 149 and around each first-tier support opening 129 after the processing steps of FIG. 21. For example, the first insulating cap layer 170 can include a doped silicate glass (such as borosilicate glass) and the first insulating layers 132 can include undoped silicate glass, and an isotropic etch process using dilute hydrofluoric acid can be performed to laterally expand the portions of the first-tier memory openings 149 and the first sacrificial openings 129 at the level of the first insulating cap layer 170. In this case, each of the memory stack structures 55 and the composite support pillar structures 322 has a greater lateral extent at a level of the insulating cap layer (such as the first insulating cap layer 170) than at a level of a topmost layer within the first-tier alternating stack (132, 146), and than at a level of a bottommost layer within the second-tier alternating stack (232, 246).

Referring to FIGS. 20A-36 and according to various embodiments of the present disclosure, a three-dimensional semiconductor device is provided, which comprises: a first-tier alternating stack (132, 146) of first insulating layers 142 and first electrically conductive layers 146 located over a substrate 8; a second-tier alternating stack (232, 246) of second insulating layers 232 and second electrically conductive layers 246 located over the first-tier alternating stack (132, 146); a memory array region 100 including memory stack structures 55 that vertically extend through each layer of the first-tier alternating stack (132, 146) and the second-tier alternating stack (232, 246); a staircase region 200 including first stepped surfaces of the first-tier alternating stack (132, 146) and second stepped surfaces of the second-tier alternating stack (232, 246); and first-tier dielectric support pillar structures 322 extending through portions of the first-tier alternating stack (132, 146) underlying the stepped surfaces, wherein a height of each of the dielectric support pillar structures 322 decreases with a lateral distance from the memory array region.

Figure 37:
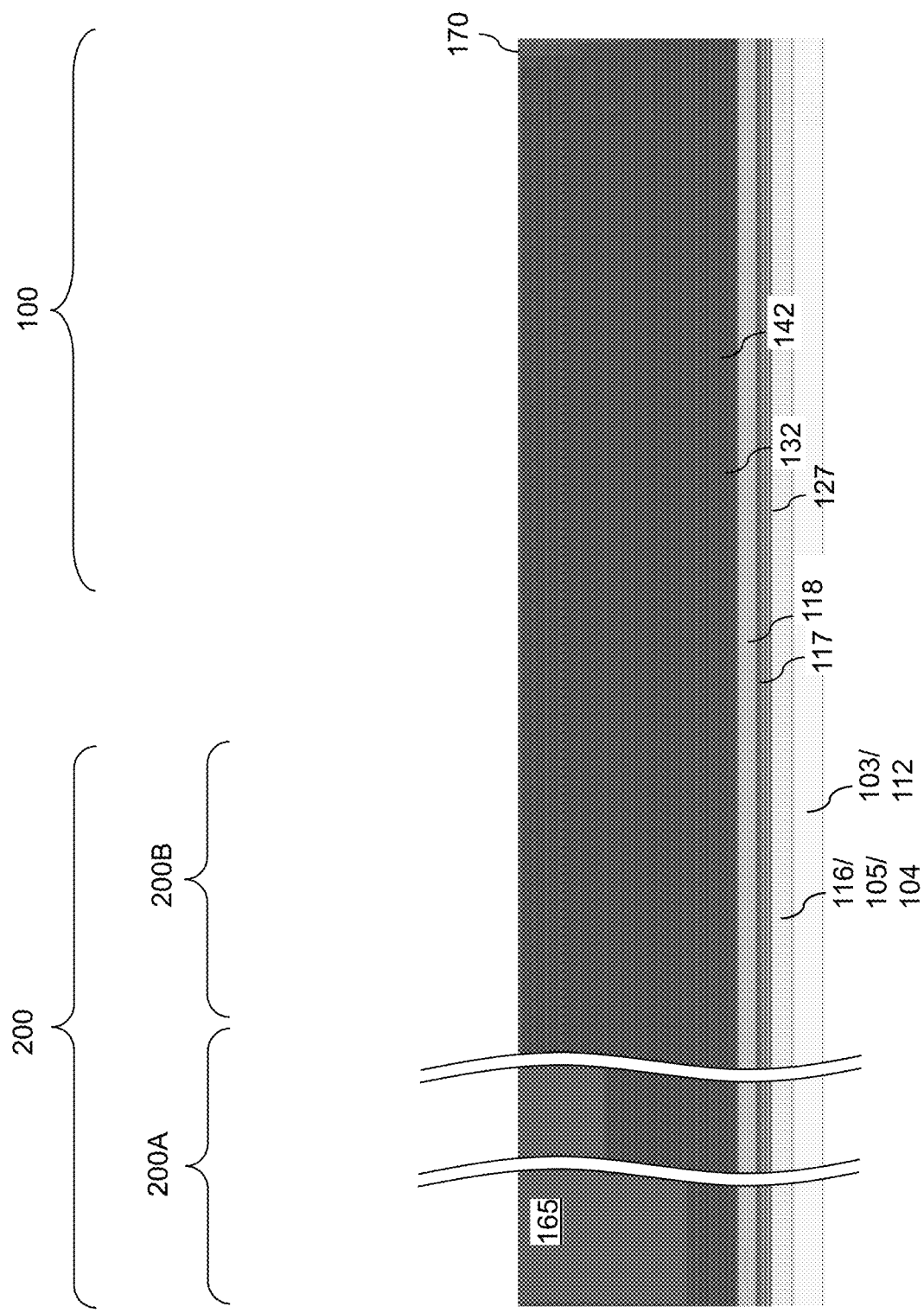
FIG. 37 is a vertical cross-sectional view of a third exemplary structure after formation of a first-tier alternating stack of first insulating layers and first sacrificial material layers, first stepped surfaces, and a first retro-stepped dielectric material portion according to an embodiment of the present disclosure.

Referring to FIG. 37, a third exemplary structure according to a third embodiment of the present disclosure may be the same as the first exemplary structure of FIG. 3. Generally, a first-tier alternating stack of first insulating layers 132 and first spacer material layers (such as first sacrificial material layers 142) is formed over a substrate 8 (illustrated in FIG. 1A). First stepped surfaces are formed by patterning the first-tier alternating stack (132, 142), and a first retro-stepped dielectric material portion 165 can be formed over the first stepped surfaces. The first retro-stepped dielectric material portion 165 is formed in a first staircase region 200A, which is a distal segment of the staircase region 200. A second staircase region 200, in which stepped surfaces of a second-tier alternating stack are to be subsequently formed, is provided between the first staircase region 200A and the memory array region 100. The inter-tier dielectric layer 180 of the first exemplary structure may, or may not, be present in the third exemplary structure of FIG. 37.

Figure 38:
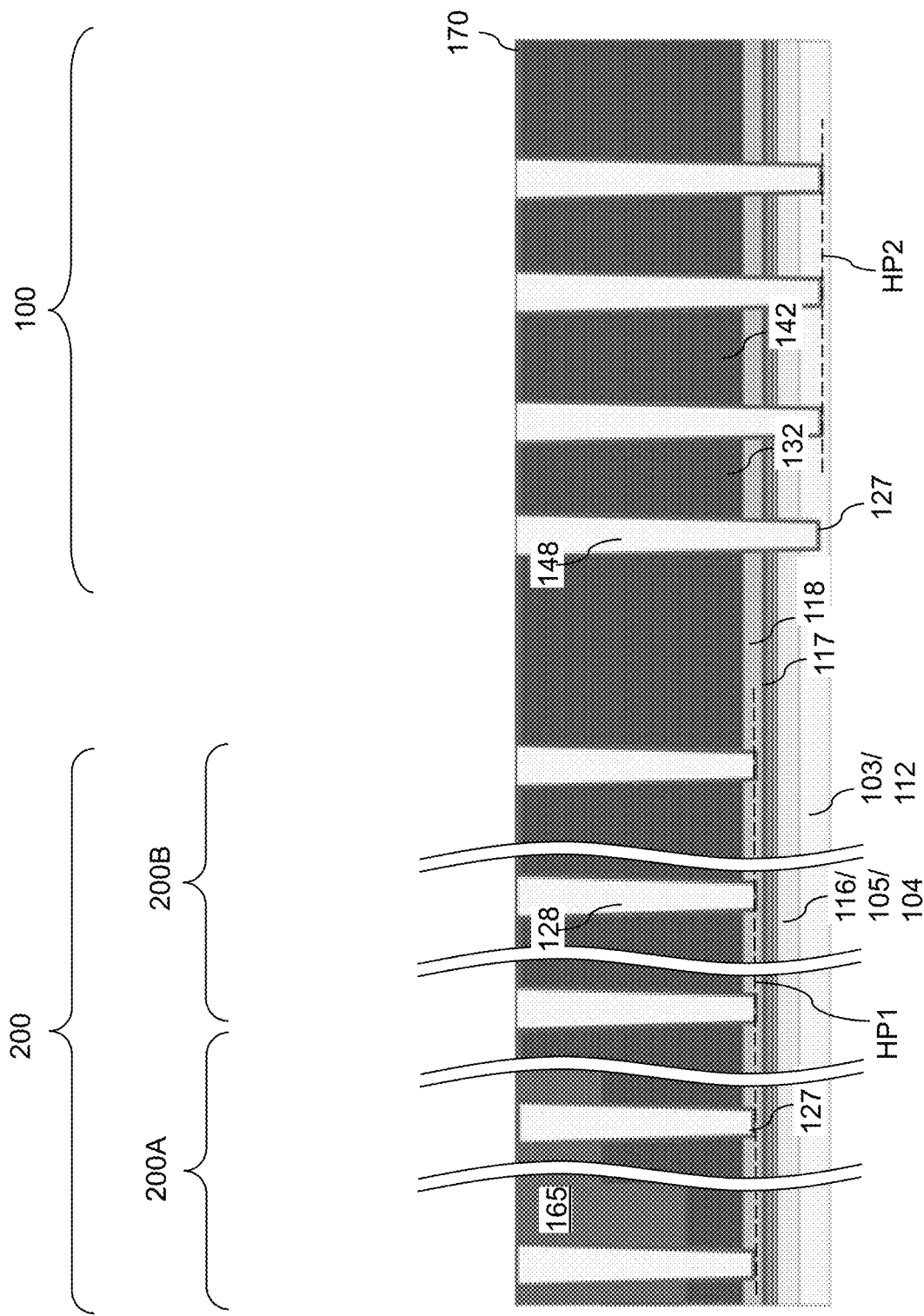
FIG. 38 is a vertical cross-sectional view of the third exemplary structure after formation of sacrificial first-tier memory opening fill structures and sacrificial first-tier support opening fill structures according to an embodiment of the present disclosure.

Referring to FIG. 38, the processing steps of FIGS. 20A and 20B, 21, and 22 can be performed to form first-tier memory openings 149 and first-tier support openings 129, and to form sacrificial first-tier memory opening fill structures 148 in the first-tier memory openings 149 and to form sacrificial first-tier support opening fill structures 128 in the first-tier support openings 129. In one embodiment, the anisotropic etch process can be continued until the bottom surfaces of the support openings 129 reach a first horizontal plane HP1 located at a level of the source-select-level conductive layer 118 and the bottom surfaces of the first-tier memory openings 149 reach a second horizontal plane HP2 located at a level of the lower source-level semiconductor layer 112. A sacrificial dielectric liner 127 can be located at a periphery and at a bottom of each first-tier memory opening 149 and each first-tier support opening 129, and can laterally surround a respective one of the sacrificial first-tier memory opening fill structures 148 and the sacrificial first-tier support opening fill structures 128.

A first subset of the sacrificial first-tier support opening fill structures 128 is formed through the first retro-stepped dielectric material portion 165 and the first stepped surfaces of the first-tier alternating stack (132, 142) in the first staircase region 200A, and a second subset of the sacrificial first-tier support opening fill structures 128 is formed through the first-tier alternating stack (132, 232) in the second staircase region 200B. The second subset of the sacrificial first-tier support opening fill structures 128 is formed through the first-tier alternating stack (132, 142) without extending through the first retro-stepped dielectric material portion 165, and is laterally spaced from the first retro-stepped dielectric material portion 165.

Figure 39:
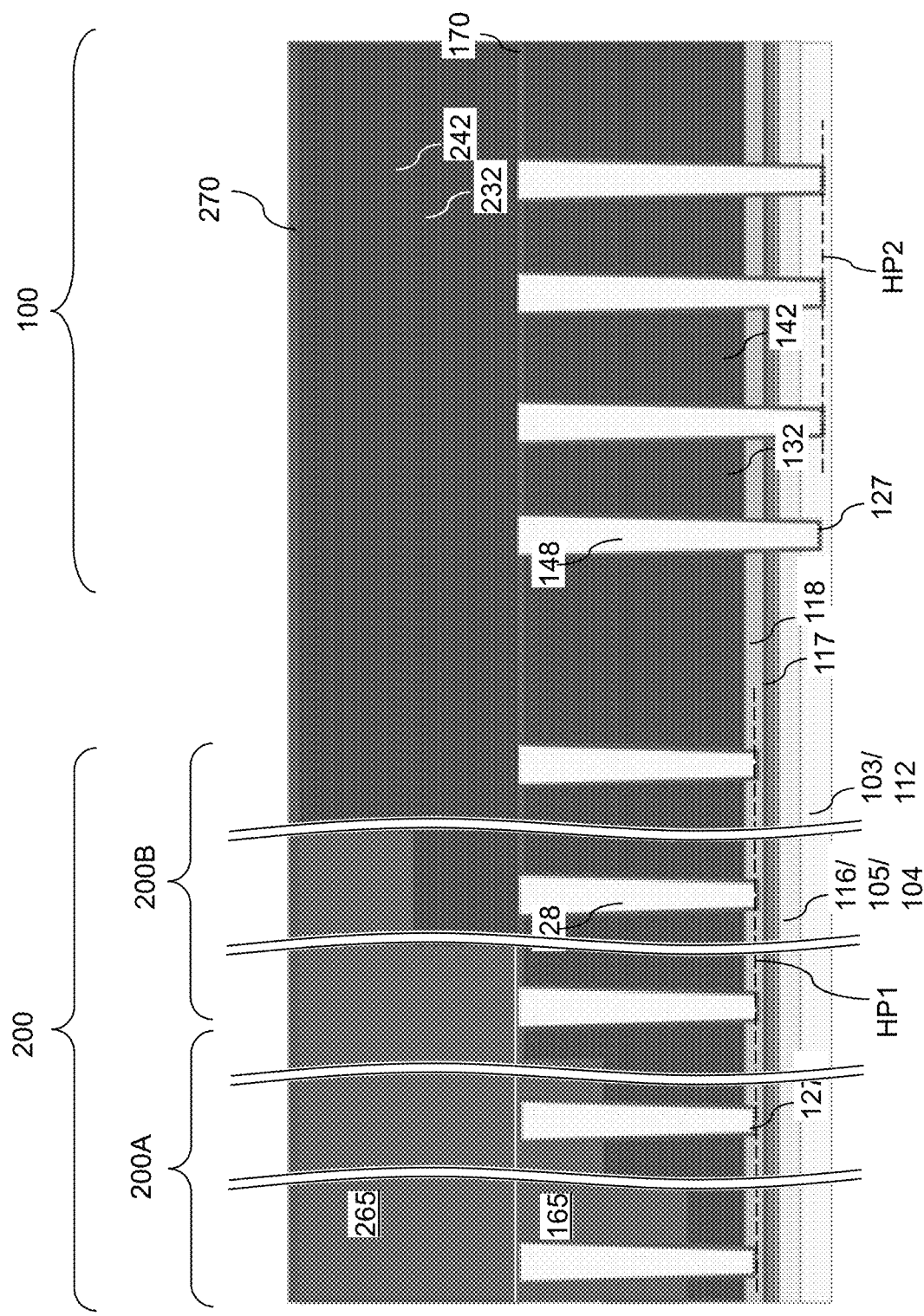
FIG. 39 is a vertical cross-sectional view of the third exemplary structure after formation of a second-tier alternating stack of second insulating layers and second sacrificial material layers, second stepped surfaces, and a second retro-stepped dielectric material portion according to an embodiment of the present disclosure.

Referring to FIG. 39, the processing steps of FIG. 6 can be performed to form a second-tier alternating stack of second insulating layers 232 and second sacrificial material layers 242, to form a second insulating cap layer over the second-tier alternating stack (232, 242), to pattern stepped surfaces in the second staircase region 200B, and to form a second retro-stepped dielectric material portion 265.

Figure 40:
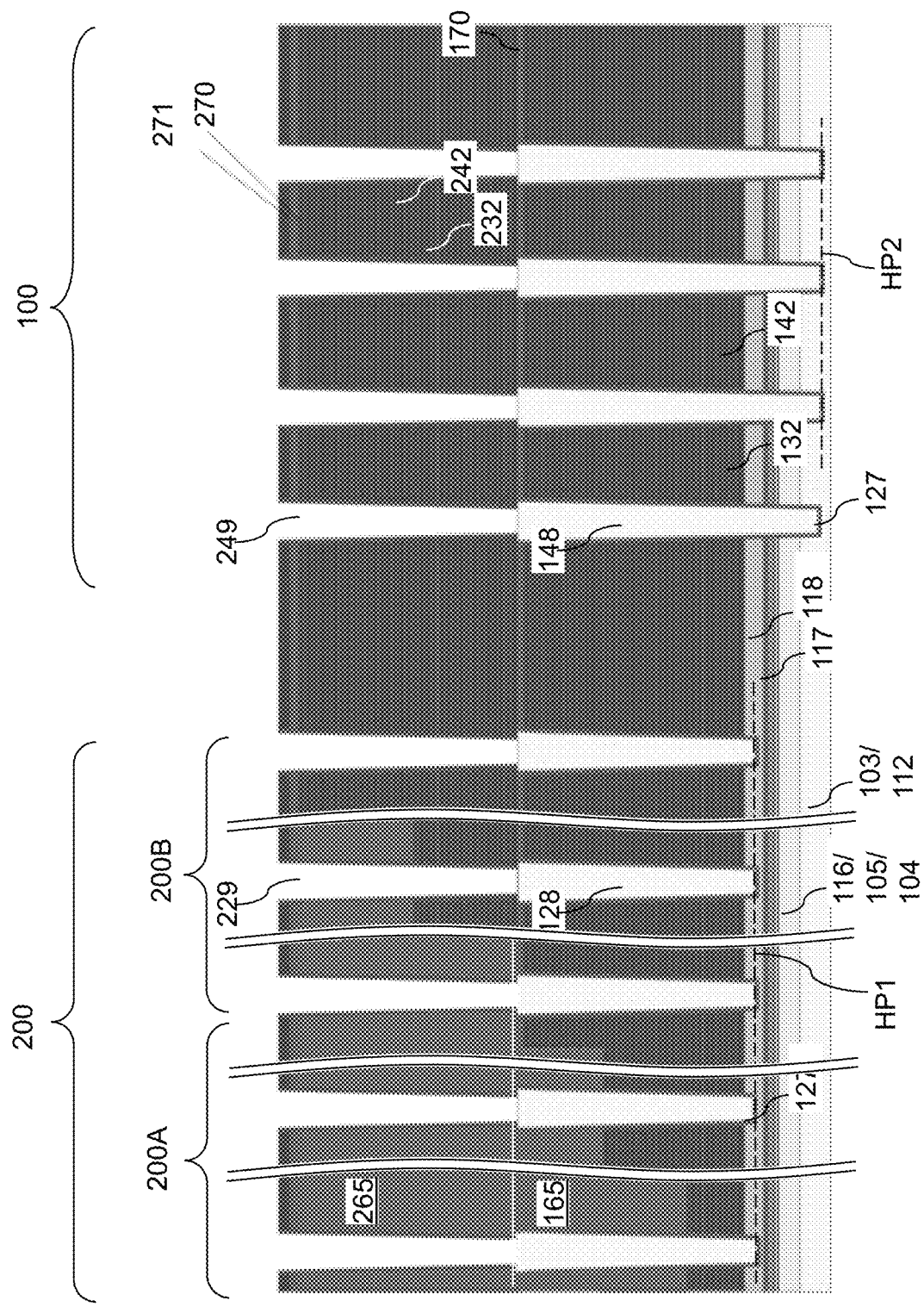
FIG. 40 is a vertical cross-sectional view of the third exemplary structure after formation of second-tier memory openings and second-tier support openings according to an embodiment of the present disclosure.

Referring to FIG. 40, a dielectric mask layer 271 can be optionally formed over the second insulating cap layer 270 and the second retro-stepped dielectric material portion 265. The dielectric mask layer 271 can include silicon nitride. The thickness of the dielectric mask layer 271 can be in a range from 10 nm to 200 nm, although lesser and greater thicknesses can also be used. The processing steps of FIGS. 7A and 7B can be performed to form second-tier memory openings 249 and second-tier support openings 229. The steps of the anisotropic etch process used to form the second-tier memory openings 249 and second-tier support openings 229 may be modified to etch through the dielectric mask layer 271 in case the dielectric mask layer 271 is present. Each second-tier memory opening 249 is formed over a respective one of the sacrificial first-tier memory opening fill structures 148, and each second-tier support opening 229 is formed over a respective one of the sacrificial first-tier support opening fill structures 128.

Figure 41:
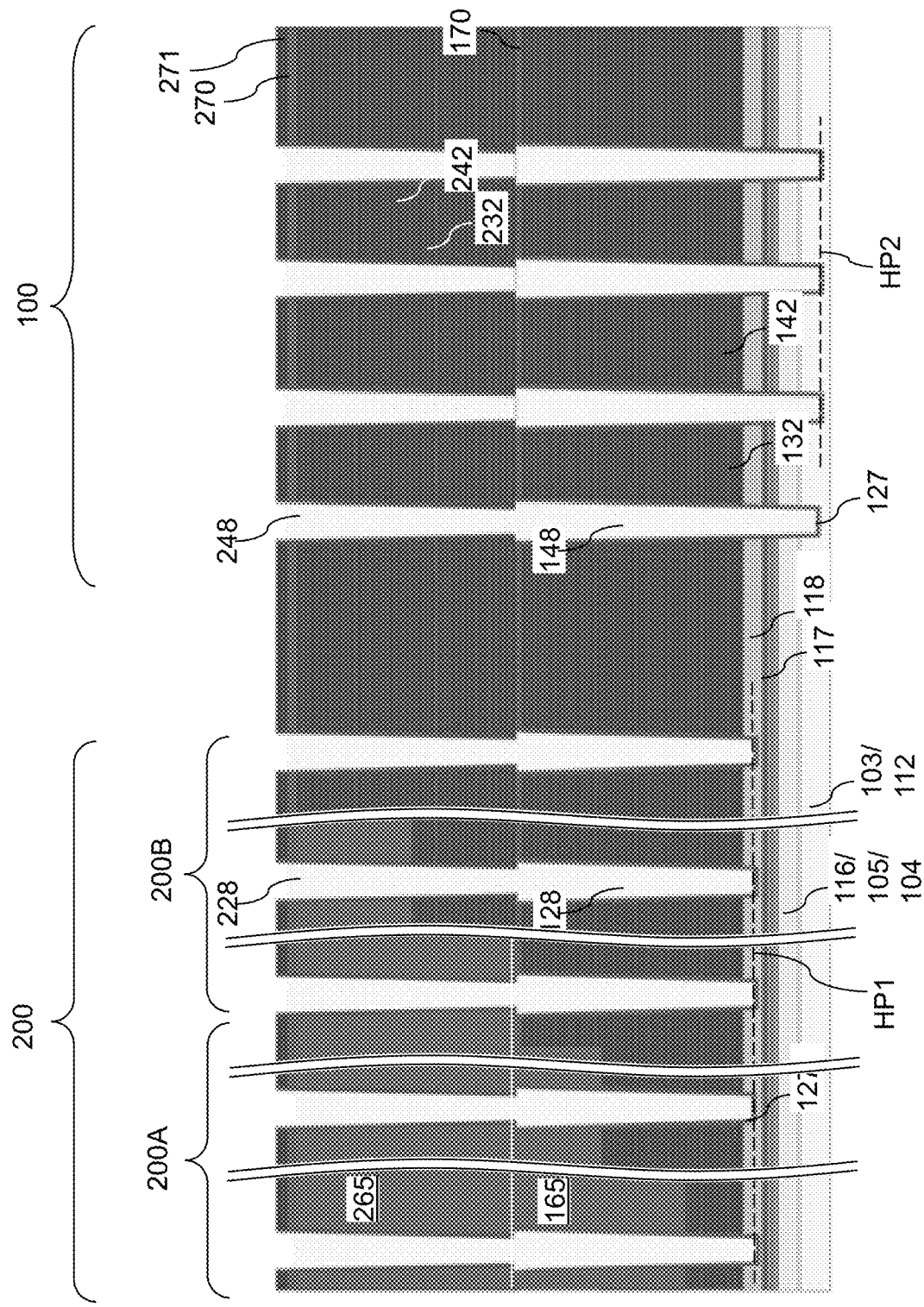
FIG. 41 is a vertical cross-sectional view of the third exemplary structure after formation of sacrificial second-tier memory opening fill structures and sacrificial second-tier support opening fill structures according to an embodiment of the present disclosure.

Referring to FIG. 41, a sacrificial fill material can be deposited in the second-tier memory openings 249 and the second-tier support openings 229. The sacrificial fill material may be the same as the sacrificial fill material of the sacrificial first-tier memory opening fill structures 148 and the sacrificial first-tier support opening fill structures 128. For example, the sacrificial fill material can include amorphous silicon, polysilicon, or a silicon-germanium alloy. Excess portions of the sacrificial fill material can be removed from above the dielectric mask layer 271. Remaining portions of the sacrificial fill material in the second-tier memory openings 249 constitute sacrificial second-tier memory opening fill structures 248, and remaining portions of the sacrificial fill material in the second-tier support openings 229 constitute sacrificial second-tier support opening fill structures 228.

Figure 42:
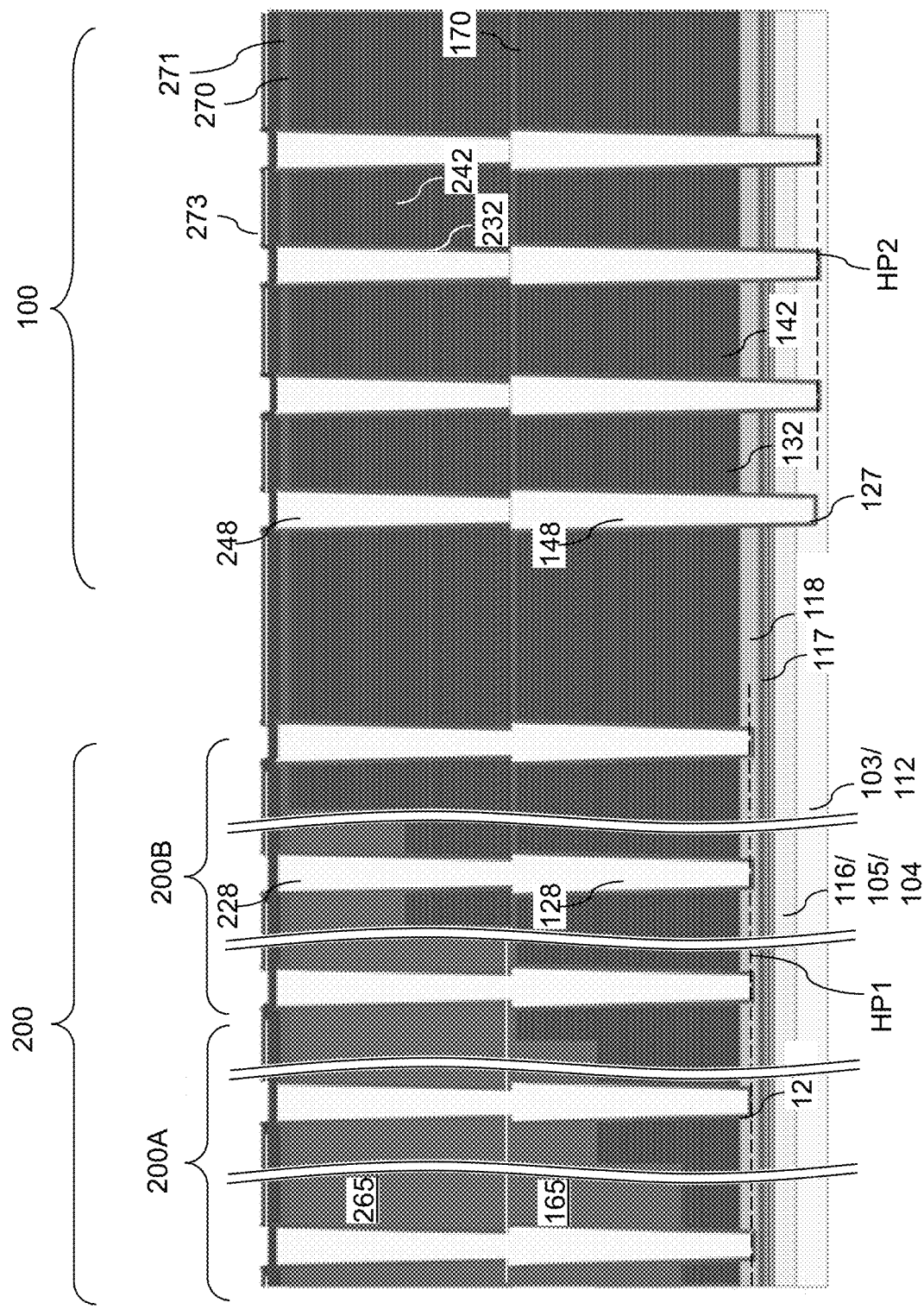
FIG. 42 is a vertical cross-sectional view of the third exemplary structure after deposition of a dielectric mask layer according to an embodiment of the present disclosure.

Referring to FIG. 42, a cover silicon nitride layer 273 can be deposited over the top surface of the dielectric mask layer 271 and the top surfaces of the sacrificial second-tier support opening fill structures 228 and the sacrificial second-tier memory opening fill structures 248. The thickness of the cover silicon nitride layer 273 can be in a range from 5 nm to 30 nm, although lesser and greater thicknesses can also be used.

Figure 43:
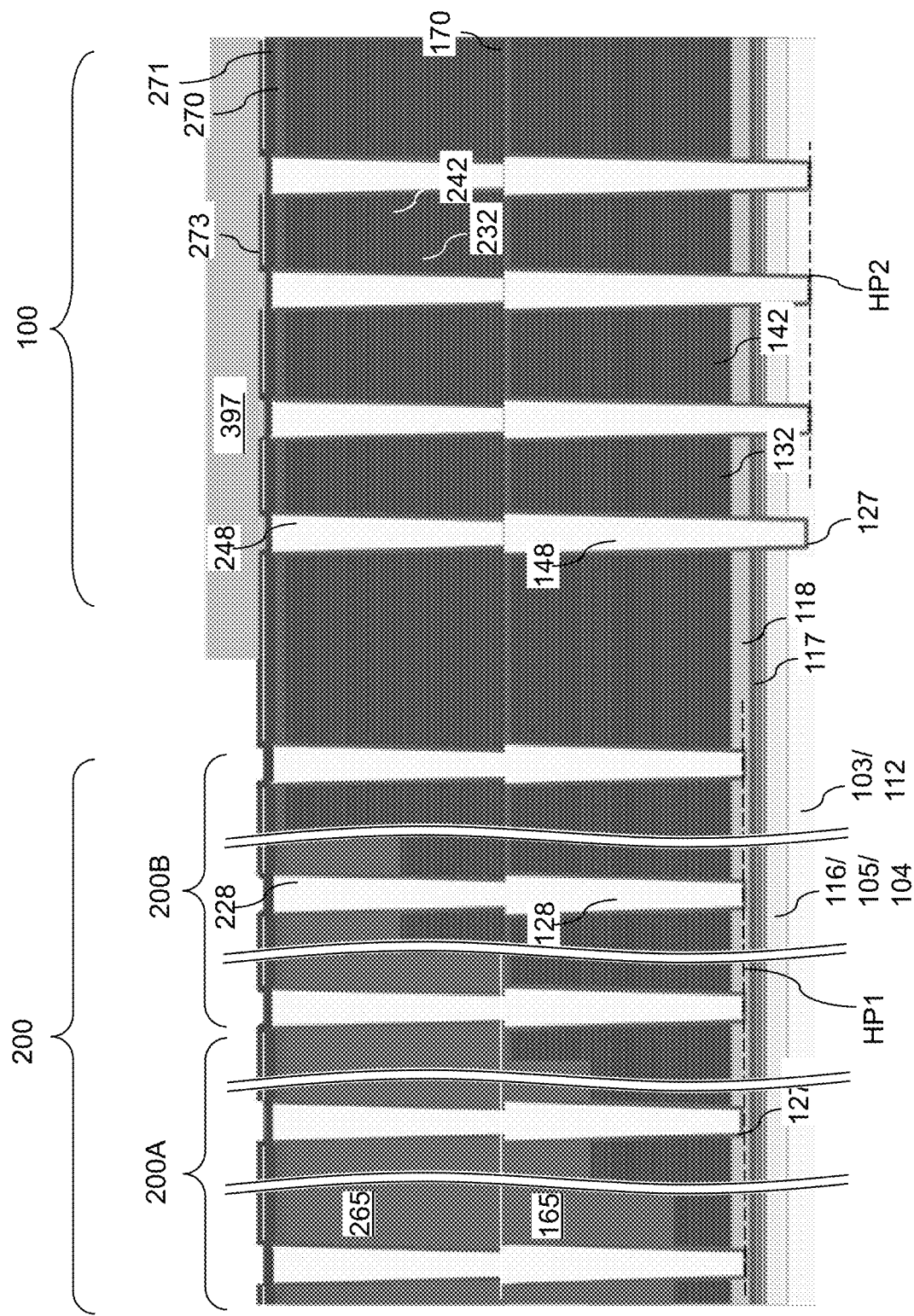
FIG. 43 is a vertical cross-sectional view of the staircase region of the third exemplary structure after formation of a patterned photoresist layer according to an embodiment of the present disclosure.

Referring to FIG. 43, a second photoresist layer 397 is applied over the cover silicon nitride layer 273, and is lithographically patterned to cover the memory array region 100 and the peripheral device region 400 while not covering the staircase region 200.

Figure 44:
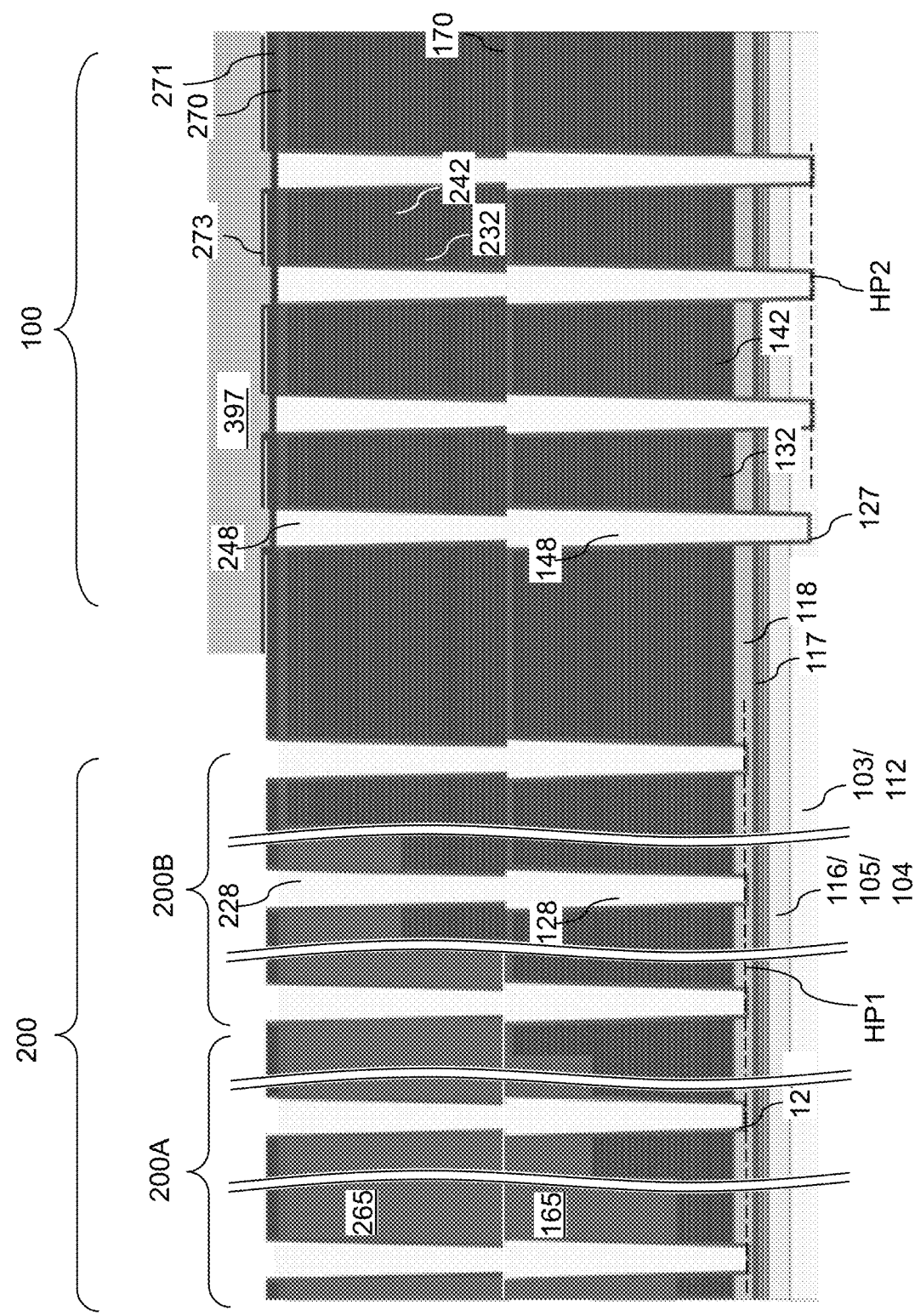
FIG. 44 is a vertical cross-sectional view of the staircase region of the third exemplary structure after patterning the dielectric mask layer according to an embodiment of the present disclosure.

Referring to FIG. 44, portions of the cover silicon nitride layer 273 in the staircase region 200 that are not covered by the second photoresist layer 397 can be removed by an etch process. An isotropic etch process or an anisotropic etch process may be used to etch the unmasked portions of the cover silicon nitride layer 273. The duration of the isotropic or anisotropic etch process can be selected such that the dielectric mask layer 271 remains outside the areas of the sacrificial second-tier support opening fill structures 228. Top surfaces of the sacrificial second-tier support opening fill structures 228 in the staircase region 200 are physically exposed, while the sacrificial second-tier memory opening fill structures 248 in the memory array region 100 are covered by the cover silicon nitride layer 273.

Figure 45:
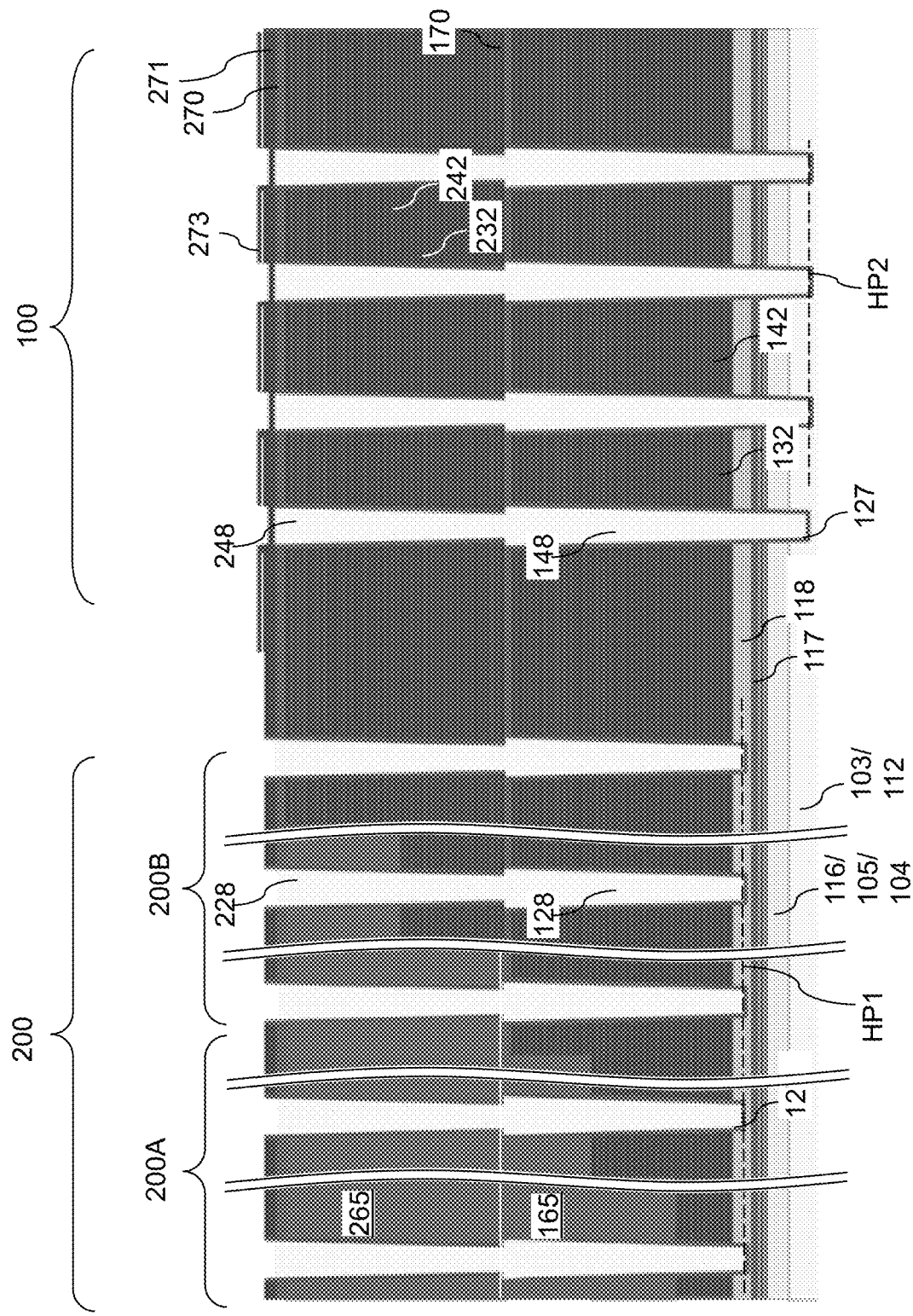
FIG. 45 is a vertical cross-sectional view of the staircase region of the third exemplary structure after removal of the patterned photoresist layer according to an embodiment of the present disclosure.

Referring to FIG. 45, the second photoresist layer 397 can be removed, for example, by ashing.

Figure 46:
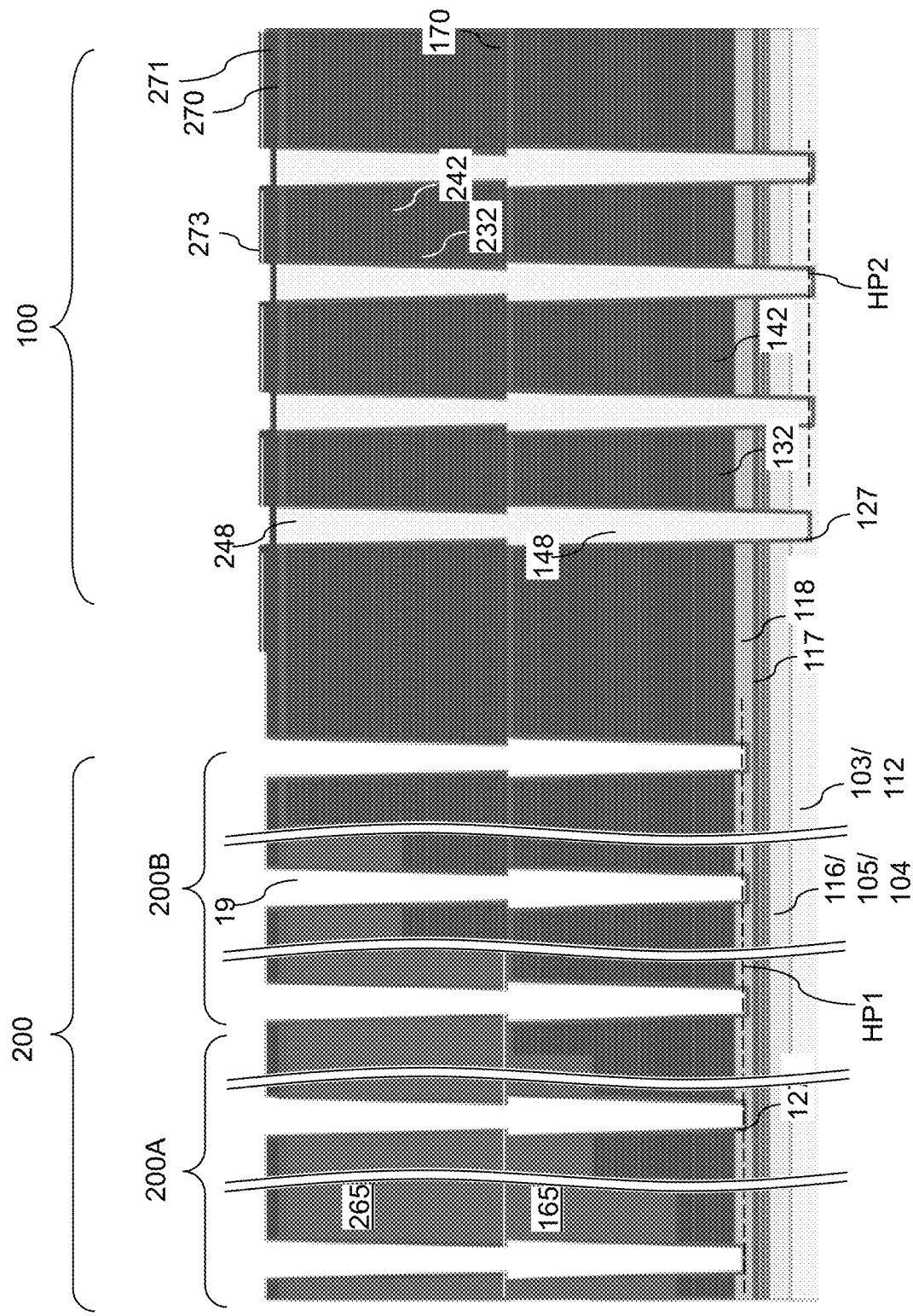
FIG. 46 is a vertical cross-sectional view of the staircase region of the third exemplary structure after removal of the sacrificial support opening fill structures and formation of inter-tier support openings according to an embodiment of the present disclosure.

Referring to FIG. 46, the sacrificial second-tier support opening fill structures 228 and the sacrificial first-tier support opening fill structures 128 in the staircase region 200 can be removed to form support openings 19, which are also referred to as inter-tier support openings 19. A first subset of the inter-tier support openings 19 located in the first staircase region 200A can extend through the second retro-stepped dielectric material portion 265, the first retro-stepped dielectric material portion 165, and a region of the first-tier alternating stack (132, 142) that underlie first stepped surfaces of the first-tier alternating stack (132, 142). A second subset of the inter-tier support openings 19 located in the second staircase region 200B can extend through the second retro-stepped dielectric material portion 265, a region of the second-tier alternating stack (232, 242) that underlies second stepped surfaces of the second-tier alternating stack (232, 242), and the first-tier alternating stack (132, 142).

Removal of the sacrificial second-tier support opening fill structures 228 and the sacrificial first-tier support opening fill structures 128 can be accomplished by an etch process. The chemistry of the etch process can be selected such that the etch process etches the sacrificial fill materials of the sacrificial second-tier support opening fill structures 228 and the sacrificial first-tier support opening fill structures 128 selective to the materials of the second-tier alternating stack (232, 242), the first-tier alternating stack (132, 142), the first and second retro-stepped dielectric material portions (165, 265), and the source-select-level conductive layer 118. In embodiments in which sacrificial dielectric liners 127 are present in the first-tier support openings 129, the etch process can remove the sacrificial fill materials of the sacrificial second-tier support opening fill structures 228 and the sacrificial first-tier support opening fill structures 128 selective to the materials of the second-tier alternating stack (232, 242), the first and second retro-stepped dielectric material portions (165, 265) and the sacrificial dielectric liners 127. For example, if the sacrificial dielectric liners 127 include silicon oxide and if the sacrificial first-tier support opening fill structures 128 and the sacrificial second-tier support opening fill structures 228 include amorphous undoped silicon, undoped poly silicon, or a silicon-germanium alloy, a wet etch process using hot trimethyl-2 hydroxyethyl ammonium hydroxide ("hot TMY") or tetramethyl ammonium hydroxide (TMAH) may be used to remove the sacrificial first-tier support opening fill structures 128.

Volumes of the second-tier support openings 229 and the volumes of the first-tier support openings 129 combine to provide the inter-tier support openings 19. The inter-tier support openings 19 can vertically extend at least from a horizontal plane including a topmost surface of the second-tier alternating stack (232, 242) at least to another horizontal plane including a bottommost surface of the first-tier alternating stack (132, 142). Each of the inter-tier support openings 19 can have a greater lateral extent at a level of a topmost layer of the first-tier alternating stack (132, 142) than at a level of a bottommost layer of the second-tier alternating stack (232, 242), for example, by finite taper angles of straight sidewalls of the first-tier support openings 129 and second-tier support openings 229.

Figure 47:
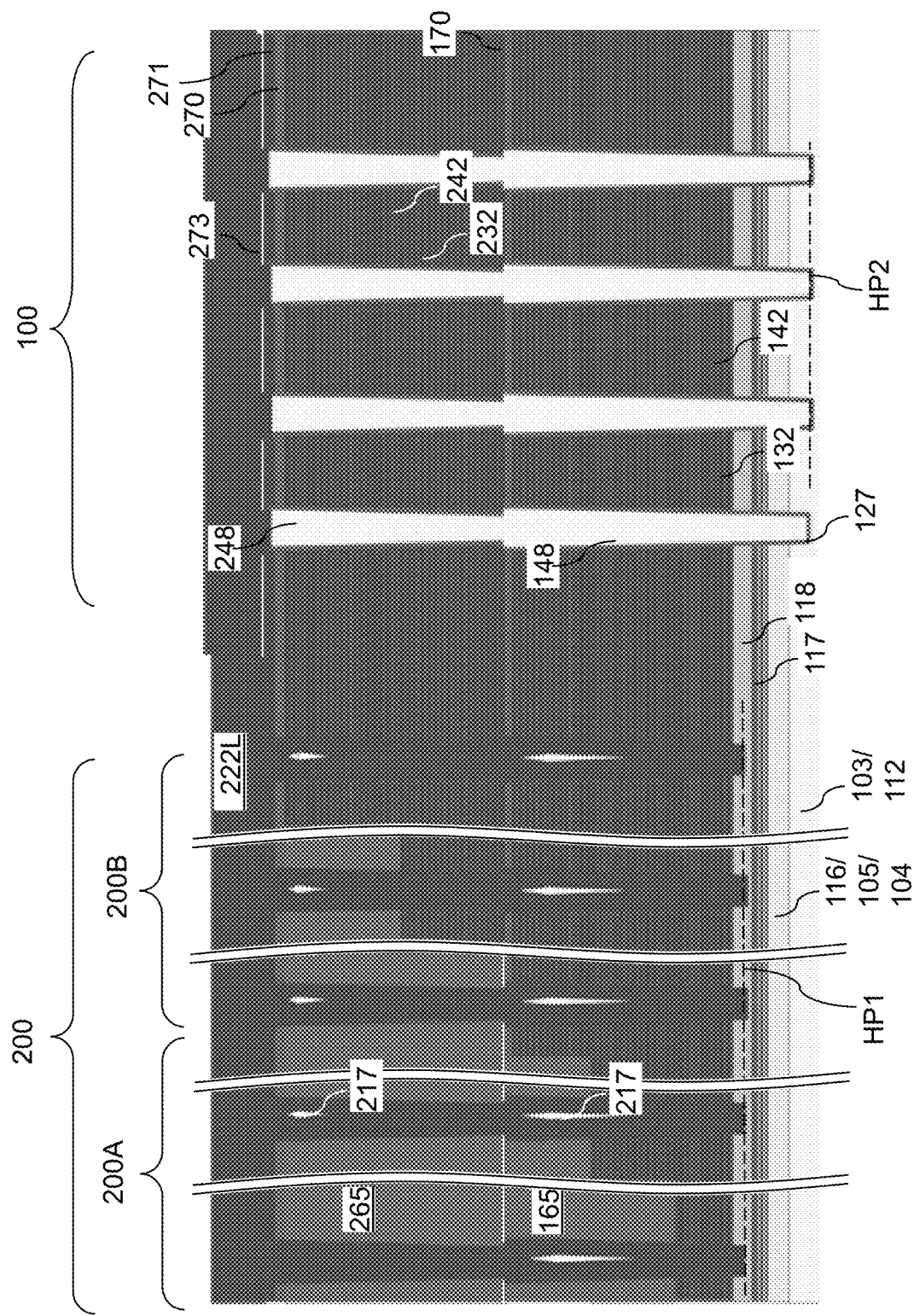
FIG. 47 is a vertical cross-sectional view of the staircase region of the third exemplary structure after deposition of a dielectric fill material layer in the inter-tier support openings according to an embodiment of the present disclosure.

Referring to FIG. 47, a dielectric fill material, such as a silicate glass, can be deposited in the empty volumes of the inter-tier support openings 19 to form a continuous dielectric fill material layer 222L. Deposition of the dielectric fill material may be conformal or may be at least partly non-conformal. In one embodiment, voids 217 may be formed within the continuous dielectric fill material layer 222L in the volumes of the inter-tier support openings 19.

Figure 48:
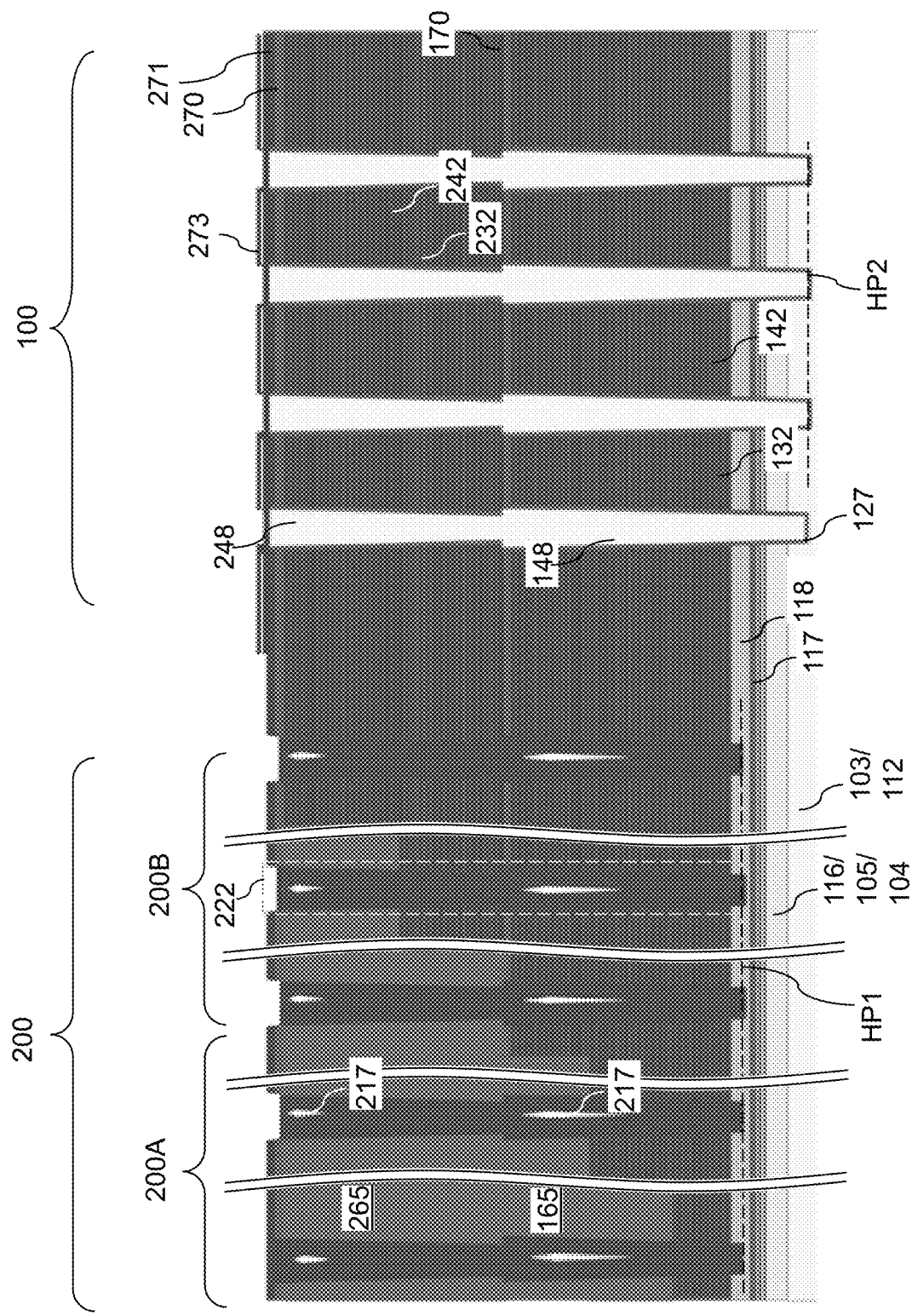
FIG. 48 is a vertical cross-sectional view of the staircase region of the third exemplary structure after formation of dielectric support pillar structures according to an embodiment of the present disclosure.

Referring to FIG. 48, the dielectric fill material is etched back, for example by a recess etch. Each remaining portion of the dielectric fill material in the support openings 19 constitutes a dielectric support pillar structure 222. The dielectric support pillar structures 222 are used as support pillar structures during replacement of the sacrificial material layers (142, 242) with electrically conductive layers in subsequent processing steps. A first subset of the dielectric support pillar structures 222 is formed in the first staircase region 200A, and a second subset of the dielectric support pillar structures 222 is formed in the second staircase region 200B. Each dielectric support pillar structure 222 can have a top surface above the horizontal plane including the bottom surface of the second insulating cap layer 270. Each dielectric support pillar structure 222 may contain no void, one void 217, or two voids 217. The dielectric support pillar structures 222 can be formed in the inter-tier support openings 19 and directly on sidewalls of the second retro-stepped dielectric material portion 265.

Figure 49:
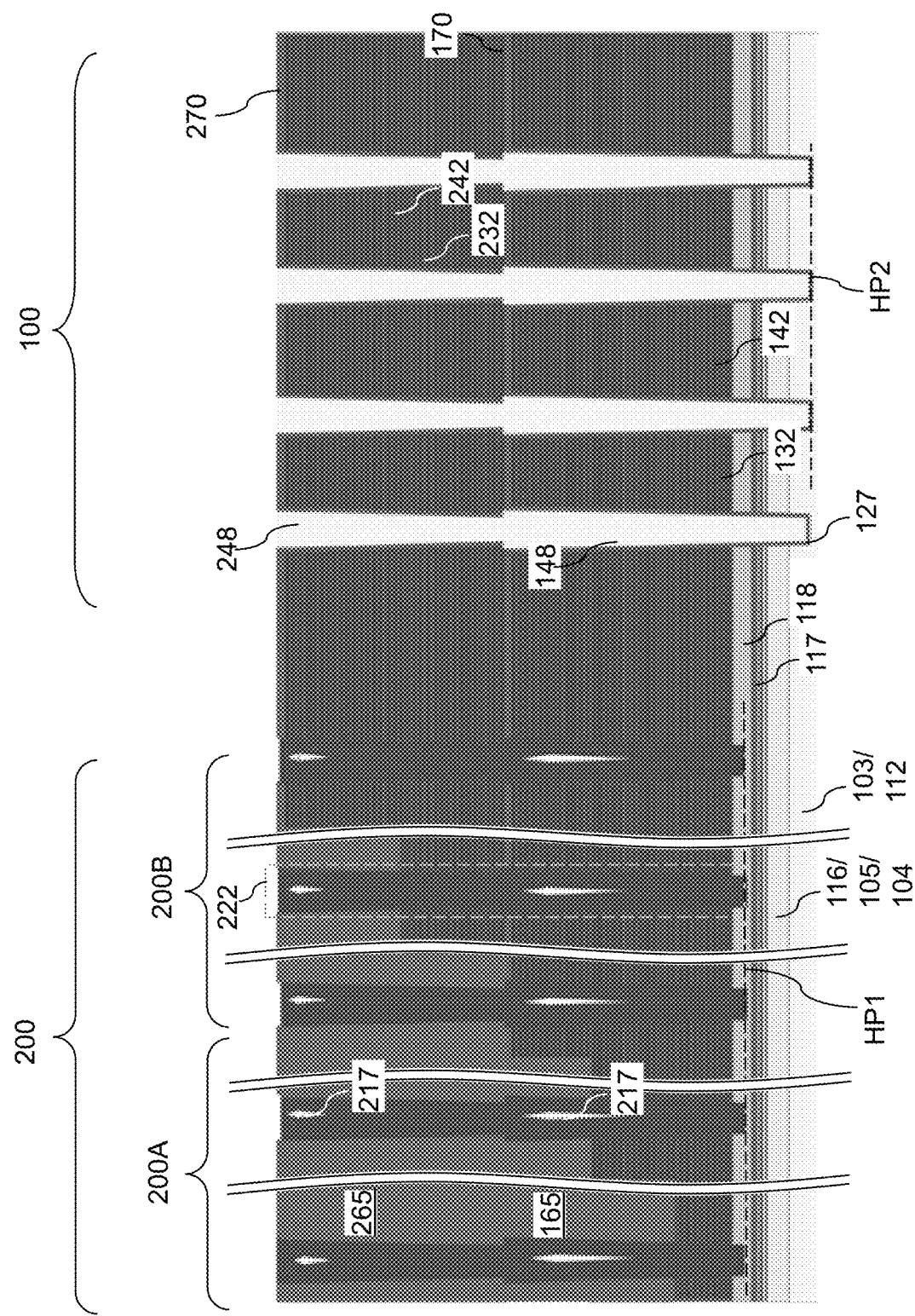
FIG. 49 is a vertical cross-sectional view of the staircase region of the third exemplary structure after removal of the dielectric mask layer according to an embodiment of the present disclosure.

Referring to FIG. 49, the cover silicon nitride layer 273 and the dielectric mask layer 271 can be removed from above the second insulating cap layer 270, for example, by a wet etch process using hot phosphoric acid.

Figure 50:
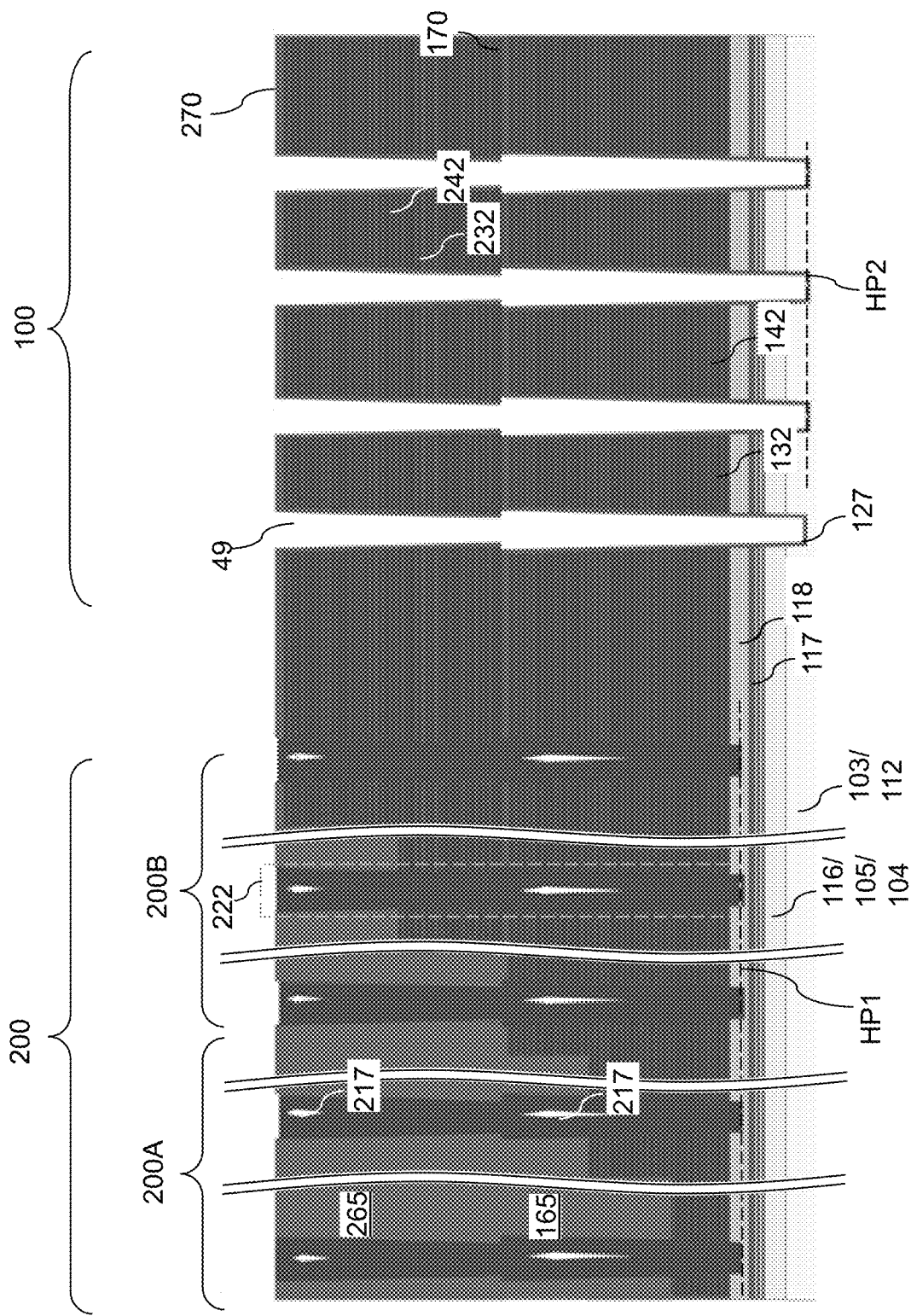
FIG. 50 is a vertical cross-sectional view of the third exemplary structure after removal of sacrificial memory opening fill structures and formation of inter-tier memory openings according to an embodiment of the present disclosure.

Referring to FIG. 50, the sacrificial second-tier memory opening fill structures 248 and the sacrificial first-tier memory opening fill structures 148 in the memory array region 100 can be removed to form memory openings 49, which are also referred to as inter-tier memory openings 49. The inter-tier memory openings 49 extend through the second-tier alternating stack (232, 242) and the first-tier alternating stack (132, 142), and can extend into the source-level sacrificial layer 104.

Removal of the sacrificial second-tier memory opening fill structures 248 and the sacrificial first-tier memory opening fill structures 148 can be accomplished by an etch process. The chemistry of the etch process can be selected such that the etch process etches the sacrificial fill materials of the sacrificial second-tier memory opening fill structures 248 and the sacrificial first-tier memory opening fill structures 148 selective to the materials of the second-tier alternating stack (232, 242), the first-tier alternating stack (132, 142), the second retro-stepped dielectric material portion 265, the dielectric support pillar structures 222, and the source-select-level conductive layer 118. In embodiments in which sacrificial dielectric liners 127 are present in the first-tier memory openings 149, the etch process can remove the sacrificial fill materials of the sacrificial second-tier memory opening fill structures 248 and the sacrificial first-tier memory opening fill structures 148 selective to the materials of the second-tier alternating stack (232, 242), the first and second retro-stepped dielectric material portions (165, 265) and the sacrificial dielectric liners 127. For example, if the sacrificial dielectric liners 127 include silicon oxide and if the sacrificial first-tier memory opening fill structures 148 and the sacrificial second-tier memory opening fill structures 248 include amorphous undoped silicon, undoped polysilicon, or a silicon-germanium alloy, a wet etch process using hot TMY or TMAH may be used to remove the sacrificial first-tier memory opening fill structures 148.

Volumes of the second-tier memory openings 249 and the volumes of the first-tier memory openings 149 combine to provide the inter-tier memory openings 49. The inter-tier memory openings 49 can vertically extend at least from a horizontal plane including a topmost surface of the second-tier alternating stack (232, 242) at least to another horizontal plane including a bottommost surface of the first-tier alternating stack (132, 142). Each of the inter-tier memory openings 49 can have a greater lateral extent at a level of a topmost layer of the first-tier alternating stack (132, 142) than at a level of a bottommost layer of the second-tier alternating stack (232, 242), for example, by finite taper angles of straight sidewalls of the first-tier memory openings 149 and second-tier memory openings 249.

Figure 51:
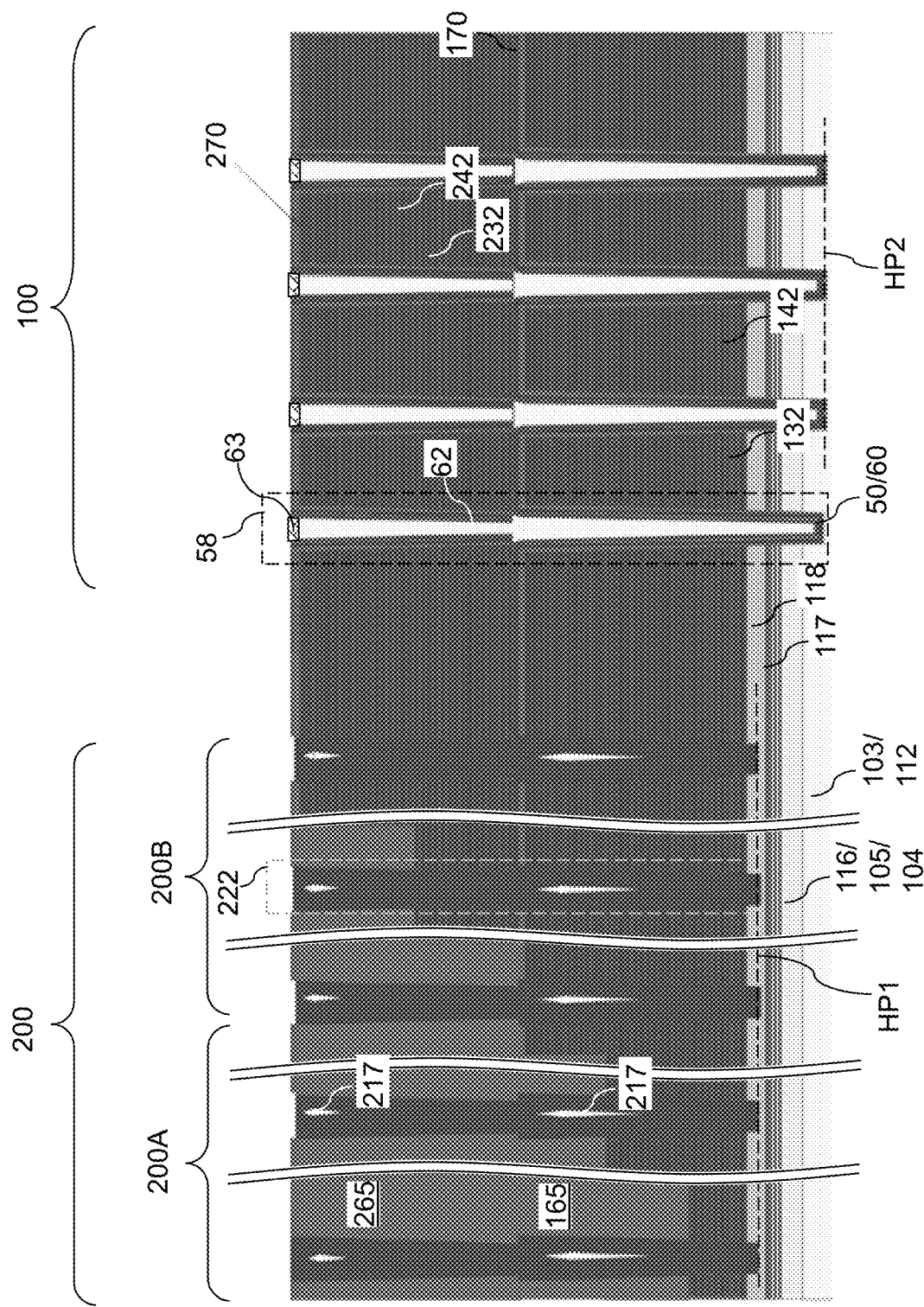
FIG. 51 is a vertical cross-sectional view of the third exemplary structure after formation of memory opening fill structures according to an embodiment of the present disclosure.

Referring to FIG. 51, the sacrificial dielectric liners 127, if present, are removed selective to the first-tier alternating stack (132, 142), the second-tier alternating stack (232, 242), the first and second insulating cap layers (170, 270), the dielectric support pillar structures 222, and the various materials of the in-process source-level material layer 10'.

Subsequently, the processing steps of FIGS. 9A-9D and 10 can be performed to form memory opening fill structures 58 in each of the inter-tier memory openings 58. The processing steps of FIGS. 11A, 11B, 12, 13A-13E, and 14 can be performed to form a second contact level dielectric layer 282 and backside trenches 79, and to replace the in-process source-level material layers 10' with source-level material layers 10. The processing steps of FIGS. 15 and 16 can be performed to replace the first and second sacrificial material layers (142, 242) with first and second electrically conductive layers (146, 246). The processing steps of FIGS. 17A-17C, 18A an 18B, and 19 can be performed to form dielectric wall structures 76, a second contact level dielectric layer 282, various contact via structures (86, 88, 488), a line-level dielectric layer 290, bit lines 98, and interconnection line structures 96.

Figure 52:
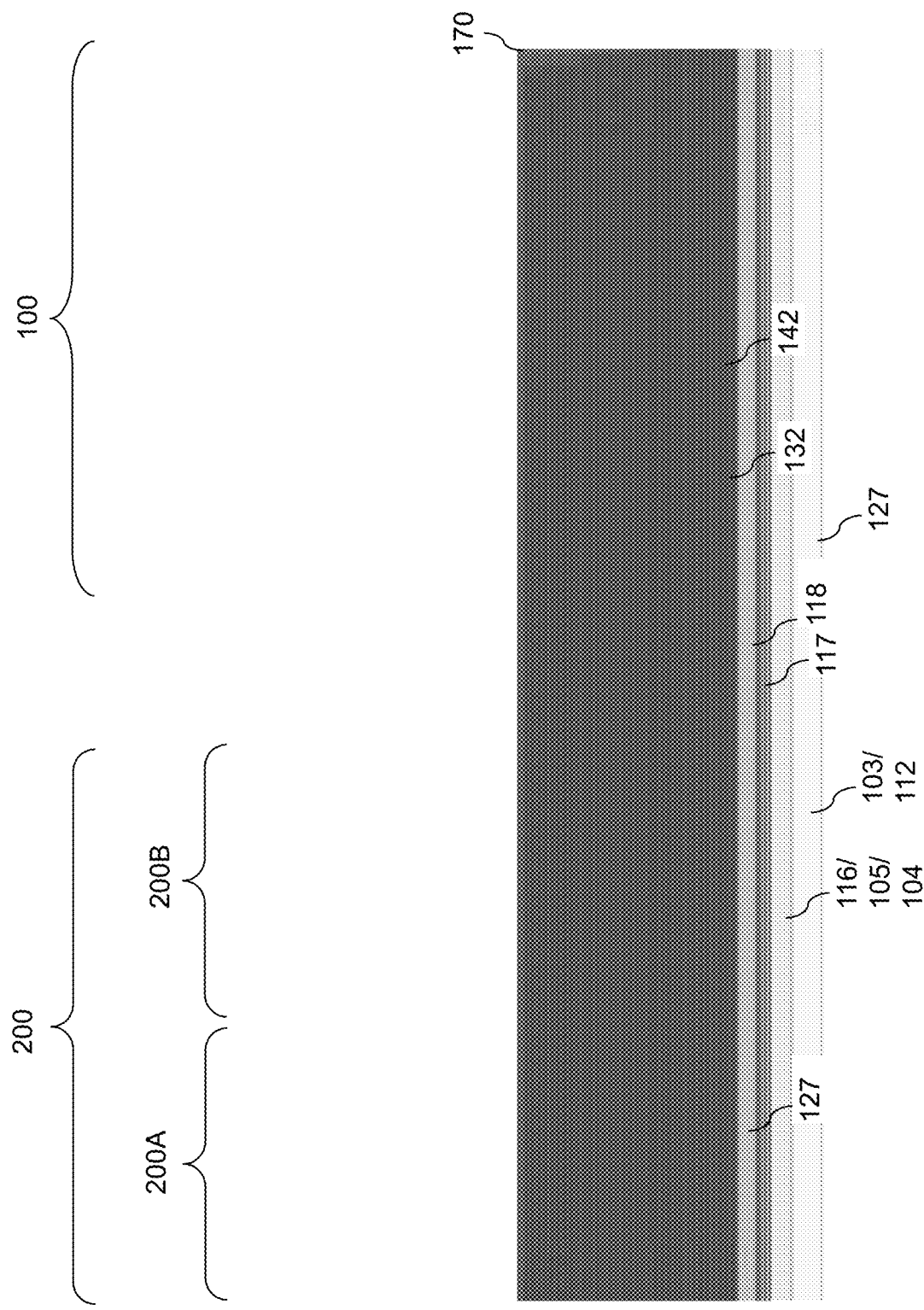
FIG. 52 is a vertical cross-sectional view of a fourth exemplary structure after formation of a first-tier alternating stack of first insulating layers and first sacrificial material layers according to an embodiment of the present disclosure.

Referring to FIG. 52, a fourth exemplary structure according to an embodiment of the present disclosure can be derived from the first exemplary structure of FIG. 2. In one embodiment, the fourth exemplary structure of FIG. 52 can be the same as the first exemplary structure of FIG. 2.

Figure 53:
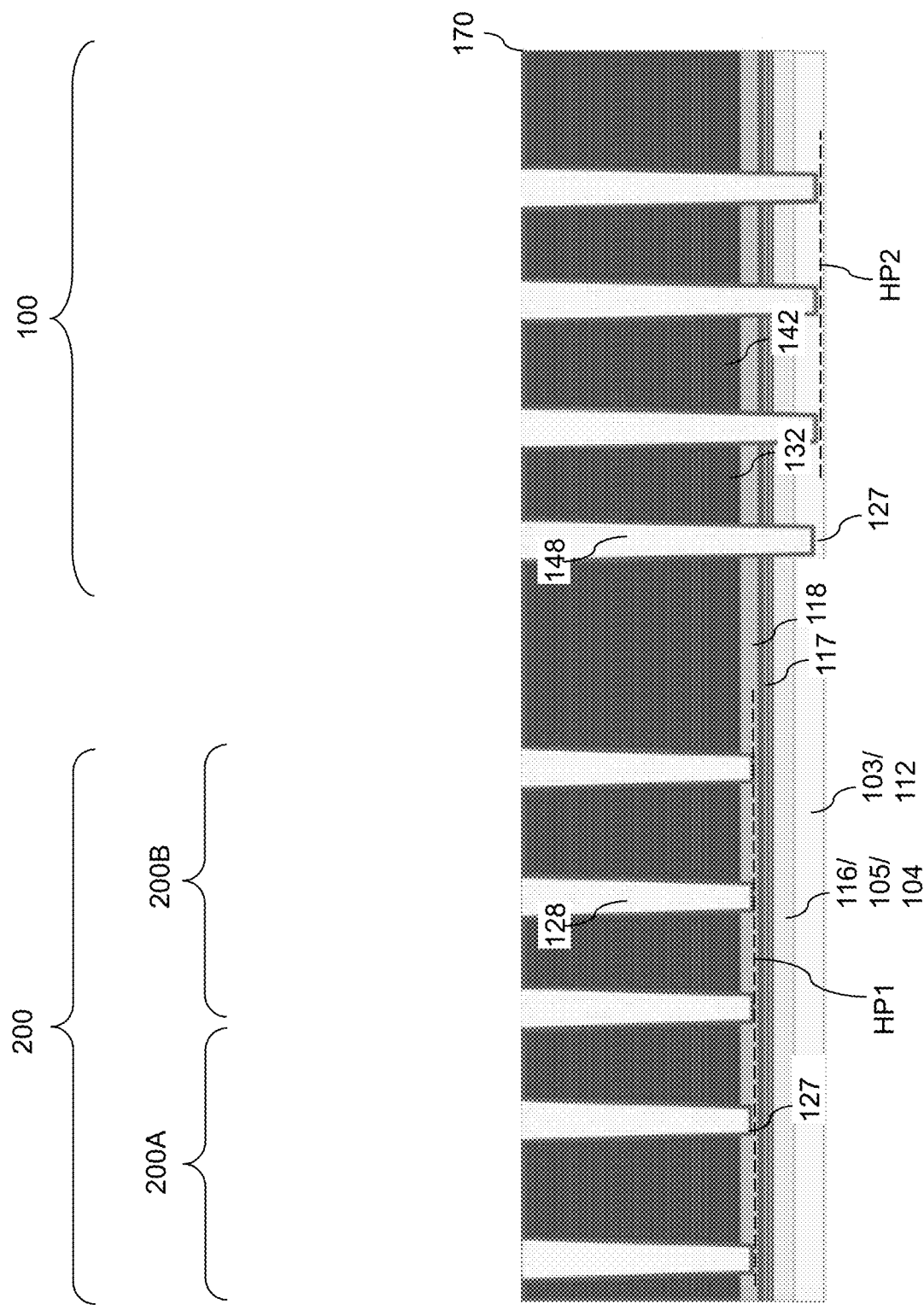
FIG. 53 is a vertical cross-sectional view of the fourth exemplary structure after formation of sacrificial first-tier memory opening fill structures and sacrificial first-tier support opening fill structures according to an embodiment of the present disclosure.

Referring to FIG. 53, the processing steps of FIGS. 20A and 20B, 21, and 22 can be performed to form sacrificial first-tier support opening fill structures 128 through the first-tier alternating stack (132, 142) in the staircase region 200, and to form sacrificial first-tier memory opening fill structures 148 through the first-tier alternating stack (132, 142) in the memory array region 100. In one embodiment, the fourth exemplary structure illustrated in FIG. 53 can be the same as the second exemplary structure illustrated in FIG. 22. Alternatively, the fourth exemplary structure illustrated in FIG. 53 can be derived from the third exemplary structure of FIG. 38 by omitting formation of the first retro-stepped dielectric material portion 165.

Figure 54:
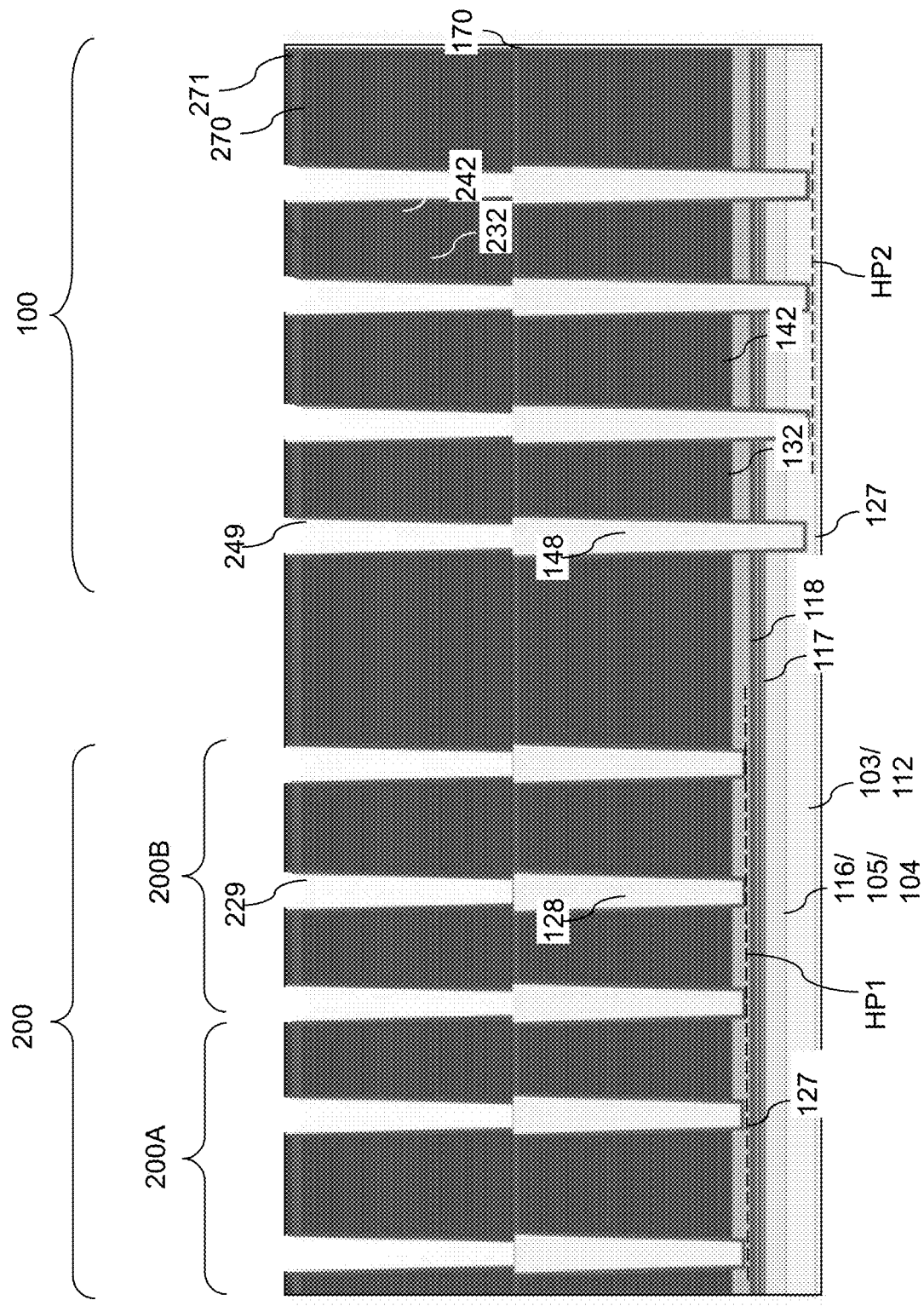
FIG. 54 is a vertical cross-sectional view of the fourth exemplary structure after formation of a second-tier alternating stack of second insulating layers and second sacrificial material layers, second-tier memory openings, and second-tier support openings according to an embodiment of the present disclosure.

Referring to FIG. 54, a second-tier alternating stack (232, 242) of second insulating layer 132 and second sacrificial material layers 142 is formed over the first-tier alternating stack (132, 142). For example, the processing steps of FIG. 6 for forming a second-tier alternating stack (232, 242) can be performed to form the second-tier alternating stack (232, 242) of the fourth exemplary structure. A second insulating cap layer 170 can be formed over the second-tier alternating stack (232, 242). A first dielectric mask layer 271 can be optionally formed over the second insulating cap layer 270. The first dielectric mask layer 271 can include silicon nitride. The thickness of the first dielectric mask layer 271 can be in a range from 10 nm to 200 nm, although lesser and greater thicknesses can also be used.

Various second-tier openings (249, 229) can be formed through the second-tier alternating stack (232, 242). For example, the processing steps of FIGS. 7A and 7B can be performed to form the second-tier openings (249, 229). The various second-tier openings (249, 229) can include second-tier memory openings 249 and second-tier support openings 229.

The second-tier memory openings 249 are formed directly on a top surface of a respective one of the sacrificial first-tier memory opening fill structures 148. The second-tier support openings 229 are formed directly on a top surface of a respective one of the sacrificial first-tier support opening fill structures 128. Each of the second-tier openings (249, 229) can vertically extend through each layer within the second-tier alternating stack (232, 242). A bottom periphery of each second-tier opening (249, 229) may be laterally offset from, and/or may be located entirely within, a periphery of a top surface of an underlying sacrificial first-tier opening fill structure (148, 128).

Figure 55:
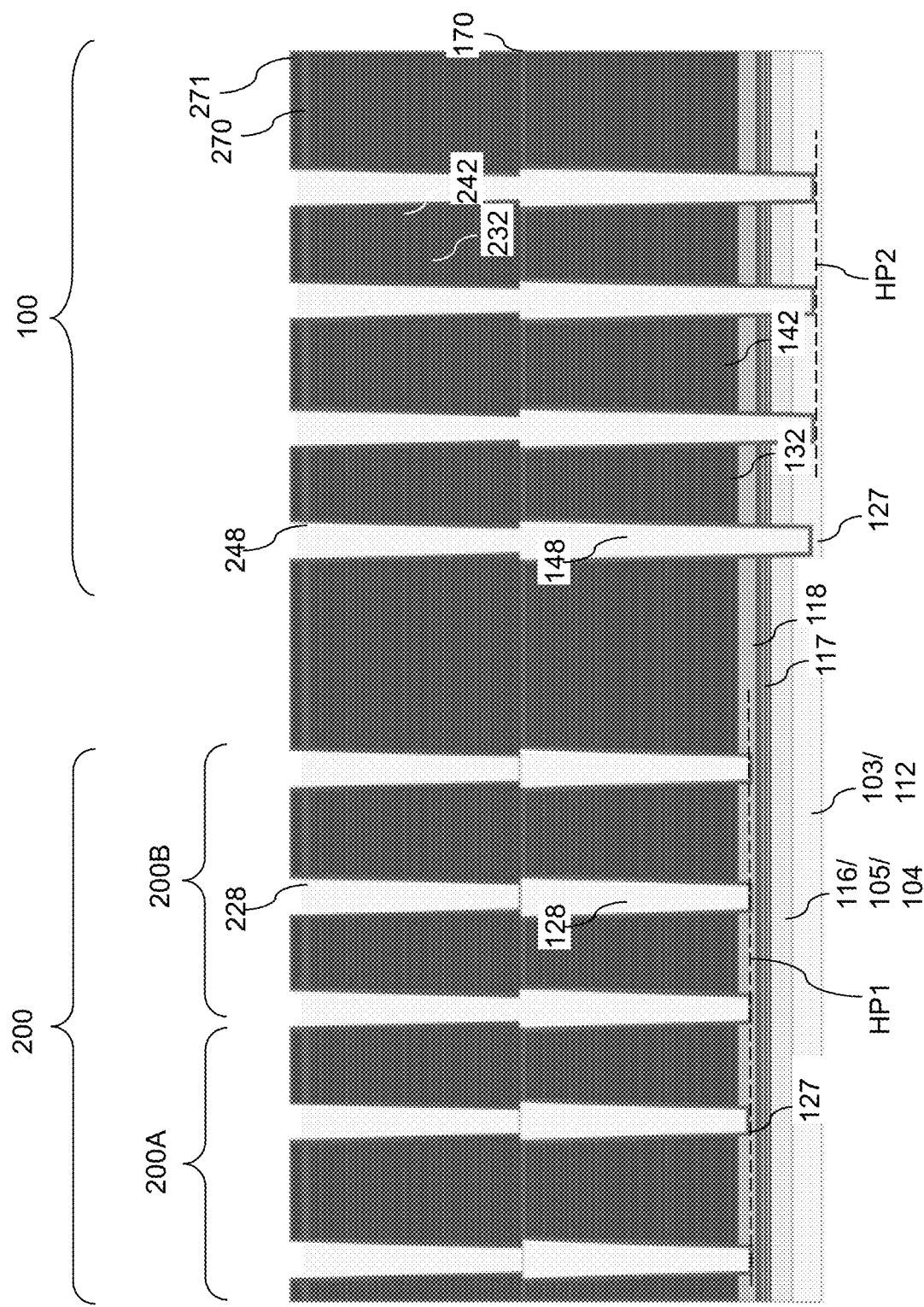
FIG. 55 is a vertical cross-sectional view of the fourth exemplary structure after formation of sacrificial second-tier memory opening fill structures and sacrificial second-tier support opening fill structures according to an embodiment of the present disclosure.

Referring to FIG. 55, a sacrificial fill material can be deposited in the second-tier memory openings 249 and the second-tier support openings 229. The sacrificial fill material may be the same as the sacrificial fill material of the sacrificial first-tier memory opening fill structures 148 and the sacrificial first-tier support opening fill structures 128. For example, the sacrificial fill material can include amorphous silicon, polysilicon, or a silicon-germanium alloy. Excess portions of the sacrificial fill material can be removed from above the first dielectric mask layer 271. Remaining portions of the sacrificial fill material in the second-tier memory openings 249 constitute sacrificial second-tier memory opening fill structures 248, and remaining portions of the sacrificial fill material in the second-tier support openings 229 constitute sacrificial second-tier support opening fill structures 228.

Figure 56:
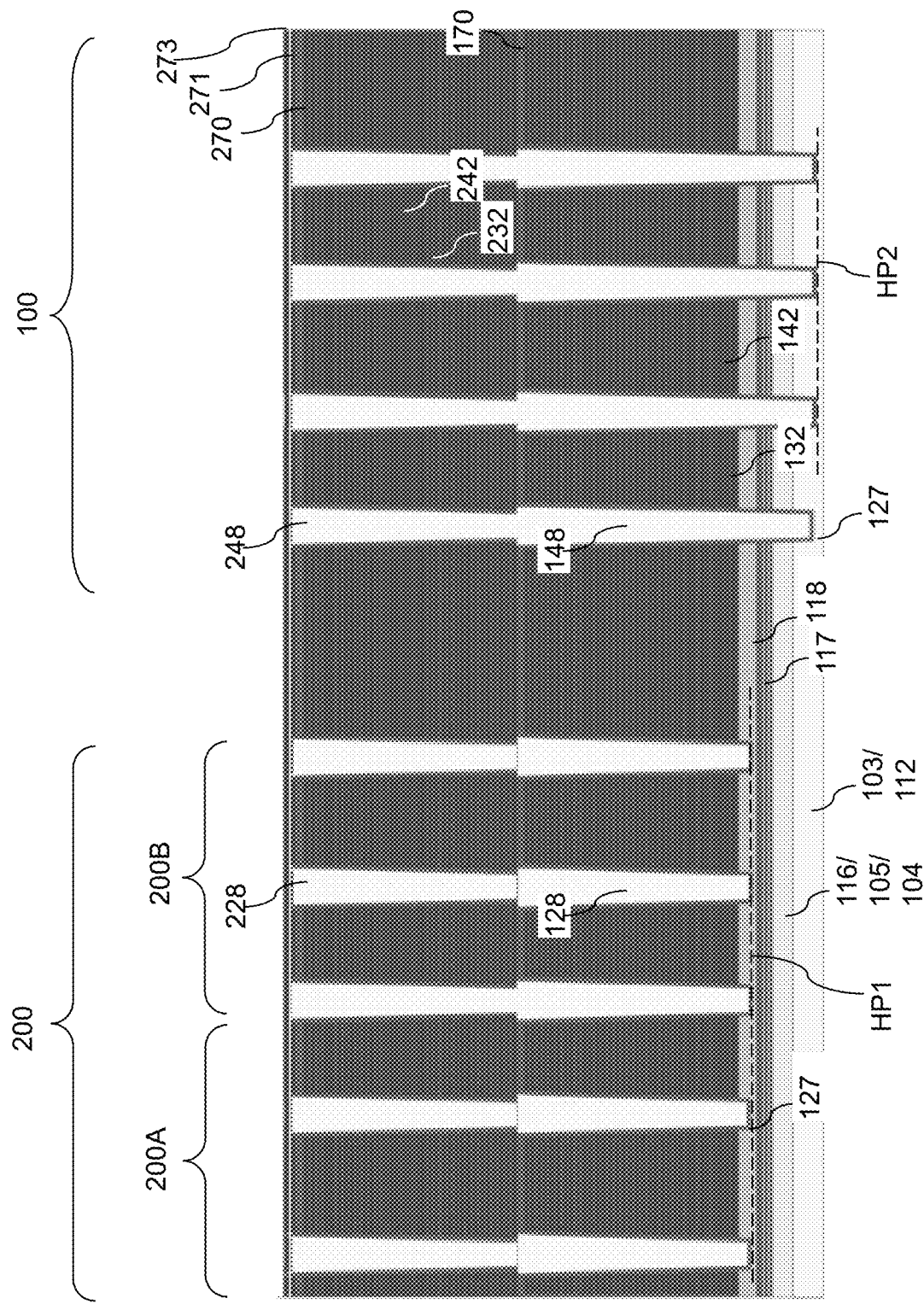
FIG. 56 is a vertical cross-sectional view of the fourth exemplary structure after deposition of a cover silicon nitride layer according to an embodiment of the present disclosure.

Referring to FIG. 56, a cover silicon nitride layer 273 can be deposited over the top surface of the first dielectric mask layer 271 and the top surfaces of the sacrificial second-tier support opening fill structures 228 and the sacrificial second-tier memory opening fill structures 248. The thickness of the cover silicon nitride layer 273 can be in a range from 5 nm to 30 nm, although lesser and greater thicknesses can also be used.

Figure 57:
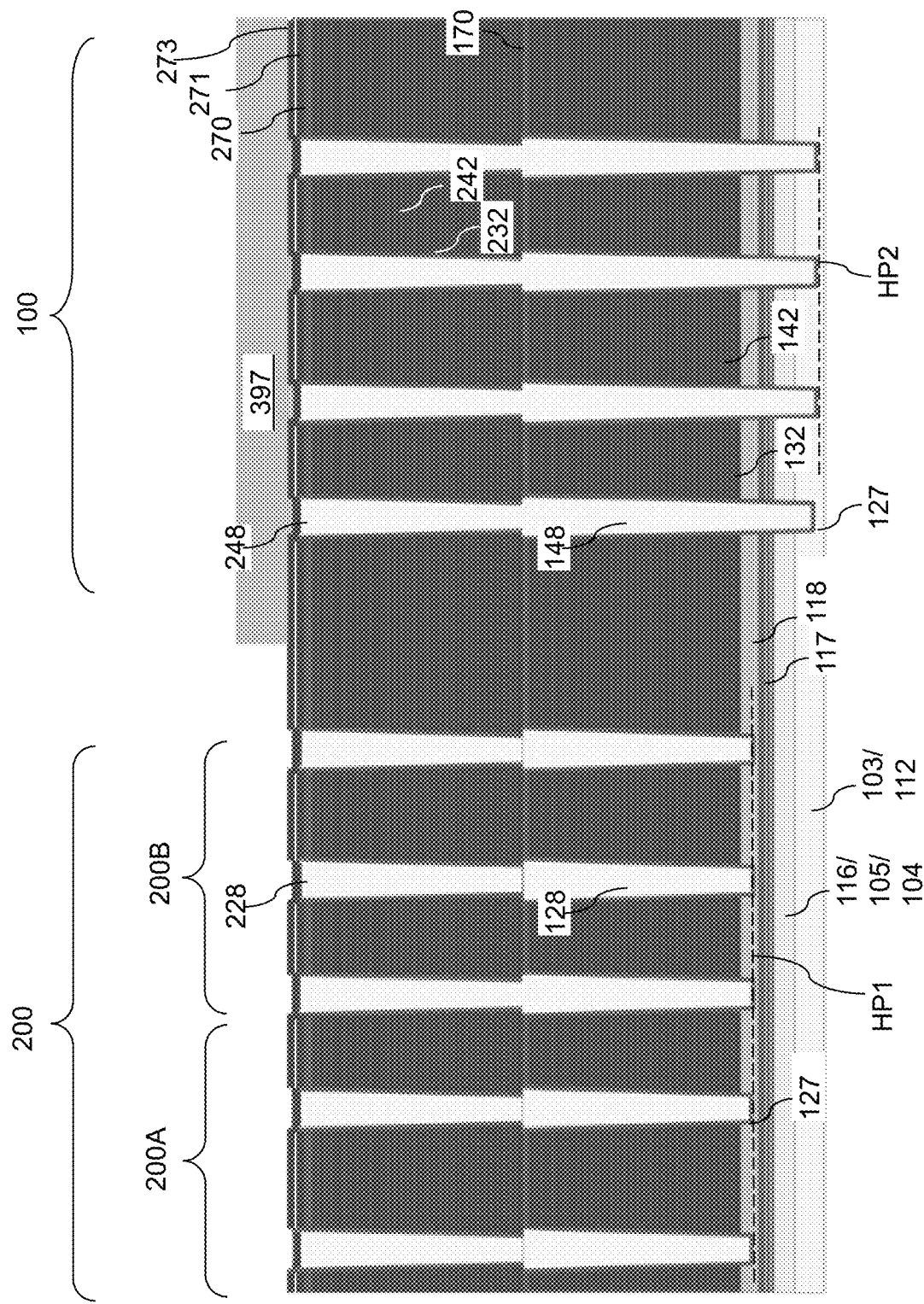
FIG. 57 is a vertical cross-sectional view of the fourth exemplary structure after formation of a patterned photoresist layer according to an embodiment of the present disclosure.

Referring to FIG. 57, a second photoresist layer 397 is applied over the cover silicon nitride layer 273, and is lithographically patterned to cover the memory array region 100 and the peripheral device region 400 while not covering the staircase region 200.

Figure 58:
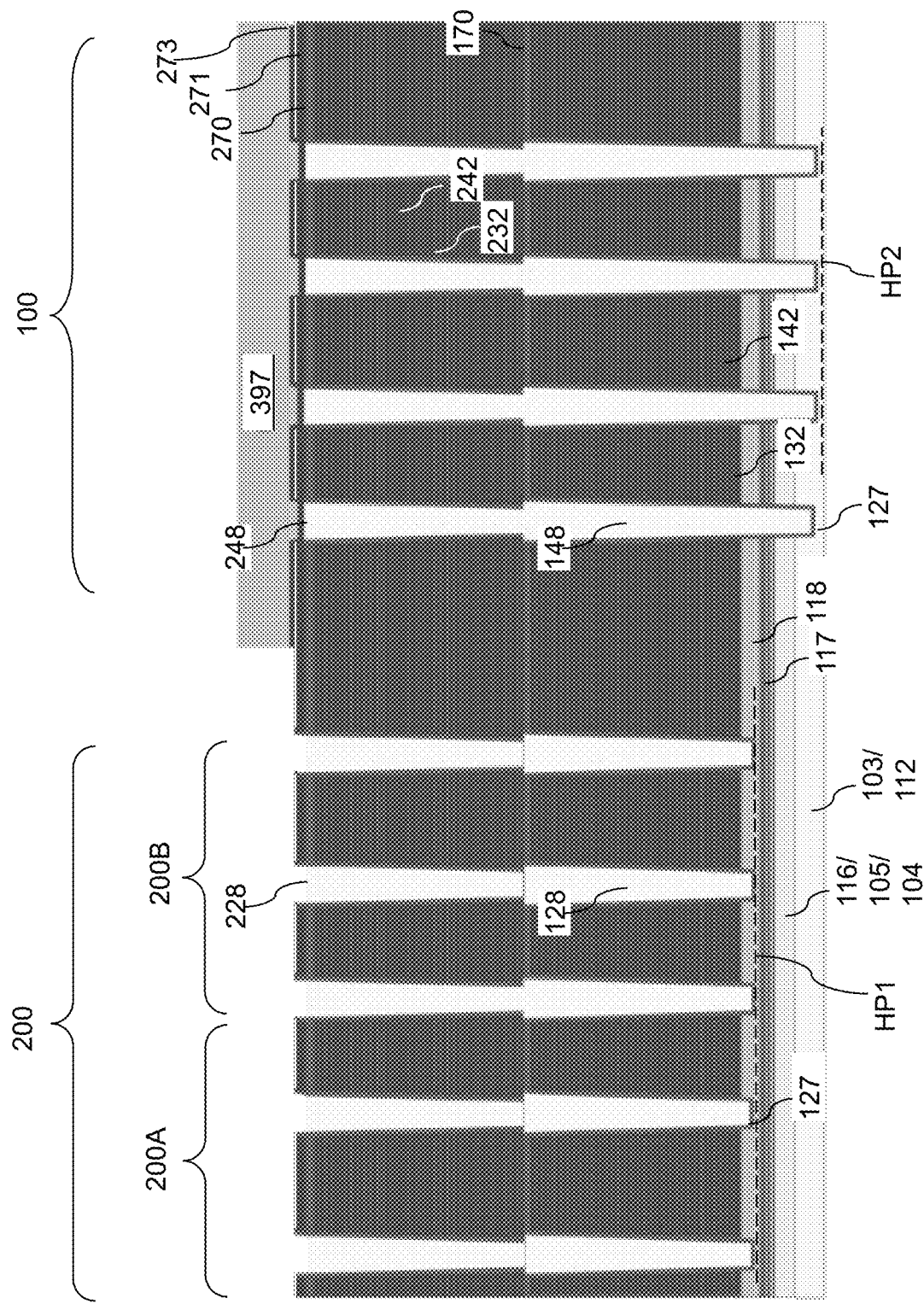
FIG. 58 is a vertical cross-sectional view of the fourth exemplary structure after patterning the cover silicon nitride layer according to an embodiment of the present disclosure.

Referring to FIG. 58, portions of the cover silicon nitride layer 273 in the staircase region 200 that are not covered by the second photoresist layer 397 can be removed by an etch process. An isotropic etch process or an anisotropic etch process may be used to etch the unmasked portions of the cover silicon nitride layer 273. The duration of the isotropic or anisotropic etch process can be selected such that the first dielectric mask layer 271 remains outside the areas of the sacrificial second-tier support opening fill structures 228. Top surfaces of the sacrificial second-tier support opening fill structures 228 in the staircase region 200 are physically exposed, while the sacrificial second-tier memory opening fill structures 248 in the memory array region 100 are covered by the cover silicon nitride layer 273.

Figure 59:
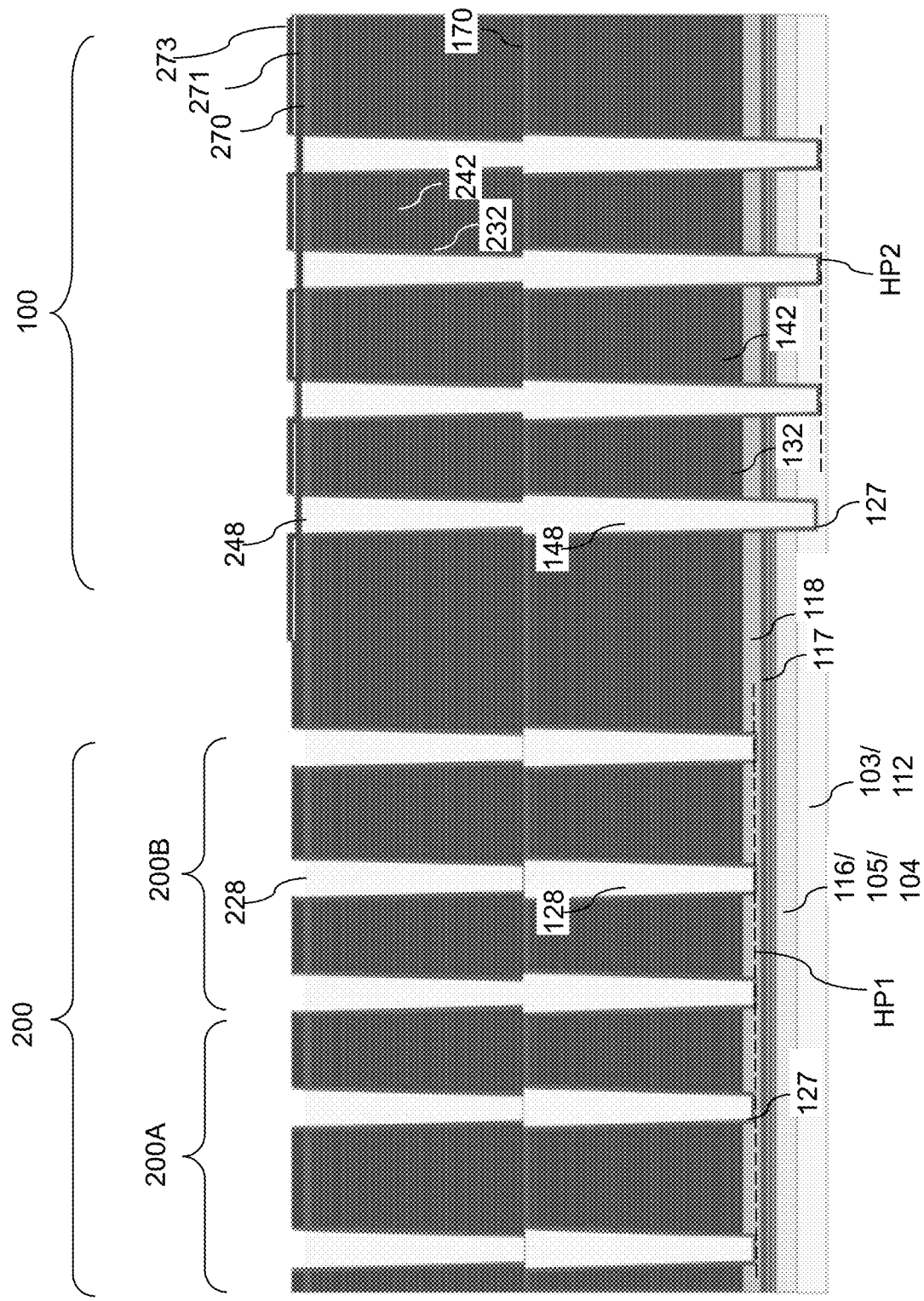
FIG. 59 is a vertical cross-sectional view of the fourth exemplary structure after removal of the patterned photoresist layer according to an embodiment of the present disclosure.

Referring to FIG. 59, the second photoresist layer 397 can be removed, for example, by ashing.

Figure 60:
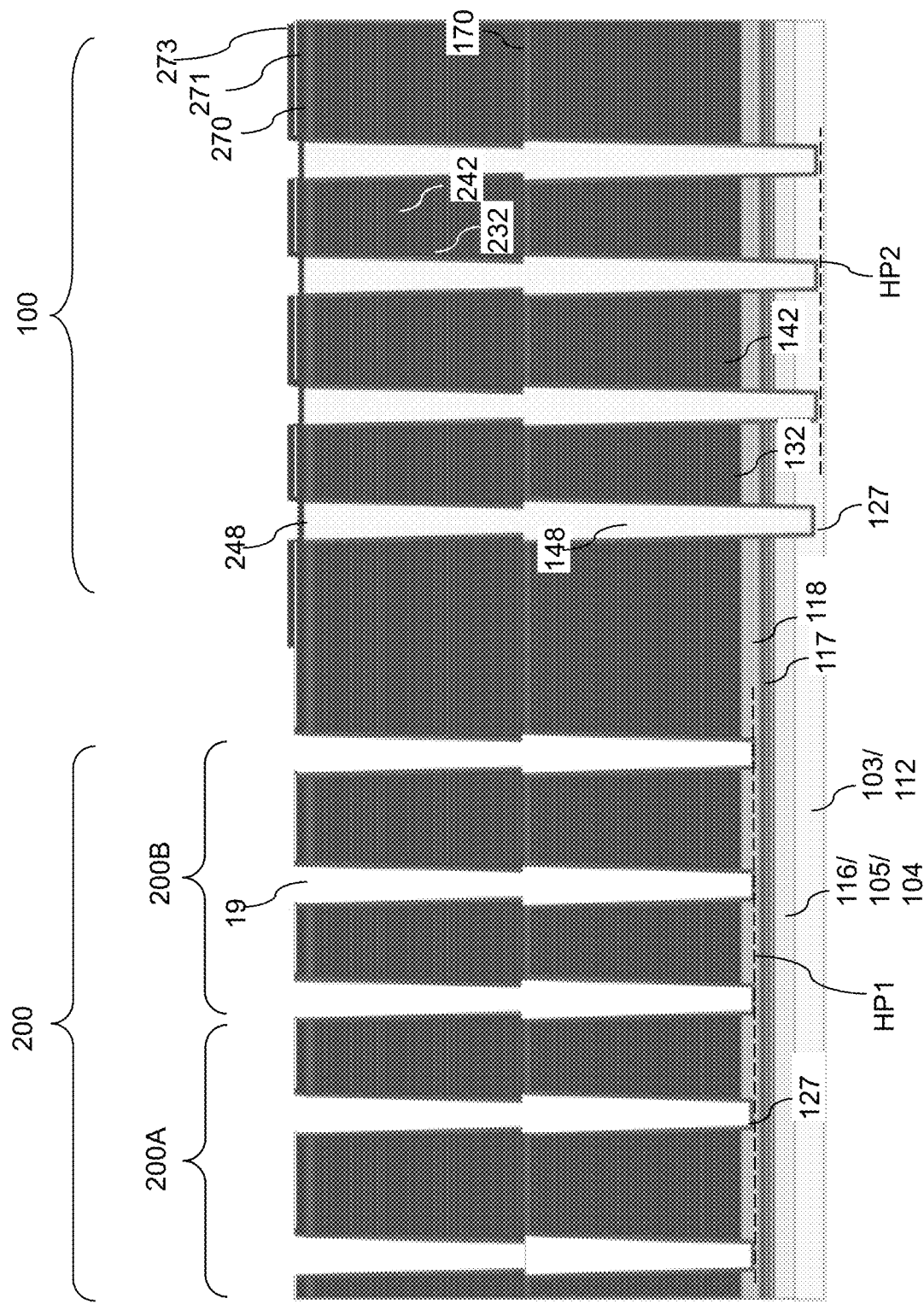
FIG. 60 is a vertical cross-sectional view of the fourth exemplary structure after removal of the sacrificial support opening fill structures and formation of inter-tier support openings according to an embodiment of the present disclosure.

Referring to FIG. 60, the sacrificial second-tier support opening fill structures 228 and the sacrificial first-tier support opening fill structures 128 in the staircase region 200 can be removed to form support openings 19, which are also referred to as inter-tier support openings 19. Each inter-tier support openings 19 extends through, and is laterally bounded by sidewalls of, each layer within the second-tier alternating stack (232, 242) and each layer within the first-tier alternating stack (132, 142).

Removal of the sacrificial second-tier support opening fill structures 228 and the sacrificial first-tier support opening fill structures 128 can be accomplished by an etch process. The chemistry of the etch process can be selected such that the etch process etches the sacrificial fill materials of the sacrificial second-tier support opening fill structures 228 and the sacrificial first-tier support opening fill structures 128 selective to the materials of the second-tier alternating stack (232, 242), the first-tier alternating stack (132, 142), and the source-select-level conductive layer 118. In embodiments in which sacrificial dielectric liners 127 are present in the first-tier support openings 129, the etch process can remove the sacrificial fill materials of the sacrificial second-tier support opening fill structures 228 and the sacrificial first-tier support opening fill structures 128 selective to the materials of the second-tier alternating stack (232, 242), the first and second retro-stepped dielectric material portions (165, 265) and the sacrificial dielectric liners 127. For example, if the sacrificial dielectric liners 127 include silicon oxide and if the sacrificial first-tier support opening fill structures 128 and the sacrificial second-tier support opening fill structures 228 include amorphous silicon, undoped polysilicon, or a silicon-germanium alloy, a wet etch process using hot TMY or TMAH may be used to remove the sacrificial first-tier support opening fill structures 128.

Volumes of the second-tier support openings 229 and the volumes of the first-tier support openings 129 combine to provide the inter-tier support openings 19. The inter-tier support openings 19 can vertically extend at least from a horizontal plane including a topmost surface of the second-tier alternating stack (232, 242) at least to another horizontal plane including a bottommost surface of the first-tier alternating stack (132, 142). Each of the inter-tier support openings 19 can have a greater lateral extent at a level of a topmost layer of the first-tier alternating stack (132, 142) than at a level of a bottommost layer of the second-tier alternating stack (232, 242), for example, by finite taper angles of straight sidewalls of the first-tier support openings 129 and second-tier support openings 229.

Figure 61:
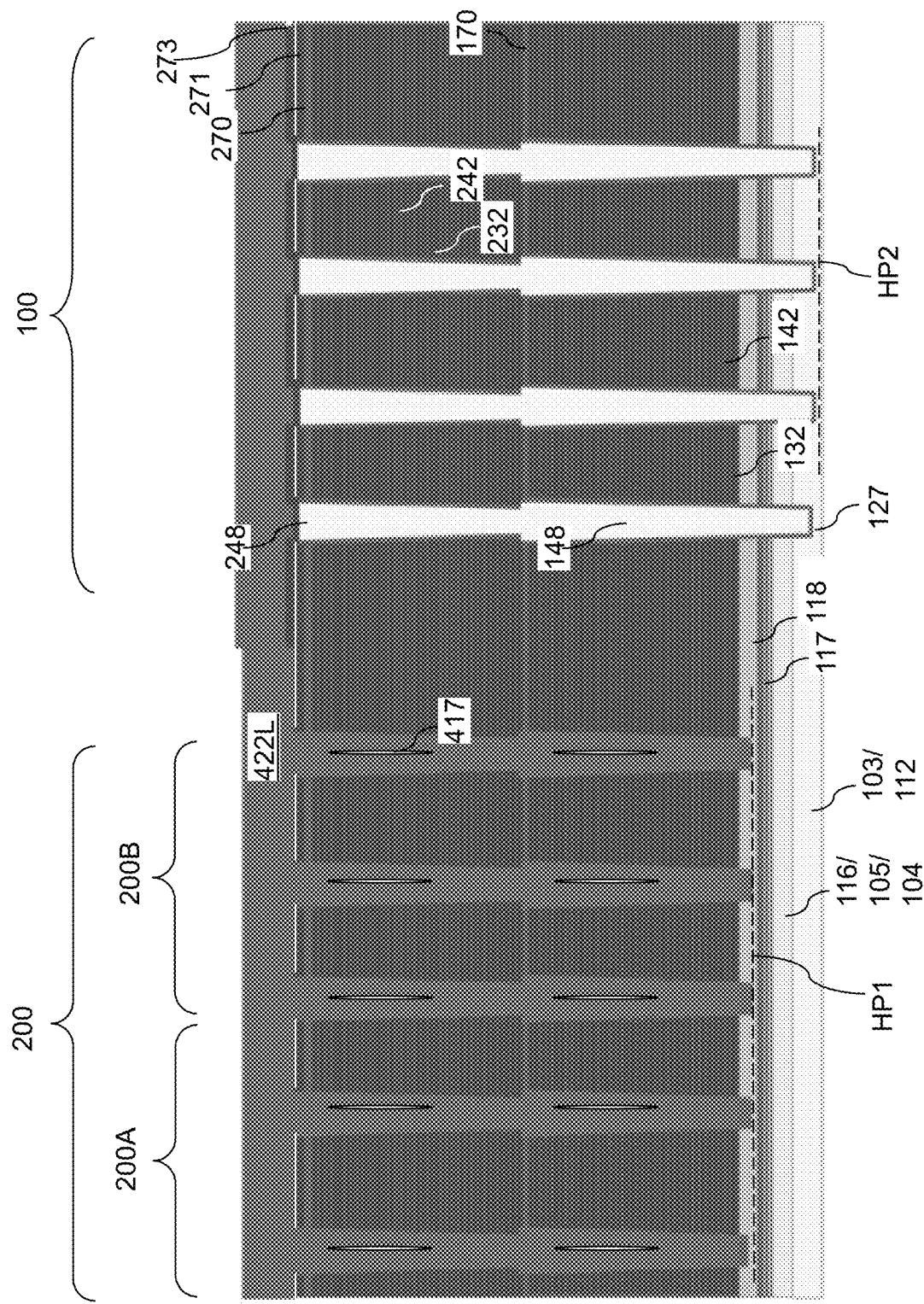
FIG. 61 is a vertical cross-sectional view of the fourth exemplary structure after deposition of a dielectric fill material layer in the inter-tier support openings according to an embodiment of the present disclosure.

Referring to FIG. 61, a dielectric fill material, such as a silicate glass, can be deposited in the empty volumes of the inter-tier support openings 19 to form a continuous dielectric fill material layer 422L. Deposition of the dielectric fill material may be conformal or may be at least partly non-conformal. In one embodiment, voids 417 may be formed within the continuous dielectric fill material layer 422L in the volumes of the inter-tier support openings 19.

Figure 62:
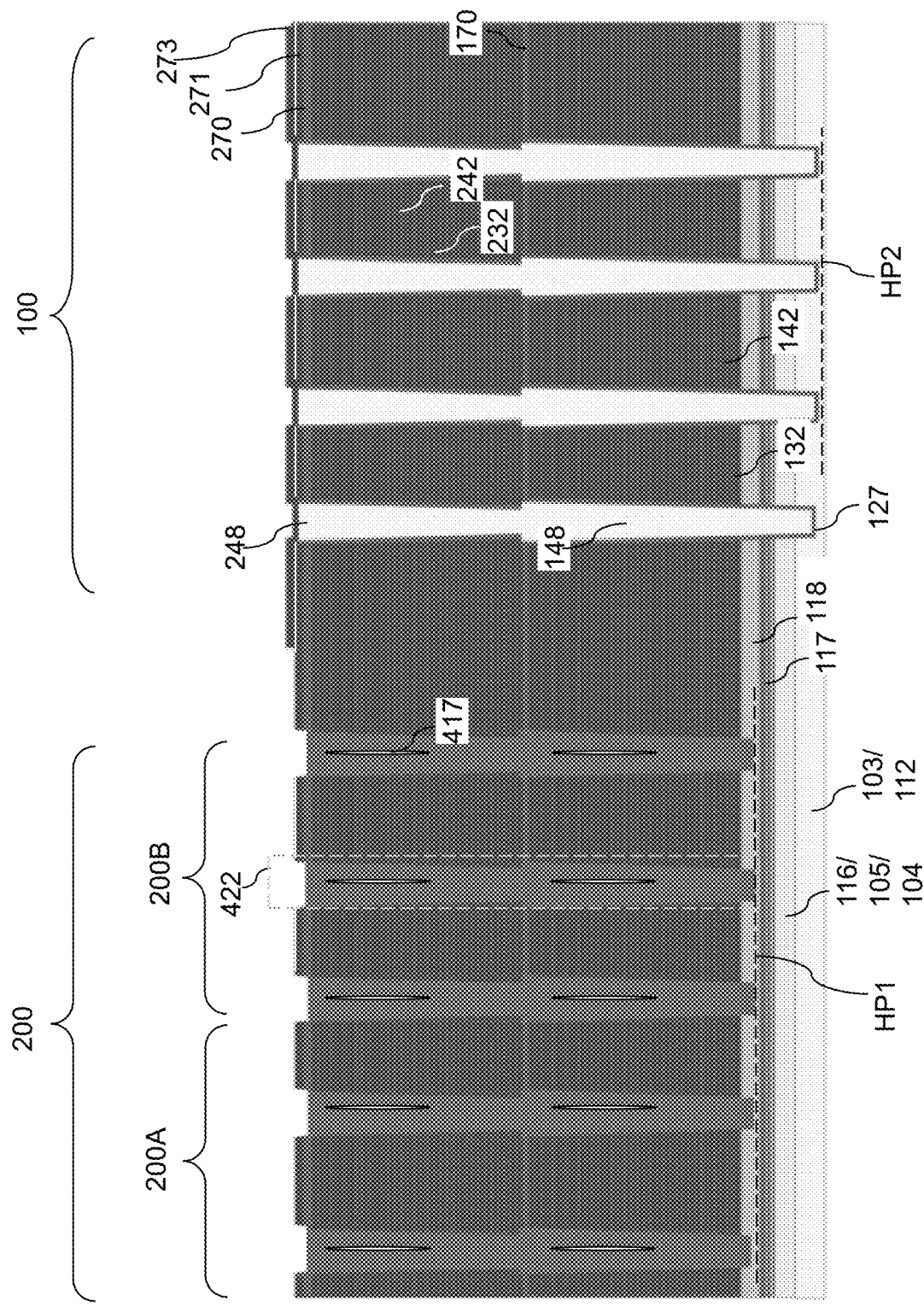
FIG. 62 is a vertical cross-sectional view of the fourth exemplary structure after formation of dielectric support pillar structures according to an embodiment of the present disclosure.

Referring to FIG. 62, the dielectric fill material is etched back, for example, by a recess etch. Each remaining portion of the dielectric fill material in the support openings 19 constitutes a dielectric support pillar structure 422. The dielectric support pillar structures 422 are used as support pillar structures during replacement of the sacrificial material layers (142, 242) with electrically conductive layers in subsequent processing steps. Each dielectric support pillar structure 422 extends through, and is laterally contacted by, each layer within the first-tier alternating stack (132, 142) and each layer with the second-tier alternating stack (232, 242). Each dielectric support pillar structure 422 can have a top surface above the horizontal plane including the bottom surface of the second insulating cap layer 270. Each dielectric support pillar structure 422 may contain no void, one void 217, or two voids 217.

Figure 63:
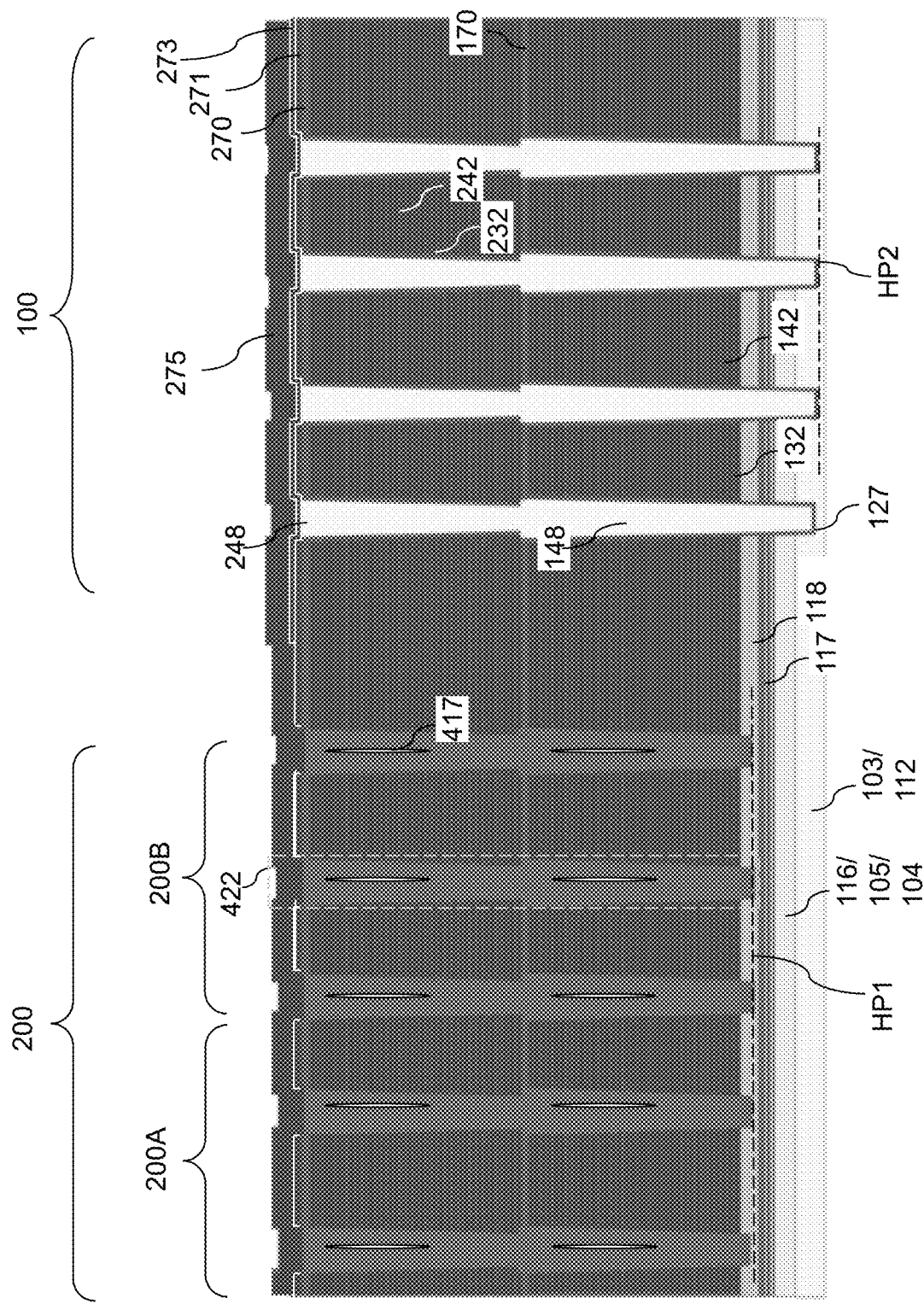
FIG. 63 is a vertical cross-sectional view of the fourth exemplary structure after formation of a second dielectric mask layer according to an embodiment of the present disclosure.

Referring to FIG. 63, a second dielectric mask layer 275 can be deposited over the top surface of the first dielectric mask layer 271, the cover silicon nitride layer 273, and the top surfaces of the dielectric support pillar structures 422. The thickness of the second dielectric mask layer 275 can be in a range from 5 nm to 30 nm, although lesser and greater thicknesses can also be used.

Figure 64:
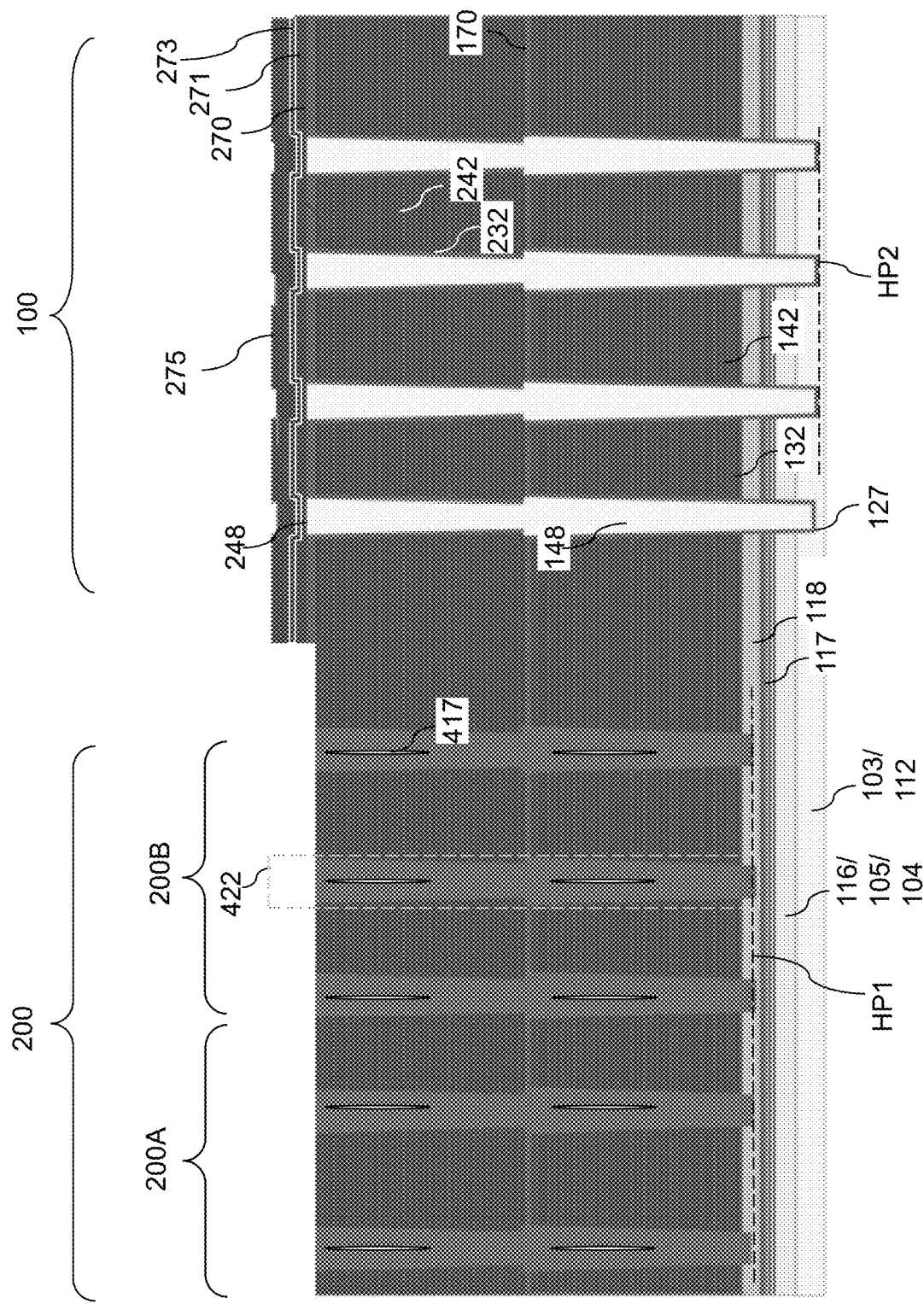
FIG. 64 is a vertical cross-sectional view of the fourth exemplary structure after removal of the first and second dielectric mask layers in the staircase region according to an embodiment of the present disclosure.

Referring to FIG. 64, a photoresist layer (not shown) can be applied over the second dielectric mask layer 275, and lithographically patterned to form an opening in each staircase region 200. Unmasked portions of the second dielectric mask layer 275 and the first dielectric mask layer 271 are etched within the areas of the opening in the photoresist layer. Thus, the second dielectric mask layer 275 and the first dielectric mask layer 271 are removed from the staircase region 200. Top surfaces of the dielectric support pillar structures 422 can be physically exposed within the staircase region 200. Optionally, an isotropic etch process or an anisotropic etch process can be performed to remove physically exposed portions of the second insulating cap layer 270 within the staircase region 200. The photoresist layer can be subsequently removed, for example, by ashing.

Figure 65:
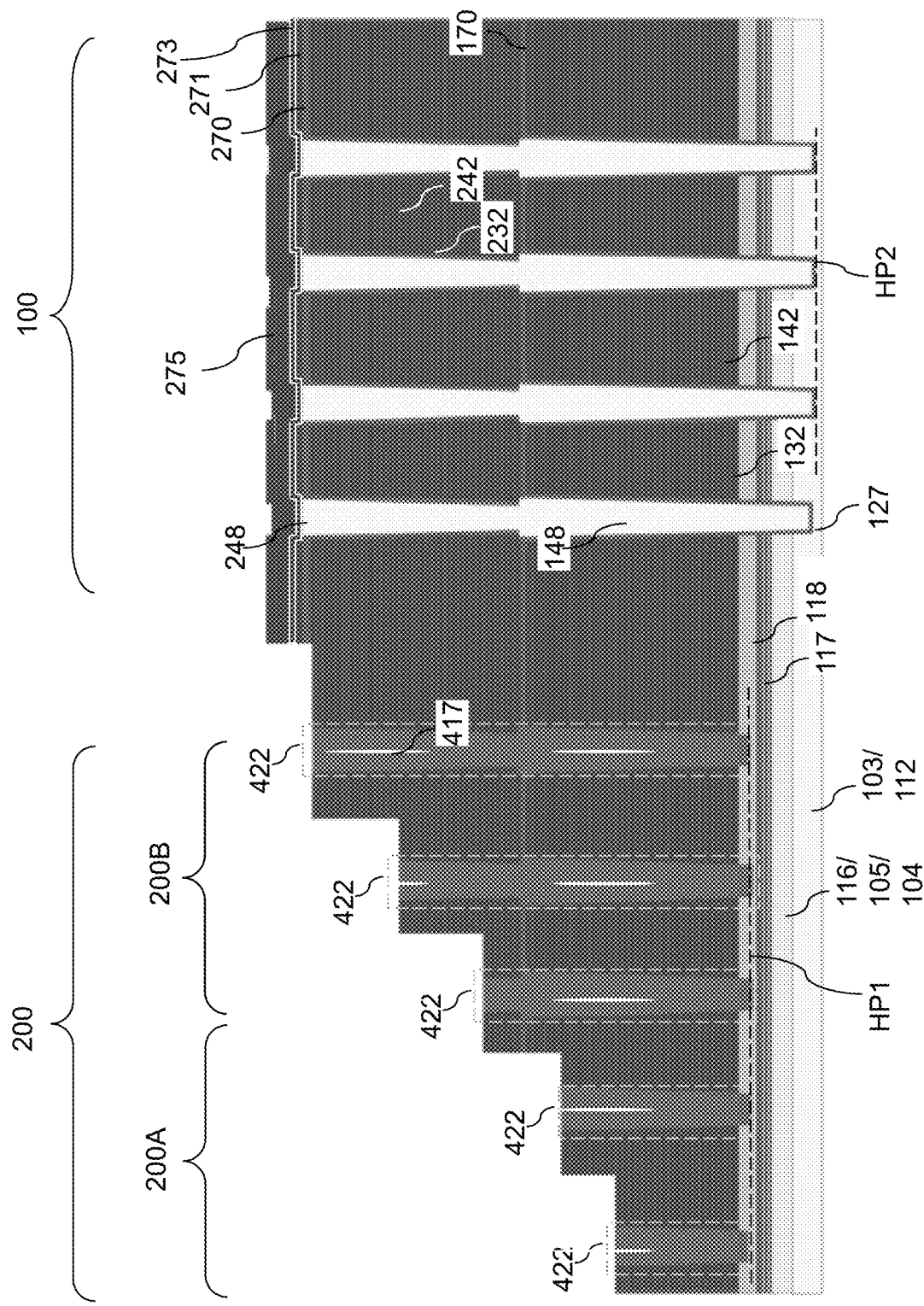
FIG. 65 is a vertical cross-sectional view of the fourth exemplary structure after formation of first stepped surfaces and second stepped surfaces according to an embodiment of the present disclosure.

Referring to FIG. 65, a trimmable etch mask layer (not shown) can be applied over the over the second-tier alternating stack (232, 242) and remaining portions of the second dielectric mask layer 275, the first dielectric mask layer 271, and the cover silicon nitride layer 273. An opening is formed within a distal portion of the trimmable etch mask layer located within a distal portion of the first staircase region 200A that is laterally spaced from the memory array region 100. An anisotropic etch process that etches at least one pair of an insulating layer (132, 232) and a spacer material layer (such as one of the sacrificial material layers (142, 242)) within the first-tier alternating stack (132, 142) and the second-tier alternating stack (232, 242) and a trimming process that trims a lateral extent of the trimmable etch mask layer can be iteratively repeated. The iterative repetition of the anisotropic etch process and the trimming process iteratively etches pairs of a sacrificial material layer (242, 142) and an insulating layer (232, 132) and expands the lateral extent of the opening in the trimmable mask layer. The second-tier alternating stack (232, 242) and the first-tier alternating stack (132, 142) are patterned to form first stepped surfaces on the first-tier alternating stack (132, 142) and second stepped surfaces on the second-tier alternating stack (232, 242).

The dielectric support pillar structures 422 are collaterally recessed vertically during etching of the first insulating layers 132 and the first sacrificial material layers 142. Specifically, the dielectric support pillar structures 422 can be partially etched during each of the anisotropic etch processes. The dielectric support pillar structures 422 are vertically recessed by different etch distances. Remaining portions of the dielectric support pillar structures 422 form dielectric support pillar structures 422 comprising at least one dielectric material. A first subset of the dielectric support pillar structures 422 extends only through a respective subset of layers within the first-tier alternating stack (132, 142) and does not extend through layers within the second-tier alternating stack (232, 242). A second subset of the dielectric support pillar structures 422 extends through all layers within the first-tier alternating stack (132, 142) and a respective subset of layers within the second-tier alternating stack (232, 242). The dielectric support pillar structures 422 can have different heights.

Generally, the dielectric support pillar structures 422 can be collaterally etched during formation of the first stepped surfaces of the first-tier alternating stack (132, 142) and the second stepped surfaces of the second-tier alternating stack (232, 242) to provide different heights that decrease with a lateral distance from the memory array region 100. The first stepped surfaces and the second stepped surfaces are formed after formation and collateral recessing of the dielectric support pillar structures 422.

In one embodiment, the dielectric support pillar structures 422 can have a variable height that decreases with a lateral distance from the memory array region 100. In one embodiment, each dielectric support pillar structure 422 can have a lesser height than top surfaces of the sacrificial first-tier memory opening fill structures 128. In one embodiment, each dielectric support pillar structure 422 can be located below a horizontal plane including a top surface of the second insulating cap layer 270. Top surfaces of the dielectric support pillar structures 422 may be coplanar with, protrude above, or be recessed below, a horizontal surface of stepped surfaces through which a support opening including the dielectric support pillar structure 422 extends.

Figure 66:
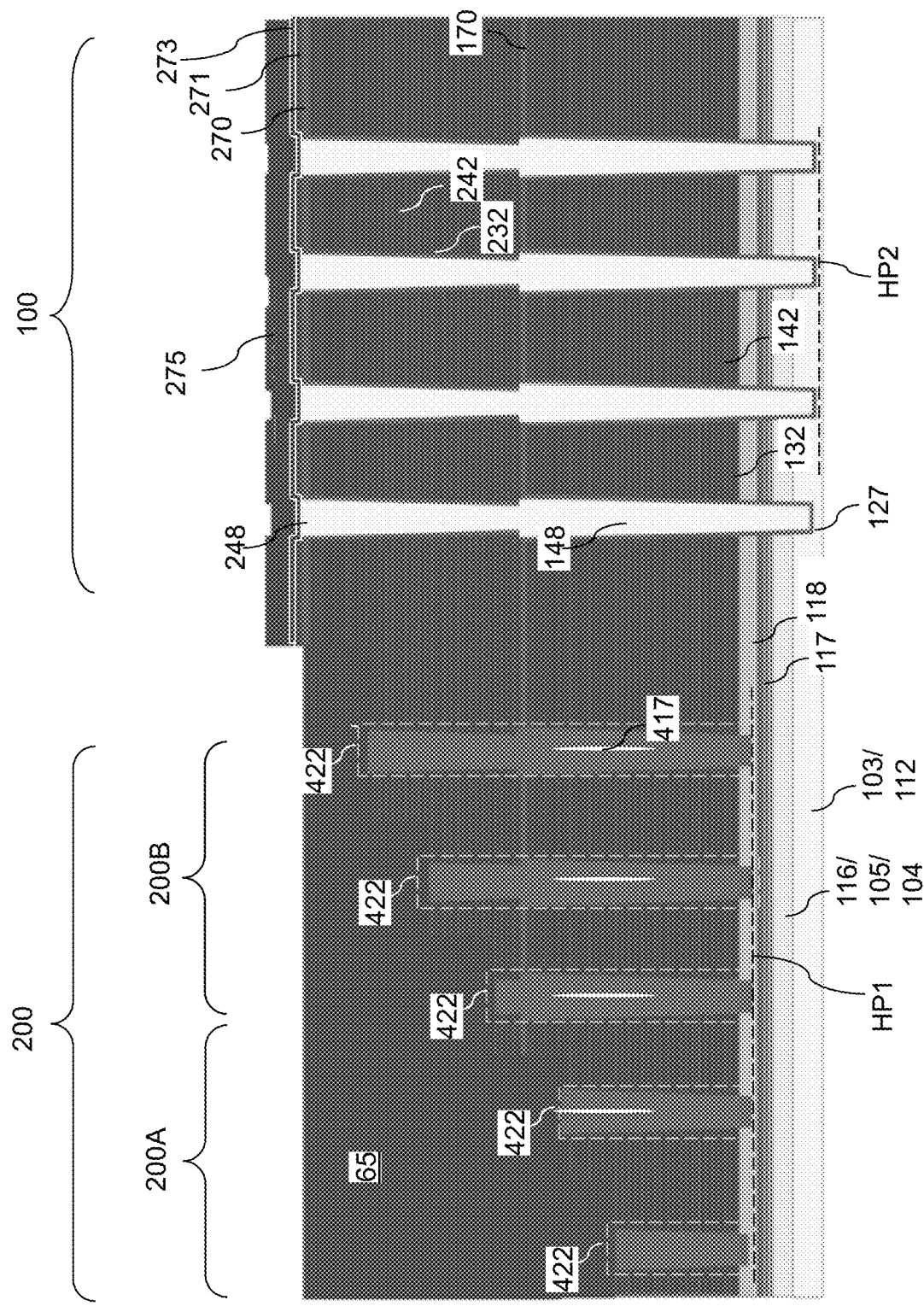
FIG. 66 is a vertical cross-sectional view of the fourth exemplary structure after formation of a retro-stepped dielectric material portion according to an embodiment of the present disclosure.

Referring to FIG. 66, a retro-stepped dielectric material portion 65 can be formed by depositing a dielectric material over the stepped surfaces. The deposited dielectric material can be planarized using the top surface of the second dielectric mask layer 275 as a stopping surface. The top surface of the remaining dielectric material portion can be vertically recessed such that the recessed top surface of the dielectric material is at, or about, the height of the top surface of the second insulating cap layer 270. The remaining portion of the deposited dielectric material constitutes the retro-stepped dielectric material portion 65.

The stepped surfaces of the retro-stepped dielectric material portion 65 can continuously extend from a bottommost layer of the first-tier alternating stack (132, 142) to a topmost layer of the second-tier alternating stack (232, 242). The retro-stepped dielectric material portion 65 includes a planarizable dielectric material, such as a silicate glass. The material of the retro-stepped dielectric material portion 65 may be the same as, or may be different from, the material of the dielectric support pillar structures 422. In one embodiment, the dielectric support pillar structures 422 can include undoped silicate glass, and the retro-stepped dielectric material portion 65 can include a doped silicate glass or undoped silicate glass. The retro-stepped dielectric material portion 65 can have a homogeneous composition throughout. The retro-stepped dielectric material portion 65 is formed over the first stepped surfaces on the first-tier alternating stack (132, 142) and the second stepped surfaces on the second-tier alternating stack (232, 242). The retro-stepped dielectric material portion 65 contacts the dielectric support pillar structures 422.

Figure 67:
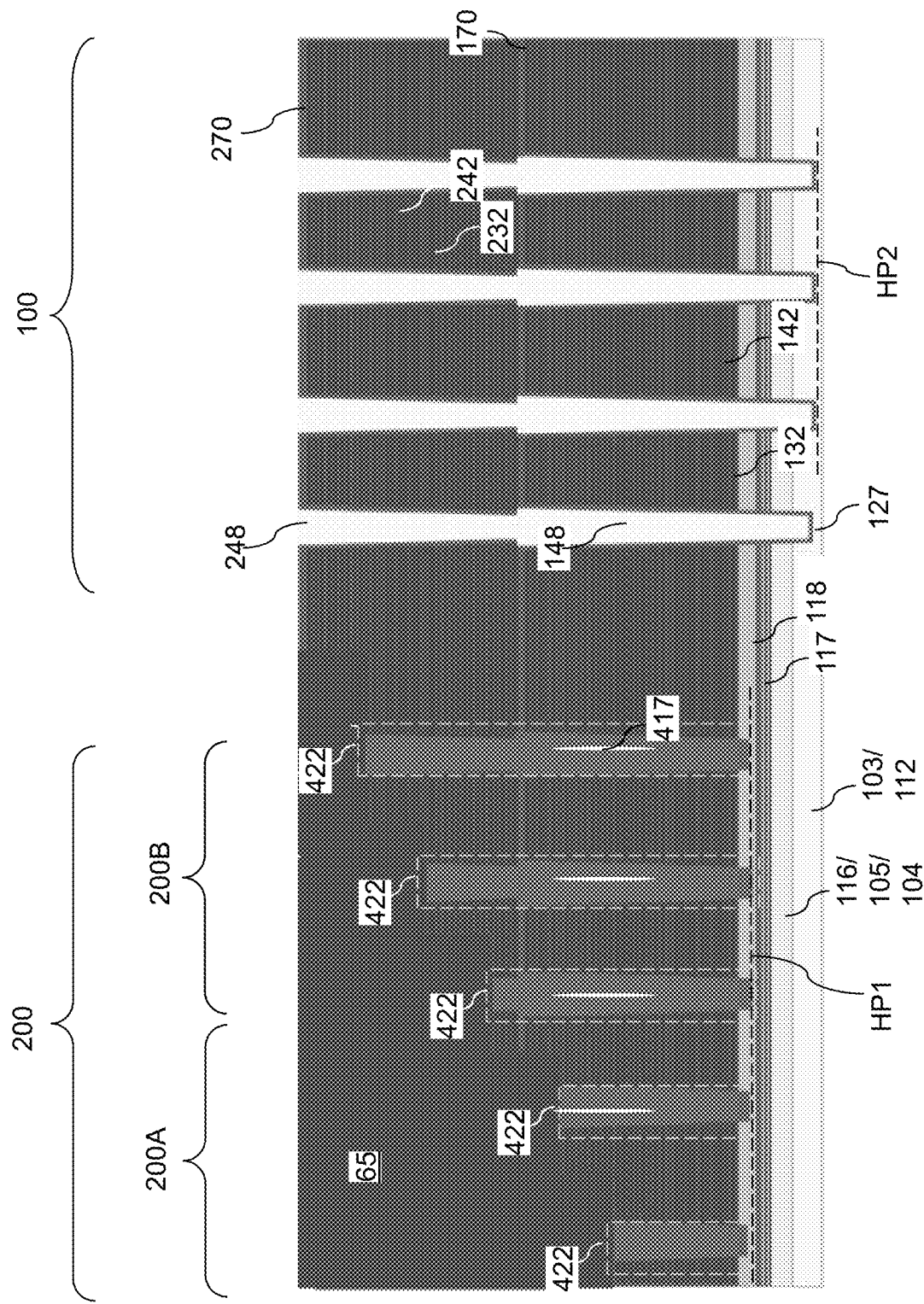
FIG. 67 is a vertical cross-sectional view of the fourth exemplary structure after removal of the dielectric mask layers according to an embodiment of the present disclosure.

Referring to FIG. 67, the remaining portions of the second dielectric mask layer 275, the cover silicon nitride layer 273, and the first dielectric mask layer 271 can be removed from above the second insulating cap layer 270, for example, by a wet etch process using hot phosphoric acid.

Figure 68:
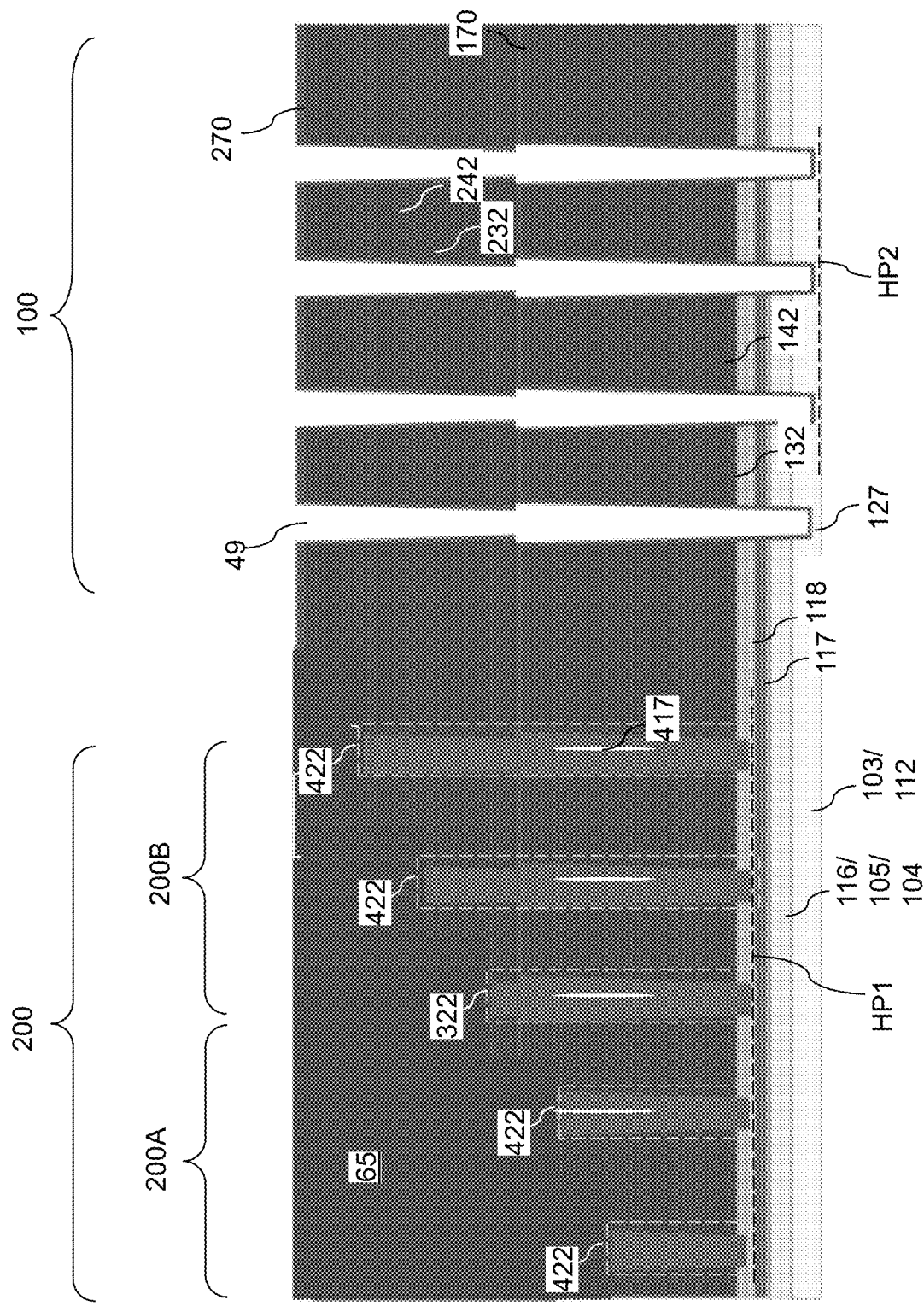
FIG. 68 is a vertical cross-sectional view of the fourth exemplary structure after removal of sacrificial memory opening fill structures and formation of inter-tier memory openings according to an embodiment of the present disclosure.

Referring to FIG. 68, the sacrificial second-tier memory opening fill structures 248 and the sacrificial first-tier memory opening fill structures 148 in the memory array region 100 can be removed to form memory openings 49, which are also referred to as inter-tier memory openings 49. The inter-tier memory openings 49 extend through the second-tier alternating stack (232, 242) and the first-tier alternating stack (132, 142), and can extend into the source-level sacrificial layer 104.

Removal of the sacrificial second-tier memory opening fill structures 248 and the sacrificial first-tier memory opening fill structures 148 can be accomplished by an etch process. The chemistry of the etch process can be selected such that the etch process etches the sacrificial fill materials of the sacrificial second-tier memory opening fill structures 248 and the sacrificial first-tier memory opening fill structures 148 selective to the materials of the second-tier alternating stack (232, 242), the first-tier alternating stack (132, 142), the second retro-stepped dielectric material portion 265, the dielectric support pillar structures 222, and the source-select-level conductive layer 118. In embodiments in which sacrificial dielectric liners 127 are present in the first-tier memory openings 149, the etch process can remove the sacrificial fill materials of the sacrificial second-tier memory opening fill structures 248 and the sacrificial first-tier memory opening fill structures 148 selective to the materials of the second-tier alternating stack (232, 242), the second retro-stepped dielectric material portion 265 and the sacrificial dielectric liners 127. For example, if the sacrificial dielectric liners 127 include silicon oxide and if the sacrificial first-tier memory opening fill structures 148 and the sacrificial second-tier memory opening fill structures 248 include amorphous undoped silicon, undoped polysilicon, or a silicon-germanium alloy, a wet etch process using hot TMY or TMAH may be used to remove the sacrificial first-tier memory opening fill structures 148.

Volumes of the second-tier memory openings 249 and the volumes of the first-tier memory openings 149 combine to provide the inter-tier memory openings 49. The inter-tier memory openings 49 can vertically extend at least from a horizontal plane including a topmost surface of the second-tier alternating stack (232, 242) at least to another horizontal plane including a bottommost surface of the first-tier alternating stack (132, 142). Each of the inter-tier memory openings 49 can have a greater lateral extent at a level of a topmost layer of the first-tier alternating stack (132, 142) than at a level of a bottommost layer of the second-tier alternating stack (232, 242), for example, by finite taper angles of straight sidewalls of the first-tier memory openings 149 and second-tier memory openings 249.

Figure 69:
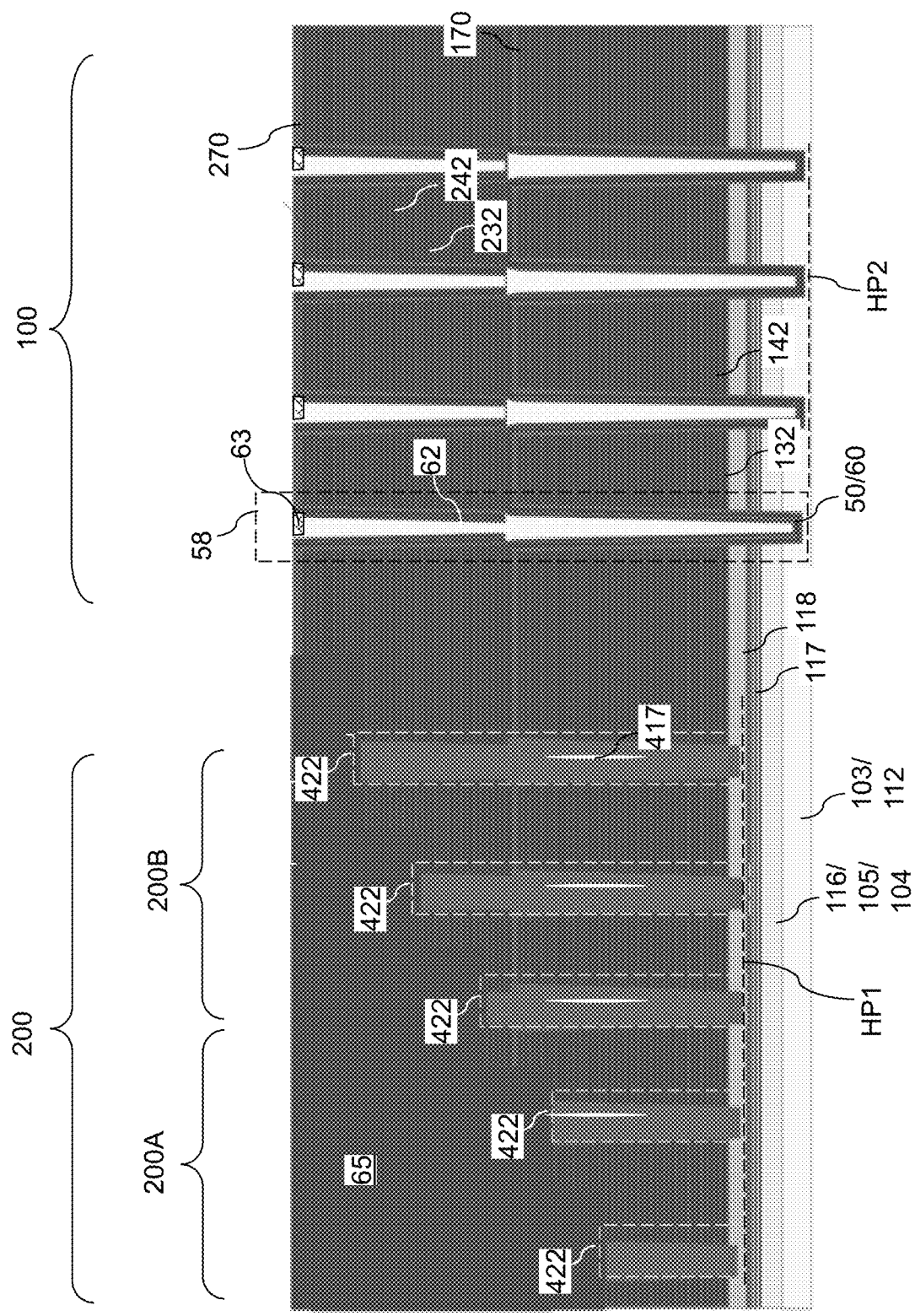
FIG. 69 is a vertical cross-sectional view of the fourth exemplary structure after formation of memory opening fill structures according to an embodiment of the present disclosure.

Referring to FIG. 69, the sacrificial dielectric liners 127, if present, are removed selective to the first-tier alternating stack (132, 142), the second-tier alternating stack (232, 242), the first and second insulating cap layers (170, 270), the dielectric support pillar structures 222, and the various materials of the in-process source-level material layer 10'.

Subsequently, the processing steps of FIGS. 9A-9D and 10 can be performed to form memory opening fill structures 58 in each of the inter-tier memory openings 58. The processing steps of FIGS. 11A, 11B, 12, 13A-13E, and 14 can be performed to form a second contact level dielectric layer 282 and backside trenches 79, and to replace the in-process source-level material layers 10' with source-level material layers 10. The processing steps of FIGS. 15 and 16 can be performed to replace the first and second sacrificial material layers (142, 242) with first and second electrically conductive layers (146, 246).

Figure 70:
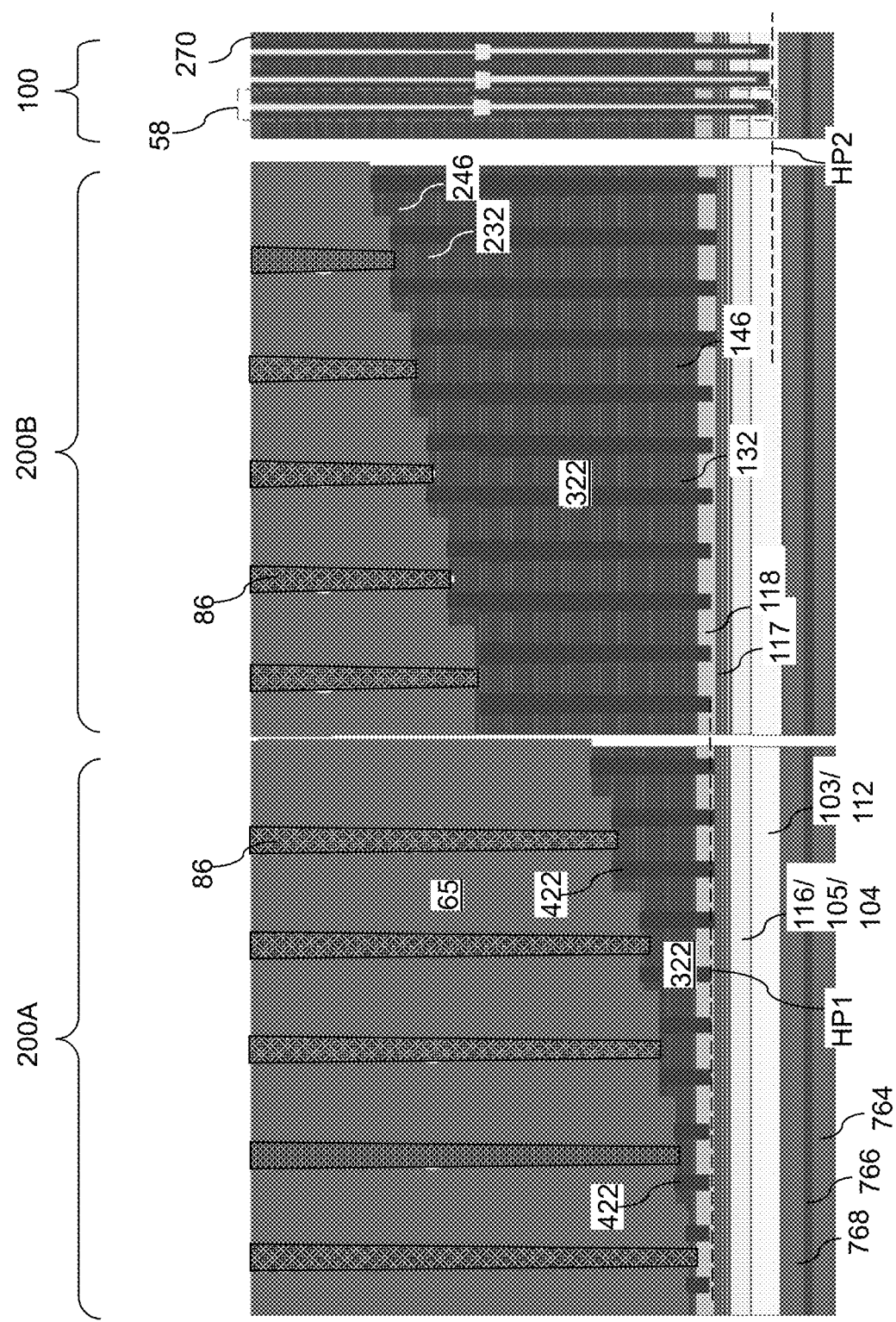
FIG. 70 is a vertical cross-sectional view of the fourth exemplary structure after formation of word line contact via structures according to an embodiment of the present disclosure.

Referring to FIG. 70, the processing steps of FIGS. 17A-17C, 18A an 18B, and 19 can be performed to form dielectric wall structures 76, followed by formation of a second contact level dielectric layer 282, various contact via structures (86, 88, 488), a line-level dielectric layer 290, bit lines 98, and interconnection line structures 96 as shown in FIG. 19.

Referring to FIGS. 1A-19 and 37-70 collectively and according to various embodiments of the present disclosure, a three-dimensional semiconductor device is provided, which comprises: a first-tier alternating stack of first insulating layers 132 and first electrically conductive layers 146 located over a substrate 8; a second-tier alternating stack of second insulating layers 232 and second electrically conductive layers 246 located over the first-tier alternating stack (132, 146); a memory array region 100 including memory stack structures 55 that vertically extend through each layer of the first-tier alternating stack (132, 146) and the second-tier alternating stack (232, 246); a staircase region including first stepped surfaces of the first-tier alternating stack (132, 146) and second stepped surfaces of the second-tier alternating stack (232, 246); dielectric support pillar structures (222 or 422) consisting essentially of at least one dielectric material and located within the staircase region 200, wherein a subset of the dielectric support pillar structures (222 or 422) extends through all layers of the first-tier alternating stack (132, 146) and at least a bottommost layer of the second-tier alternating stack (232, 246), and have a greater lateral extent at a level of a topmost layer of the first-tier alternating stack (132, 146) than at a level of the bottommost layer of the second-tier alternating stack (232, 246).

In one embodiment, the subset of the dielectric support pillar structures (222 or 422) comprises: a first straight sidewall that extends through all layers of the first-tier alternating stack (132, 146) and into a layer underlying the first-tier alternating stack (such as a source-select-level conductive layer 118); an annular horizontal surface contacting a bottom surface of the bottommost layer of the second-tier alternating stack (232, 246) (such as the bottommost one of the second insulating layers 232) and overlying the first straight sidewall; and a second straight sidewall that extends through at least the bottommost layer of the second-tier alternating stack (232, 246).

In one embodiment, the dielectric support pillar structures 422 have different heights that decrease with a lateral distance from the memory array region 100.

In one embodiment, the dielectric support pillar structures 222 have top surfaces located within a same horizontal plane.

Figure 80:
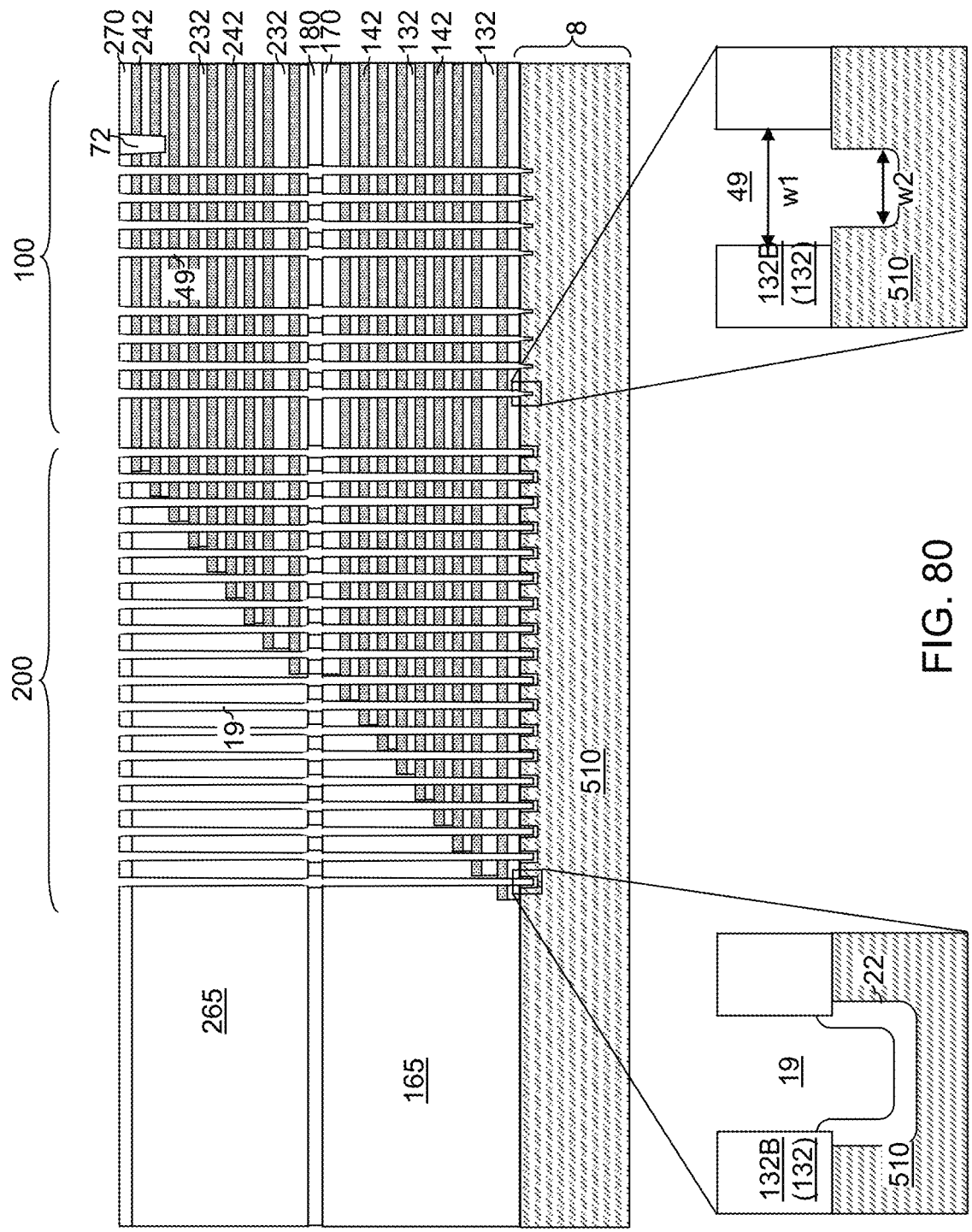
FIG. 80 is a vertical cross-sectional view of the fifth exemplary structure after removal of the etch mask material layer according to an embodiment of the present disclosure.

In one embodiment, the three-dimensional semiconductor device comprises a retro-stepped dielectric material portion (such as the second retro-stepped dielectric material portion in FIG. 51 or the retro-stepped dielectric material portion 65 in FIG. 80) overlying the first stepped surfaces and the second stepped surfaces.

In one embodiment, each of the dielectric support pillar structures 422 includes a top surface that contacts a surface of the retro-stepped dielectric material portion 65.

In one embodiment, another one of the dielectric support pillar structures 422 extends through a subset of a layer of the first-tier alternating stack (132, 146), does not contact the second-tier alternating stack (232, 246), and underlies and contacts the retro-stepped dielectric material portion 65.

In one embodiment, the three-dimensional semiconductor device comprises: first word line contact via structures 86 extending through the retro-stepped dielectric material portion (such as the second retro-stepped dielectric material portion in FIG. 51 or the retro-stepped dielectric material portion 65 in FIG. 80) and contacting a respective one of the first electrically conductive layers 146; and second word line contact via structures 86 extending through the retro-stepped dielectric material portion and contacting a respective one of the second electrically conductive layers 246.

In one embodiment, the retro-stepped dielectric material portion 65 continuously extends from a surface of a bottommost insulating layer within the first-tier alternating stack (132, 146) to a surface of a topmost insulating layer within the second-tier alternating stack (232, 246), has a homogeneous composition throughout, and has a top surface located at, or overlies, a topmost surface of the second-tier alternating stack (232, 246).

In one embodiment, each of the dielectric support pillar structures 422 has a top surface within a same horizontal plane that includes a top surface of the retro-stepped dielectric material portion (such as a second retro-stepped dielectric material portion 265).

In one embodiment, bottom surfaces of the dielectric support pillar structures (422 or 222) are located within a first horizontal plane HP1; and bottom portions of the memory stack structures 55 contact a source contact layer 114 that underlie the first horizontal plane HP1.

In one embodiment, each of the memory stack structures 55 comprises a respective memory film 50 and a respective vertical semiconductor channel 60.

In one embodiment, the three-dimensional semiconductor device comprises an insulating cap layer (such as a first insulating cap layer 170) located between the first-tier alternating stack (132, 146) and the second-tier alternating stack (232, 246), wherein each of the memory stack structures 55 and the one of the dielectric support pillar structures (422 or 222) has a greater lateral extent at a level of the insulating cap layer than at a level of a topmost layer within the first-tier alternating stack (132, 146), and than at a level of a bottommost layer within the second-tier alternating stack (232, 246).

The structures of various embodiments of the present disclosure can be used to provide structural support to the insulating layers (132, 232) in the staircase region 200 during replacement of sacrificial material layers (142, 242) with electrically conductive layers in a multi-tier structure including a first-tier alternating stack (132, 146) and a second-tier alternating stack (232, 246), while eliminating or minimizing a leakage current due to semiconductor material portions extending through the alternating stacks in the staircase region. The elimination or reduction of the leakage current improves the signal-to-noise ratio of the bit line sense amplifier, and provides enhanced sensing capability and enables scaling of a three-dimensional memory device.

Figure 71:
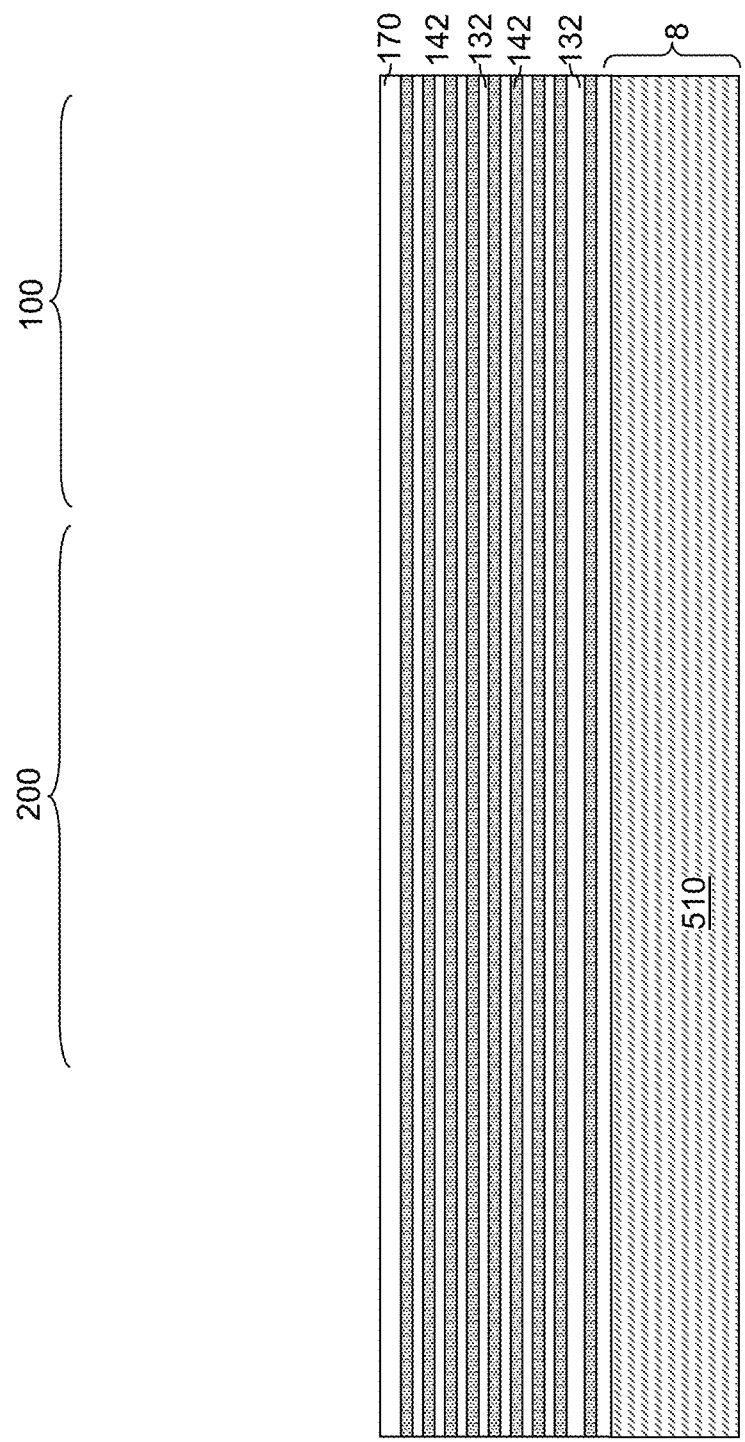
FIG. 71 is a vertical cross-sectional view of a fifth exemplary structure after formation of a first-tier alternating stack of first insulating layers and first sacrificial material layers over s substrate including a semiconductor material layer according to an embodiment of the present disclosure.

Referring to FIG. 71, a fifth exemplary structure can include a substrate 8 containing a semiconductor material layer 510. In one embodiment, the semiconductor material layer 510 can include a first single-crystalline semiconductor material such as single-crystalline silicon. In one embodiment, the semiconductor material layer 510 may be provided as a surface portion of a bulk single-crystalline semiconductor substrate. In another alternative embodiment, the semiconductor material layer 510 may be provided as a top semiconductor layer in a semiconductor-on-insulator (SOI) substrate. The semiconductor material layer 510 can have a doping of a first conductivity type. In one embodiment, the atomic concentration of dopants of the first conductivity type in the semiconductor material layer 510 may be in a range from $1.0 \times 10^{14}/cm^3$ to $1.0 \times 10^{18}/cm^3$, although lesser and greater atomic concentrations may also be employed.

The processing steps of FIG. 2 can be performed to form a first-tier alternating stack of first insulating layers 132 and first sacrificial material layers 142. The first-tier alternating stack of first insulating layers 132 and first sacrificial material layers 142 in the fifth exemplary structure may be the same as the first-tier alternating stack of first insulating layers 132 and first sacrificial material layers 142 in the first exemplary structure. A first insulating cap layer 170 may be formed over the first-tier alternating stack (132, 142) in the same manner as in the first embodiment.

Figure 72:
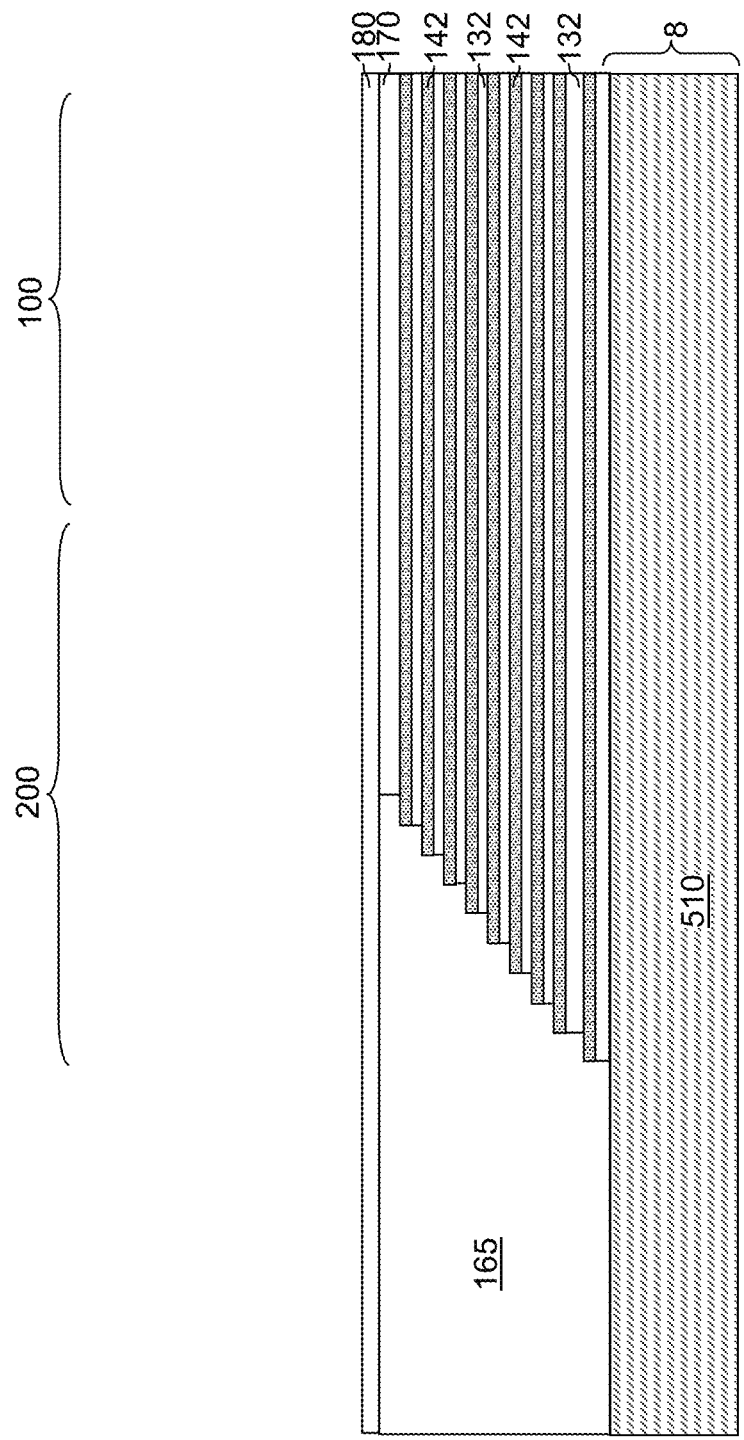
FIG. 72 is a vertical cross-sectional view of the fifth exemplary structure after formation of first stepped surfaces, a first retro-stepped dielectric material portion, and an inter-tier dielectric layer according to an embodiment of the present disclosure.

Referring to FIG. 72, the processing steps of FIG. 3 can be performed to form first stepped surfaces, a first retro-stepped dielectric material portion 165, and an inter-tier dielectric layer 180. In the fifth embodiment, a bottom surface of the first retro-stepped dielectric material portion 165 can contact a top surface of the semiconductor material layer 510.

Figure 73A:
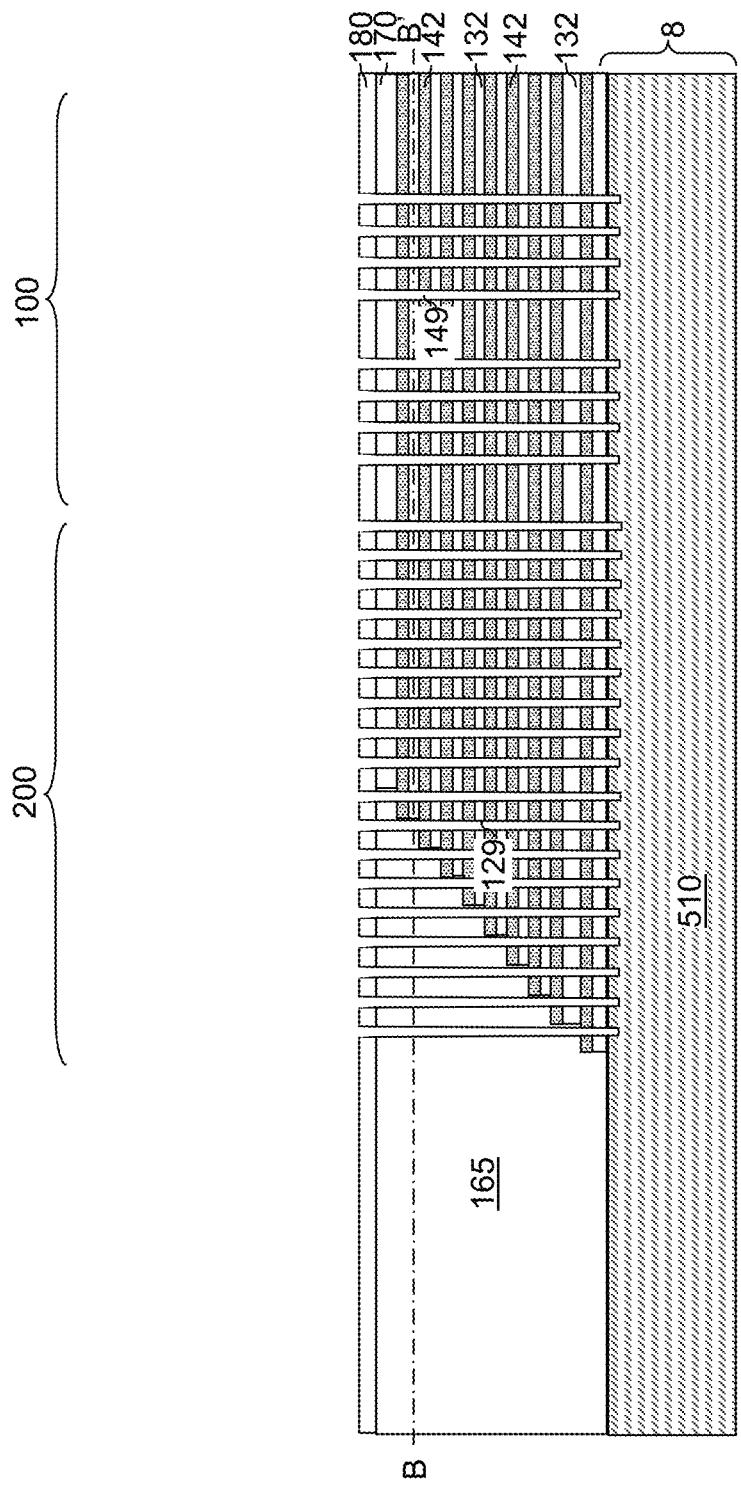
FIG. 73A is a vertical cross-sectional view of the fifth exemplary structure after formation of first-tier memory openings and first-tier support openings according to an embodiment of the present disclosure.
Figure 73B:
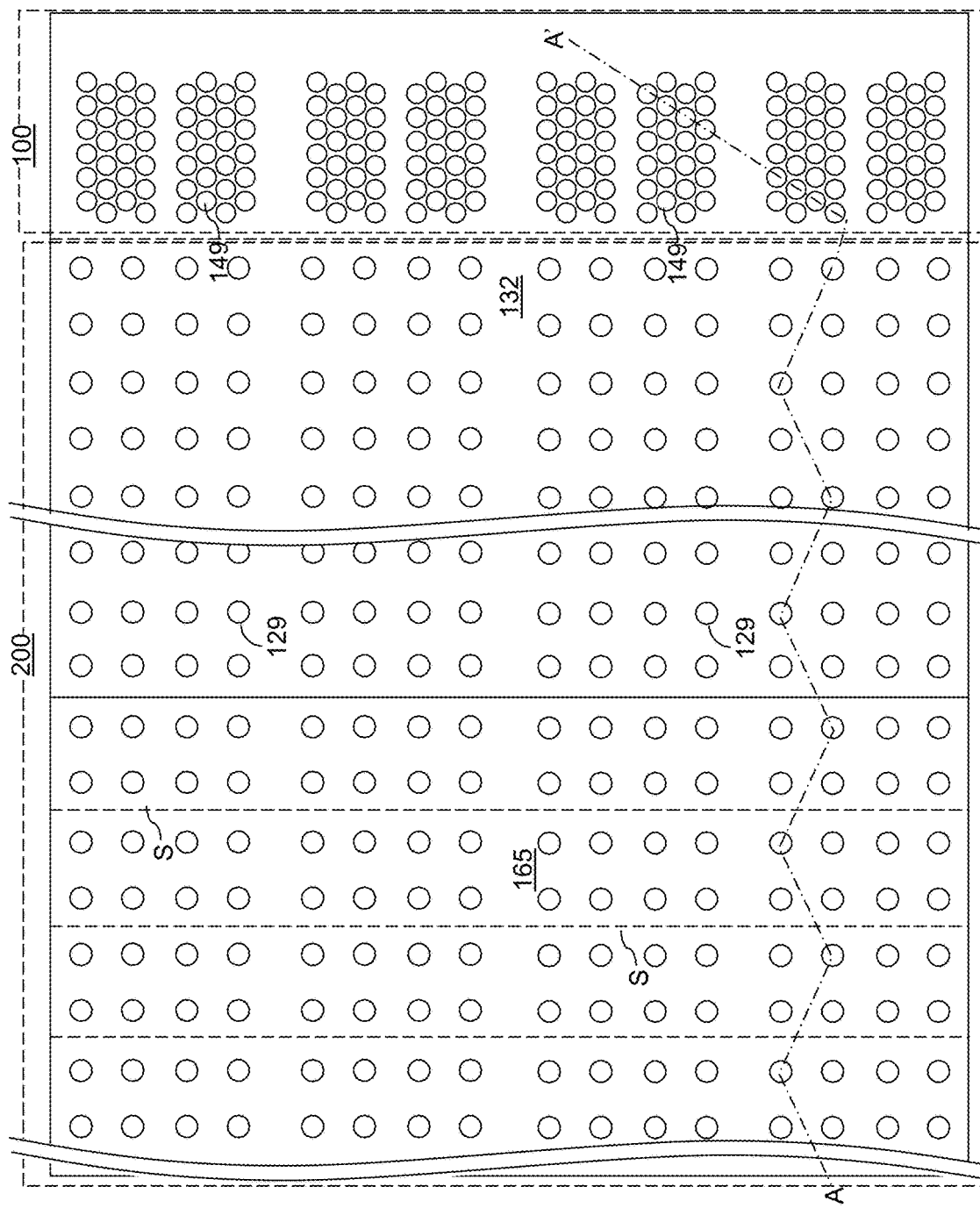
FIG. 73B is a top-down view of the fifth exemplary structure along the horizontal plane B-B' of FIG. 73A. The hinged vertical plane A-A' corresponds to the plane of the vertical cross-sectional view of FIG. 73A.

Referring to FIGS. 73A and 73B, the processing steps of FIGS. 4A and 4B can be performed to form first-tier memory openings 149 and first-tier support openings 129. Any pattern that can be employed for the first-tier memory openings 149 and first-tier support openings 129 in the first exemplary structure may be employed for the pattern of the first-tier memory openings 149 and first-tier support openings 129 in the fifth exemplary structure.

Figure 74:
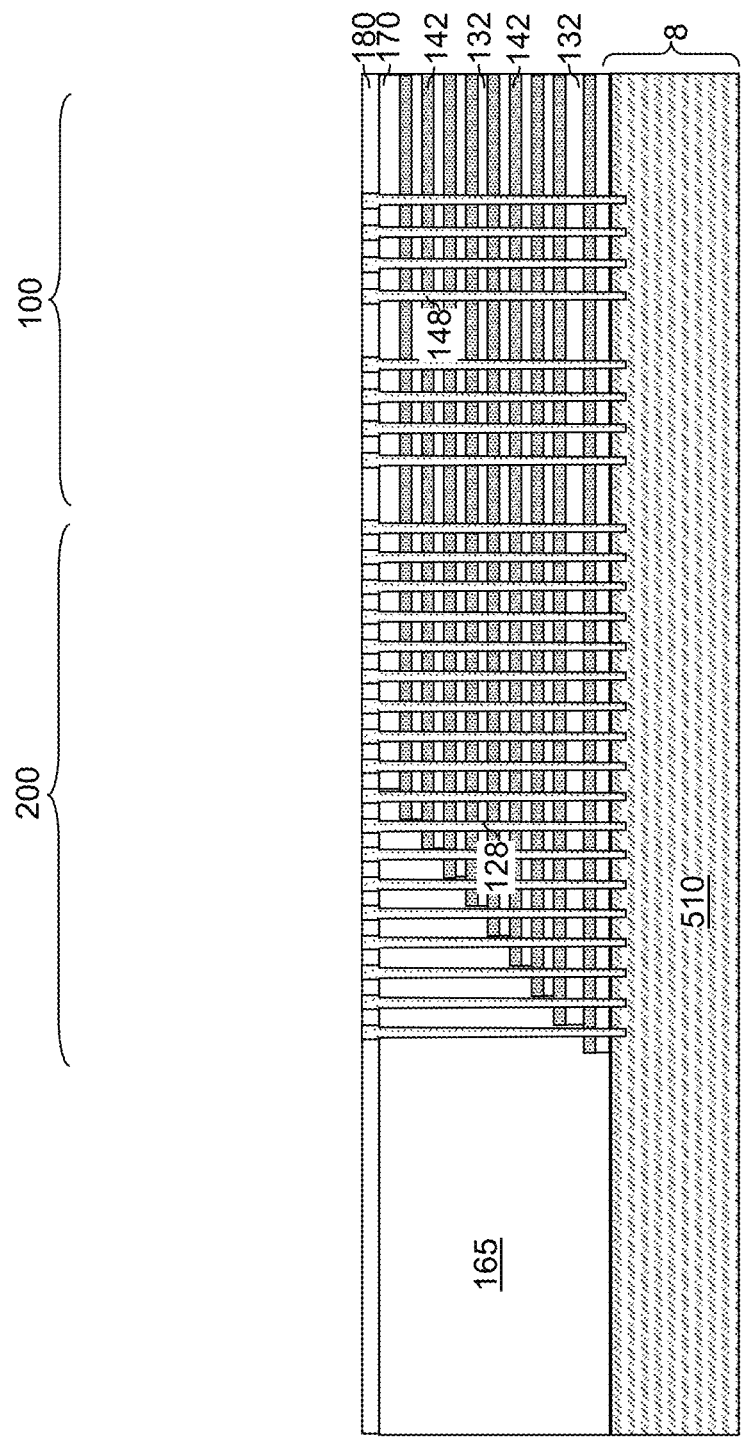
FIG. 74 is a vertical cross-sectional view of the fifth exemplary structure after formation of sacrificial first-tier memory opening fill structures and sacrificial first-tier support opening fill structures according to an embodiment of the present disclosure.

Referring to FIG. 74, the processing steps of FIG. 5 can be performed to form sacrificial first-tier memory opening fill structures 148 and sacrificial first-tier support opening fill structures 128. The sacrificial first-tier memory opening fill structures 148 and the sacrificial first-tier support opening fill structures 128 in the fifth exemplary structure can include the same material as the sacrificial first-tier memory opening fill structures 148 and the sacrificial first-tier support opening fill structures 128 in the first exemplary structure.

Figure 75:
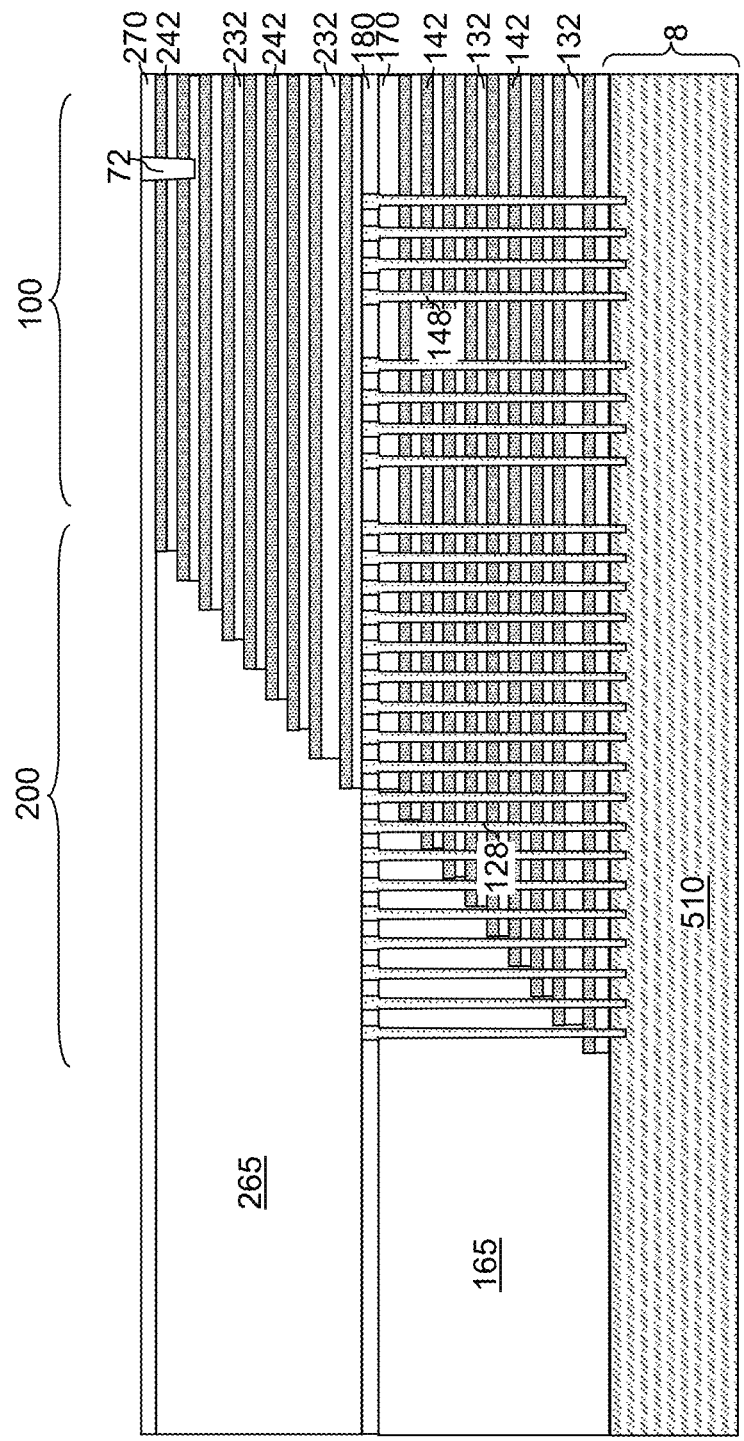
FIG. 75 is a vertical cross-sectional view of the fifth exemplary structure after formation of a second-tier alternating stack, second stepped surfaces, a second retro-stepped dielectric material portion, and a second insulating cap layer according to an embodiment of the present disclosure.

Referring to FIG. 75, the processing steps of FIG. 6 can be performed to form a second-tier alternating stack of second insulating layers 232 and second sacrificial material layers 242, second stepped surfaces, a second retro-stepped dielectric material portion 265, a second insulating cap layer 270, and optional drain-select-level isolation structures 72.

Figure 76A:
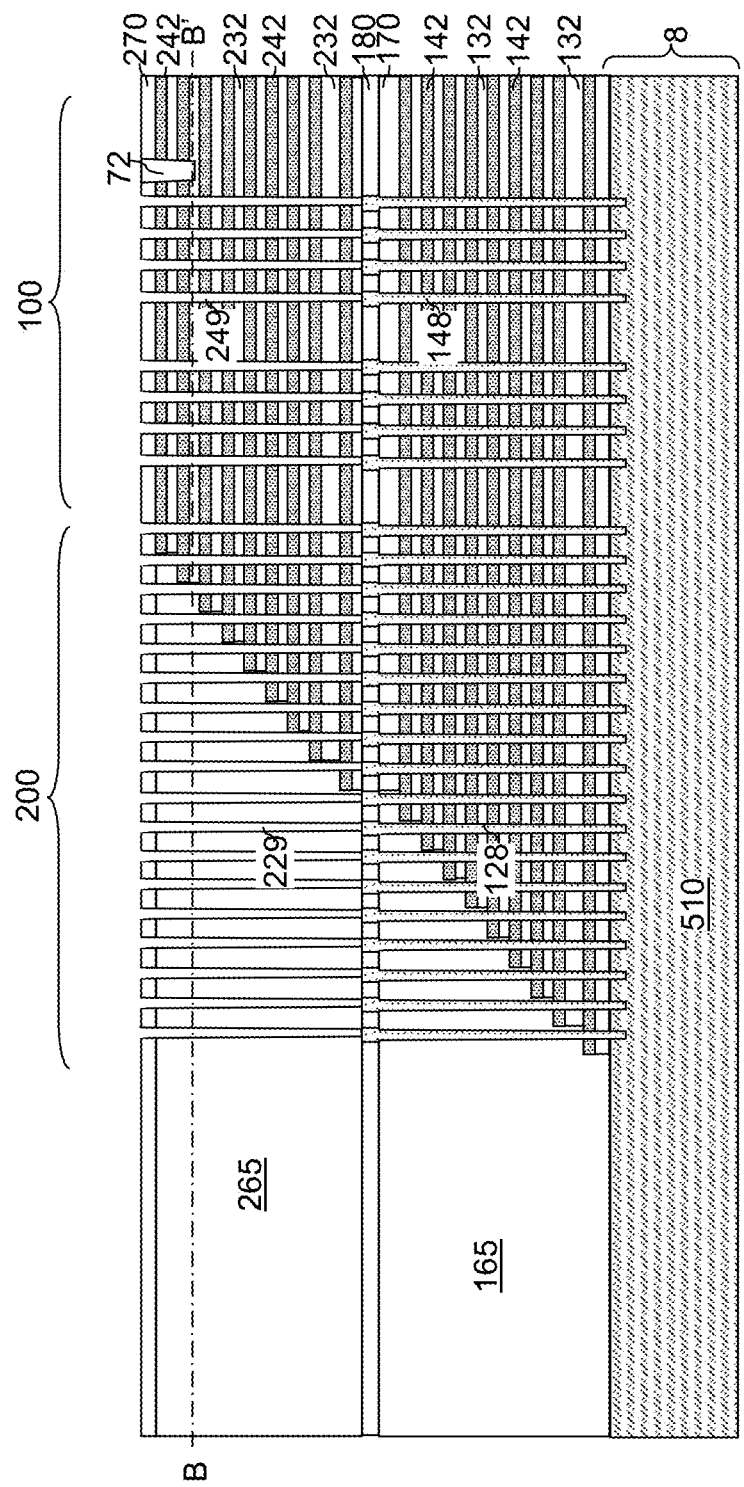
FIG. 76A is a vertical cross-sectional view of the fifth exemplary structure after formation of second-tier memory openings and second-tier support openings according to an embodiment of the present disclosure.
Figure 76B:
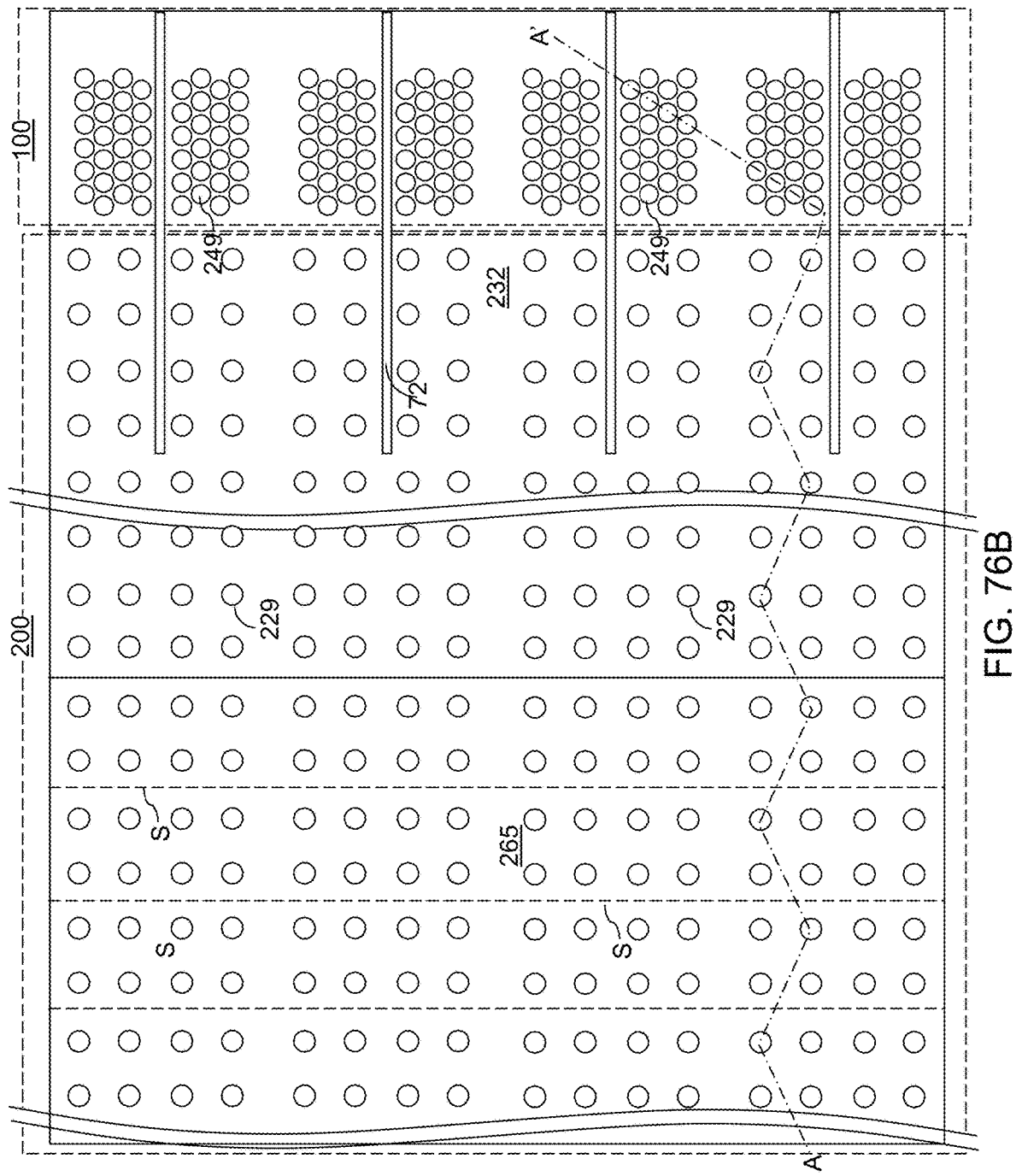
FIG. 76B is a top-down view of the fifth exemplary structure along the horizontal plane B-B' of FIG. 76A. The hinged vertical plane A-A' corresponds to the plane of the vertical cross-sectional view of FIG. 76A.

Referring to FIGS. 76A and 76B, the processing steps of FIGS. 7A and 7B can be performed to form second-tier memory openings 249 and second-tier support openings 229. The pattern of the second-tier memory openings 249 and second-tier support openings 229 can be the same as the pattern of the sacrificial first-tier memory opening fill structures 148 and the sacrificial first-tier support opening fill structures 128 in the first-tier structure. As such, a top surface of a sacrificial first-tier memory opening fill structure 148 is physically exposed at the bottom of each second-tier memory opening 249, and a top surface of a sacrificial first-tier support opening fill structure 128 is physically exposed at the bottom of each second-tier support opening 229.

Figure 77:
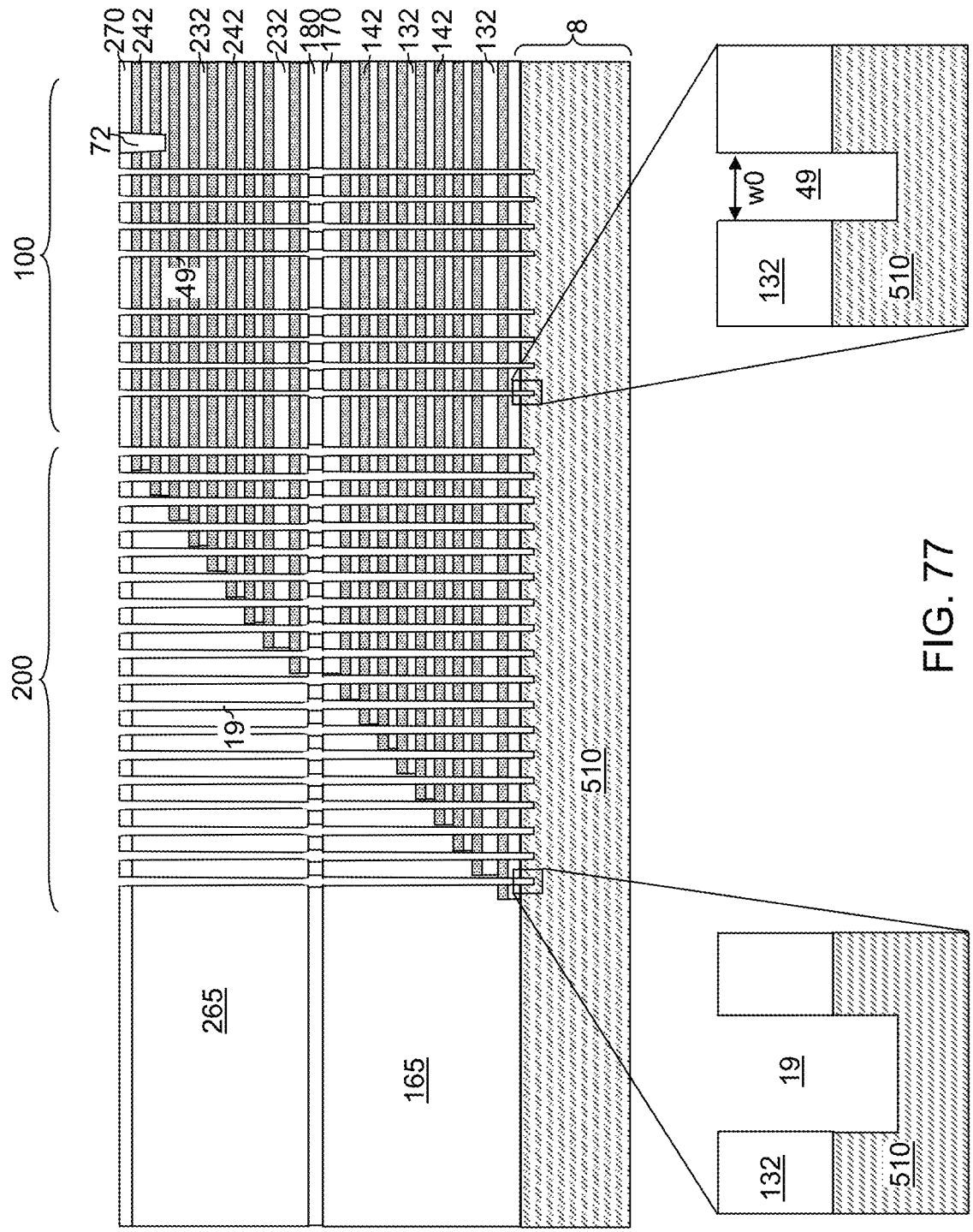
FIG. 77 is a vertical cross-sectional view of the fifth exemplary structure after formation of inter-tier memory openings and inter-tier support openings according to an embodiment of the present disclosure.

Referring to FIG. 77, the processing steps of FIG. 8 can be performed to form inter-tier memory openings 49 and inter-tier support openings 19. The inter-tier memory openings 49 are herein referred to as memory openings 49, and the inter-tier support openings 19 are herein referred to as support openings 19.

Generally, at least one alternating stack of insulating layers (132, 232) and spacer material layers (such as sacrificial material layers (142, 242)) can be formed over a substrate 8 including a semiconductor material layer 510. The spacer material layers may be formed as, or may be subsequently replaced with, electrically conductive layers. While the present disclosure is described employing an embodiment in which the spatter material layers are formed as sacrificial material layers (142, 242), embodiments are expressly contemplated herein in which the spacer material layers are formed as electrically conductive layers (146, 246). An array of memory openings 49 and an array of support openings 19 can be formed through the at least one alternating stack {(132, 142), (232, 242)}. In case the semiconductor material layers 10 include a first single crystalline semiconductor material, a cylindrical sidewall and a bottom surface of the first single crystalline semiconductor material can be physically exposed at the bottom of each memory opening 49 and at the bottom of each support opening 19.

Figure 78:
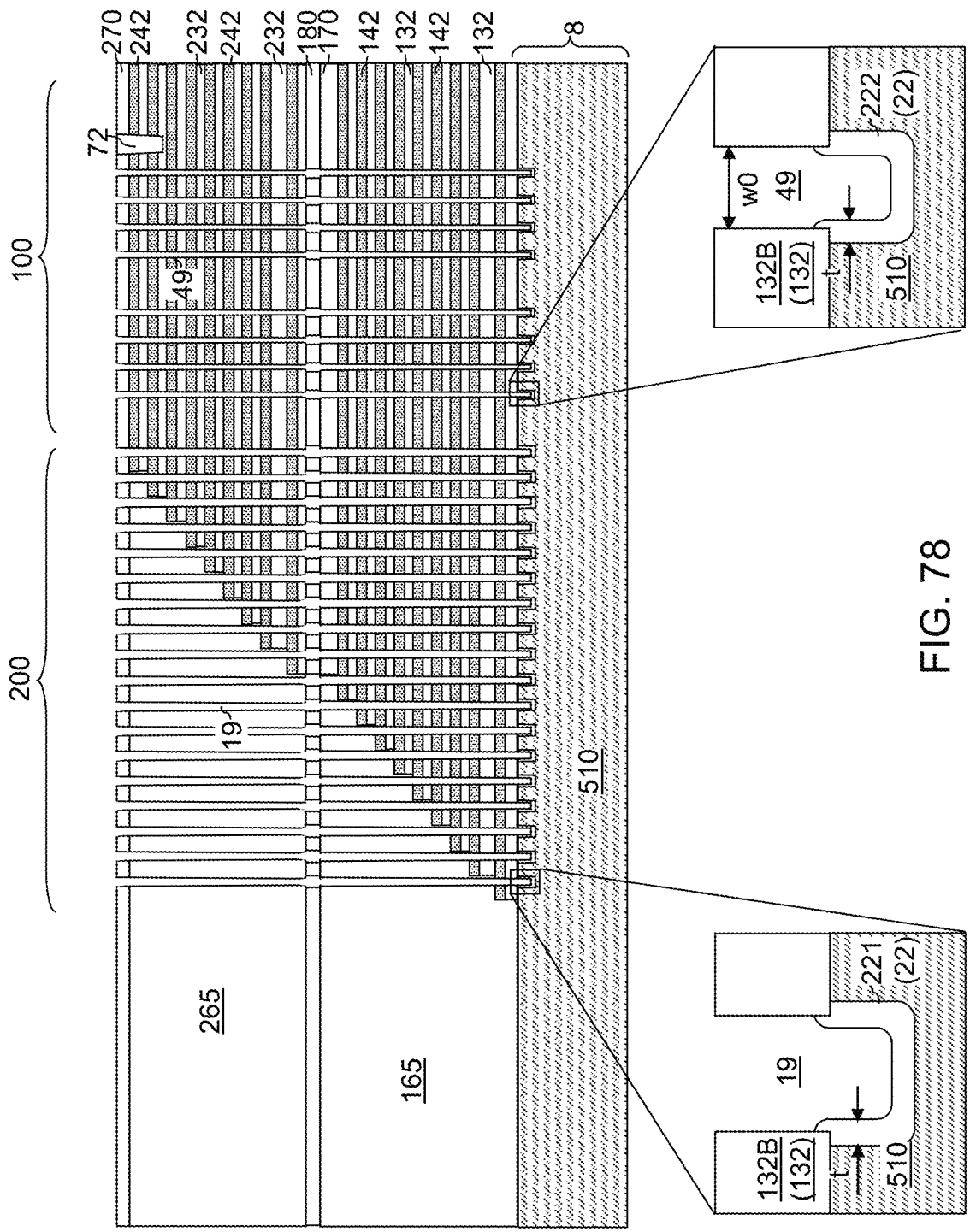
FIG. 78 is a vertical cross-sectional view of the fifth exemplary structure after formation of semiconductor oxide liners according to an embodiment of the present disclosure.

Referring to FIG. 78 and according to an aspect of the present disclosure, an oxidation process can be performed to convert surface portions of the semiconductor material of the semiconductor material layer 510 around the bottom of each memory opening 49 and around the bottom of each support opening 19 into a respective semiconductor oxide liner 22. The oxidation process may include a thermal oxidation process (such as a wet oxidation process or a dry oxidation process), and/or may include a plasma oxidation process. In case a thermal oxidation process is employed, the processing temperature of the oxidation process may be in a range from 600 degrees Celsius to 1,050 degrees Celsius depending on the duration of the oxidation process. For example, in case a rapid thermal oxidation (RTO) process is employed the processing temperature of the oxidation process may be in a range from 600 degrees Celsius to 1,100 degrees Celsius, and the duration of the oxidation process may be in a range from 10 seconds to 300 seconds, although lower and higher temperatures and shorter and longer duration may also be employed. In case a furnace oxidation process is employed, the processing temperature of the oxidation process may be in a range from 600 degrees Celsius to 950 degrees Celsius, and the duration of the oxidation process may be in a range from 1 minute to 1 hour, although lower and higher temperatures and shorter and longer duration may also be employed.

A semiconductor oxide liner 22 is formed at the bottom of each of the memory openings 49 and the support openings 19. A surface portion of the semiconductor material layer 510 around each of the memory openings 49 and the support openings 19 is oxidized to form a respective semiconductor oxide liner 22. The semiconductor oxide liners 22 include first semiconductor oxide liners 221 that are formed at the bottom of the support openings 19, and second semiconductor oxide liners 222 that are formed at the bottom of the memory openings 49. In case the semiconductor material layer 510 includes, and/or consists essentially of, silicon (such as single crystalline silicon or polysilicon), the semiconductor oxide liners 22 can include, and/or can consist essentially of, silicon oxide. Each semiconductor oxide liner 22 can include a tubular portion contacting a respective cylindrical sidewall of the semiconductor material layer 510 and a bottom cap portion contacting a respective recessed surface of the semiconductor material layer 510.

Generally, if each memory opening 49 has an initial width w0 at the bottom of the respective memory opening 49, such as at the level of the bottommost insulating layer 132B of the at least one alternating stack {(132. 142). (232. 242)}, the thickness t of each semiconductor oxide liner 22 may be in a range from 2% to 40%, such as from 4% to 20%, of the initial width w0 at the bottom of each memory opening 49. For example, the thickness t of each semiconductor oxide liner 22 can be in a range from 4 nm to 60 nm, and/or may be in a range from 6 nm to 30 nm (such as from 8 nm to 16 nm), although lesser and greater thicknesses may also be employed.

Figure 79:
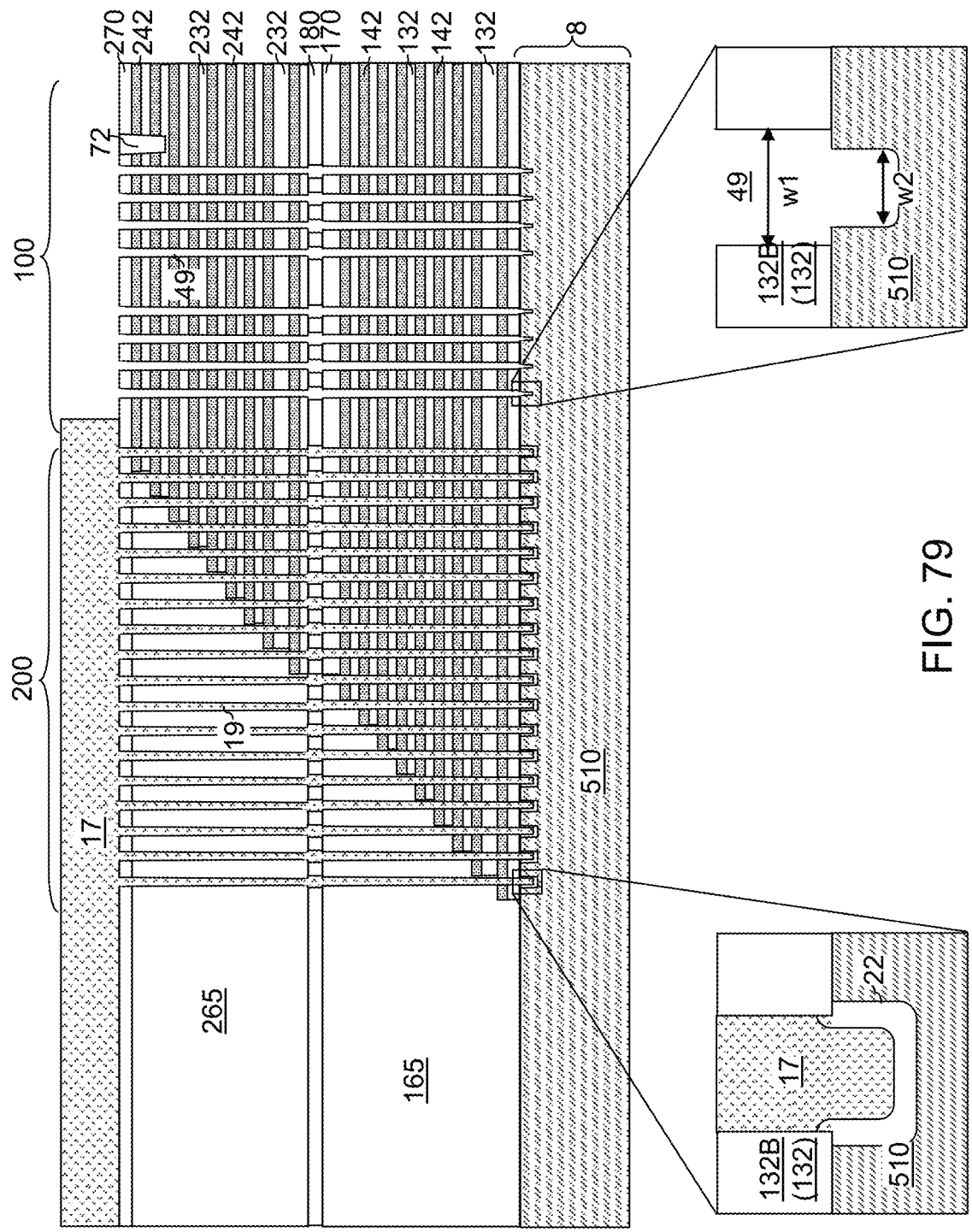
FIG. 79 is a vertical cross-sectional view of the fifth exemplary structure after application and patterning of an etch mask material layer and selective removal of second semiconductor oxide liners according to an embodiment of the present disclosure.

Referring to FIG. 79, an etch mask material layer 17 can be applied over the second insulating cap layer 270, and can be patterned to cover the support openings 19 without covering the memory openings 49. The etch mask material layer 17 can be patterned by removing a first portion of the etch mask material layer 17 that covers or fills the memory openings 49 without removing a second portion of the etch mask material layer 17 that covers the support openings 19. Each support opening 19 is covered with a patterned portion of the etch mask material layer, and the material of the etch mask material layer 17 can be removed from inside each memory opening 49 and from above each memory opening 49. In one embodiment, the etch mask material layer 17 may be a photoresist layer that can be directly patterned by lithographic exposure and development. Alternatively, the etch mask material layer 17 may include a patterning material such as amorphous carbon that may be anisotropically deposited to fill an upper portion of each of the memory openings 49 and the support openings 19. In this case, a photoresist layer (not shown) may be applied over the etch mask material layer 17 and can be subsequently lithographically patterned to cover the area in which the support openings 19 are present without covering the area in which the memory openings 49 are present. An etch process (which may be an isotropic etch process or an anisotropic etch process) can be performed to remove the portions of the etch mask material layer 17 overlying the memory openings 49. In some embodiments, portions of the etch mask material layer 17 located within the support openings 19 may include voids (not shown). Each first semiconductor oxide liner 221 in the support openings 19 is covered with the etch mask material layer 17, and each second semiconductor oxide liner 222 in the memory openings 49 is not covered by the etch mask material layer 17.

An etch process, such as a reactive ion etch (RIE) process can be performed to etch the semiconductor oxide material of the second semiconductor oxide liners 222 that are not covered by the etch mask material layer 17. An etchant that etches the material of the second semiconductor oxide liners 222 selective to the semiconductor material of the semiconductor material layer 510 can be introduced into the memory openings 49 while the support openings 19 are covered with the second portion of the etch mask material layer 17. The second semiconductor oxide liners 222 can be removed without removing the first semiconductor oxide liners 221.

The duration of the etch process can be selected such that the entirety of each second semiconductor oxide liner 222 is removed, and a cylindrical sidewall and a bottom surface of the semiconductor material layer 510 are physically exposed at the bottom of each memory opening 49. Generally, duration of the overetch step of the etch process may be limited to avoid unnecessary additional widening of the memory openings 49 by collateral etching.

However, in one embodiment, the insulating layers (132, 232) and/or the sacrificial material layers (142, 242) may be etched collaterally with the etching of the semiconductor oxide liners 222 to widen the memory opening 49. Each memory opening 49, as widened by the c etch process, may have a first width w1 at the level of the bottommost insulating layer 132B of the at least one alternating stack {(132, 142), (232, 242)}, and may have a second width w2 within the semiconductor material layer 510 which is smaller than the first width w1.

As used herein, a "width" of an element refers to the maximum dimension of the element along a lateral direction that is perpendicular to the lengthwise direction of the element. A "lengthwise direction" of an element refers to the direction along which the element has a greatest lateral extent. In case, an element has a circular horizontal cross-sectional profile, a width of the element is the diameter of the element. Thus, if a horizontal cross-sectional profile of a memory opening 49 is circular, the width is the diameter of the horizontal cross-sectional shape. If a horizontal cross-sectional profile of a memory opening is elongated along a horizontal direction, the width is the maximum dimension of the horizontal cross-sectional profile along another horizontal direction that is perpendicular to the horizontal direction along which the horizontal cross-sectional profile is elongated.

The etch process can have an etch chemistry that is selective to the semiconductor oxide liner 222 relative to the semiconductor material layer 510. Generally, the etch rate of the undoped silicate glass material of the insulating layers (132, 232) can be greater than the etch rate of the semiconductor oxide material (such as thermal silicon oxide) of the semiconductor oxide liner 222, and the distance by which a memory opening 49 is widened at the level of the bottommost insulating layer 132B (i.e., such that the first width w1 is less the initial width w0) can be greater than twice the thickness t of the second semiconductor oxide liner 222.

Referring to FIG. 80, the second portion (i.e., the remaining portion) of the etch mask material layer 17 can be removed, for example, by ashing. A suitable clean process may be performed to remove particles and/or contaminants from the physically exposed surfaces of the fifth exemplary structure.

Figure 81:
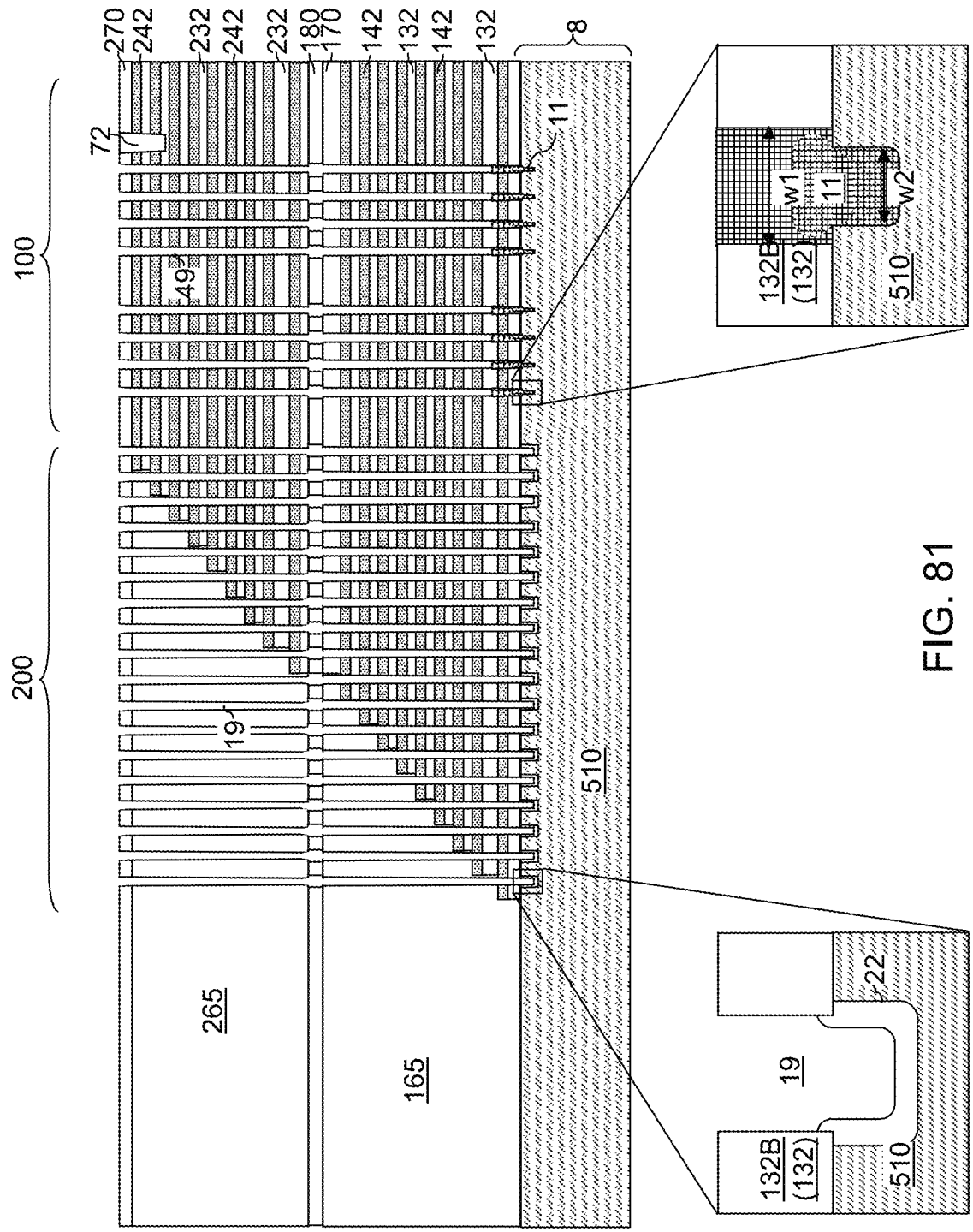
FIG. 81 is a vertical cross-sectional view of the fifth exemplary structure after formation of pedestal channel portions by a selective semiconductor deposition process according to an embodiment of the present disclosure.
Figure 82A:
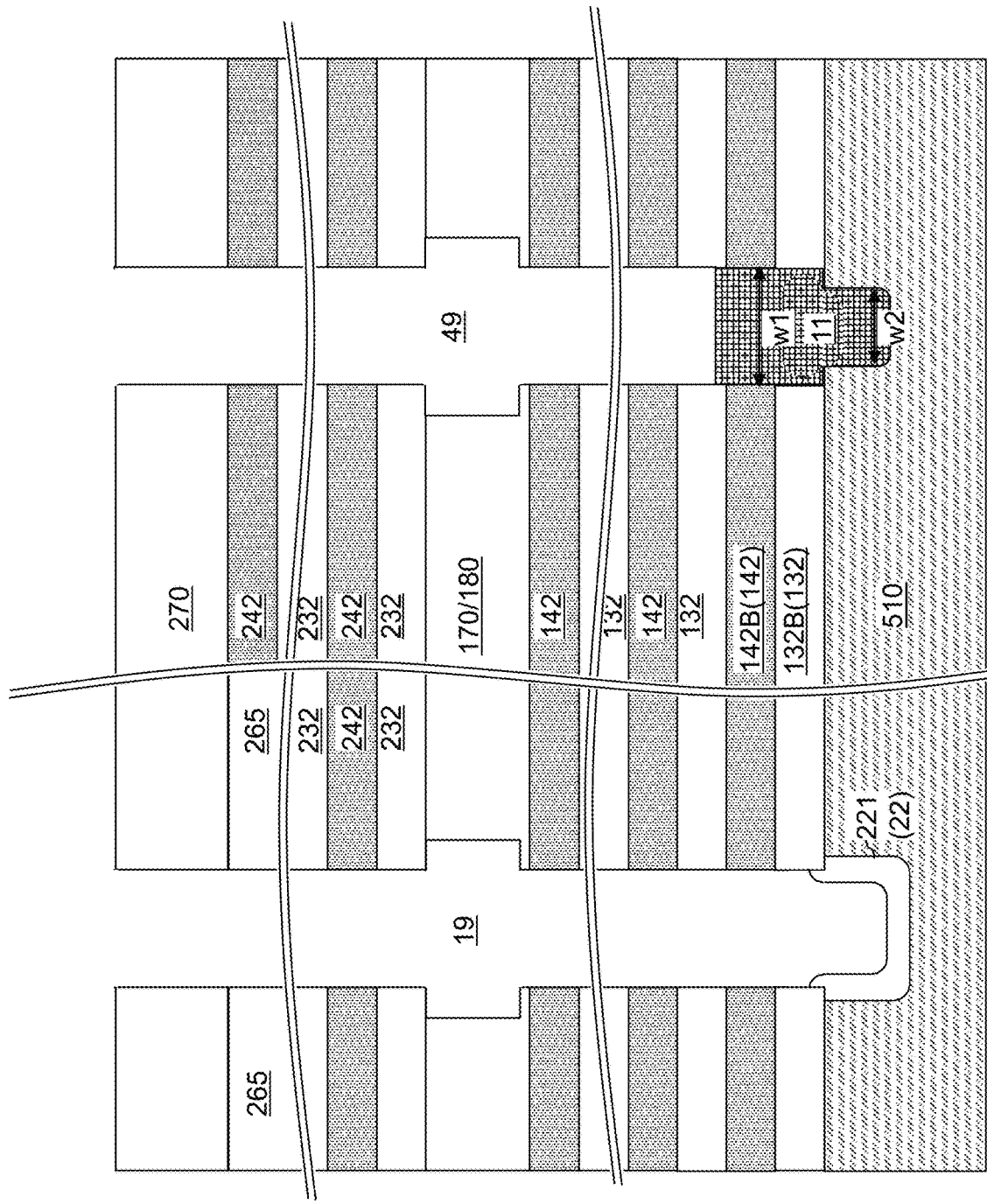
FIGS. 82A-82E are sequential vertical cross-sectional view of a region of the fifth exemplary structure during formation of a memory opening fill structure and a support pillar structure in a memory opening and a support opening, respectively.

Referring to FIGS. 81 and 82A, a selective semiconductor deposition process can be performed to grow a semiconductor material from physically exposed surfaces of the fifth exemplary structure while suppressing growth of the semiconductor material from the dielectric surfaces of the fifth exemplary structure. A selective semiconductor deposition process is a semiconductor deposition process in which a semiconductor-containing precursor gas and an etchant gas are flowed into a process chamber concurrently or alternately. The semiconductor-containing precursor gas can include, for example, silane, dichlorosilane, trichlorosilane, and/or disilane. The etchant gas may include gas phase hydrochloric acid. A carrier gas such as hydrogen gas may be employed to provide uniform laminar flow of the semiconductor-containing precursor gas and the etchant gas. The semiconductor material has a higher nucleation rate and a higher growth rate on semiconductor surfaces than on dielectric surfaces. By controlling the flow of the etchant gas so that the etch rate is less than the deposition rate on the semiconductor surfaces and is greater than the deposition rate on the dielectric surfaces, the selective semiconductor deposition process can grow a semiconductor material only from semiconductor surfaces while suppressing growth from dielectric surfaces.

A semiconductor material portion, such as a single crystalline silicon portion, can grow from the physically exposed surfaces of the semiconductor material layer 510 at the bottom of each memory opening 49 without growing any semiconductor (e.g., silicon) material from the first semiconductor oxide liners 221 by performing the selective semiconductor deposition process. Each semiconductor material portion can fill the void within the portion of the semiconductor material layer 510 that underlies a respective memory opening 49, and can grow upward at least through the bottommost insulating layer 132B and through the bottommost sacrificial material layer 142B. Each semiconductor material portion can have a pedestal shape, and can function as a bottom portion of a semiconductor channel for a vertical field effect transistor that forms a NAND string. In this case, each semiconductor material portion is referred to as a pedestal channel portion 11, which can be a single crystalline silicon pedestal channel portion 11.

Each pedestal channel portion 11 can contact a cylindrical sidewall of the bottommost sacrificial material layer 142B of the at least one alternating stack {(132, 142), (232, 242)}, a cylindrical sidewall of the bottommost insulating layer 132B of the at least one alternating stack {(132, 142), (232, 242)}, an annular surface segment of the semiconductor material layer 510 that is adjoined a bottom periphery of the cylindrical sidewall of the bottommost insulating layer 132B, a cylindrical sidewall of the semiconductor material layer 510 that is adjoined to an inner periphery of the annular surface segment of the semiconductor material layer 510, and a recessed surface of the semiconductor material layer 510 located below a horizontal plane including an interface between the semiconductor material layers 10 and the bottommost insulating layer 132B of the at least one alternating stack {(132, 142), (232, 242)}. The top surface of each pedestal channel portion 11 may be formed above the horizontal plane including the top surface of the bottommost sacrificial material layer 142B of the at least one alternating stack {(132, 142), (232, 242)}.

In one embodiment, the semiconductor material layer 510 comprises, and/or consists essentially of, a first single crystalline semiconductor material such as single crystalline silicon. In this case the selective semiconductor deposition process may be a selective semiconductor epitaxy process that provides sufficiently elevated deposition temperature providing surface diffusion of a semiconductor material for ledge growth and sufficiently low level of residual impurity gases. In this case, the pedestal channel portions 11 can comprise, and/or can consist essentially of, a second single crystalline semiconductor material in epitaxial alignment with the first single crystalline semiconductor material.

Each pedestal channel portion 11 may have a first width w1 at a level of the bottommost insulating layer 132B of the at least one alternating stack {(132, 142), (232, 242)}, and each pedestal channel portion 11 may have a second width w2 below the horizontal plane including the interface between the semiconductor material layer 510 and the bottommost insulating layer 132B. The second width w2 is less than the first width w1.

In one embodiment, each pedestal channel portion 11 can have an annular bottom surface contacting a portion of a top surface of the semiconductor material layer 510. Each pedestal channel portion 11 can have a first cylindrical sidewall that contacts the bottommost insulating layer 132B of the at least one alternating stack {(132, 142), (232, 242)}. Each pedestal channel portion 11 can have a second cylindrical sidewall that contacts the semiconductor material layer 510. A bottom periphery of the first cylindrical sidewall can coincide with an outer periphery of the annular bottom surface, and a top periphery of the second cylindrical sidewall can coincide with an inner periphery of the annular bottom surface. The outer periphery of the annular bottom surface can be laterally offset outward from the inner periphery of the annular bottom surface by a uniform lateral offset distance around the entirety of the inner periphery of the annular bottom surface. The uniform lateral offset distance is a result of the isotropic nature of the isotropic etch process that laterally recesses the insulating layers (132, 232) during removing of the second semiconductor oxide liners 222. A pedestal channel portion 11 is present within each memory opening 49, and a semiconductor oxide liner 22 (which is a first semiconductor oxide liner 221) is present within each support opening 19. No pedestal channel portion (i.e., no single crystalline silicon pedestal channel portion) 11 is present within each support opening 19.

Figure 82B:
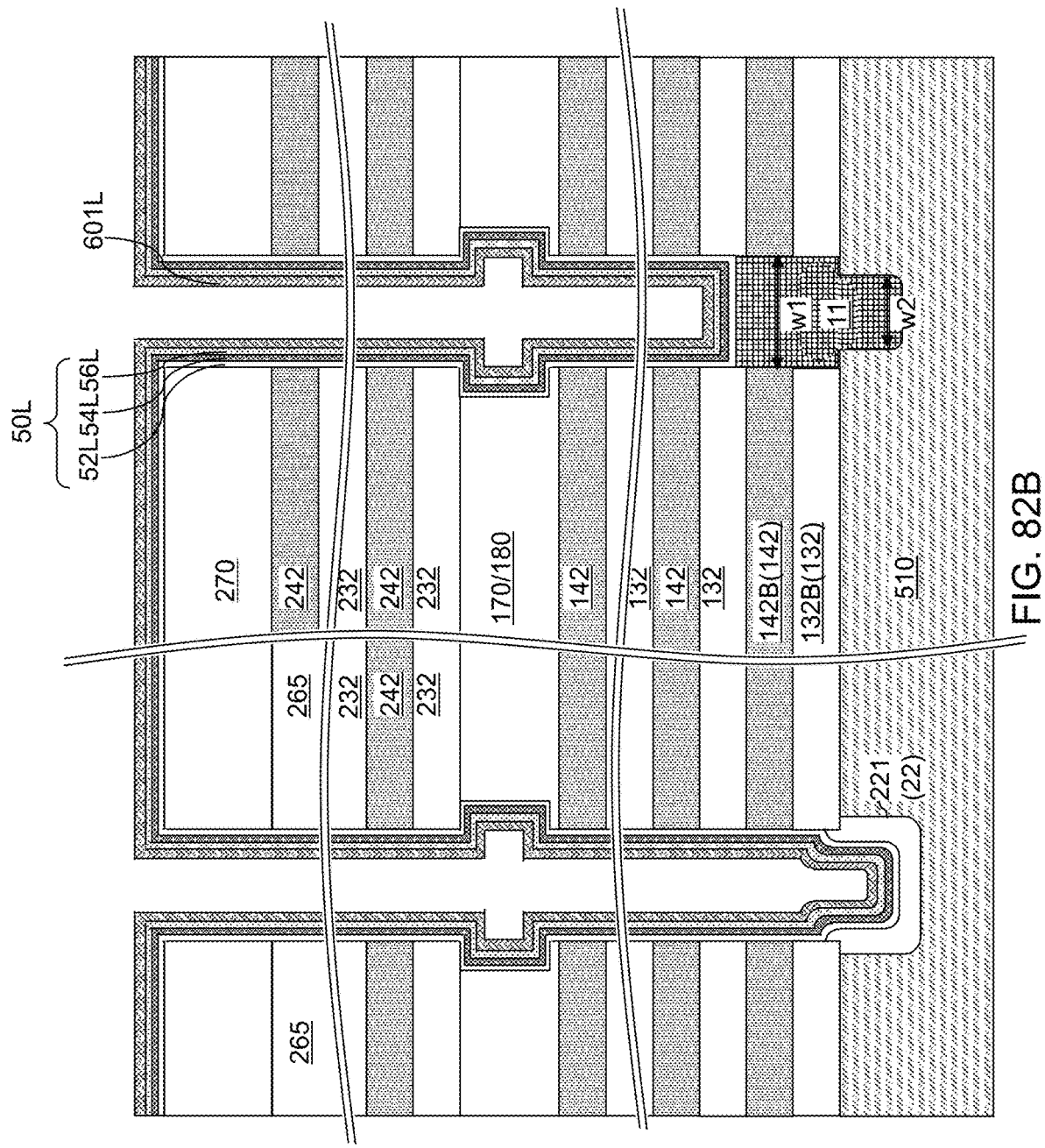

Referring to FIG. 82B, a memory film layer 50L can be formed in each of the memory openings 49, in each of the support openings 19, and over the second insulating cap layer 270. The memory film layer 50L can include a layer stack of a blocking dielectric material layer 52L, a charge storage material layer 54L, and a tunneling dielectric material layer 56L. The blocking dielectric material layer 52L can have the same material composition and the same thickness as the blocking dielectric layer 52 described above. The charge storage material layer 54L can have the same material composition and the same thickness as the charge storage layer 54 described above. The tunneling dielectric material layer 56L can have the same material composition and the same thickness as the tunneling dielectric layer 56 described above. Generally, the memory film layer 50L can be deposited directly on each of the semiconductor material portions (such as the pedestal channel portions 11) that are grown in the memory openings 49 by the selective semiconductor deposition process and directly on each of the first semiconductor oxide liners 22 (e.g., 221) located in the support openings 19.

Further, an optional first semiconductor channel material layer 601L can be deposited over the memory film layer 50L by a conformal deposition process. The first semiconductor channel material layer 601L includes a first semiconductor channel material, which can be any material that may be employed for the vertical semiconductor channels 60 of the first through fourth exemplary structures that are described above. In one embodiment, the first semiconductor channel material layer 601L can have a thickness in a range from 1 nm to 15 nm, such as from 2 nm to 10 nm, although lesser and greater thicknesses may also be employed.

Figure 82C:
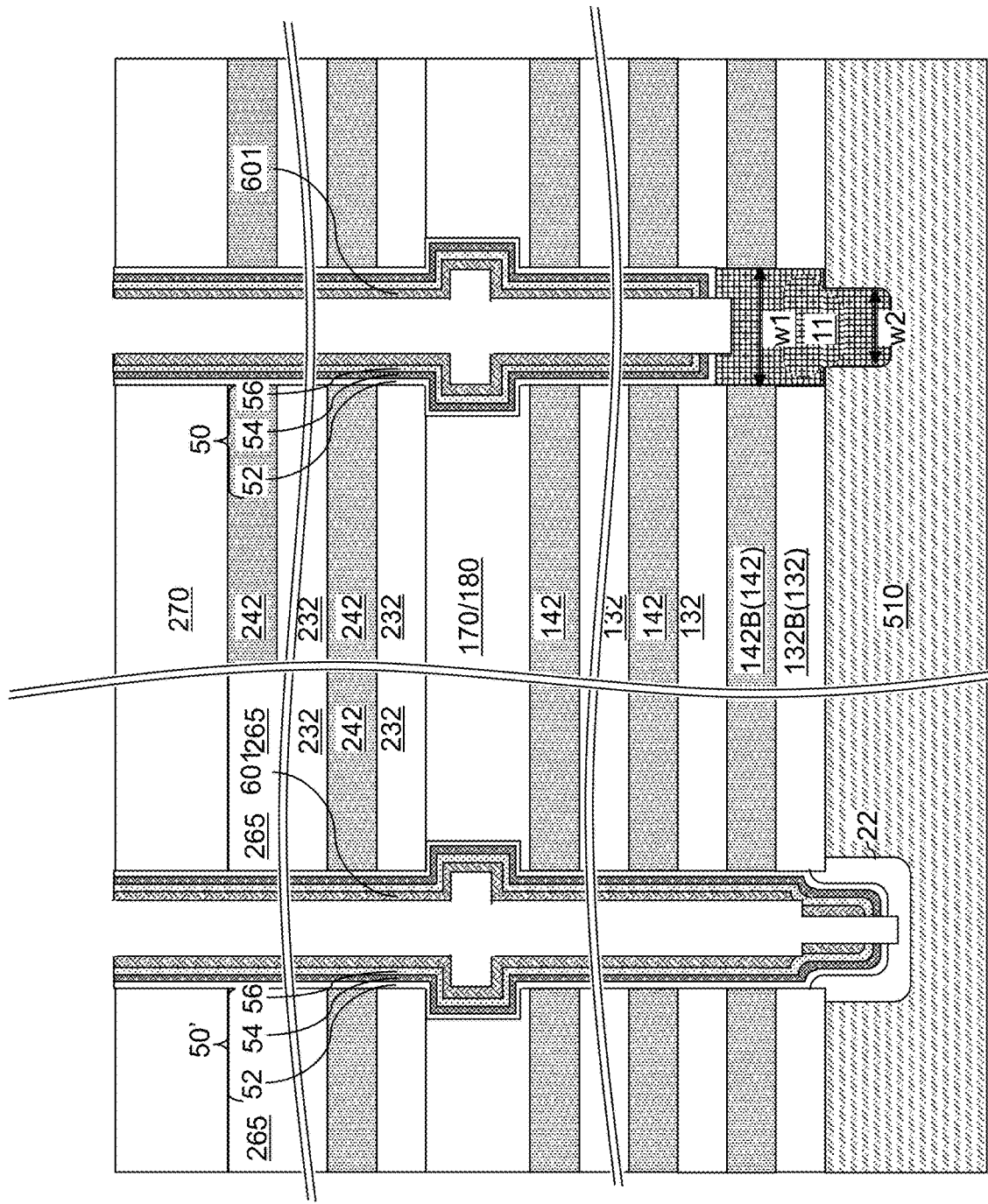

Referring to FIG. 82C, the first semiconductor channel material layer 601L and the memory film layer 50L can be anisotropically etched to remove horizontally-extending portions of the first semiconductor channel material layer 601L and the memory film layer 50L. Each remaining vertically-extending portion of the first semiconductor channel material layer 601L in a respective memory opening 49 or in a respective support opening 19 comprises a first semiconductor channel layer 601. Each remaining vertically-extending portion of the memory film layer 50L located in a respective memory opening 49 comprises a memory film 50. Each remaining vertically-extending portions of the memory film layer 50L located in a respective support opening 19 comprises a dummy memory film 50'.

Each memory film 50 can include a respective layer stack of a blocking dielectric layer 52, a charge storage layer 54, and a tunneling dielectric layer 56. Each dummy memory film 50 can include a respective layer stack of a blocking dielectric layer 52, a charge storage layer 54, and a tunneling dielectric layer 56. Thus, each dummy memory film 50' can have a same set of at least one material (such as a same set of three materials) as a memory film 50. Each blocking dielectric layer 52 is a patterned portion of the blocking dielectric material layer 52L. Each charge storage layer 54 is a patterned portion of the charge storage material layer 54L. Each tunneling dielectric layer 56 is a patterned portion of the tunneling dielectric material layer 56L. In one embodiment, each of the memory films 50 and the dummy memory films 50' comprises a respective layer stack including a respective blocking dielectric layer 52, a respective charge storage layer 54, and a respective tunneling dielectric layer 56.

In one embodiment, each memory film 50 can be formed above the horizontal plane including the top surfaces of the pedestal channel portions 11. Thus, the bottommost surface of each memory film is located above the horizontal plane including the top surface of the bottommost insulating layer 132B of the at least one alternating stack {(132, 142), (232, 242)}, and is located above the horizontal plane including the top surface of the bottommost sacrificial material layer 142B of the at least one alternating stack {(132, 142), (232, 242)}. Each memory film 50 can be vertically spaced from the bottommost insulating layer 132B and the bottommost sacrificial material layer 142B. Each dummy memory film 50' vertically extends through at least the bottommost insulating layer 132B and the bottommost sacrificial material layer 142B within the at least one alternating stack {(132, 142), (232, 242)}, and contacts a cylindrical sidewall of the bottommost insulating layer 132B and a cylindrical sidewall of the bottommost sacrificial material layer 142B.

Upon removal of horizontal portions of the memory film layer 50L by the anisotropic etch process, each stack of a first semiconductor channel layer 601 a memory film 50 in a memory opening 49 can include an opening at a respective bottom portion thereof. A surface of an underlying pedestal channel portion 11 can be physically exposed underneath each opening in the stack of the first semiconductor channel layer 601 and the memory film 50 in the memory opening 49. Each stack of a first semiconductor channel layer 601 and a dummy memory film 50' in a support opening 19 can include an opening at a respective bottom portion thereof. A surface of an underlying semiconductor oxide liner 22 can be physically exposed underneath each opening in the stack of the first semiconductor channel layer 601 and the dummy memory film 50' in the support opening 19. The duration of the anisotropic etch process can be controlled such that the semiconductor oxide liners 22 are not etched through by the anisotropic etch process. Thus, the semiconductor material layer 510 is not physically exposed at the bottom of the support openings 19.

Figure 82D:
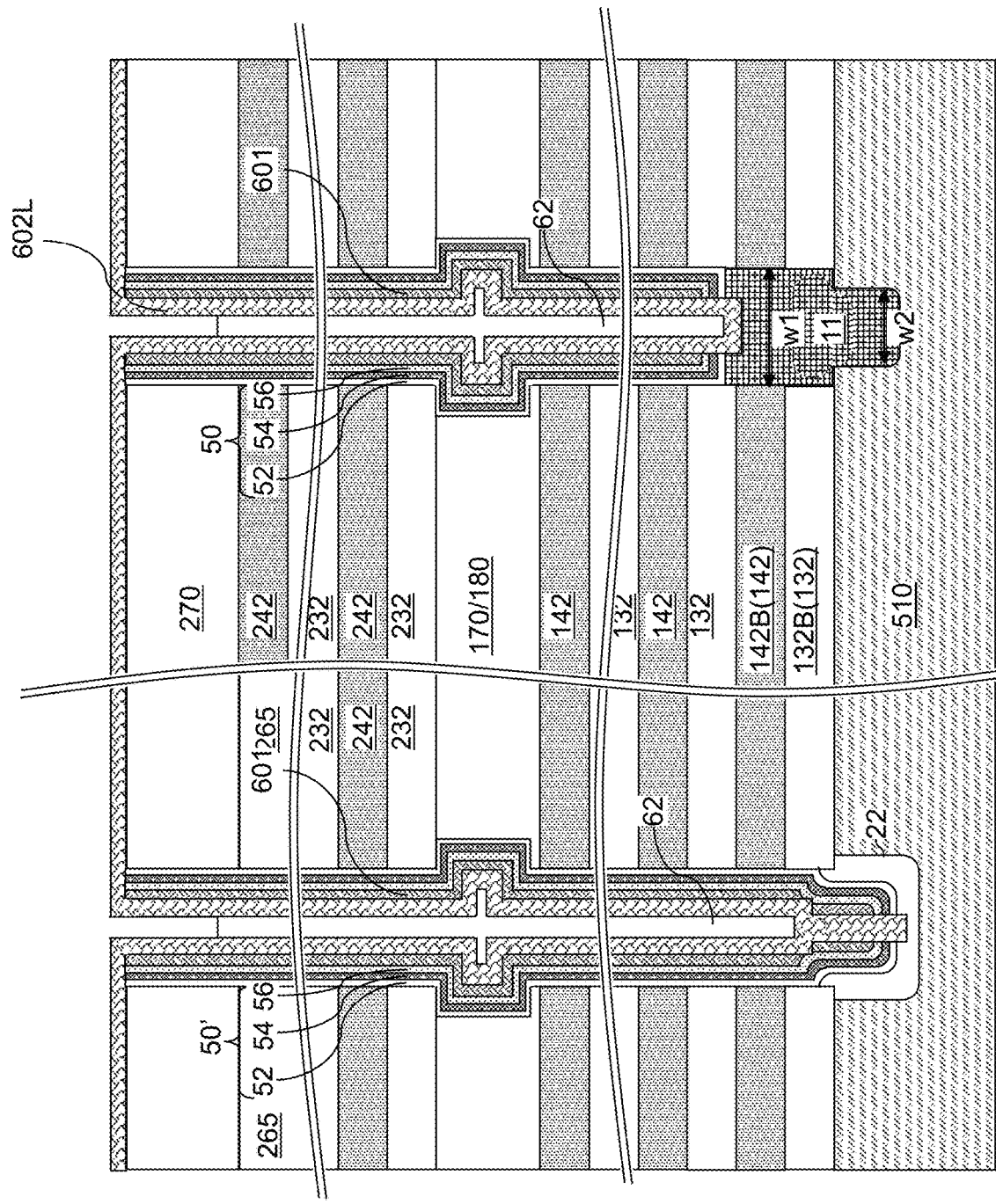

Referring to FIG. 82D, a second semiconductor channel material layer 602L can be conformally deposited on the physically exposed surfaces of the pedestal channel portions 11, the physically exposed surfaces of the first semiconductor channel layers 601, the physically exposed surfaces of the memory films 50 and the dummy memory films 50', and over the top surface of the second insulating cap layer 270. The second semiconductor channel material layer 602L includes a second semiconductor channel material, which can be any material that may be employed for the vertical semiconductor channels 60 of the first through fourth exemplary structures that are described above. In one embodiment, the second semiconductor channel material layer 602L can have a thickness in a range from 1 nm to 15 nm, such as from 2 nm to 10 nm, although lesser and greater thicknesses may also be employed. In one embodiment, each pedestal channel portion 11 may have a physically exposed recessed surface and a physically exposed cylindrical surface that is adjoined to a periphery of the physically exposed recessed surface, and the second semiconductor channel material layer 602L can be formed directly on the recessed surface and the cylindrical surface of each pedestal channel portion 11.

Subsequently, a dielectric core layer including a dielectric material (such as silicon oxide) can be deposited in unfilled volumes of the memory openings 49 and the support openings 19 by a conformal deposition process such as a chemical vapor deposition process. The dielectric core layer can be vertically recessed to remove a horizontal portion of the dielectric core layer that overlies the second insulating cap layer 270. The recessed top surfaces of the dielectric core layer may be formed at, or about, the height of the interface between the second insulating cap layer 270 and the second-tier alternating stack (232, 242). Each remaining portion of the dielectric core layer constitutes a dielectric core 62.

Figure 82E:
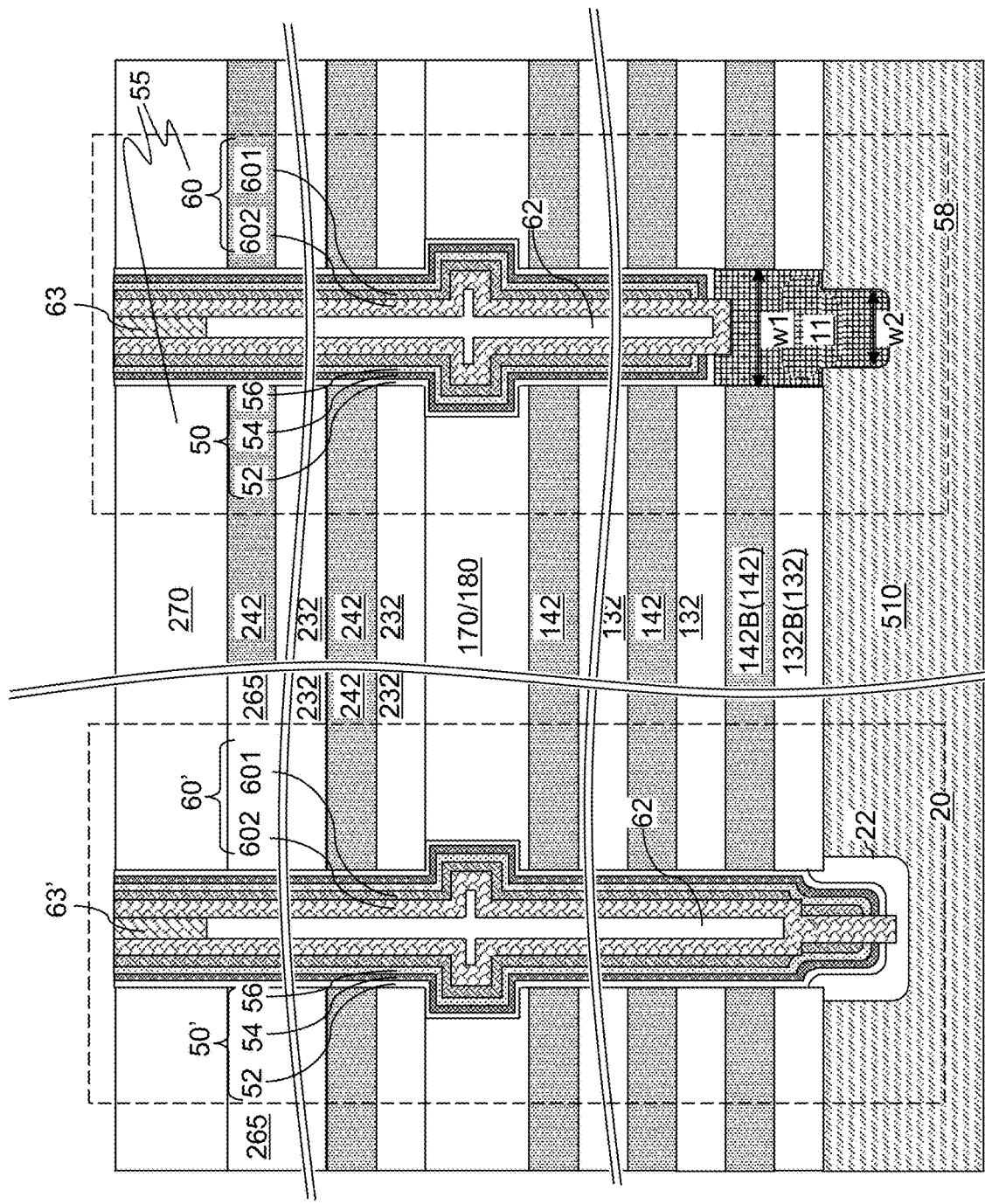
Figure 83:
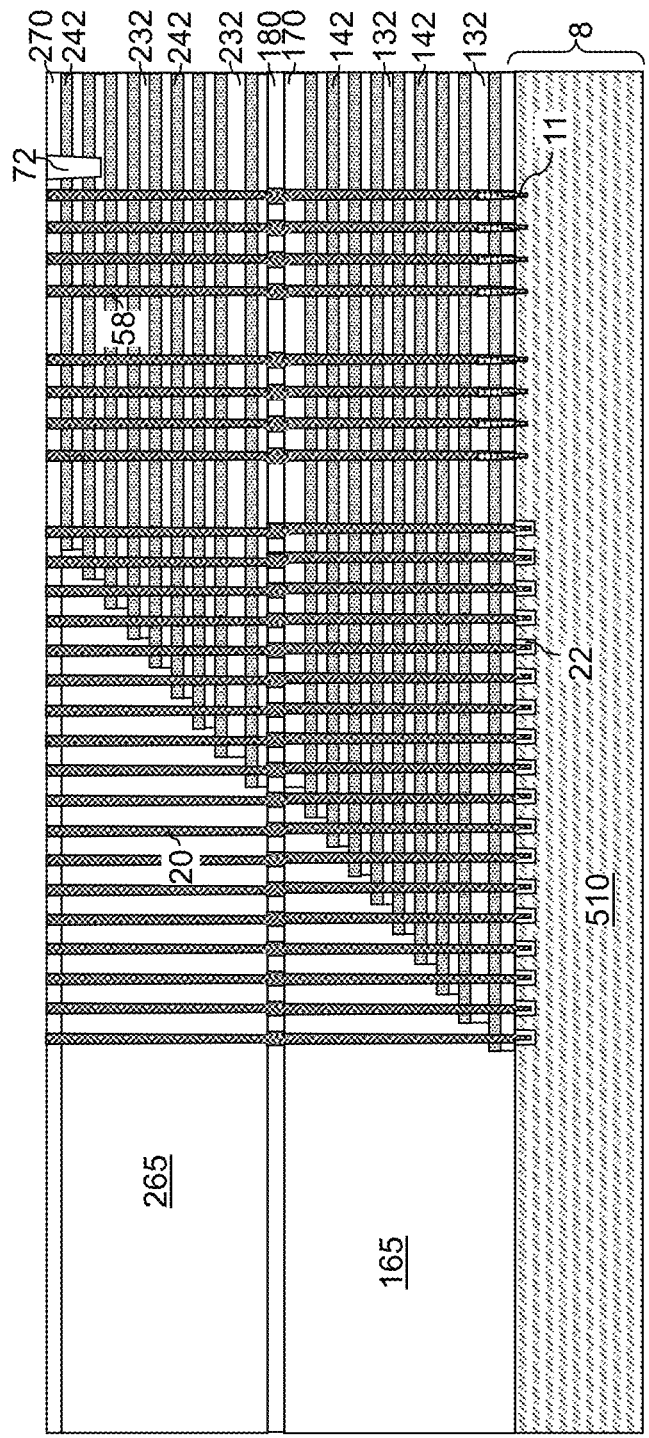
FIG. 83 is a vertical cross-sectional view of the fifth exemplary structure after formation of memory opening fill structures and support pillar structures according to an embodiment of the present disclosure.

Referring to FIGS. 82E and 83, a doped semiconductor material having a doping of a second conductivity type can be deposited in the cavities overlying the dielectric cores 62. Portions of the deposited doped semiconductor material and the second semiconductor channel material layer 602L that overlie the horizontal plane including the top surface of the second insulating cap layer 270 can be removed by a planarization process such as a chemical mechanical planarization process. Each remaining portion of the deposited doped semiconductor material having a doping of the second conductivity type comprises a drain region 63. Each remaining portion of the second semiconductor channel material layer 602L in the memory openings 49 and the support openings 19 comprise a second semiconductor channel layer 602.

Each contiguous combination of a first semiconductor channel layer 601 and a second semiconductor channel layer 602 in a memory opening 49 constitutes a vertical semiconductor channel 60. Each contiguous combination of a first semiconductor channel layer 601 and a second semiconductor channel layer 602 in a support opening 19 constitutes a dummy vertical semiconductor channel 60'. Thus, each vertical semiconductor channel 60 comprises a remaining portion of the second semiconductor channel material layer 602L in a respective memory opening 49, and each dummy vertical semiconductor channel 60' comprises a remaining portion of the second semiconductor channel material layer 602L in a respective support opening 19. Each vertical semiconductor channel 60 directly contacts a respective pedestal channel portion 11. The dummy vertical semiconductor channels 60' do not contact the semiconductor material layer 510, and is spaced from the semiconductor material layer 510 by the first semiconductor oxide liners 22 (e.g., 221). The dummy vertical semiconductor channels 60' are not in electrical contact with any conductive lines, such as bit lines, of the device.

Generally, a semiconductor channel material layer (such as the second semiconductor channel material layer 602L) can be formed directly on a surface of each semiconductor material portion (such as each pedestal channel portion 11) through an opening in a respective memory film 50, and can be formed directly on a surface of one or more first semiconductor oxide liners 22 (e.g., 221) through an opening in a respective dummy memory film 50'.

The set of all material portions that fills a memory opening 49 constitutes a memory opening fill structure 58, and the set of all material portions that fills a support opening 19 constitutes a support pillar structure 20. Each memory opening fill structure 58 can comprise a vertical semiconductor channel 60 in contact with a sidewall and a recessed surface of the semiconductor material portion (such as the pedestal channel portion 11). Each support pillar structure 20 can comprise a dummy vertical semiconductor channel 60' having a same material composition as the vertical semiconductor channel 60 and contacting an inner sidewall of the dummy memory film 50'. The dummy vertical semiconductor channel 60' vertically extends through a bottom portion of the dummy memory film 50', contacts a respective semiconductor oxide liner 22, and is spaced from the semiconductor material layer 510 by the respective semiconductor oxide liner 22. Each contiguous combination of a memory film 50 and a vertical semiconductor channel 60 constitutes a memory stack structure 55, which includes a vertical stack of memory elements located adjacent to a common vertical semiconductor channel 60.

Generally, each memory opening fill structure 58 can comprise a semiconductor material portion (such as a pedestal channel portion 11), a memory film 50, and a vertical semiconductor channel 60, and each support pillar structure 20 can comprise a first semiconductor oxide liner 221, a dummy memory film 50', and a dummy vertical semiconductor channel 60'. The semiconductor material portion (such as the pedestal channel portion 11) can be in contact with the semiconductor material layer 510. Each support pillar structure 20 can be located in a respective support opening 19, and can comprise a semiconductor oxide liner 22 (such as a first semiconductor oxide liner 221) that includes a dielectric oxide of a semiconductor material of the semiconductor material layer 510. The entire interface between the support pillar structure 20 and the semiconductor material layer 510 can be a continuous interface between the semiconductor oxide liner 22 and the semiconductor material layer 510.

The top surfaces of the memory opening fill structures 58 and the support pillar structures 20 can be located within the horizontal plane including the top surface of the second insulating cap layer 270. Thus, the surface of each support pillar structure 20 can be located above the topmost surface of the at least one alternating stack {(132, 142), (232, 242)}, and can be located within the same horizontal plane as the top surfaces of the memory opening fill structures 58. In one embodiment, at least one retro-stepped dielectric material portion (165, 265) can overlie stepped surfaces of the at least one alternating stack {(132, 142), (232, 242)}. At least a subset of the support pillar structures 20 can vertically extend through one of more of the at least one retro-stepped dielectric material portion (165, 265).

Figure 84A:
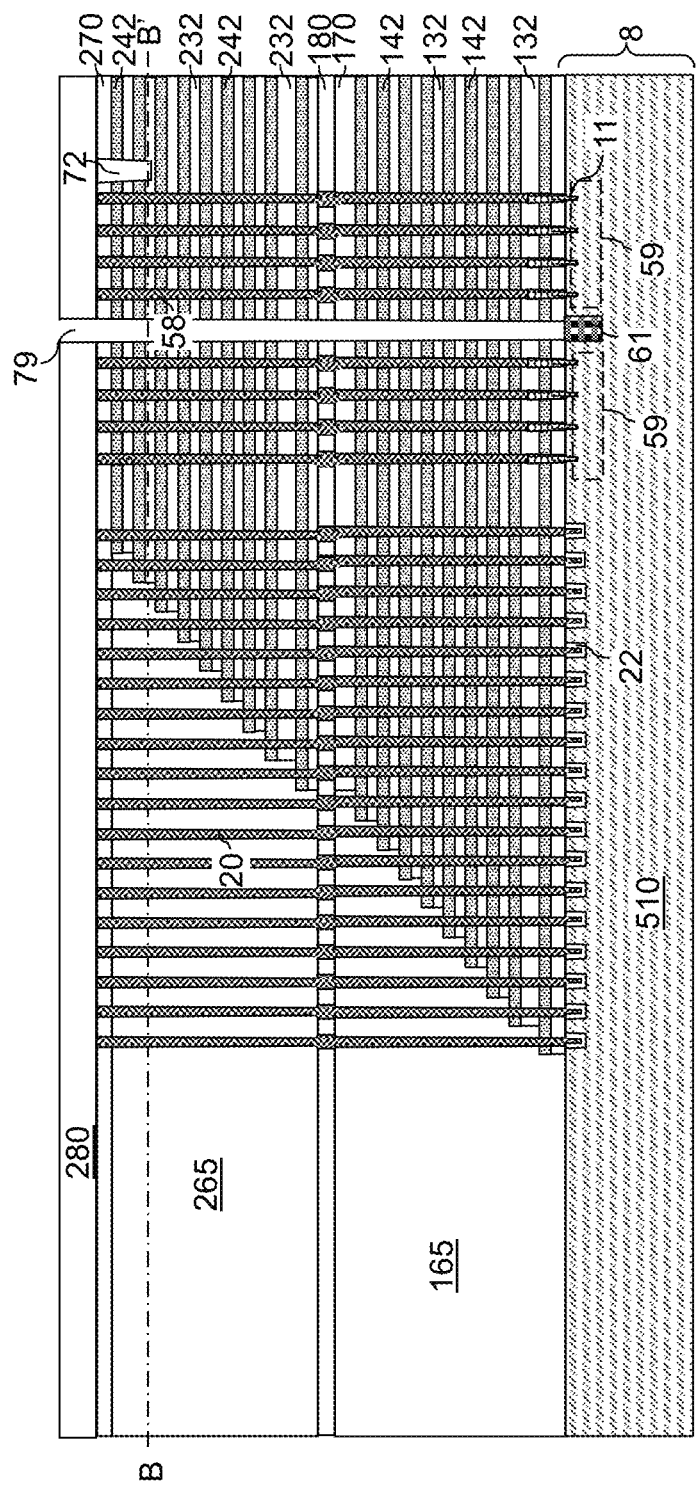
FIG. 84A is a vertical cross-sectional view of the fifth exemplary structure after formation of a first contact-level dielectric layer, backside trenches, and source regions according to an embodiment of the present disclosure.
Figure 84B:
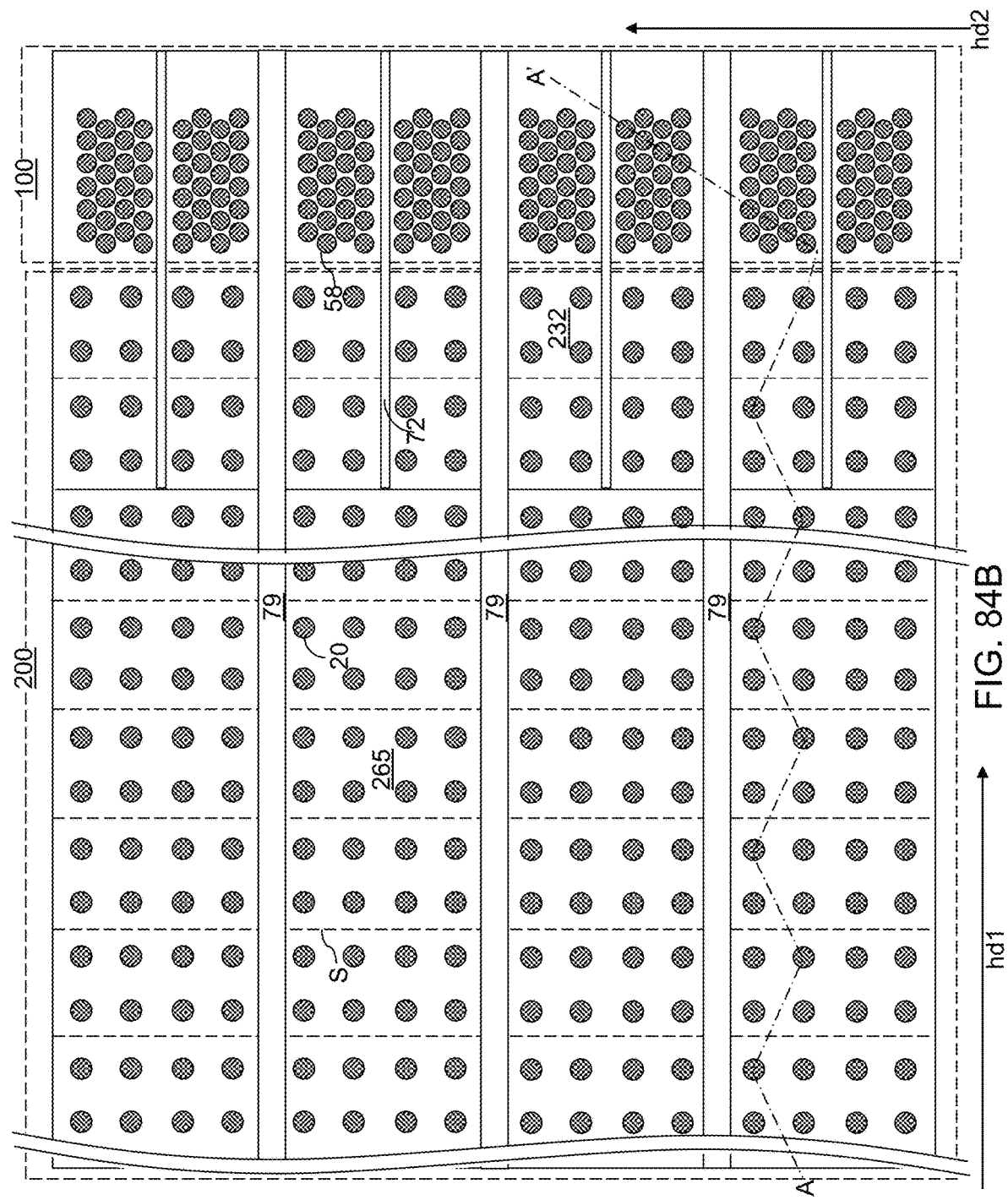
FIG. 84B is a top-down view of the fifth exemplary structure along the horizontal plane B-B' of FIG. 84A. The hinged vertical plane A-A' corresponds to the plane of the vertical cross-sectional view of FIG. 84A.

Referring to FIGS. 84A and 84B, a first contact level dielectric layer 280 can be formed over the second-tier structure (232, 242, 270, 265, 72). The first contact level dielectric layer 280 includes a dielectric material such as silicon oxide, and can be formed by a conformal or non-conformal deposition process. For example, the first contact level dielectric layer 280 can include undoped silicate glass and can have a thickness in a range from 100 nm to 600 nm, although lesser and greater thicknesses can also be used.

A photoresist layer can be applied over the first contact level dielectric layer 280 and can be lithographically patterned to form elongated openings that extend along the first horizontal direction hd1 between clusters of memory opening fill structures 58. Backside trenches 79 can be formed by transferring the pattern in the photoresist layer through the first contact level dielectric layer 280, the second-tier structure (232, 242, 270, 265, 72), and the first-tier structure (132, 142, 170, 165), and down to a top surface of the semiconductor material layer 510. Portions of the first contact level dielectric layer 280, the second-tier structure (232, 242, 270, 265, 72), and the first-tier structure (132, 142, 170, 165) that underlie the openings in the photoresist layer can be removed to form the backside trenches 79. In one embodiment, the backside trenches 79 can be formed between clusters of memory stack structures 55. The clusters of the memory stack structures 55 can be laterally spaced apart along the second horizontal direction hd2 by the backside trenches 79.

Dopants of the second conductivity type can be implanted into surface portions of the semiconductor material layer 510 that underlie the backside trenches 79. Source regions 61 having a doping of the second conductivity type can be formed underneath the backside trenches 79. The source regions 61 can include dopants of the second conductivity type at an atomic concentration in a range from $5.0 \times 10^{18}/\text{cm}^3$ to $2.0 \times 10^{21}/\text{cm}^3$, although lesser and greater atomic concentrations may also be employed. Each horizontally-extending surface portion of the semiconductor material layer 510 that extends between a source region 61 and a neighboring set of pedestal channel portions 11 constitute a horizontal semiconductor channel 59, through which electrical current can flow during operation of NAND strings to be provided in the memory openings 49 upon subsequent replacement of the sacrificial material layers (142, 242) with electrically conductive layers. In this case, a semiconductor channel between a source region 61 and a drain region 63 can include a horizontal semiconductor channel 59, a pedestal channel portion 11, and a vertical semiconductor channel 60.

Figure 85A:
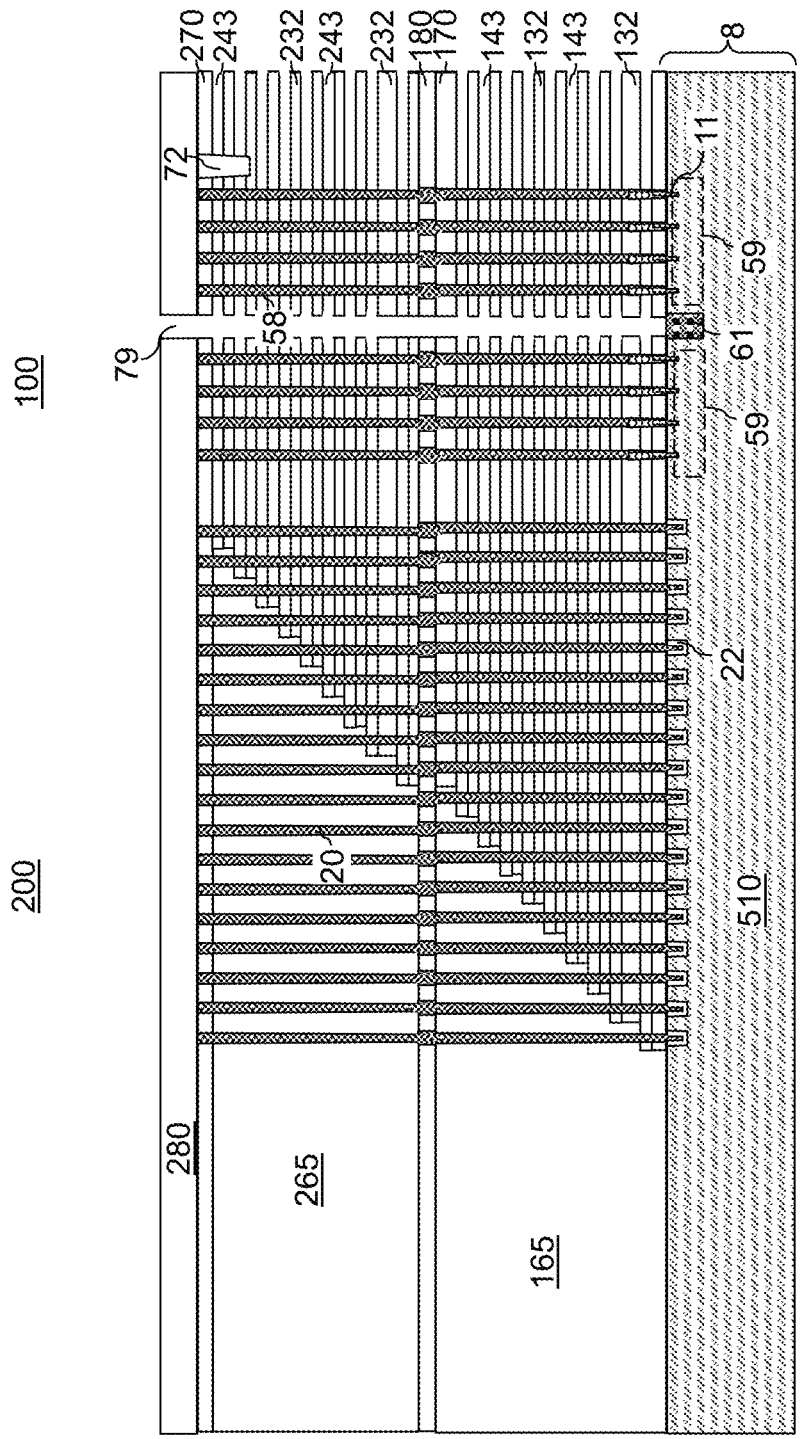
FIG. 85A is a vertical cross-sectional view of the fifth exemplary structure after formation of backside recesses according to an embodiment of the present disclosure.
Figure 85B:
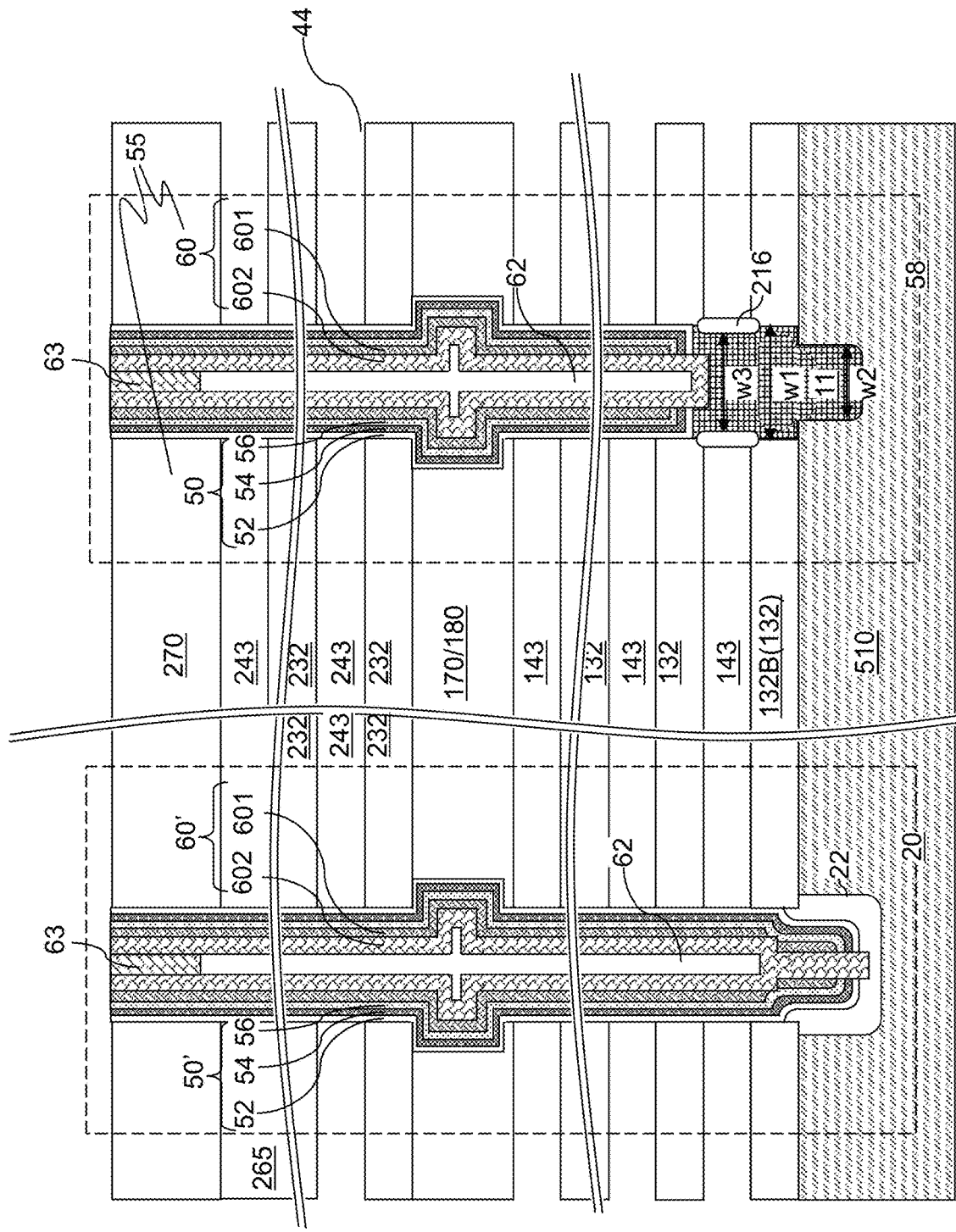
FIG. 85B is a vertical cross-sectional view of a region of the fifth exemplary structure of FIG. 85A.

Referring to FIGS. 85A and 85B, the sacrificial material layers (142, 242) are can be removed selective to the insulating layers (132, 232), the first and second insulating cap layers (170, 270), the first contact level dielectric layer 280, and the source regions 61. For example, an etchant that selectively etches the materials of the sacrificial material layers (142, 242) selective to the materials of the insulating layers (132, 232), the first and second insulating cap layers (170, 270), the retro-stepped dielectric material portions (165, 265), and the material of the outermost layer of the memory films 50 can be introduced into the backside openings 79, for example, using an isotropic etch process. For example, the sacrificial material layers (142, 242) can include silicon nitride, the materials of the insulating layers (132, 232), the first and second insulating cap layers (170, 270), the retro-stepped dielectric material portions (165, 265), and the outermost layer of the memory films 50 can include silicon oxide materials.

The isotropic etch process can be a wet etch process using a wet etch solution, or can be a gas phase (dry) etch process in which the etchant is introduced in a vapor phase into the backside trenches 79. For example, if the sacrificial material layers (142, 242) include silicon nitride, the etch process can be a wet etch process in which the fifth exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) can be a laterally extending cavity having a lateral dimension that is greater than the vertical extent of the cavity. In other words, the lateral dimension of each of the backside recesses (143, 243) can be greater than the height of the respective backside recess (143, 243). A plurality of backside recesses (143, 243) can be formed in the volumes from which the material of the sacrificial material layers (142, 242) is removed. Each of the backside recesses (143, 243) can extend substantially parallel to the top surface of the semiconductor material layer 510. A backside recess (143, 243) can be vertically bounded by a top surface of an underlying insulating layer (132, 232) and a bottom surface of an overlying insulating layer (132, 232). In one embodiment, each of the backside recesses (143, 243) can have a uniform height throughout.

Physically exposed surface portions of the optional pedestal channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 216, and to convert each physically exposed surface portion of the semiconductor material layer 510 into a planar dielectric portion (not shown). In one embodiment, each tubular dielectric spacer 216 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 216 include a dielectric material that includes the same semiconductor element as the pedestal channel portions 11 and additionally includes at least one non-metallic element such as oxygen and/or nitrogen such that the material of the tubular dielectric spacers 216 is a dielectric material. In one embodiment, the tubular dielectric spacers 216 can include a dielectric oxide, a dielectric nitride, or a dielectric oxynitride of the semiconductor material of the pedestal channel portions 11. Likewise, each planar dielectric portion includes a dielectric material that includes the same semiconductor element as the source regions 61 and additionally includes at least one non-metallic element such as oxygen and/or nitrogen.

Each tubular dielectric spacer 216 laterally surrounds, and contacts, a respective pedestal channel portion 11, and contacts the bottommost insulating layer 132B. The tubular dielectric spacers 216 comprise, and/or consist essentially of, a thermal oxide of the semiconductor material of the pedestal channel portions 11. The oxidation process that forms the tubular dielectric spacers 216 consumes peripheral regions of the pedestal channel portions 11 at the level of the bottommost lateral recess 143. Thus, each pedestal channel portion 11 can have a third width w3 at a level of the tubular dielectric spacers 216 that is less than the first width w1.

Figure 86A:
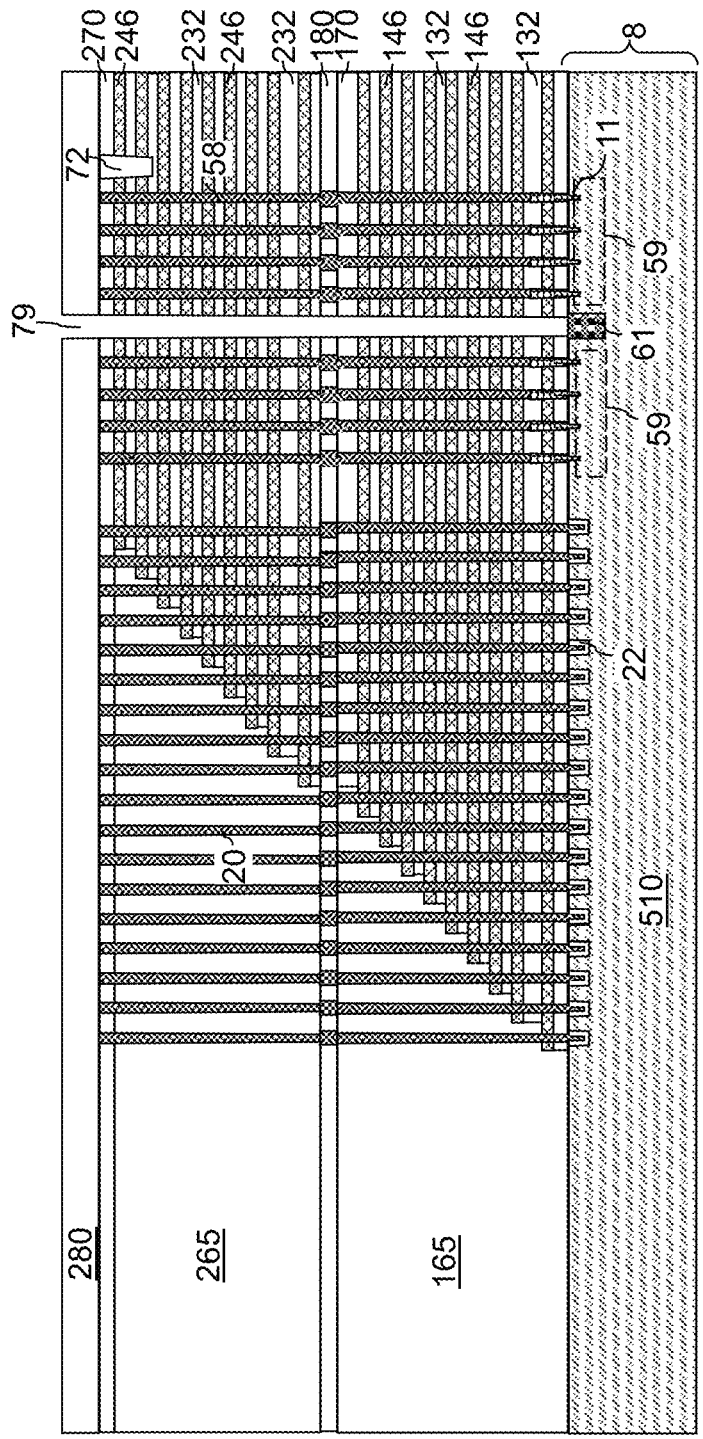
FIG. 86A is a vertical cross-sectional view of the fifth exemplary structure after formation of electrically conductive layers according to an embodiment of the present disclosure.
Figure 86B:
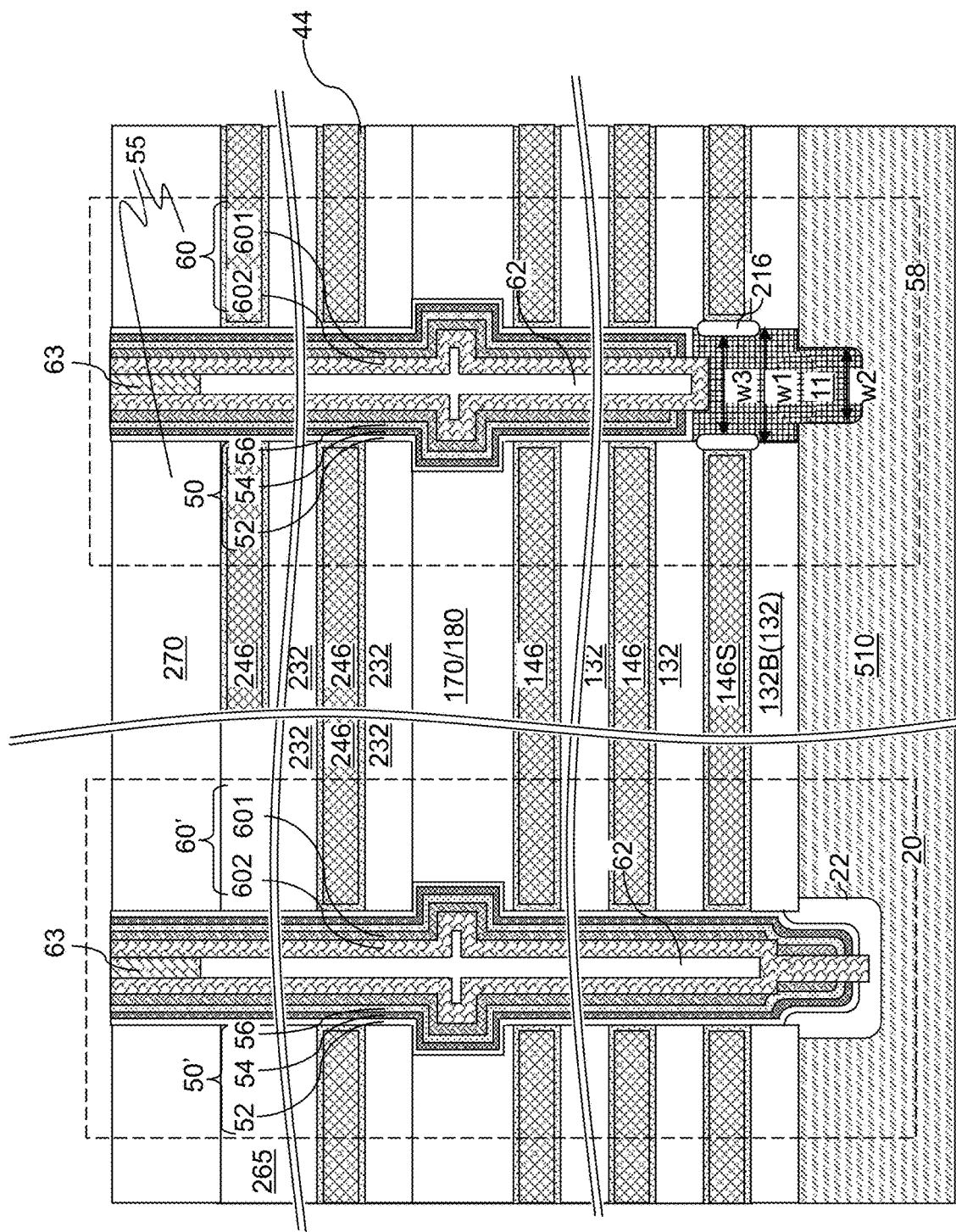
FIG. 86B is a vertical cross-sectional view of a region of the fifth exemplary structure of FIG. 86A.

Referring to FIGS. 86A and 86B, a backside blocking dielectric layer 44 can be optionally deposited in the backside recesses (143, 243) and the backside trenches 79 and over the first contact level dielectric layer 280. The backside blocking dielectric layer 44 includes a dielectric material such as a dielectric metal oxide, silicon oxide, or a combination thereof. For example, the backside blocking dielectric layer 44 can include aluminum oxide. The backside blocking dielectric layer 44 can be formed by a conformal deposition process such as atomic layer deposition or chemical vapor deposition. The thickness of the backside blocking dielectric layer 44 can be in a range from 1 nm to 20 nm, such as from 2 nm to 10 nm, although lesser and greater thicknesses can also be used.

At least one conductive material can be deposited in the plurality of backside recesses (243, 243), on the sidewalls of the backside trenches 79, and over the first contact level dielectric layer 280. The at least one conductive material can be deposited by a conformal deposition method, which can be, for example, chemical vapor deposition (CVD), atomic layer deposition (ALD), electroless plating, electroplating, or a combination thereof. The at least one conductive material can include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material can include at least one metallic material, i.e., an electrically conductive material that includes at least one metallic element. Non-limiting exemplary metallic materials that can be deposited in the backside recesses (143, 243) include tungsten, tungsten nitride, titanium, titanium nitride, tantalum, tantalum nitride, cobalt, and ruthenium. For example, the at least one conductive material can include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) can be a combination of titanium nitride layer and a tungsten fill material.

Electrically conductive layers (146, 246) can be formed in the backside recesses (143, 243) by deposition of the at least one conductive material. A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the first contact level dielectric layer 280. Each of the first electrically conductive layers 146 and the second electrically conductive layers 246 can include a respective conductive metallic nitride liner and a respective conductive fill material. Thus, the first and second sacrificial material layers (142, 242) can be replaced with the first and second electrically conductive layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

Residual conductive material can be removed from inside the backside trenches 79 and from above the first contact level dielectric layer 280. Specifically, the deposited metallic material of the continuous metallic material layer can be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. The planar dielectric portions overlying the source regions 61 can be removed collaterally during the anisotropic or isotropic etch that removes the residual conductive material can be removed from inside the backside trenches 79.

Each electrically conductive layer (146, 246) can be a conductive sheet including openings therein. A first subset of the openings through each electrically conductive layer (146, 246) can be filled with memory opening fill structures 58. A second subset of the openings through each electrically conductive layer (146, 246) can be filled with the support pillar structures 20. Each electrically conductive layer (146, 246) can have a lesser area than any underlying electrically conductive layer (146, 246) because of the first and second stepped surfaces. Each electrically conductive layer (146, 246) can have a greater area than any overlying electrically conductive layer (146, 246) because of the first and second stepped surfaces.

In some embodiment, drain-select-level isolation structures 72 may be provided at topmost levels of the second electrically conductive layers 246. At least one upper second electrically conductive layer 246 located at the levels of the drain-select-level isolation structures 72 functions as a drain select gate electrode. At least one lower first electrically conductive layer 146S functions as a source select gate electrode. A subset of the electrically conductive layers (146, 246) located between the source select gate electrode(s) and the drain select gate electrode(s) can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. A memory-level assembly is formed over the semiconductor material layer 510. The memory-level assembly includes at least one alternating stack (132, 146, 232, 246) and memory stack structures 55 vertically extending through the at least one alternating stack (132, 146, 232, 246).

Figure 87A:
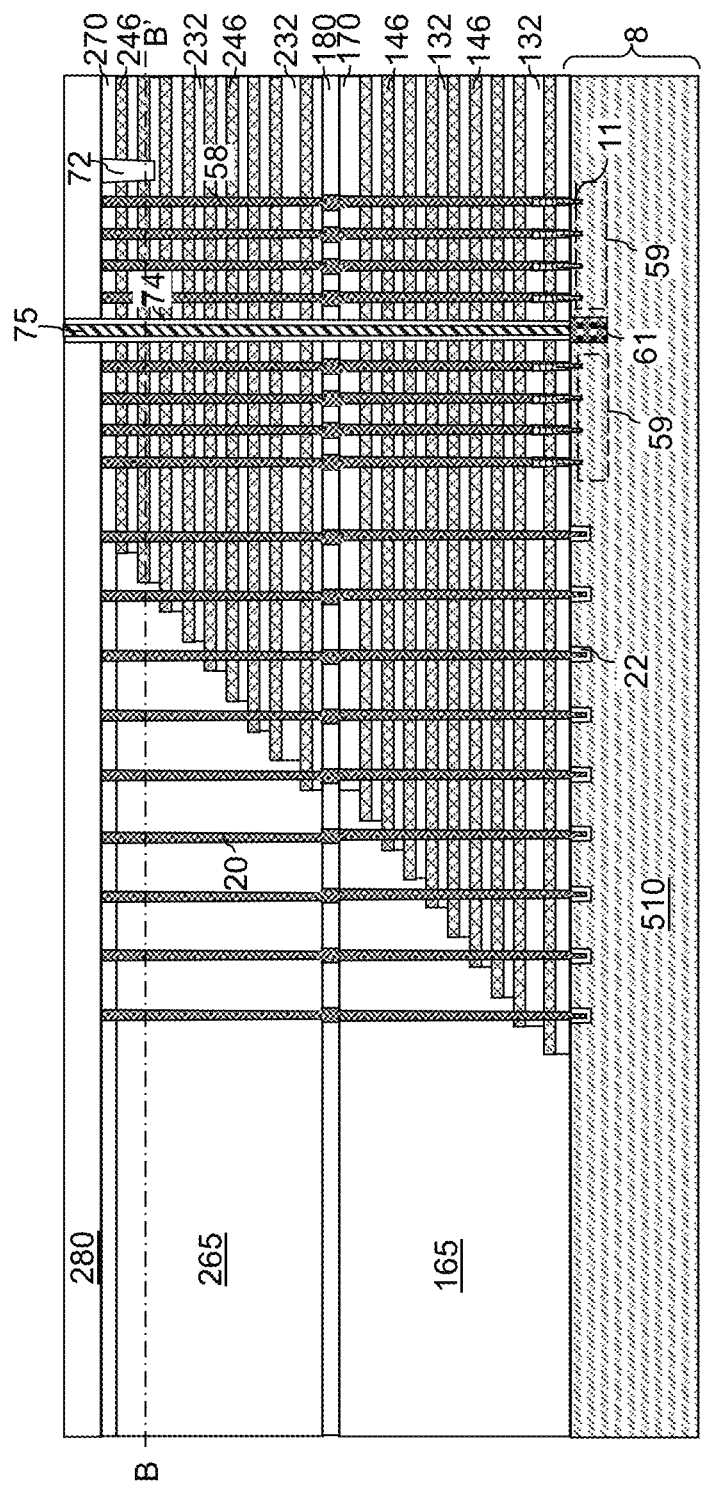
FIG. 87A is a vertical cross-sectional view of the fifth exemplary structure after formation of backside contact via structures according to an embodiment of the present disclosure.
Figure 87B:
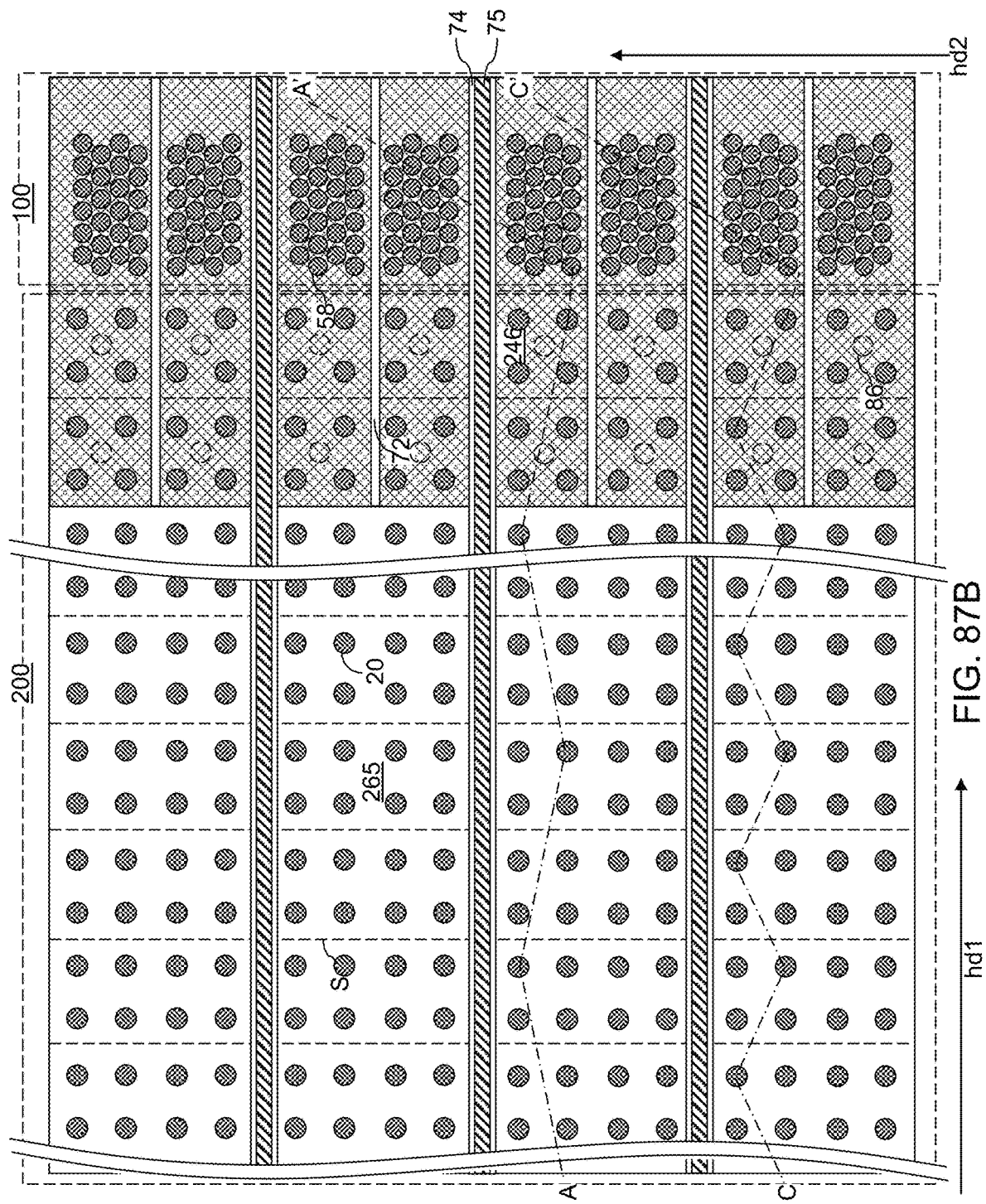
FIG. 87B is a horizontal cross-sectional view of the fifth exemplary structure along the horizontal plane B-B' of FIG. 87A. The hinged vertical plane A-A' is the plane of the vertical cross-sectional view of FIG. 87A.
Figure 87C:
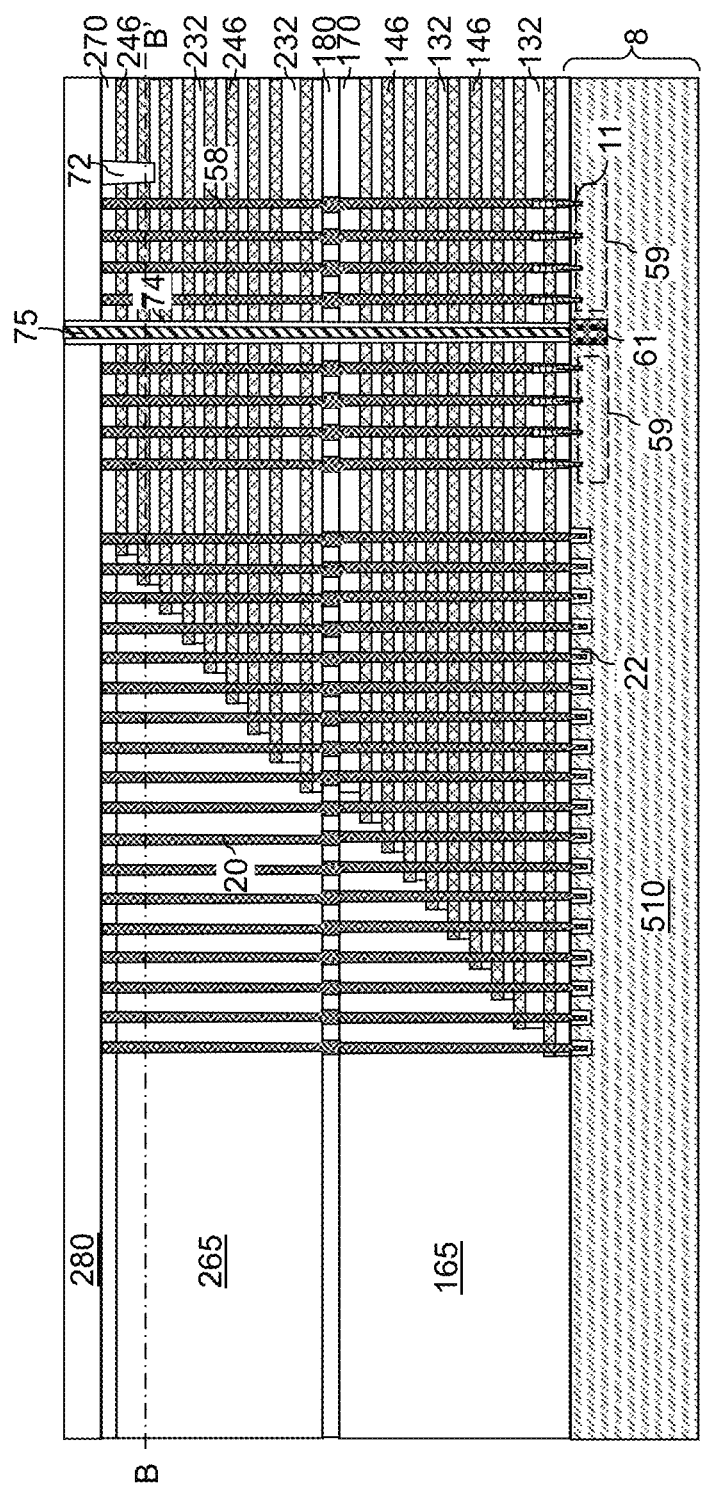
FIG. 87C is a vertical cross-sectional view of the fifth exemplary structure along the hinged vertical plane C-C' of FIG. 87B.

Referring to FIGS. 87A-87C, an insulating material layer can be formed in the backside trenches 79 and over the first contact level dielectric layer 280 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the first contact level dielectric layer 280 and at the bottom of each backside trench 79. Each remaining portion of the insulating material layer constitutes an insulating spacer 74. A backside cavity is present within a volume surrounded by each insulating spacer 74. A top surface of a source region 61 can be physically exposed at the bottom of each backside trench 79.

A backside contact via structure 75 can be formed within each backside cavity 79'. The contact via structures 75 can be formed by depositing at least one conductive material in the remaining unfilled volume (i.e., the backside cavity 79') of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the first contact level dielectric layer 280 as a stopping layer. If chemical mechanical planarization (CMP) process is employed, the first contact level dielectric layer 280 can be employed as a CMP stopping layer. Each remaining continuous portion of the at least one conductive material in the backside trenches 79 constitutes a backside contact via structure 75, which can function as a source contact via structure.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure 76. In this case, each backside trench fill structure may fill the entire volume of a backside trench 79 and may consist essentially of at least one dielectric material. In this alternative embodiment, the source region 61 and the backside contact via structure 75 may be omitted, and a horizontal buried source layer (112, 114, 116) including the contact layer 114 shown in FIG. 13E may contact an side of the lower portion of the vertical semiconductor channel 60.

Figure 88A:
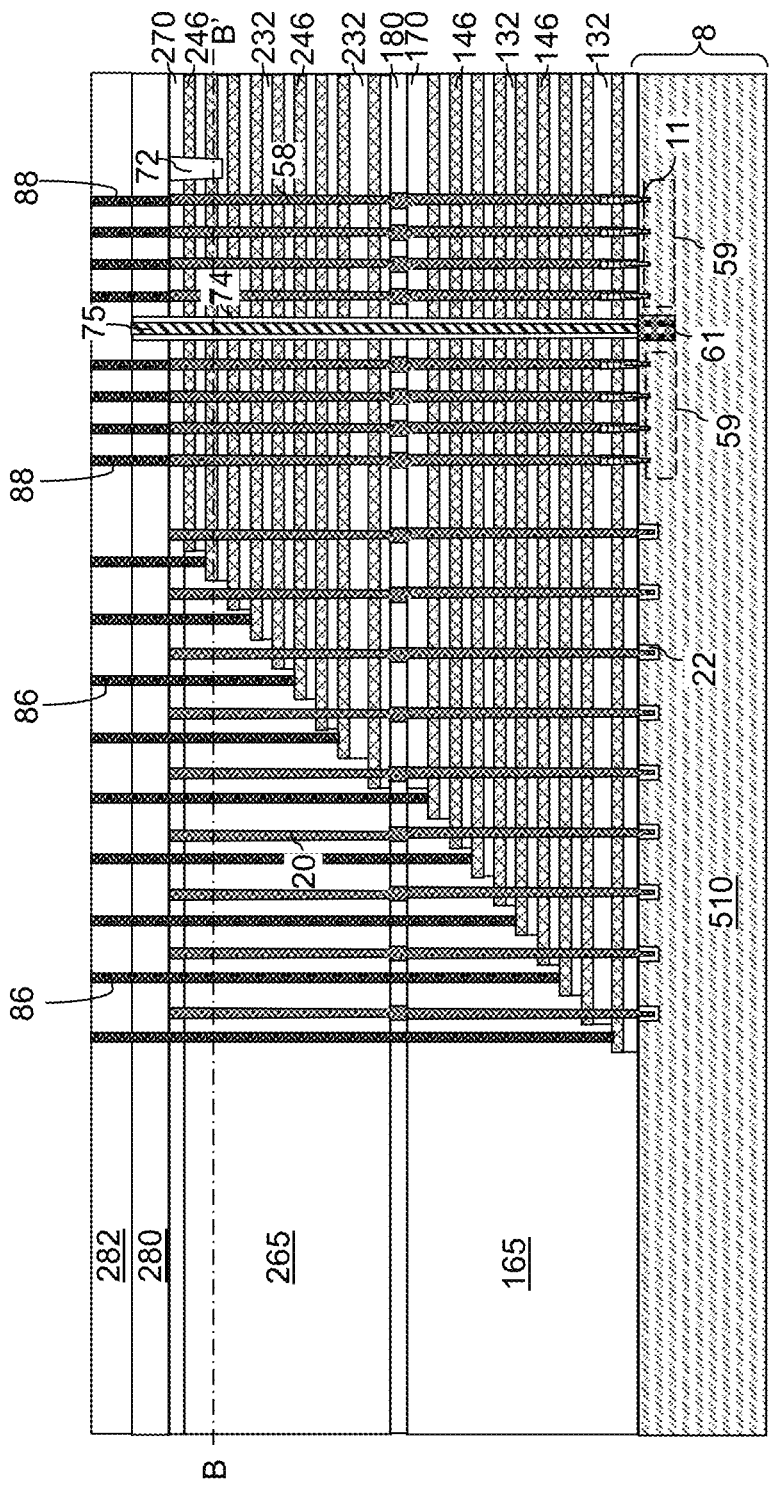
FIG. 88A is a vertical cross-sectional view of the fifth exemplary structure after formation of a second contact-level dielectric layer and contact via structures according to an embodiment of the present disclosure.
Figure 88B:
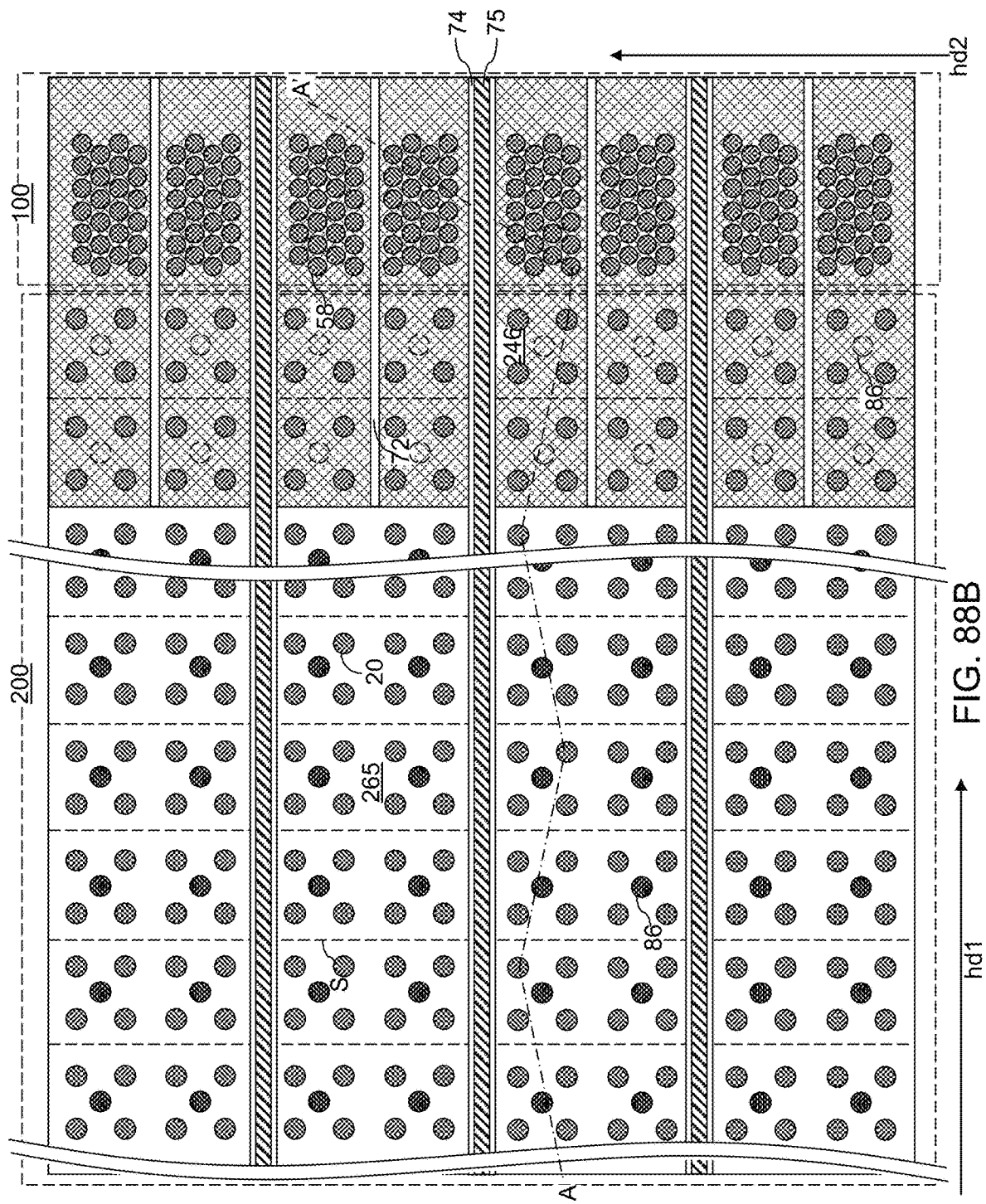
FIG. 88B is a horizontal cross-sectional view of the fifth exemplary structure along the horizontal plane B-B' of FIG. 88A. The hinged vertical plane A-A' is the plane of the vertical cross-sectional view of FIG. 88A.

Referring to FIGS. 88A and 88B, a second contact level dielectric layer 282 may be formed over the first contact level dielectric layer 280. The second contact level dielectric layer 282 includes a dielectric material such as silicon oxide, and can have a thickness in a range from 100 nm to 600 nm, although lesser and greater thicknesses can also be used.

A photoresist layer (not shown) can be applied over the second contact level dielectric layer 282, and can be lithographically patterned to form various contact via openings. For example, openings for forming drain contact via structures can be formed in the memory array region 100, and openings for forming staircase region contact via structures can be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) can be used as etch stop structures. Drain contact via cavities can be formed over each drain region 63, and staircase-region contact via cavities can be formed over each electrically conductive layer (146. 246) at the stepped surfaces underlying the first and second retro-stepped dielectric material portions (165, 265). The photoresist layer can be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 can include drain select level contact via structures that contact a subset of the second electrically conductive layers 246 that function as drain select level gate electrodes. Further, the staircase-region contact via structures 86 can include word line contact via structures that contact electrically conductive layers (146, 246) that underlie the drain select level gate electrodes and function as word lines for the memory stack structures 55.

Figure 89:
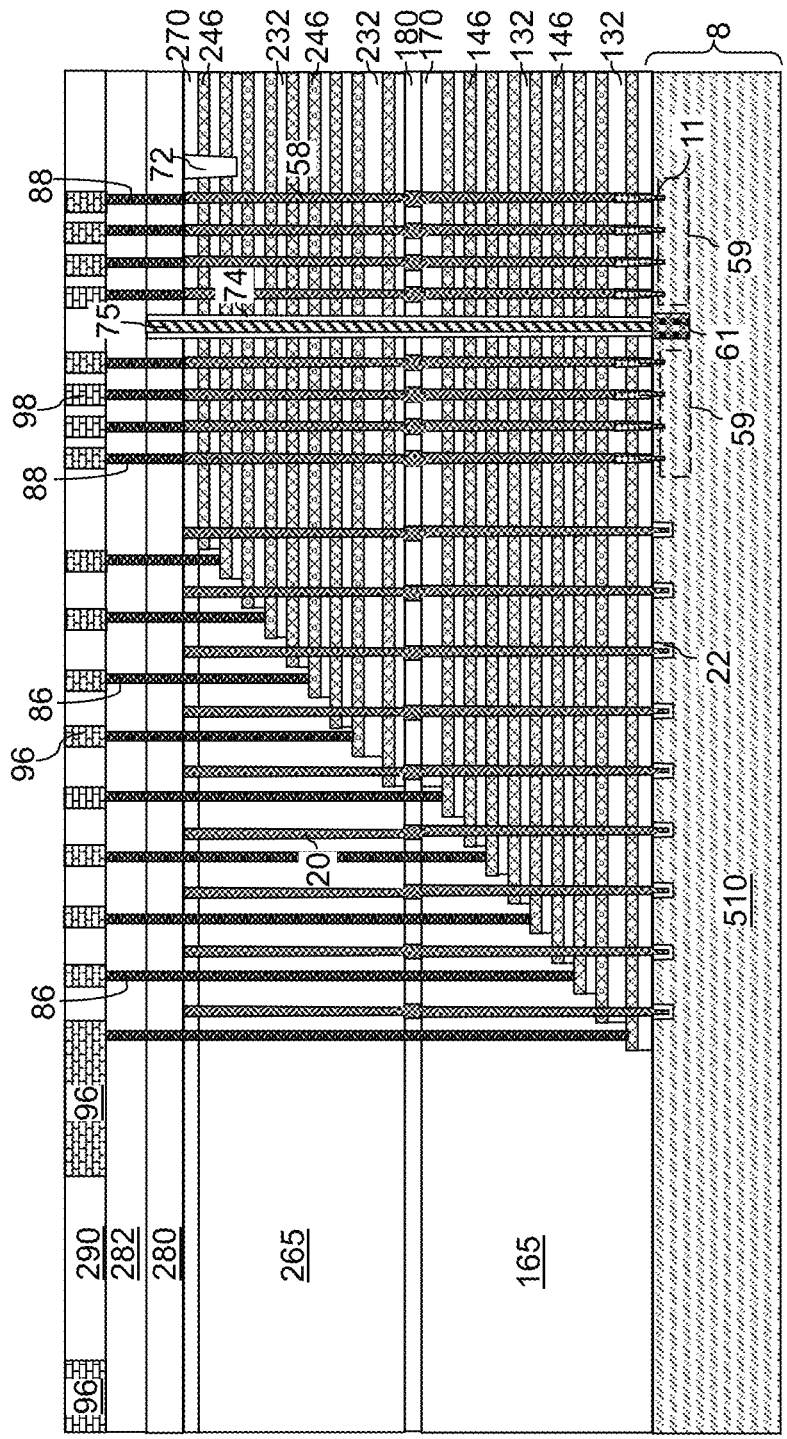
FIG. 89 is a vertical cross-sectional view of the fifth exemplary structure after formation of a line-level dielectric layer and upper-level metal interconnect structures according to an embodiment of the present disclosure.

Referring to FIG. 89, a line-level dielectric layer 290 and upper-level metal interconnect structures can be formed over the second contact level dielectric layer 282. For example, the upper-level metal interconnect structures can include bit lines 98 and interconnection line structures 96. The bit lines 98 are not in electrical contact with the dummy vertical semiconductor channels 60' of the support pillar structures 20.

Referring to FIGS. 71-89 and all related drawings and according to various embodiments of the present disclosure, a semiconductor device is provided, which may be a three-dimensional semiconductor device including a three-dimensional array of memory elements. The semiconductor device can comprise: at least one alternating stack of insulating layers (132, 232) and electrically conductive layers (146, 246) located over a substrate 8 including a semiconductor material layer 510; a memory opening 49 vertically extending through a memory array region 100 of the at least one alternating stack {(132, 146), (232, 246)} in which each layer of the at least one alternating stack {(132, 146), (232, 246)} is present; a memory opening fill structure 58 located in the memory opening 49 and comprising a memory film 50 and a semiconductor material portion (such as a pedestal channel portion 11) in contact with the semiconductor material layer 510; a support opening 19 vertically extending through at least a bottommost one 146S of the electrically conductive layers (146, 246) of the at least one alternating stack {(132, 146), (232, 246)}; and a support pillar structure 20 located in the support opening 19, wherein the support pillar structure 20 lacks a semiconductor material portion which is in contact with the semiconductor material layer 510.

In one embodiment, the semiconductor material portion of the memory opening fill structure comprises a vertical semiconductor channel 60 and a semiconductor pedestal channel portion 11 located between the semiconductor material layer 510 and a bottom of the vertical semiconductor channel 60. The semiconductor pedestal channel portion 11 contacts both the semiconductor material layer 510 and the bottom of the vertical semiconductor channel 60. In contrast, the support pillar structure 20 comprises a dummy vertical semiconductor channel 60' which does not contact the semiconductor material layer 510. The support pillar structure 20 lacks the semiconductor pedestal channel portion located between the semiconductor material layer 510 and a bottom of the dummy vertical semiconductor channel 60'.

In one embodiment, the support pillar structure 20 comprises a dummy memory film 50' having a same set of layers as the memory film 50. In one embodiment, the dummy memory film 50' vertically extends through at least a bottommost insulating layer 132B within the at least one alternating stack {(132, 146), (232, 246)} and contacts a sidewall of the bottommost insulating layer 132B. In one embodiment, a bottommost surface of the memory film 50 can be located above a horizontal plane including a top surface of the bottommost insulating layer 132B of the at least one alternating stack {(132, 146), (232, 246)}. The bottommost surface of the memory film 50 can be located above a horizontal plane including a top surface of the bottommost electrically conductive layer of the at least one alternating stack {(132, 146), (232, 246)}. In one embodiment, each of the memory film 50 and the dummy memory film 50' comprises a respective layer stack including a respective blocking dielectric layer 52, a respective charge storage layer 54, and a respective tunneling dielectric layer 56.

In one embodiment, the memory opening fill structure 58 comprises the vertical semiconductor channel 60 in contact with a sidewall and a recessed surface of the semiconductor material portion (such as a pedestal channel portion 11); and the support pillar structure 20 comprises a dummy vertical semiconductor channel 60' which has a same material composition as the vertical semiconductor channel 60 and contacts an inner sidewall of the dummy memory film 50'. In one embodiment, the dummy vertical semiconductor channel 60' vertically extends through a bottom portion of the dummy memory film 50', contacts the semiconductor oxide liner 22, and is spaced from the semiconductor material layer 510 by the semiconductor oxide liner 22.

In one embodiment, a top surface of the support pillar structure 20 is located above a topmost surface of the at least one alternating stack {(132, 146), (232, 246)} and is located within a same horizontal plane as a top surface of the memory opening fill structure 58. In one embodiment, the semiconductor device comprises at least one retro-stepped dielectric material portion (165 and/or 265) overlying stepped surfaces of the at least one alternating stack {(132, 146), (232, 246)}, wherein the support pillar structure 20 vertically extends through the at least one retro-stepped dielectric material portion (165 and/or 265).

In one embodiment, the semiconductor material portion of the memory opening fill structure 58 comprises a pedestal channel portion 11 contacting a sidewall of a bottommost insulating layer 132B of the at least one alternating stack {(132, 146), (232, 246)}, a sidewall of the semiconductor material layer 510, and a recessed surface of the semiconductor material layer 510 located below a horizontal plane including an interface between the semiconductor material layer 510 and the bottommost insulating layer 132B of the at least one alternating stack {(132, 146), (232, 246)}. In one embodiment, the semiconductor material layer 510 comprises, and/or consists essentially of, a first single crystalline semiconductor material; and the pedestal channel portion 11 comprises, and/or consists essentially of, a second single crystalline semiconductor material in epitaxial alignment with the first single crystalline semiconductor material.

In one embodiment, the pedestal channel portion 11 has a first width w1 at a level of the bottommost insulating layer 132B of the at least one alternating stack {(132, 146), (232, 246)}; the pedestal channel portion 11 has a second width w2 below the horizontal plane including the interface between the semiconductor material layer 510 and the bottommost insulating layer 132B; and the second width w2 is less than the first width w1.

In one embodiment, the pedestal channel portion 11 has an annular bottom surface contacting a portion of a top surface of the semiconductor material layer 510; the pedestal channel portion 11 has a first cylindrical sidewall that contacts the bottommost insulating layer 132B of the at least one alternating stack {(132, 146), (232, 246)}; the pedestal channel portion 11 has a second cylindrical sidewall that contacts the semiconductor material layer 510; a bottom periphery of the first cylindrical sidewall coincides with an outer periphery of the annular bottom surface; a top periphery of the second cylindrical sidewall coincides with an inner periphery of the annular bottom surface; and the outer periphery of the annular bottom surface is laterally offset outward from the inner periphery of the annular bottom surface by a uniform lateral offset distance around an entirety of the inner periphery of the annular bottom surface.

In one embodiment, the memory device comprises a tubular dielectric spacer 216 laterally surrounding the pedestal channel portion 11 and contacting a bottommost insulating layer 132B of the at least one alternating stack {(132, 146), (232, 246)}, wherein a bottommost electrically conductive layer (which is the bottommost layer among the first electrically conductive layers 146) within the at least one alternating stack {(132, 146), (232, 246)} laterally surrounds the tubular dielectric spacer 216, wherein: the tubular dielectric spacer 216 comprises a thermal oxide of a semiconductor material of the pedestal channel portion 11; and the pedestal channel portion 11 has a third width w3 at a level of the tubular dielectric spacer 216 that is less than the first width w1.

In one embodiment, the support pillar structure 20 further comprises a semiconductor oxide liner 22 that includes a dielectric oxide of a semiconductor material of the semiconductor material layer 510, and wherein an entire interface between the support pillar structure 20 and the semiconductor material layer 510 is a continuous interface between the semiconductor oxide liner 22 and the semiconductor material layer 510. Thus, the semiconductor oxide liner 22 physically separates the dummy vertical semiconductor channel 60' from the semiconductor material layer 510.

The fifth embodiment of the present disclosure reduce short circuits and leakage current through the support pillar structures. For example, some of the tubular dielectric spacers 216 may not be formed or may be formed with voids or breaks. If such defects in the tubular dielectric spacers 216 located in the support pillar structures 20 occur, then there would be a short circuit between the source select gate electrode 146S and the epitaxial pedestal structure 11 in the support pillar structure 20. However, since the epitaxial pedestal structures 11 are not present in the support pillar structures 20, short circuits and leakage current between the epitaxial pedestal structures in the support pillar structures 20 and the electrically conductive layers 146 (e.g., 146S) are eliminated. The dummy memory film 50' surrounds the entire dummy vertical semiconductor channel 60' and prevents or reduces short circuits between the dummy vertical semiconductor channel 60' and the electrically conductive layers 146 (e.g., 146S). Furthermore, the semiconductor oxide liners 22 in the fifth exemplary structure can prevent leakage current between the semiconductor material layer 510 and the dummy vertical semiconductor channels 60' within support pillar structures 20.

Although the foregoing refers to particular embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A semiconductor device, comprising:
at least one alternating stack of insulating layers and electrically conductive layers located over a substrate including a semiconductor material layer;
a memory opening vertically extending through a memory region of the at least one alternating stack in which each layer of the at least one alternating stack is present;
a memory opening fill structure located in the memory opening and comprising a memory film, and a semiconductor material portion in contact with the semiconductor material layer;
a support opening vertically extending through at least a bottommost one of the electrically conductive layers of the at least one alternating stack; and
a support pillar structure located in the support opening, wherein the support pillar structure lacks a semicon- ductor material portion which is in contact with the semiconductor material layer;

wherein:

the semiconductor material portion of the memory opening fill structure comprises a vertical semiconductor channel and a semiconductor pedestal channel portion located between the semiconductor material layer and a bottom of the vertical semiconductor channel;

the semiconductor pedestal channel portion contacts both the semiconductor material layer and the bottom of the vertical semiconductor channel;

the support pillar structure comprises a dummy vertical semiconductor channel which does not contact the semiconductor material layer;

the support pillar structure lacks the semiconductor pedestal channel portion located between the semiconductor material layer and a bottom of the dummy vertical semiconductor channel;

the support pillar structure comprises a dummy memory film having a same set layers as the memory film;

the vertical semiconductor channel is in contact with a sidewall and a recessed surface of the semiconductor material portion;

the dummy vertical semiconductor channel has a same material composition as the vertical semiconductor channel and contacts an inner sidewall of the dummy memory film; and the dummy vertical semiconductor channel vertically extends through a bottom portion of the dummy memory film, and is spaced from the semiconductor material layer by a semiconductor oxide liner.

2. A semiconductor device, comprising:

at least one alternating stack of insulating layers and electrically conductive layers located over a substrate including a semiconductor material layer;

a memory opening vertically extending through a memory region of the at least one alternating stack in which each layer of the at least one alternating stack is present;

a memory opening fill structure located in the memory opening and comprising a memory film, and a semiconductor material portion in contact with the semiconductor material layer;

a support opening vertically extending through at least a bottommost one of the electrically conductive layers of the at least one alternating stack; and a support pillar structure located in the support opening, wherein the support pillar structure lacks a semiconductor material portion which is in contact with the semiconductor material layer;

wherein:

the semiconductor material portion of the memory opening fill structure comprises a vertical semiconductor channel and a semiconductor pedestal channel portion located between the semiconductor material layer and a bottom of the vertical semiconductor channel;

the semiconductor pedestal channel portion contacts both the semiconductor material layer and the bottom of the vertical semiconductor channel;

the support pillar structure comprises a dummy vertical semiconductor channel which does not contact the semiconductor material layer;

the support pillar structure lacks the semiconductor pedestal channel portion located between the semiconductor material layer and a bottom of the dummy vertical semiconductor channel;

the semiconductor pedestal channel portion contacts a sidewall of a bottommost insulating layer of the at least one alternating stack, a sidewall of the semiconductor material layer, and a recessed surface of the semiconductor material layer located below a horizontal plane including an interface between the semiconductor material layer and the bottommost insulating layer of the at least one alternating stack;

the semiconductor pedestal channel portion has an annular bottom surface contacting a portion of a top surface of the semiconductor material layer;

the semiconductor pedestal channel portion has a first cylindrical sidewall that contacts the bottommost insulating layer of the at least one alternating stack; and the semiconductor pedestal channel portion has a second cylindrical sidewall that contacts the semiconductor material layer.

3. The memory device of claim 2, wherein:

a bottom periphery of the first cylindrical sidewall coincides with an outer periphery of the annular bottom surface;

a top periphery of the second cylindrical sidewall coincides with an inner periphery of the annular bottom surface; and the outer periphery of the annular bottom surface is laterally offset outward from the inner periphery of the annular bottom surface by a uniform lateral offset distance around an entirety of the inner periphery of the annular bottom surface.

4. The memory device of claim 2, further comprising a tubular dielectric spacer laterally surrounding the semiconductor pedestal channel portion and contacting a bottommost insulating layer of the at least one alternating stack, wherein a bottommost electrically conductive layer within the at least one alternating stack laterally surrounds the tubular dielectric spacer, wherein the tubular dielectric spacer comprises a thermal oxide of a semiconductor material of the semiconductor pedestal channel portion.

5. A semiconductor device, comprising:

at least one alternating stack of insulating layers and electrically conductive layers located over a substrate including a semiconductor material layer;

a memory opening vertically extending through a memory region of the at least one alternating stack in which each layer of the at least one alternating stack is present;

a memory opening fill structure located in the memory opening and comprising a memory film, and a semiconductor material portion in contact with the semiconductor material layer;

a support opening vertically extending through at least a bottommost one of the electrically conductive layers of the at least one alternating stack; and a support pillar structure located in the support opening, wherein the support pillar structure lacks a semiconductor material portion which is in contact with the semiconductor material layer;

wherein the support pillar structure further comprises a semiconductor oxide liner that includes a dielectric oxide of a semiconductor material of the semiconductor material layer, and wherein an entire interface between the support pillar structure and the semiconductor material layer is a continuous interface between the semiconductor oxide liner and the semiconductor material layer.

* * * * *